US011783958B2

(12) United States Patent
Hatakeyama et al.

(10) Patent No.: US 11,783,958 B2
(45) Date of Patent: Oct. 10, 2023

(54) CONDUCTIVE WIRING MATERIAL COMPOSITION, CONDUCTIVE WIRING SUBSTRATE AND METHOD FOR PRODUCING CONDUCTIVE WIRING SUBSTRATE

(71) Applicant: SHIN-ETSU CHEMICAL CO., LTD., Tokyo (JP)

(72) Inventors: Jun Hatakeyama, Joetsu (JP); Koji Hasegawa, Joetsu (JP); Osamu Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 452 days.

(21) Appl. No.: 16/918,156

(22) Filed: Jul. 1, 2020

(65) Prior Publication Data

US 2021/0007218 A1 Jan. 7, 2021

(30) Foreign Application Priority Data

Jul. 1, 2019 (JP) ................................ 2019-122671

(51) Int. Cl.
*H01B 1/12* (2006.01)
*H01B 1/22* (2006.01)
(Continued)

(52) U.S. Cl.
CPC .............. *H01B 1/122* (2013.01); *C08L 25/08* (2013.01); *C08L 33/02* (2013.01); *H01B 1/22* (2013.01);
(Continued)

(58) Field of Classification Search
CPC . C08L 25/08; C08L 33/02; C08K 2003/0806; C08K 2003/0831;
(Continued)

(56) References Cited

U.S. PATENT DOCUMENTS

2008/0318108 A1* 12/2008 Kaneko ............... H01M 8/1025 429/493
2011/0256383 A1 10/2011 Cochet et al.
(Continued)

FOREIGN PATENT DOCUMENTS

EP 3 358 572 A1 8/2018
JP H11-349786 A 12/1999
(Continued)

OTHER PUBLICATIONS

Aug. 3, 2021 Office Action issued in Korean Patent Application No. 10-2020-0080330.
(Continued)

*Primary Examiner* — Mark Kopec
*Assistant Examiner* — Jaison P Thomas
(74) *Attorney, Agent, or Firm* — Oliff PLC

(57) ABSTRACT

The conductive wiring material composition includes (A) a polymer compound having a repeating unit "a" which has a structure selected from an ammonium salt, a lithium salt, a sodium salt, a potassium salt and a silver salt of any of fluorosulfonic acid, fluorosulfonimide and fluorosulfonamide and (B) metal powder, wherein the component (B) is contained with an amount exceeding 50 parts by mass based on 100 parts by mass of a solid content of the conductive wiring material composition excluding the component (B).

13 Claims, 1 Drawing Sheet

(51) Int. Cl.

| | |
|---|---|
| ***H05K 1/09*** | (2006.01) |
| ***C08L 33/02*** | (2006.01) |
| ***C08L 25/08*** | (2006.01) |
| *C08K 3/08* | (2006.01) |

(52) U.S. Cl.
CPC ................ *H05K 1/09* (2013.01); *C08K 3/08* (2013.01); *C08K 2003/0806* (2013.01)

(58) Field of Classification Search
CPC .... C08K 2003/085; C08K 3/08; C09D 11/52; H01B 1/122; H01B 1/22; H05K 1/09
See application file for complete search history.

(56) References Cited

U.S. PATENT DOCUMENTS

| | | | |
|---|---|---|---|
| 2014/0303470 | A1 | 10/2014 | Tsukada et al. |
| 2018/0193632 | A1* | 7/2018 | Hatakeyama .......... A61B 5/259 |
| 2018/0197653 | A1* | 7/2018 | Hatakeyama ......... A61L 31/126 |
| 2018/0223133 | A1* | 8/2018 | Hatakeyama .......... C09J 183/04 |
| 2019/0088997 | A1* | 3/2019 | Bouchet ............ H01M 10/0569 |
| 2019/0117101 | A1* | 4/2019 | Hatakeyama ...... C08G 18/8025 |
| 2019/0388594 | A1* | 12/2019 | Hatakeyama ........... C08L 83/08 |
| 2020/0082957 | A1 | 3/2020 | Matsuhisa et al. |

FOREIGN PATENT DOCUMENTS

| | | | |
|---|---|---|---|
| JP | 2004-033468 | A | 2/2004 |
| JP | 2011-216487 | A | 10/2011 |
| JP | 2015-037696 | A | 2/2015 |
| JP | 6343903 | B2 | 6/2018 |
| JP | 2018-110845 | A | 7/2018 |
| JP | 2018-126496 | A | 8/2018 |
| KR | 10-2018-0091749 | A | 8/2018 |
| WO | 2016/204162 | A1 | 12/2016 |
| WO | 2017/217509 | A1 | 12/2017 |
| WO | 2018/110632 | A1 | 6/2018 |

OTHER PUBLICATIONS

Nov. 16, 2020 Extended European Search Report issued in European Patent Application No. 20183006.4.
Mar. 22, 2023 Office Action issued in Japanese Application No. 2020-096752.

* cited by examiner

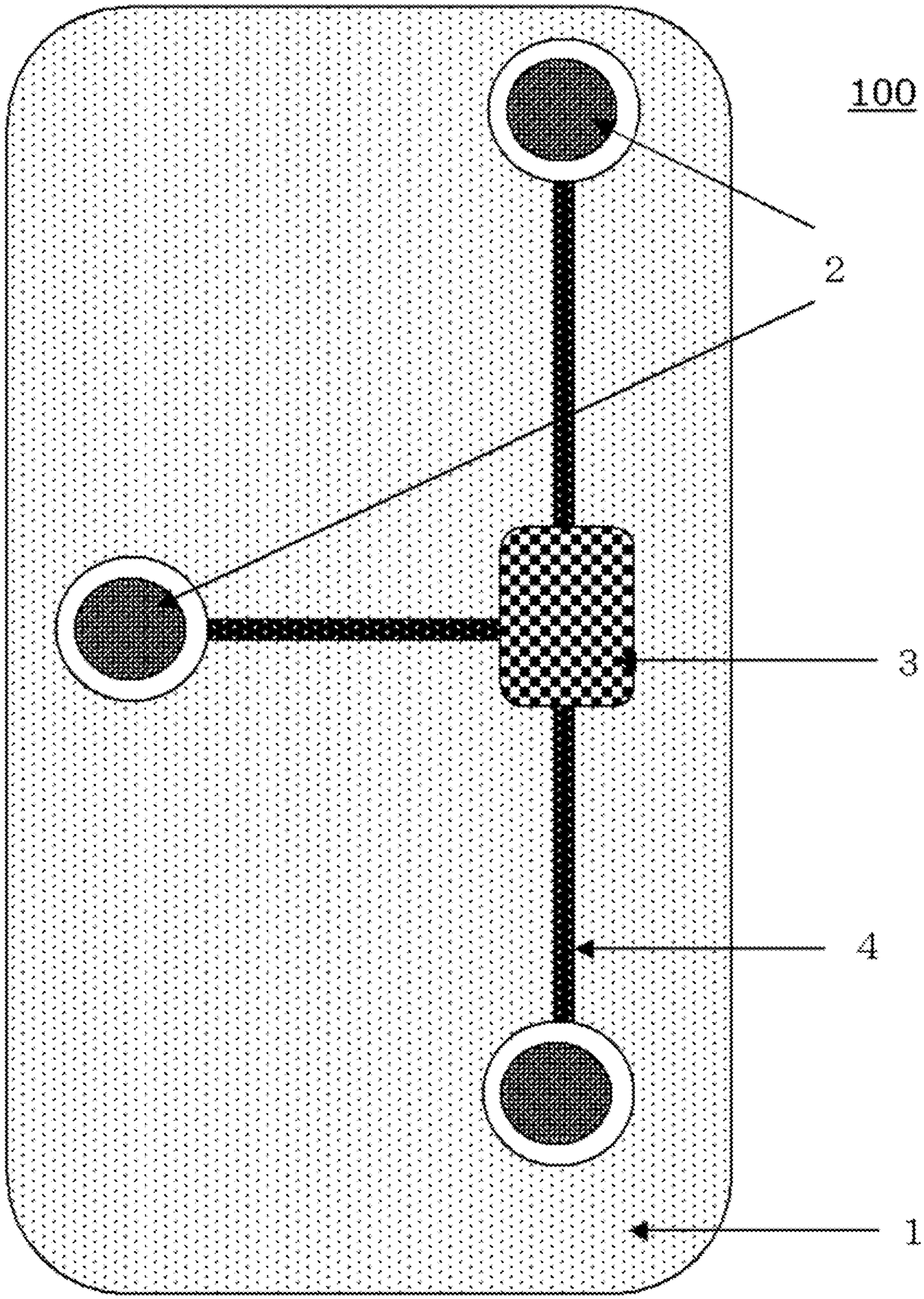
100
2
3
4
1

CONDUCTIVE WIRING MATERIAL COMPOSITION, CONDUCTIVE WIRING SUBSTRATE AND METHOD FOR PRODUCING CONDUCTIVE WIRING SUBSTRATE

TECHNICAL FIELD

The present invention relates to a conductive wiring material composition, a conductive wiring substrate using the conductive wiring material composition, and a method for producing the conductive wiring substrate.

BACKGROUND ART

In recent years, development of wearable devices has been progressing with the spread of IoT (Internet of Things). Watches and eyeglasses capable of connecting to the internet are representative ones. In addition, in the medical field and the field of sport, wearable devices capable of constantly monitoring the physical conditions are also required, which are future growing fields.

As the wearable devices, a form of constantly monitoring the state of the body by attaching to the body is shown. Such a wearable device generally includes a bioelectrode for detecting electric signals from the body, a wiring for transmitting the electric signals to a sensor, a semiconductor chip serving as a sensor and a battery. In addition, an adhesive pad for adhering the device to the skin is usually necessary. With regard to the structures of the bioelectrode, the wirings around thereof and the adhesive pad, these are described in Patent Document 1 in detail. In the wearable device described in Patent Document 1, a silicone-based adhesive membrane is disposed around the bioelectrode, and the bioelectrode and the sensor device are connected to each other by a bellows-shaped stretchable silver wiring covered with a stretchable urethane membrane. Even if the metal wiring itself does not have stretchability, conductivity can be ensured by making the wiring bellows-shape where horse's hoofs are arranged or using a wrinkled substrate.

If conduction can be taken not by a bellows-shape but a straight wiring at the time of stretching or shrinkage, it becomes a more compact wiring area, which is beautiful in design and becomes a low cost. Furthermore, when the conductivity is higher and higher, conduction can be ensured even if the wiring is made thin, and ultra-fine wirings which cannot be seen with naked eyes prevents the user feel the presence of the wiring, which generates flexibility of the design and gives an excellent impression. Therefore, development of highly conductive and stretchable conductive paste or conductive ink has been enthusiastically carried out.

There are many proposals or applications such as, for example, stretchable wiring using Galinstan including gallium-indium-tin or a liquid metal including gallium-indium, and a conductive paste in which silver particles are mixed with silicone (Patent Document 2), a mixture of a polyester or polyurethane resin and metal particles (Patent Document 3), a conductive composition in which silver nanowires are mixed with an elastomer component as a metal additive (Patent Document 4), a stretchable wiring which generates silver nanoparticles during annealing by combining a fluorine rubber, a surfactant and silver filler (Patent Document 5) and the like, but most of them relate to conductive pastes in which a metal filler such as silver is mixed with a stretchable resin.

In a conductive wiring using a conductive paste in which a metal filler is mixed with a resin, conduction is established by the percolation phenomenon of electrons among conductive particles. Conductivity of such a conductive wiring is lowered when the printed wiring is stretched simultaneously with a substrate. A distance among metal particles in the wiring is elongated at the time of stretching, and then an insulation distance becomes long, whereby the percolation phenomenon is difficultly to occur and conductivity is lowered.

CITATION LIST

Patent Literature

Patent Document 1: JP 2004-033468A
Patent Document 2: WO 2016/204162A1
Patent Document 3: JP 6,343,903B2
Patent Document 4: WO 2017/217509A1
Patent Document 5: WO 2018/110632A1

SUMMARY OF INVENTION

Technical Problem

The present invention has been made to solve the above-mentioned problems, and an object thereof is to provide a conductive wiring material composition having a small change in conductivity at the time of stretching, a conductive wiring substrate using the conductive wiring material composition, and a method for producing the conductive wiring substrate.

Solution to Problem

To achieve the above-mentioned objects, in the present invention, there is provided a conductive wiring material composition containing (A) an ionic material and (B) metal powder, wherein the component (A) is a polymer compound having a repeating unit "a" which has a structure selected from an ammonium salt, a lithium salt, a sodium salt, a potassium salt and a silver salt of any of fluorosulfonic acid, fluorosulfonimide and fluorosulfonamide, and the component (B) is contained in an amount exceeding 50 parts by mass based on 100 parts by mass of a solid content in the conductive wiring material composition excluding the component (B).

This conductive wiring material composition has a small change in conductivity at the time of stretching and shrinkage, is capable of transmitting electric signals to the device with good efficiency (that is, excellent in conductivity), and is capable of forming a lightweight wiring having a high flexibility design at a low cost.

This conductive wiring material composition further preferably contains (C) a stretchable resin, and the metal powder as the component (B) is contained in an amount of exceeding 50 parts by mass based on 100 parts by mass of the total of the component (A) and the component (C).

When the conductive wiring material composition contains the (C) stretchable resin, it becomes a composition providing a wiring having excellent stretchability. In particular, change in conductivity during stretching and shrinkage can be made small.

The component (C) is preferably a resin selected from polyurethane, polyester, polyamide, silicone, polybutadiene and polyacrylonitrile.

When the component (C) is the above-mentioned specific resin, this conductive wiring material composition becomes a material providing a wiring having more excellent stretchability.

The above-mentioned repeating unit "a" is preferably a repeating unit having one or more structures represented by the following general formulae (1)-1 to (1)-4.

(1)-1

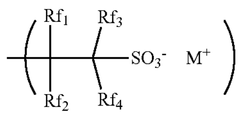

(1)-2

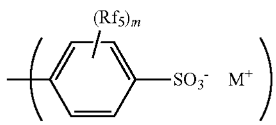

(1)-3

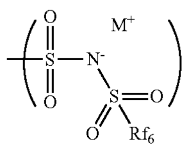

(1)-4

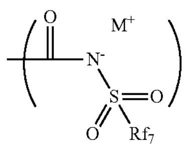

wherein, $Rf_1$ and $Rf_2$ each represent a hydrogen atom, a fluorine atom, an oxygen atom, a methyl group or a trifluoromethyl group, when $Rf_1$ is an oxygen atom, $Rf_2$ is also an oxygen atom to form a carbonyl group together with the carbon atom to which it is bonded, $Rf_3$ and $Rf_4$ each represent a hydrogen atom, a fluorine atom or a trifluoromethyl group and one or more of $Rf_1$ to $Rf_4$ is/are a fluorine atom(s) or a trifluoromethyl group(s). $Rf_5$, $Rf_6$ and $Rf_7$ each represent a fluorine atom or a linear or branched alkyl group having 1 to 4 carbon atoms and have one or more fluorine atoms. "m" is an integer of 1 to 4. $M^+$ represents an ion selected from an ammonium ion, a lithium ion, a sodium ion, a potassium ion and a silver ion.

When the above-mentioned repeating unit "a" is a repeating unit having the above-mentioned specific structure, this conductive wiring material composition becomes a material which can form a lightweight wiring capable of transmitting electric signals to the device more efficiently (that is, excellent in conductivity), with a design having high flexibility and at a low cost.

The above-mentioned repeating unit "a" is preferably one or more kinds selected from the repeating units "a1" to "a7" represented by the following general formula (2).

(2)

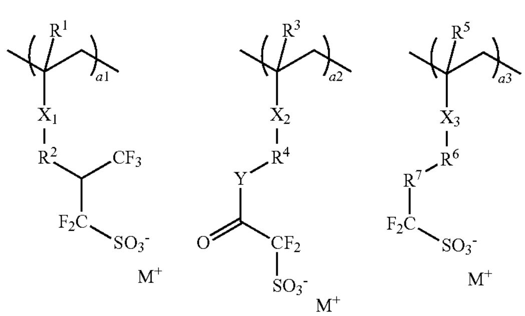

-continued

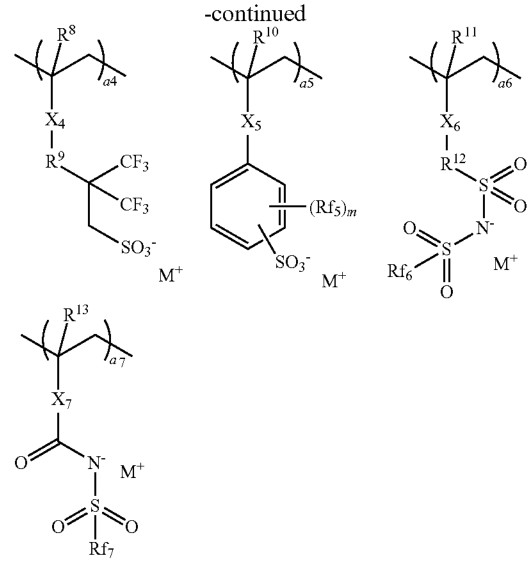

wherein, $R^1$, $R^3$, $R^5$, $R^8$, $R^{10}$, $R^{11}$ and $R^{13}$ each independently represent a hydrogen atom or a methyl group, $R^2$, $R^4$, $R^6$, $R^9$ and $R^{12}$ each independently represent a single bond, an ester group or a linear, branched or cyclic hydrocarbon group having 1 to 13 carbon atoms which may have either of or both of an ether group and an ester group. $R^7$ represents a linear cr branched alkylene group having 1 to 4 carbon atoms, and among hydrogen atoms in $R^7$, one or two of them may be substituted by a fluorine atom(s). $X_1$, $X_2$, $X_3$, $X_4$ and $X_6$ each independently represent any of a single bond, a phenylene group, a naphthylene group, an ether group, an ester group and an amide group, $X_5$ represents any of a single bond, an ether group and an ester group, $X_7$ represents a single bond, an arylene group having 6 to 12 carbon atoms or —C(═O)—O—$X_{10}$—, $X_{10}$ represents a linear, branched or cyclic alkylene group having 1 to 12 carbon atoms or a divalent aromatic hydrocarbon group having 6 to 10 carbon atoms, and may have an ether group, a carbonyl group and/or an ester group in $X_{10}$. Y represents an oxygen atom or a —$NR^{19}$— group, $R^{19}$ represents a hydrogen atom or a linear or branched alkyl group having 1 to 4 carbon atoms, and Y and $R^4$ may be bonded to each other to form a ring. "m" is an integer of 1 to 4. "a1", "a2", "a3", "a4", "a5", "a6" and "a7" each represent $0 \le a1 < 1.0$, $0 \le a2 < 1.0$, $0 \le a3 < 1.0$, $0 \le a4 < 1.0$, $0 \le a5 < 1.0$, $0 \le a6 < 1.0$ and $0 \le a7 < 1.0$, and numbers satisfying $0 < a1+a2+a3+a4+a5+a6+a7 < 1.0$. $M^+$ represents an ion selected from an ammonium ion, a lithium ion, a sodium ion, a potassium ion and a silver ion.

When the above-mentioned repeating unit "a" is the above-mentioned specific repeating unit, the effects of the present invention can be further improved.

The component (A) has a repeating unit "a" having the ammonium salt structure, and the ammonium salt is preferably a material containing an ammonium ion represented by the following general formula (3).

(3)

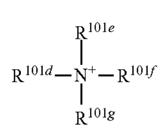

wherein, $R^{101a}$, $R^{101e}$, $R^{101f}$ and $R^{101g}$ each represent a hydrogen atom, a linear, branched or cyclic alkyl group having 1 to 12 carbon atoms, a linear, branched or cyclic alkenyl group or alkynyl group having 2 to 12 carbon atoms or an aromatic group having 6 to 20 carbon atoms, and may have one or more kinds selected from an ether group, a carbonyl group, an ester group, a hydroxy group, an amino group, a nitro group, a sulfonyl group, a sulfinyl group, a halogen group and a sulfur atom. $R^{101d}$ and $R^{101e}$, and $R^{101d}$, $R^{101e}$ and $R^{101f}$ may form a ring with the nitrogen atom bonded therewith, and when a ring is formed, $R^{101d}$ and $R^{101e}$, and $R^{101d}$, $R^{101e}$ and $R^{101f}$ are an alkylene group having 3 to 10 carbon atoms or form a heteroaromatic ring having the nitrogen atom in the formula in the ring.

When the component (A) is a material having a repeating unit "a" which as the above-mentioned specific ammonium salt structure, the effects of the present invention can be further improved.

The conductive wiring material composition preferably further contains an organic solvent.

When the conductive wiring material composition is a composition further containing an organic solvent, it becomes a composition capable of printing on a substrate.

The component (B) is preferably powder of a metal selected from gold, silver, platinum, copper, tin, titanium, nickel, aluminum, tungsten, molybdenum, ruthenium, chromium and indium.

When the component (B) is the above-mentioned specific metal powder, this conductive wiring material composition becomes a composition capable of forming a wiring more excellent in conductivity.

The component (B) is more preferably silver powder, copper powder, tin powder or titanium powder.

When the component (B) is the above-mentioned specific metal powder, this conductive wiring material composition becomes a composition capable of forming a wiring more excellent in conductivity at a lower cost.

In addition, in the present invention, it is provided a conductive wiring substrate (conductive wiring board) including a wiring formed from the conductive wiring material composition on a substrate.

This conductive wiring substrate has high conductivity of wiring, a small change in conductivity of the wiring at the time of stretching and shrinkage, is lightweight and can be manufactured at a low cost.

The substrate is preferably a substrate capable of stretching at the maximum of 1,000%.

When the substrate is a substrate capable of stretching at the maximum of 1,000%, this conductive wiring substrate becomes a substrate capable of sticking to a part of a human body or the like at which a high degree of stretching is to be required.

Further, in the present invention, there is provided a method for manufacturing a conductive wiring substrate including forming a wiring by printing the conductive wiring material composition on a substrate.

According to the method for manufacturing the conductive wiring substrate, it is possible to manufacture a conductive wiring substrate in which the wiring has high conductivity and a small change in conductivity at the time of stretching and shrinkage, and which is lightweight, at a low cost.

Advantageous Effects of Invention

As described above, the conductive wiring material composition of the present invention can form a lightweight wiring which has a small change in conductivity at the time of stretching and shrinkage, and is capable of transmitting electric signals to the device with good efficiency (that is, excellent in conductivity), at a low cost.

In addition, according to the conductive wiring material composition of the present invention, by using a material which is a combination of an ion polymer excellent in ion conductivity and metal powder excellent in electron conductivity, a wiring having a small change in conductivity at the time of stretching and shrinkage and excellent conductivity can be formed. Formation of the wiring can be also carried out by printing, and in this case, a wiring with a design having high flexibility can be formed with high throughput.

BRIEF DESCRIPTION OF DRAWINGS

FIG. 1 is a schematic drawing showing an example of a conductive wiring substrate of the present invention.

DESCRIPTION OF EMBODIMENTS

As described above, it has been required to develop a conductive wiring material composition which has high conductivity, small change in conductivity at the time of stretching, lightweight, and can be manufactured at a low cost, a stretchable conductive wiring substrate formed by the conductive wiring material composition and a method for manufacturing thereof.

When a conductive wiring is formed on a stretchable substrate by a material in which a metal filler is added to a stretchable resin, and this is stretched, conductivity thereof is lowered. This is because conductive percolation of electrons less likely to occur due to elongation of the distance among metal fillers. If efficiency of percolation among metal fillers can be increased, not only can conductivity be prevented from lowering at the time of stretching but also conductivity can be improved even when it is not stretched.

The present inventors focused on an ionic liquid as a material having high ion conductivity. Ionic liquids have characteristics that they have high thermal and chemical stabilities, and excellent in conductivity, so that applications to battery uses are spreading. In addition, as the ionic liquids, a hydrochloride, a hydrobromide, a hydroiodide, a trifluoromethanesulfonate, a nonafluorobutanesulfonate, a bis(trifluoromethanesulfonyl)imidate, a hexafluorophosphate or a tetrafluoroborate of sulfonium, phosphonium, ammonium, morpholinium, pyridinium, pyrrolidinium or imidazolium, and the like have been known. However, improvement in conductivity at the static state can be expected by adding the ionic liquid, but the ionic liquid is not a material capable of stretching, so that when it is mixed with metal powder and the mixture is printed to form a wiring, it cannot retain the metal powder and the metal powder is peeled off whereby conductivity is lowered at the time of stretching.

In order to retain the metal powder, the ionic material is required to be a polymer. As the ionic polymer, Nafion (Registered Trademark) has been known. Nafion has fluorosulfonic acid, and its lithium salt or sodium salt is highly-polarlizable and has high ion conductivity, and is used for the use of batteries. However, the main chain of Nafion is fluorinated so that it is rigid and has completely no stretchability, whereby it is not suitable for the use of a stretchable conductive material.

The present inventors have investigated earnest studies on the above-mentioned problems, and as a result, as a conductive wiring material for forming a wiring capable of retaining high conductivity even at the time of stretching, they have developed a material in which a polymer compound having highly-polarizable ions and metal powder are combined. A polymer compound having highly-polarizable ions does not contain fluorine in the main chain so that it has high stretchability, and thus, disconnection due to cracks in the wiring does never occur at the time of stretching, and efficiency of percolation among metal powders is high due to highly-polarized ions. They have found that a wiring having a small change in conductivity at the time of stretching can be formed by using the material, whereby the present invention has been completed.

That is, the present invention is directed to a conductive wiring material composition containing (A) an ionic material and (B) metal powder, wherein the component (A) is a polymer compound having a repeating unit "a" which has a structure selected from an ammonium salt, a lithium salt, a sodium salt, a potassium salt and a silver salt of any of fluorosulfonic acid, fluorosulfonimide and fluorosulfonamide, and the component (B) is contained in an amount exceeding 50 parts by mass based on 100 parts by mass of a solid content in the conductive wiring material composition excluding the component (B).

Hereinafter, the present invention will be described in detail, but the present invention is not limited thereto.

<Conductive Wiring Material Composition>

The conductive wiring material composition of the present invention contains (A) an ionic material and (B) metal powder. Hereinafter, each of the components is described in more detail.

[(A) Ionic Material]

The salt included in the conductive wiring material composition of the present invention as (A) an ionic material (conductive material) is a polymer compound having a repeating unit "a" which has a structure selected from an ammonium salt, a lithium salt, a sodium salt, a potassium salt and a silver salt of any of fluorosulfonic acid, fluorosulfonimide and fluorosulfonamide.

(A) The ionic material is preferably a polymer compound containing no fluorine in the main chain. Such (A) an ionic material has high stretchability, so that the conductive wiring material composition containing (A) the ionic material and (B) metal powder can form a wiring having a more small change in conductivity at the time of stretching.

The above-mentioned repeating unit "a" preferably has any one or more structures represented by the following general formulae (1)-1 to (1)-4.

(1)-1

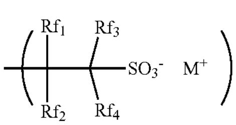

(1)-2

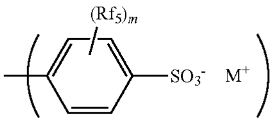

(1)-3

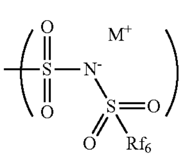

-continued (1)-4

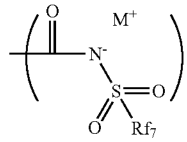

wherein, $Rf_1$ and $Rf_2$ each represent a hydrogen atom, a fluorine atom, an oxygen atom, a methyl group or a trifluoromethyl group, when $Rf_1$ is an oxygen atom, $Rf_2$ is also an oxygen atom to form a carbonyl group together with the carbon atom to which it is bonded, $Rf_3$, $Rf_4$ each represent a hydrogen atom, a fluorine atom or a trifluoromethyl group and one or more of $Rf_1$ to $Rf_4$ is/are a fluorine atom(s) or a trifluoromethyl group(s). $Rf_5$, $Rf_6$ and $Rf_7$ each represent a fluorine atom or a linear or branched alkyl group having 1 to 4 carbon atoms and have one or more fluorine atom(s). "m" is an integer of 1 to 4. $M^+$ represents an ion selected from an ammonium ion, a lithium ion, a sodium ion, a potassium ion and a silver ion.

One or more kinds of the repeating unit(s) selected from an ammonium salt, a lithium salt, a sodium salt, a potassium salt and a silver salt of the fluorosulfonic acid represented by the above-mentioned general formula (1)-1 or (1)-2, the sulfonimide represented by (1)-3 and the sulfonamide represented by (1)-4 is/are preferably one or more kinds selected from the repeating units "a1" to "a7" represented by the following general formula (2).

(2)

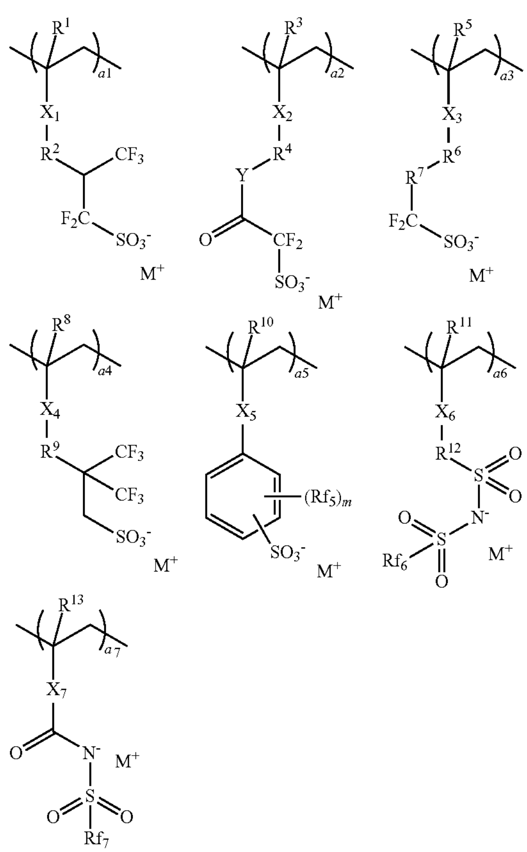

wherein, $R^1$, $R^3$, $R^5$, $R^8$, $R^{10}$, $R^{11}$ and $R^{13}$ each independently represent a hydrogen atom or a methyl group, $R^2$, $R^4$, $R^6$, $R^9$ and $R^{12}$ each independently represent a single bond, an ester group or a linear, branched or cyclic hydrocarbon group having 1 to 13 carbon atoms which may have either of or both of an ether group and an ester group. $R^7$ represents a linear or branched alkylene group having 1 to 4 carbon atoms, and among hydrogen atoms in $R^7$, one or two of them may be substituted by a fluorine atom(s). $X_1$, $X_2$, $X_3$, $X_4$ and $X_6$ each independently represent any of a single bond, a phenylene group, a naphthylene group, an ether group, an ester group and an amide group, $X_5$ represents any of a single bond, an ether group and an ester group, $X_7$ represents a single bond, an arylene group having 6 to 12 carbon atoms or —C(═O)—O—$X_{10}$—, $X_{10}$ represents a linear, branched or cyclic alkylene group having 1 to 12 carbon atoms or a divalent aromatic hydrocarbon group having 6 to 10 carbon atoms, and may have an ether group, a carbonyl group and/or an ester group in $X_{10}$. Y represents an oxygen atom or a —$NR^{19}$— group, $R^{19}$ represents a hydrogen atom or a linear or branched alkyl group having 1 to 4 carbon atoms, and Y and $R^4$ may be bonded to each other to form a ring. "m" is an integer of 1 to 4. "a1", "a2", "a3", "a4", "a5", "a6" and "a7" each represent $0 \le a1 < 1.0$, $0 \le a2 < 1.0$, $0 \le a3 < 1.0$, $0 \le a4 < 1.0$, $0 \le a5 < 1.0$, $0 \le a6 < 1.0$ and $0 \le a7 < 1.0$, and numbers satisfying $0 < a1+a2+a3+a4+a5+a6+a7 < 1.0$. $M^+$ represents an ion selected from an ammonium ion, a lithium ion, a sodium ion, a potassium ion and a silver ion.

Among the repeating units "a1" to "a7" represented by the general formula (2), as the fluorosulfonate monomer for obtaining the repeating units "a1" to "a5", there may be specifically exemplified by the following materials.

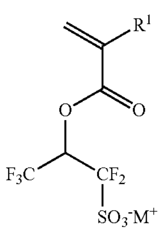
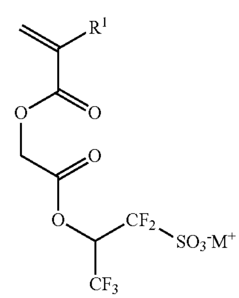
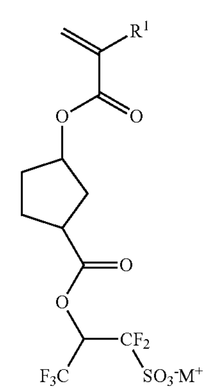
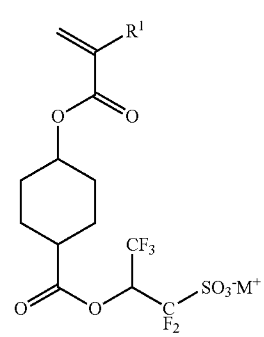

-continued

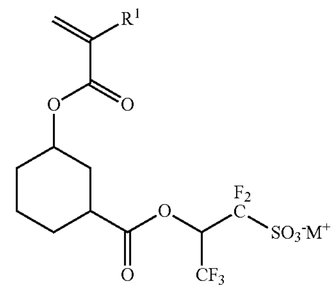
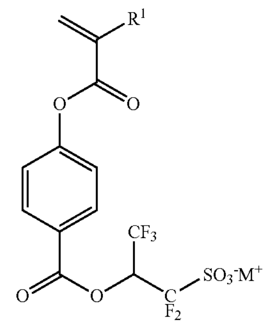
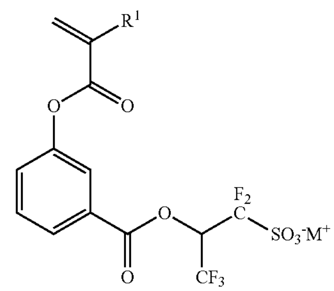
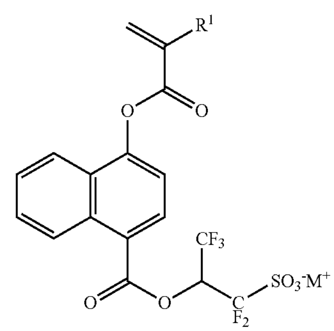
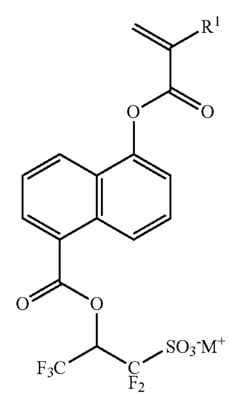
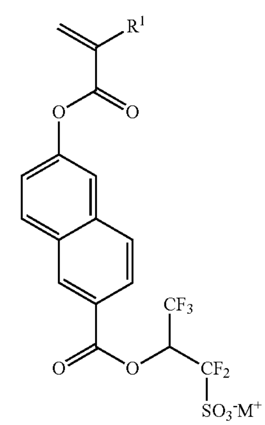

-continued
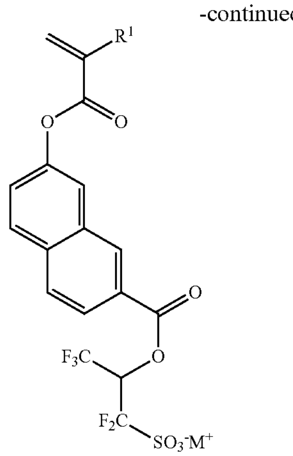
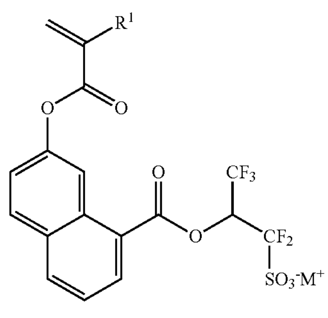
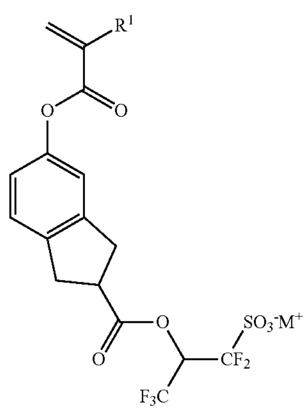
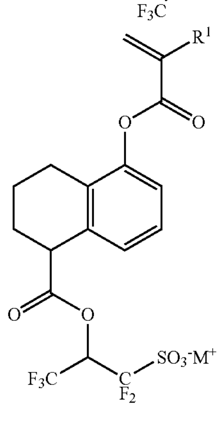
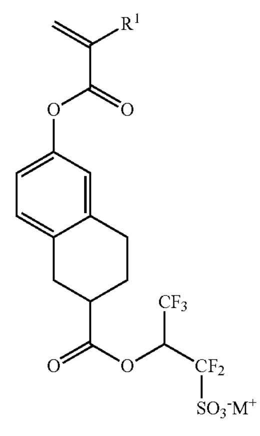
-continued
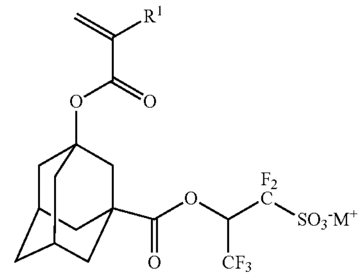
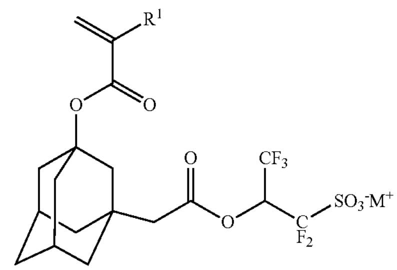
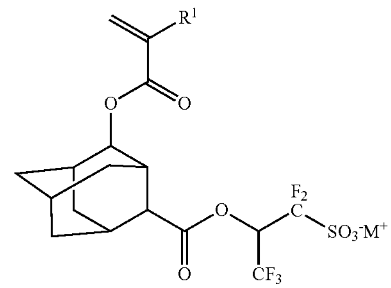
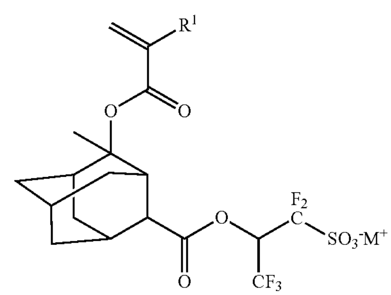
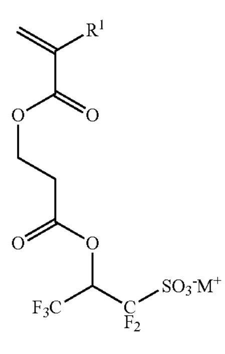
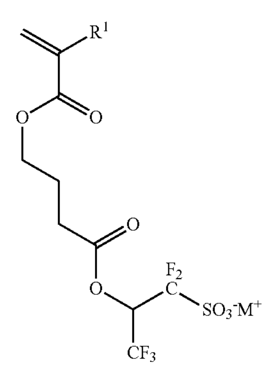

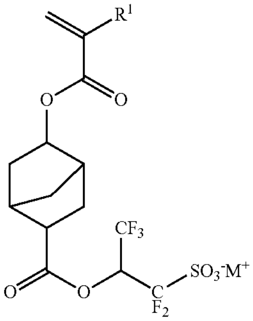
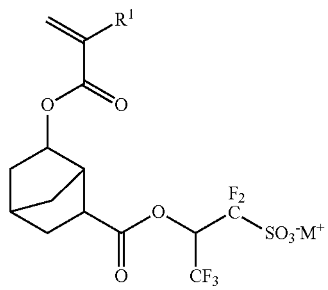
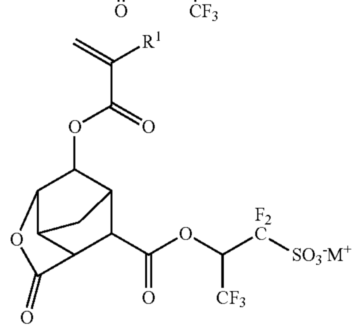
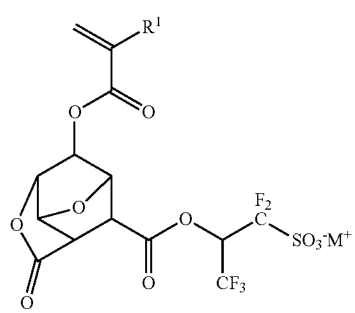
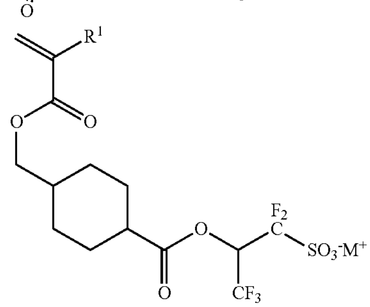
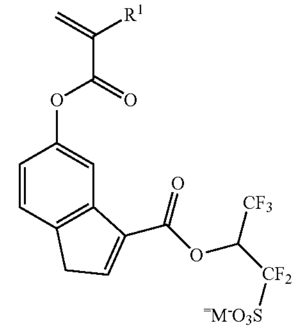
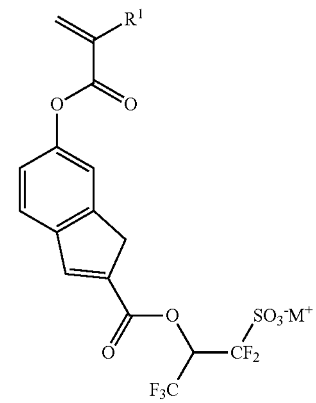
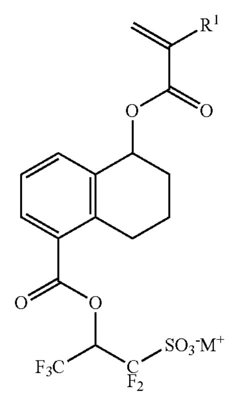
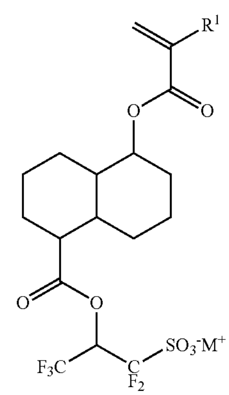
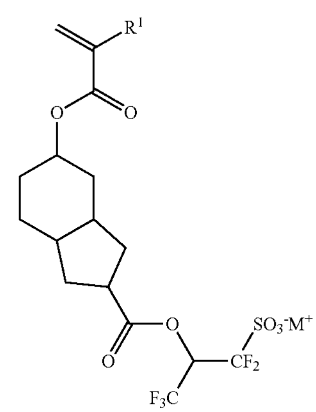

-continued
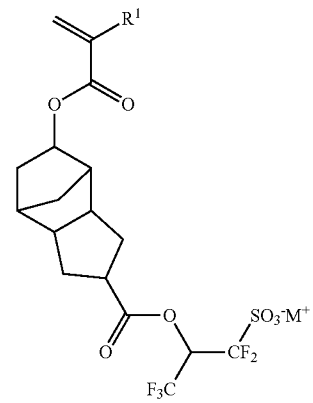
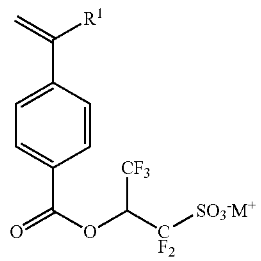
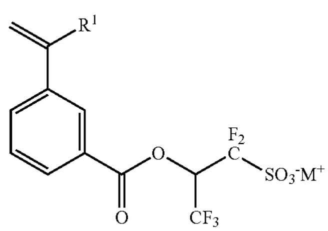
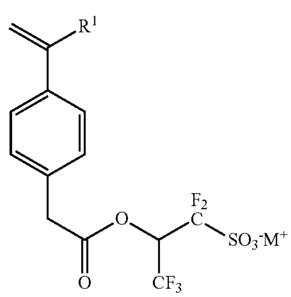
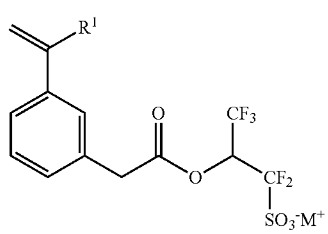
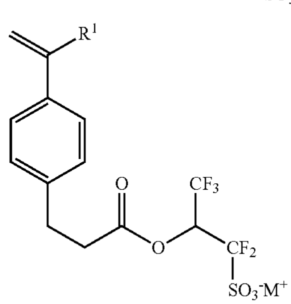
-continued
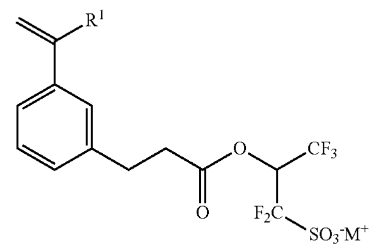
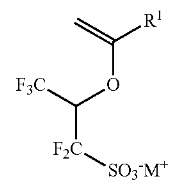
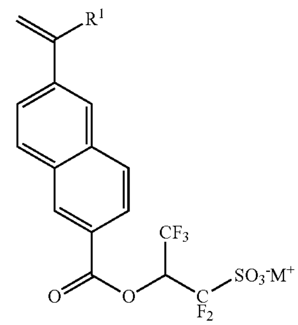
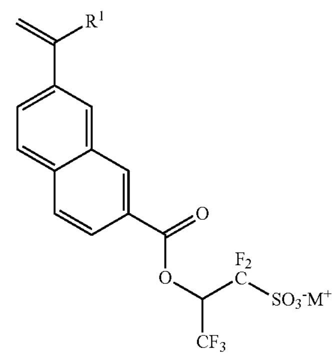
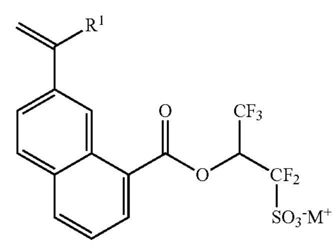
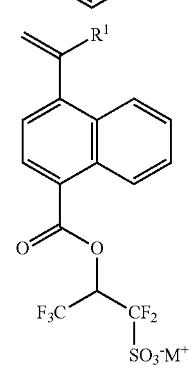
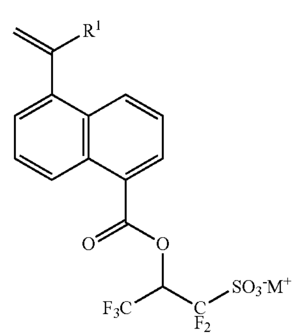

-continued
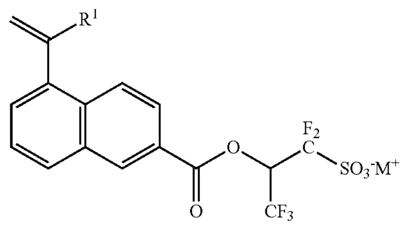
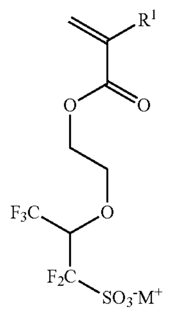
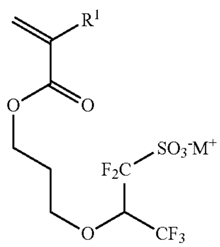
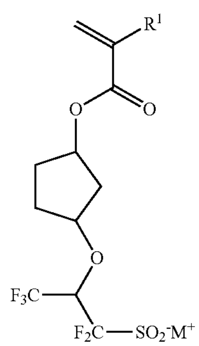
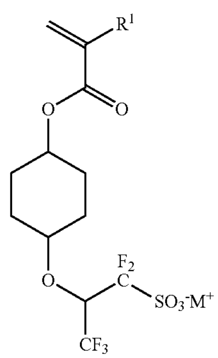
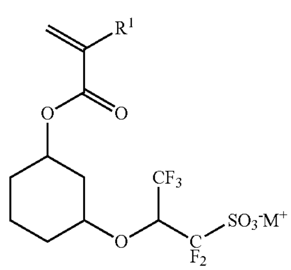
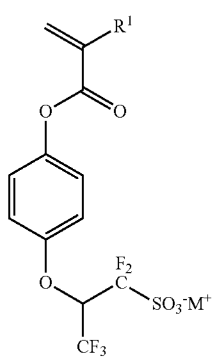
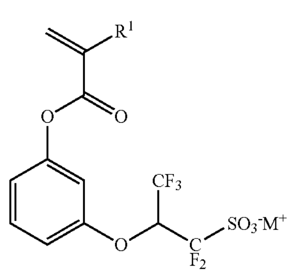
-continued
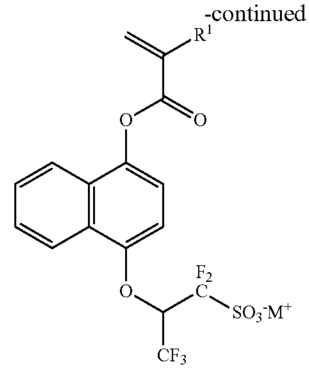
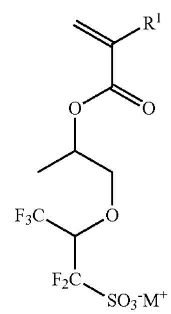
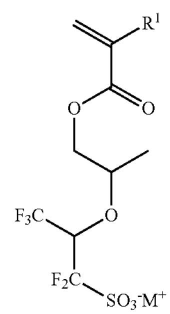
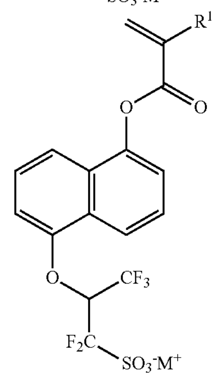
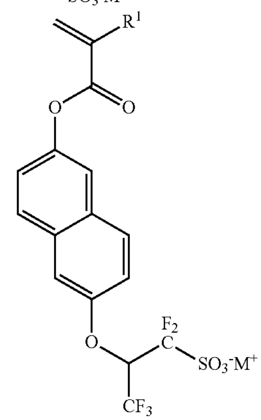
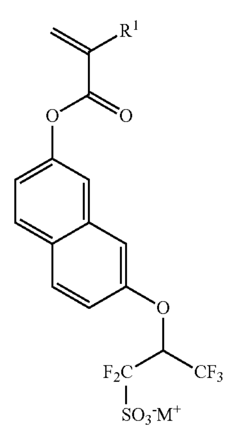

-continued
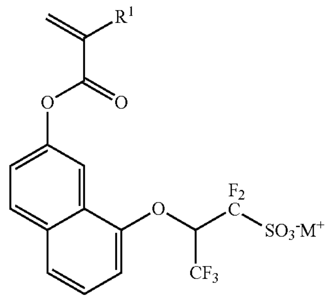
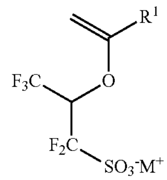
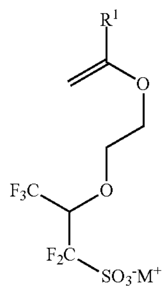
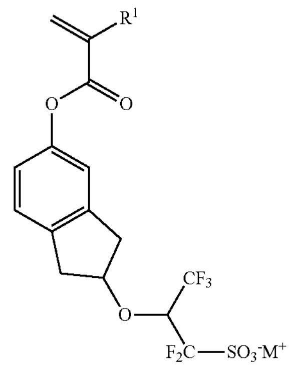
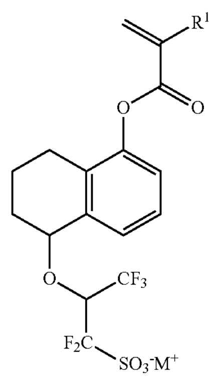
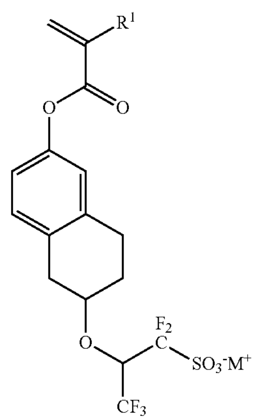
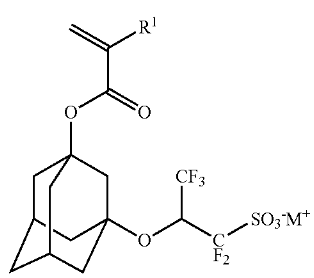
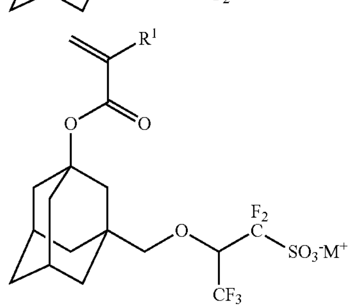
-continued
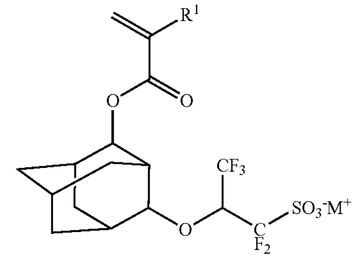
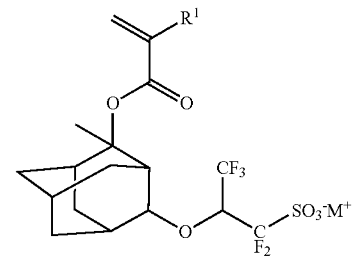
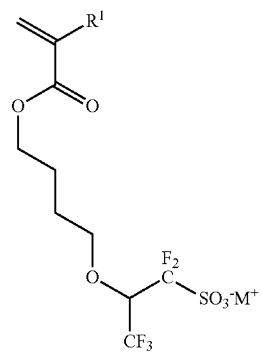
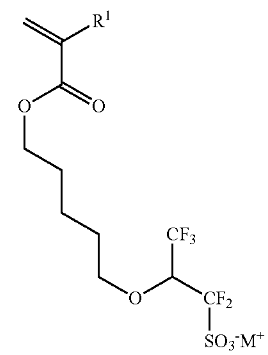
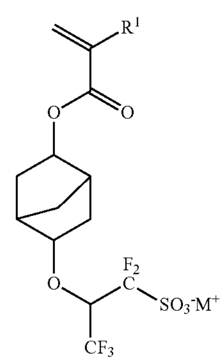
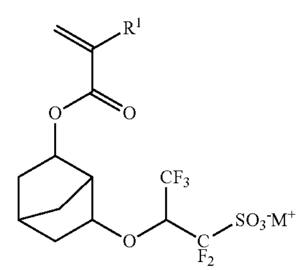
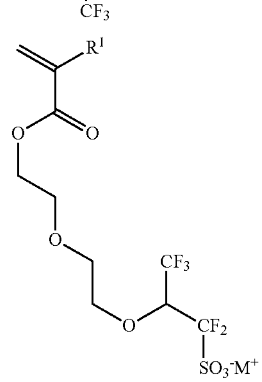
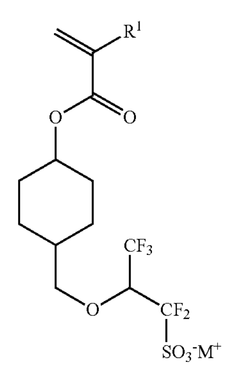

-continued
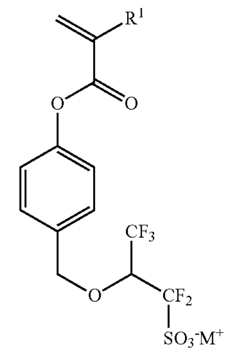
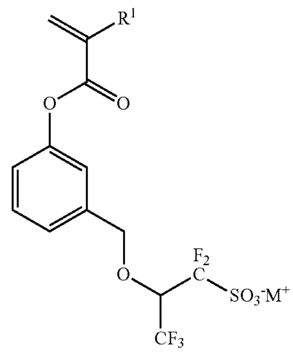
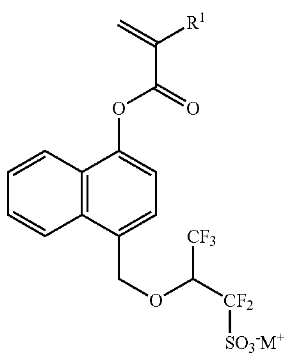
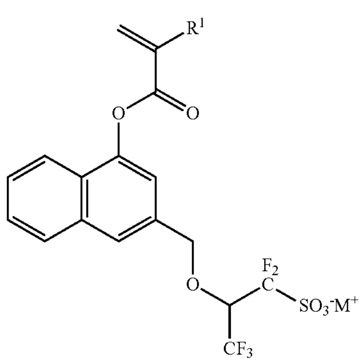
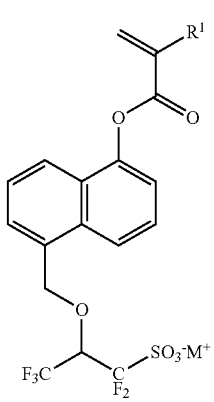
-continued
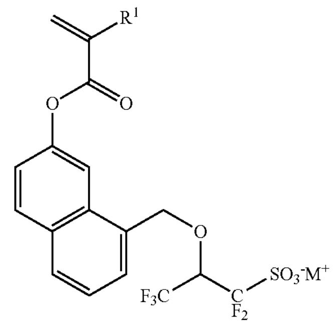
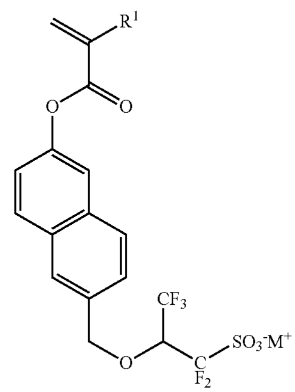
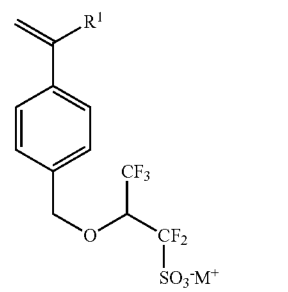
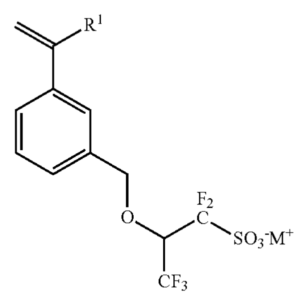
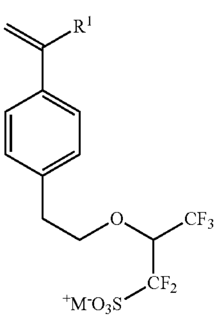

-continued
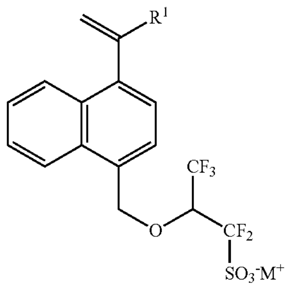
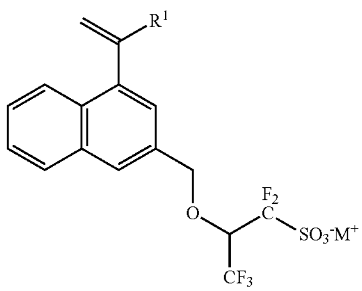
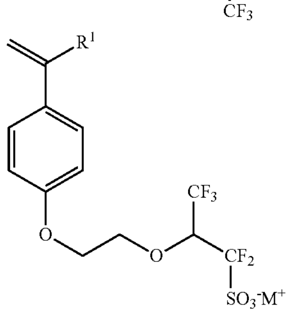
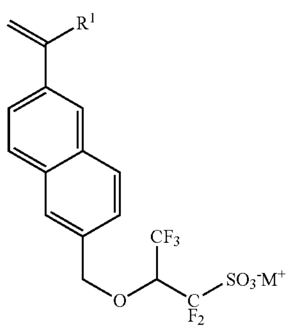
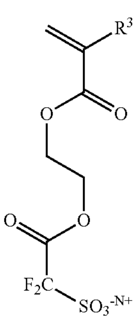
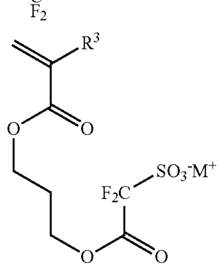
-continued
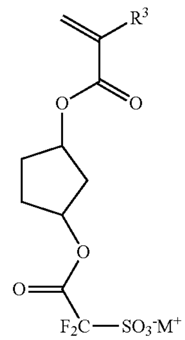
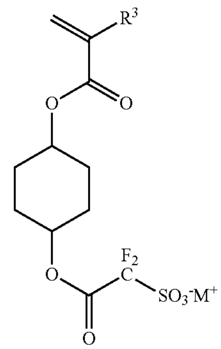
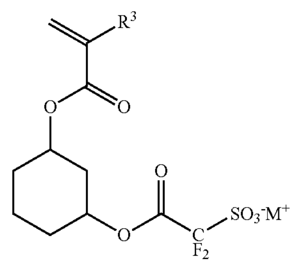
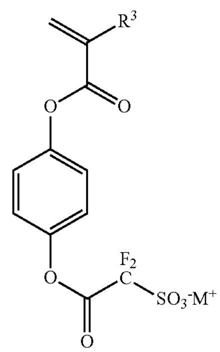
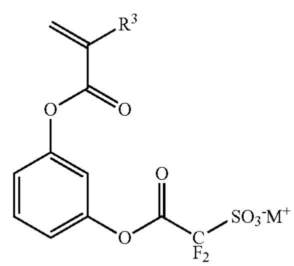
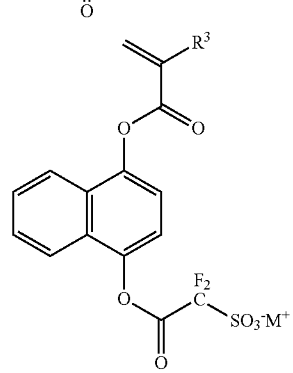
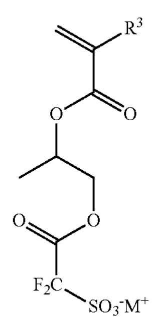
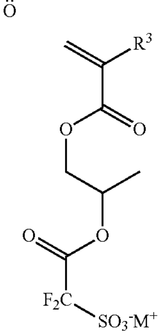

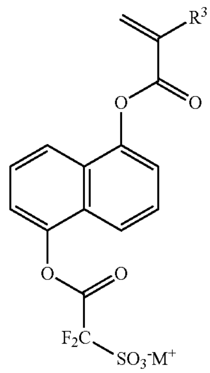
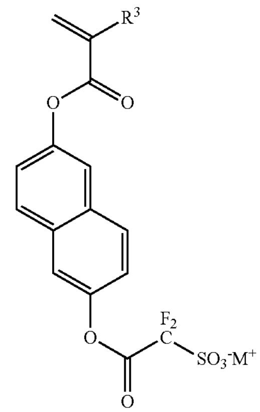
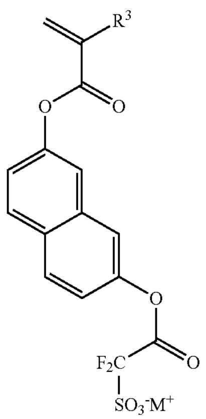
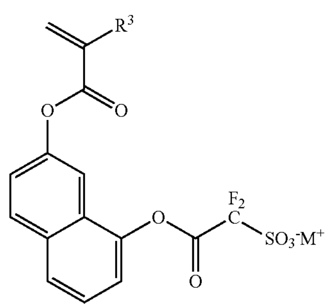
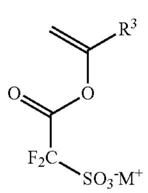
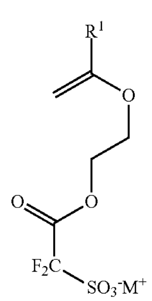
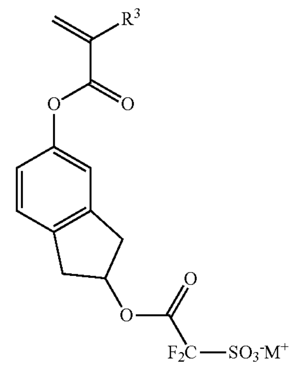
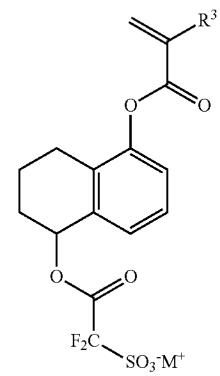
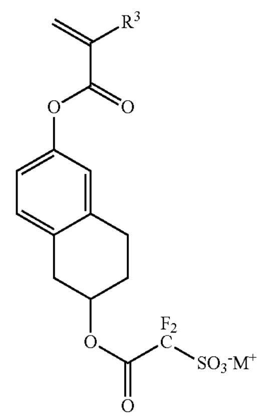
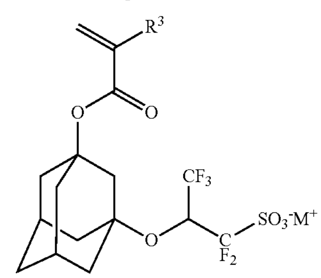
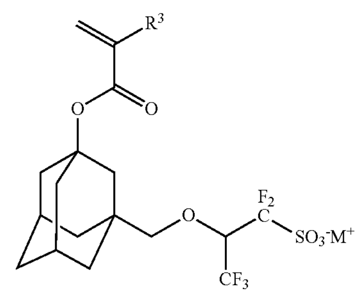
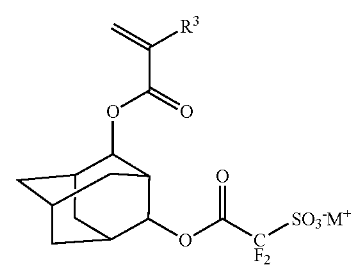

-continued
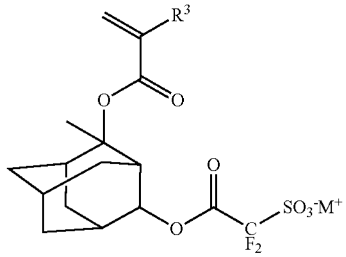
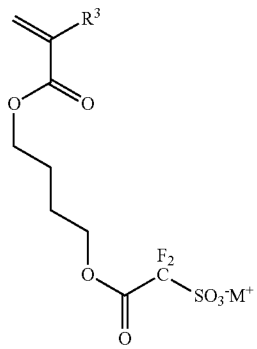
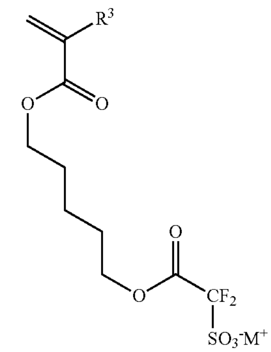
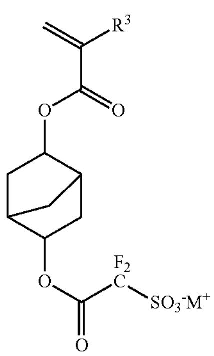
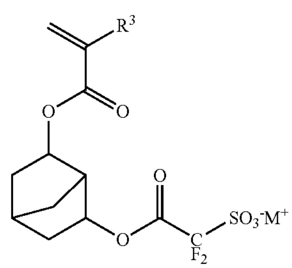
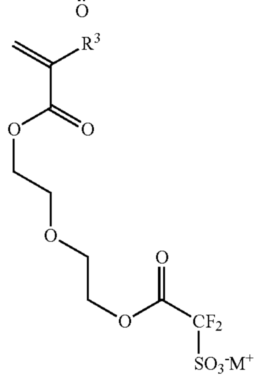
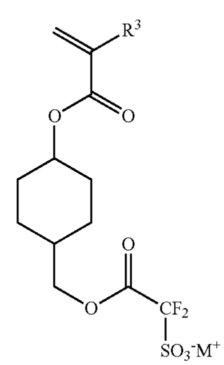
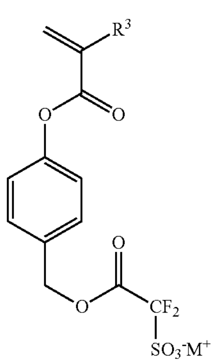
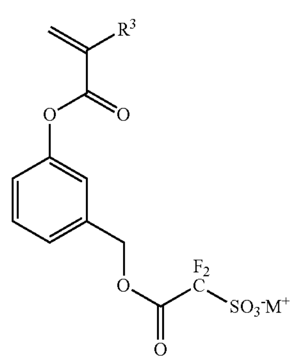
-continued
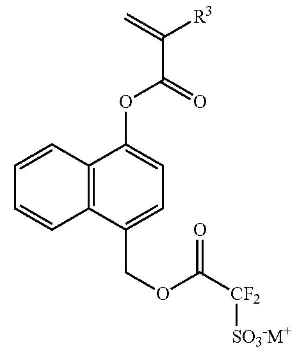
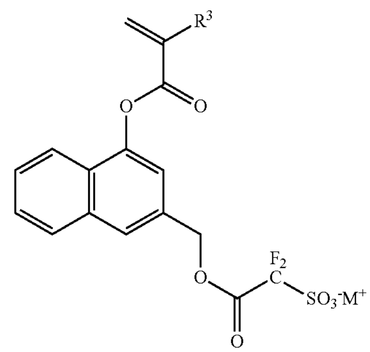
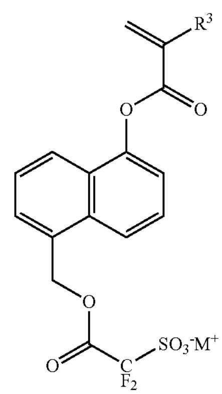
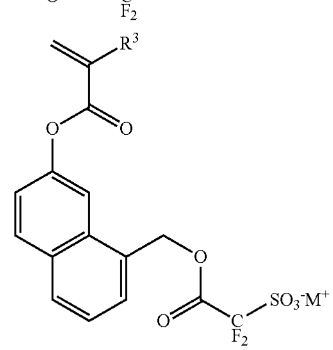

-continued
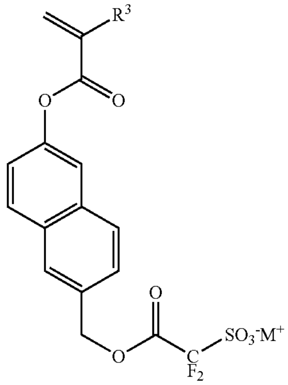
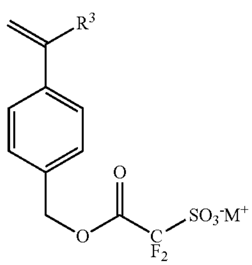
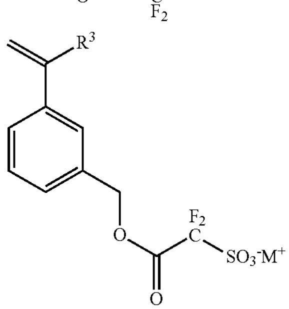
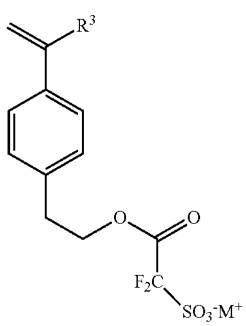
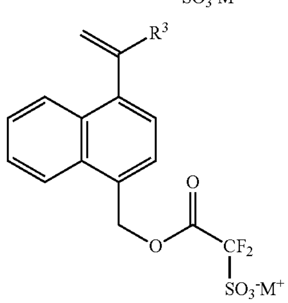
-continued
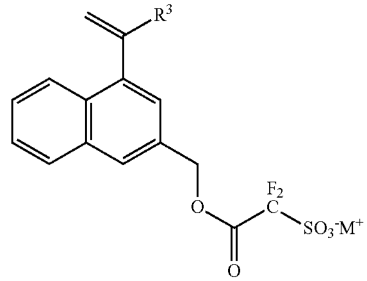
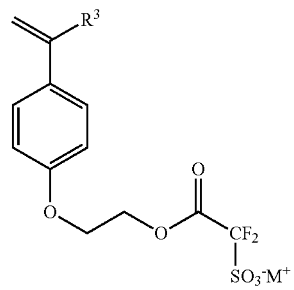
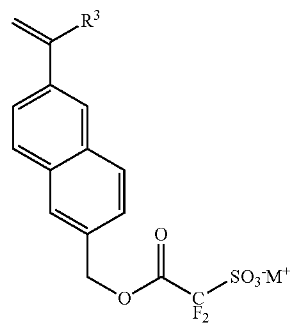
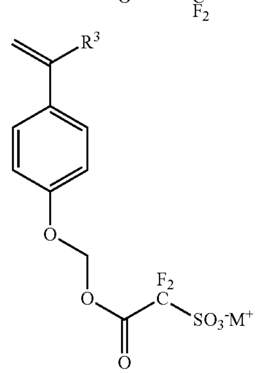
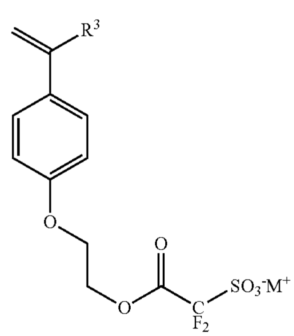

-continued
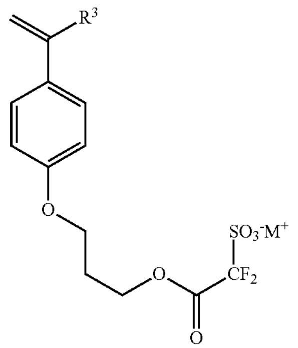
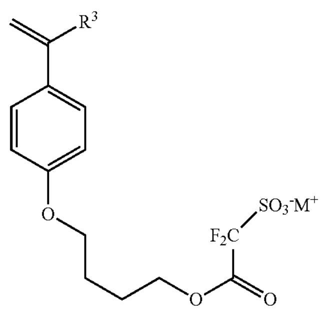
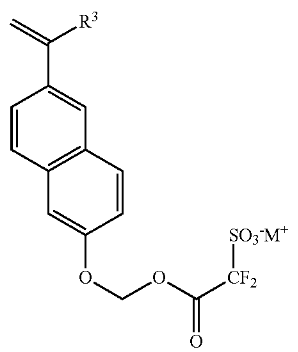
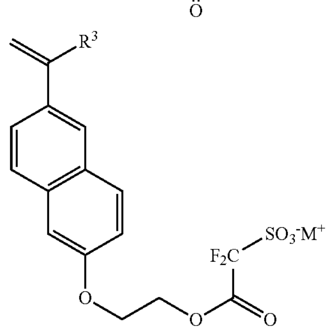
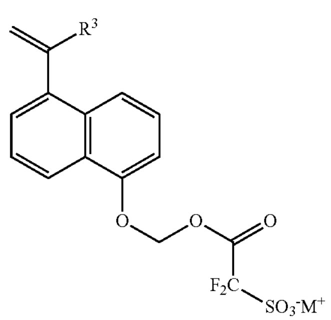
-continued
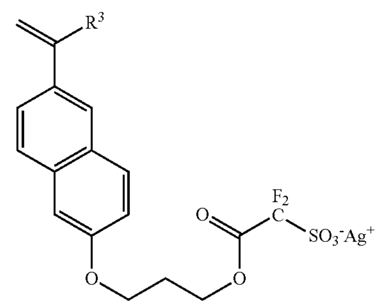
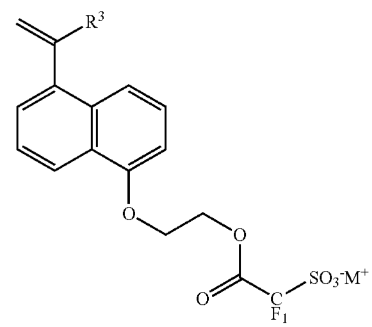
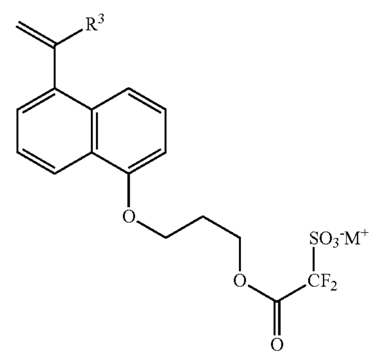
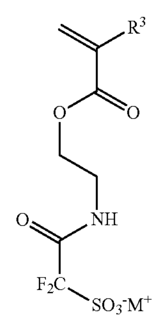
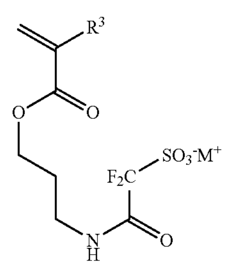
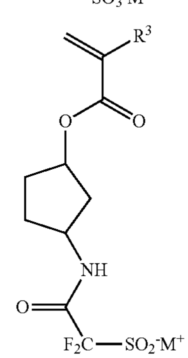
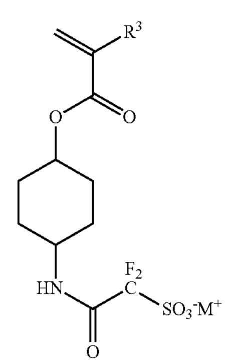

-continued
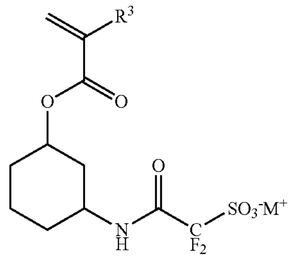
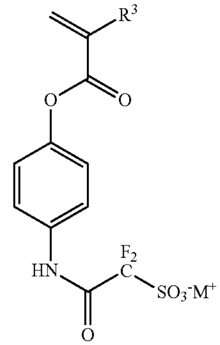
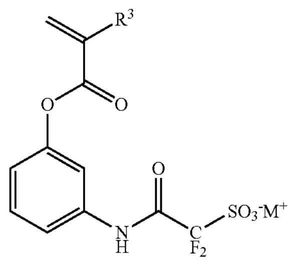
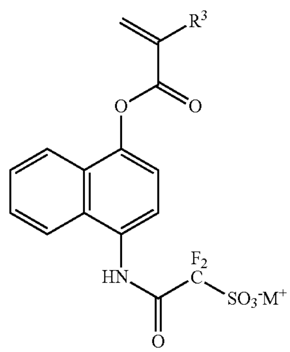
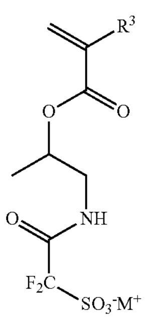
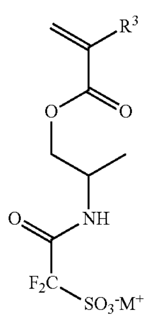
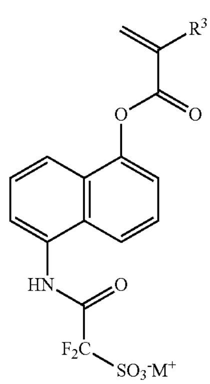
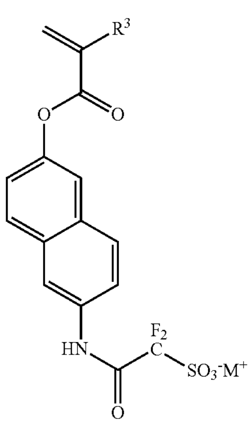
-continued
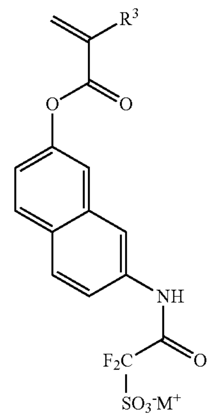
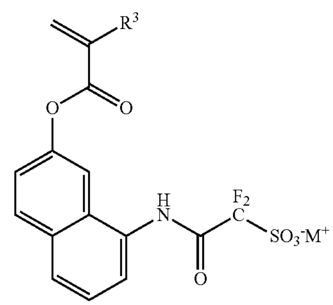
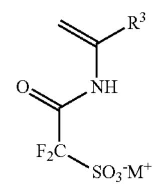
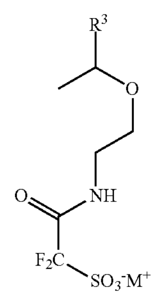
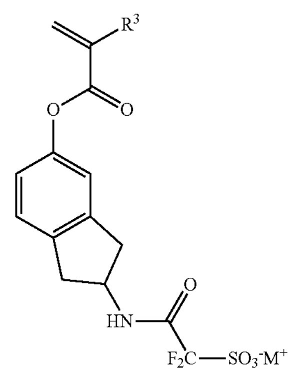
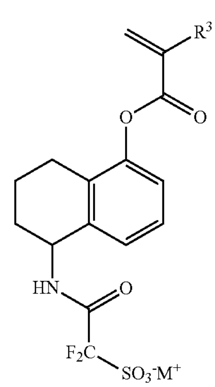
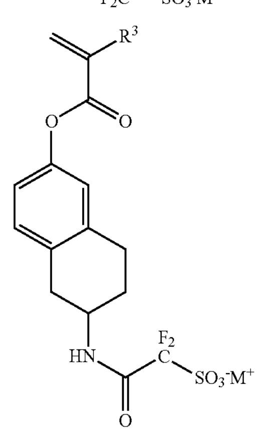

-continued
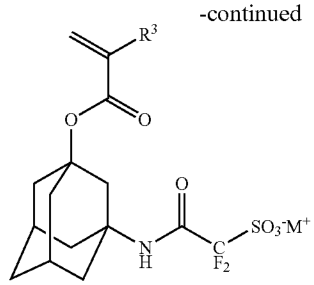
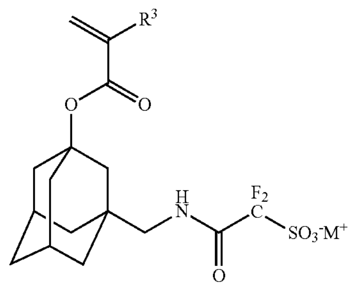
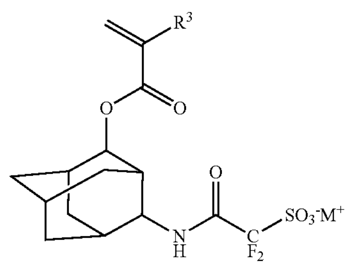
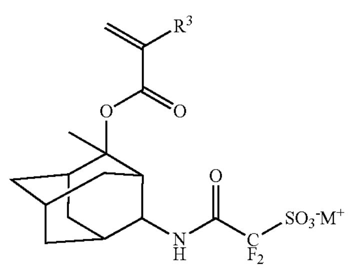
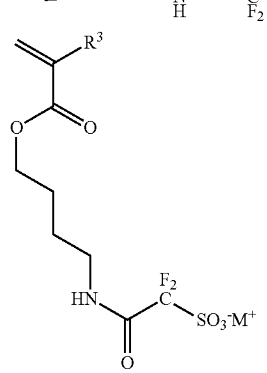
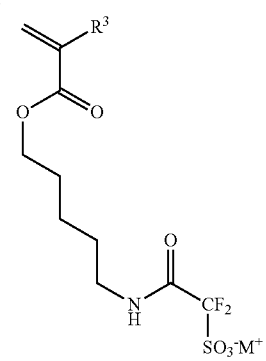
-continued
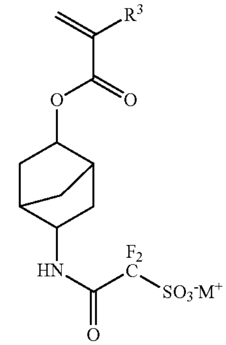
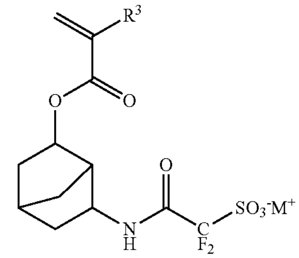
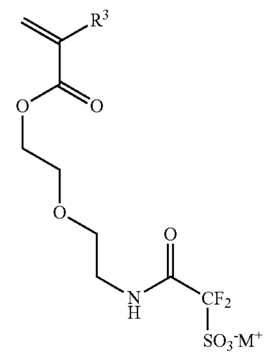
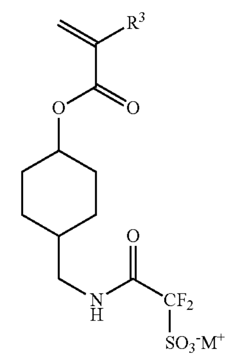
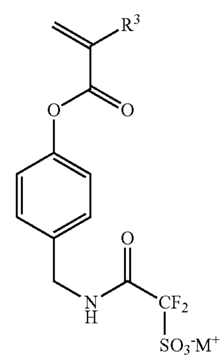
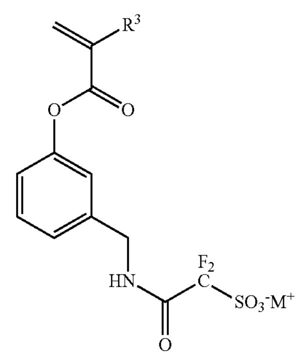
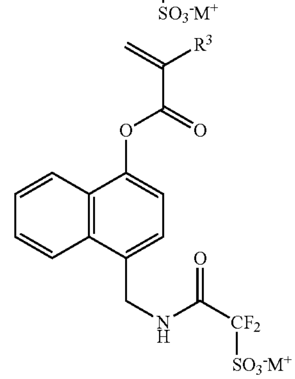

-continued
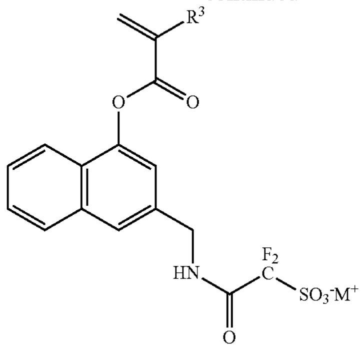
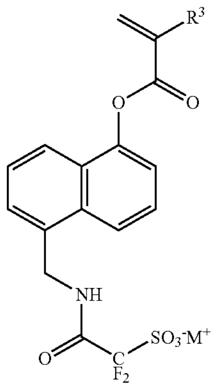
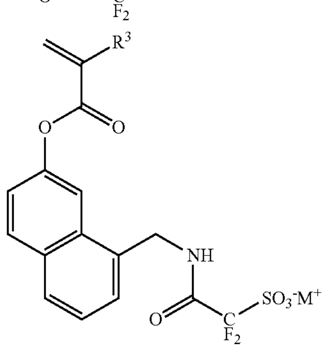
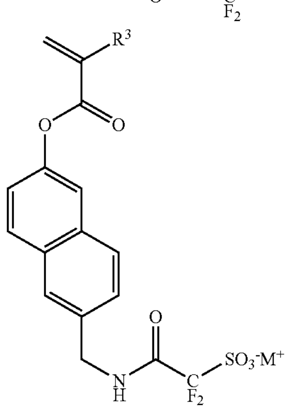
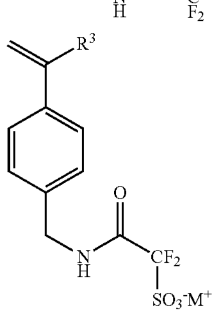
-continued
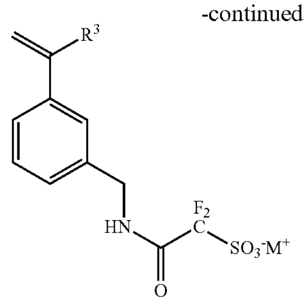
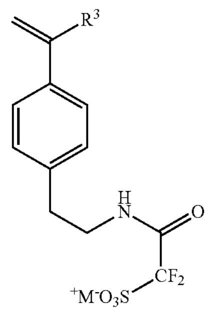
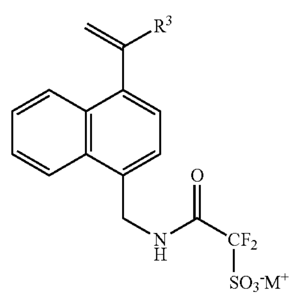
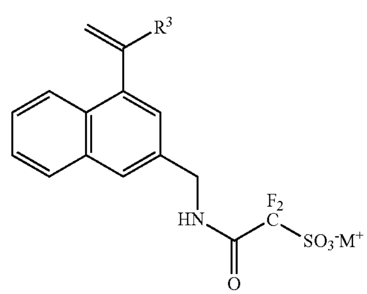
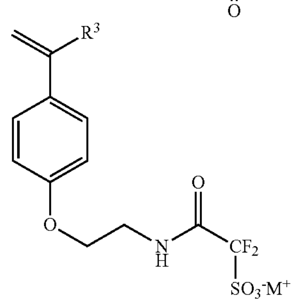

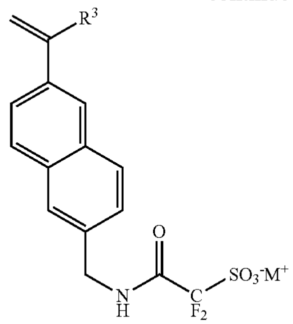
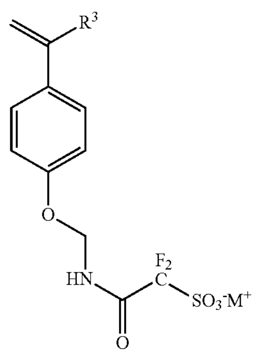
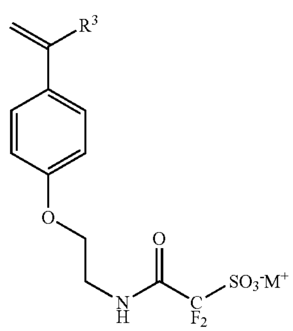
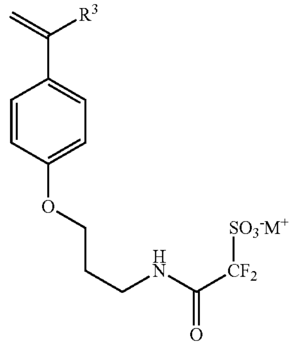
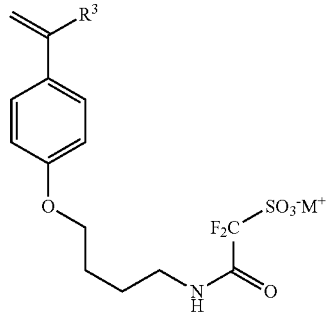
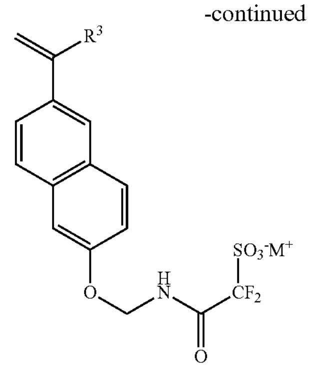
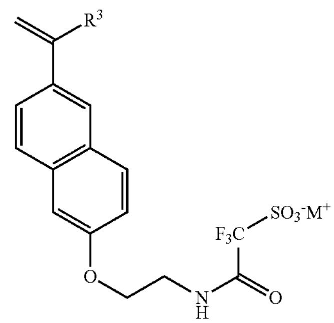
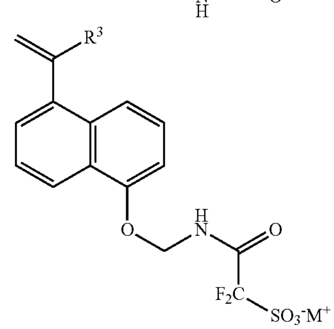
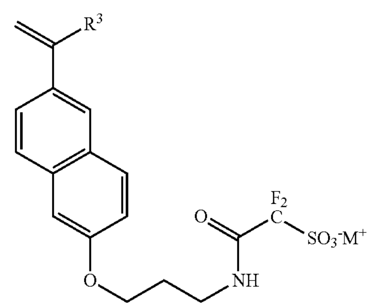
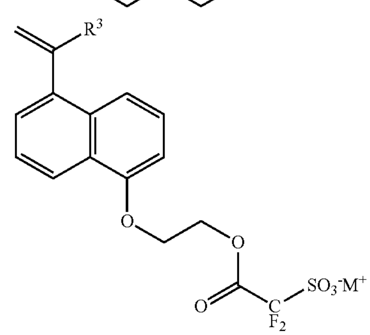

-continued
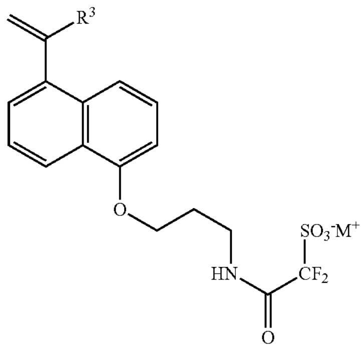
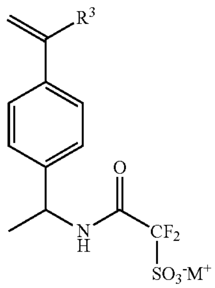
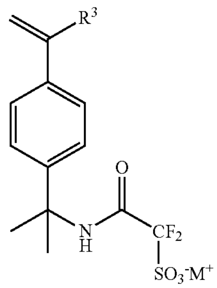
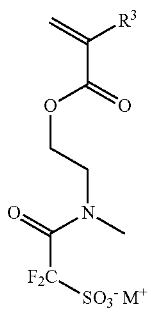
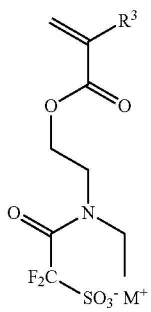
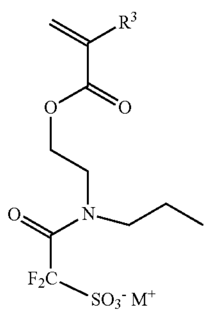
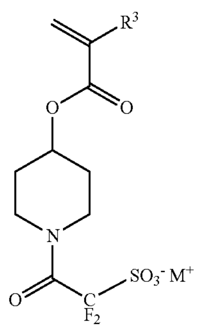
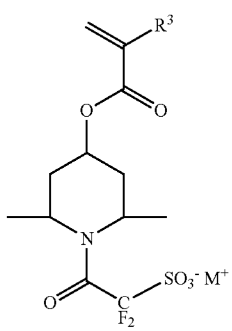
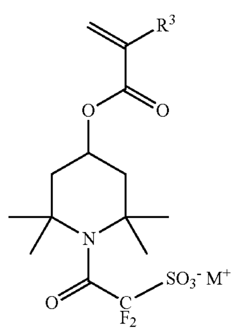
-continued
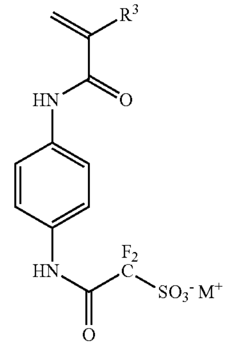
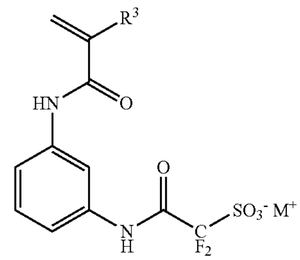
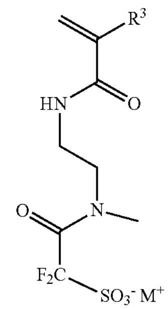
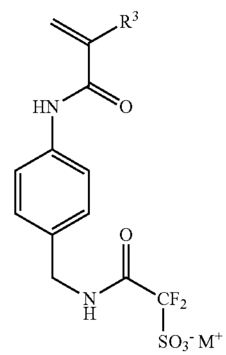
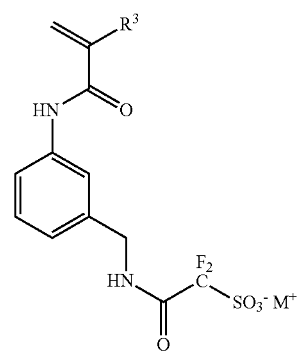
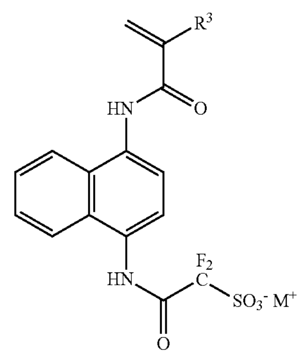

-continued
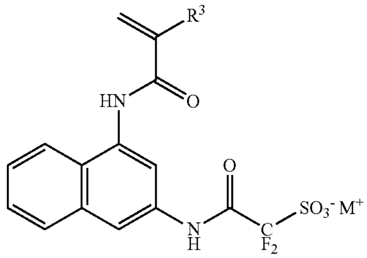
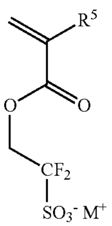
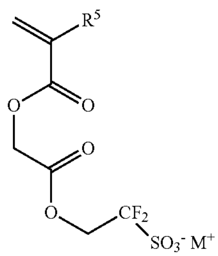
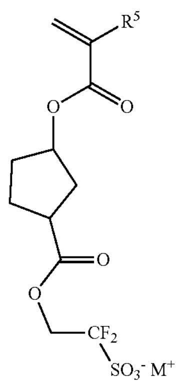
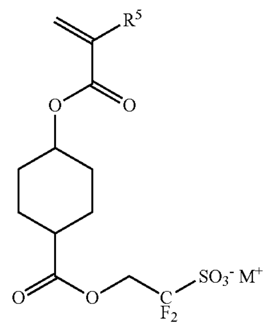
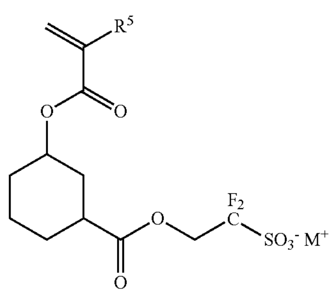
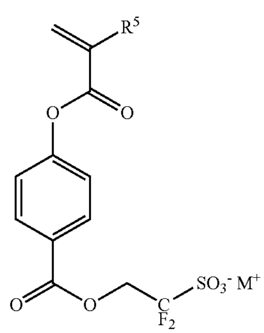
-continued
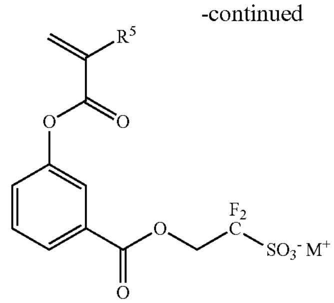
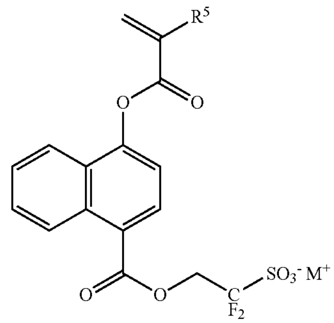
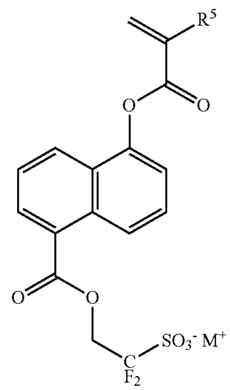
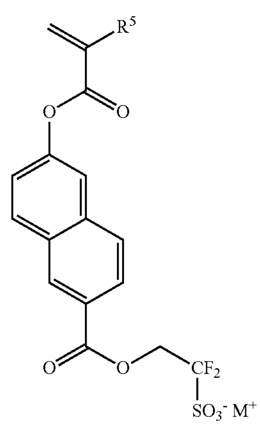
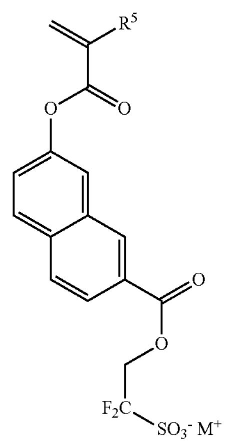
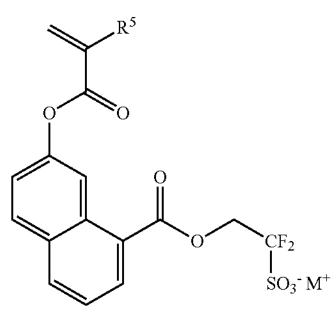

-continued
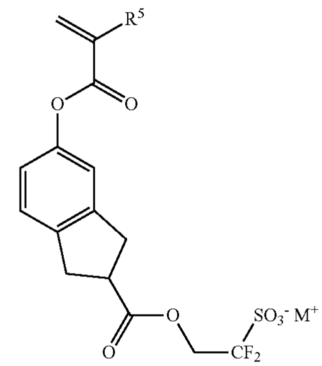
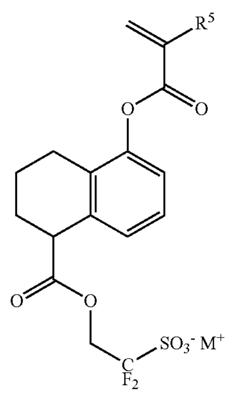
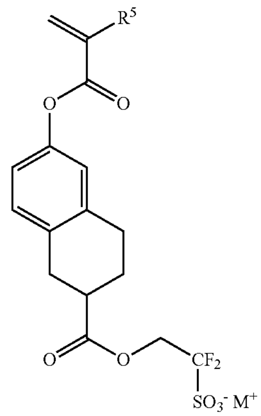
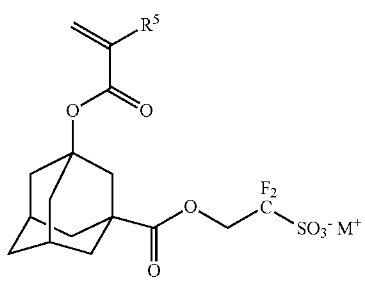
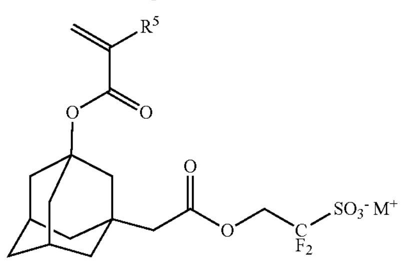
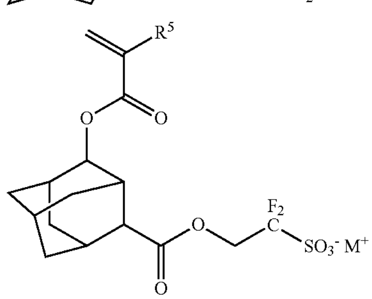
-continued
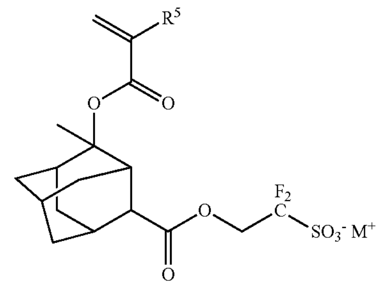
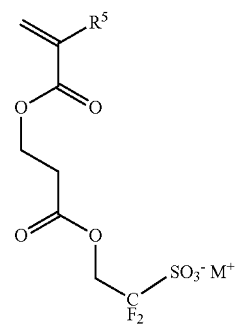
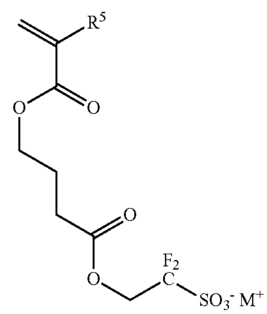
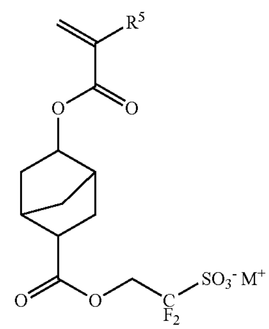
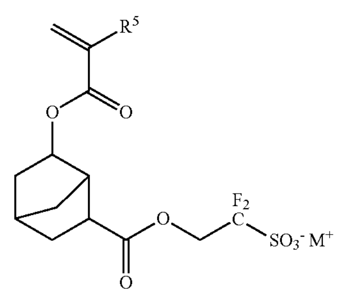
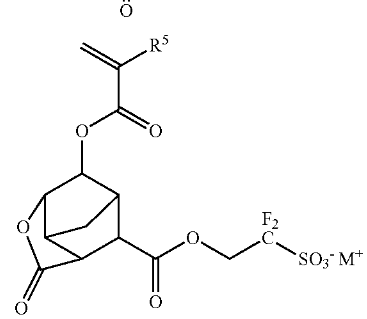

-continued
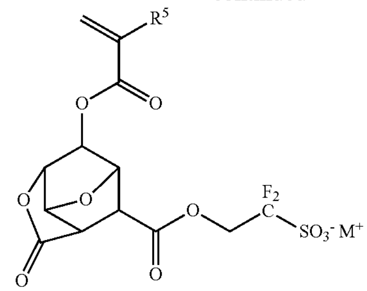
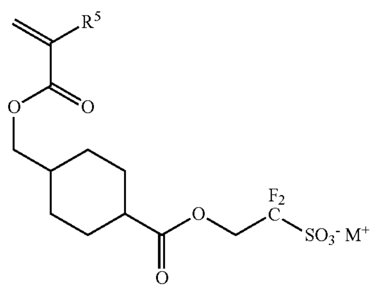
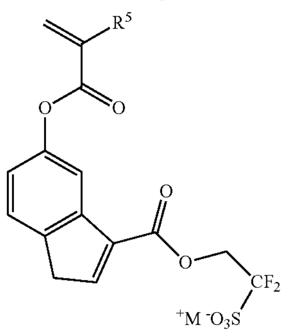
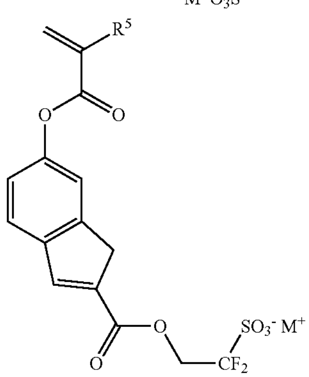
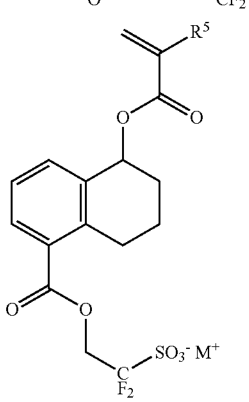
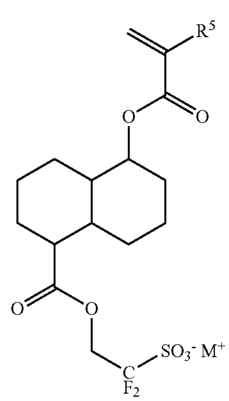
-continued
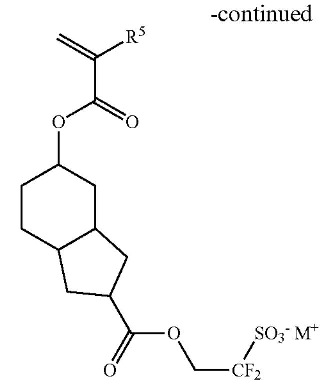
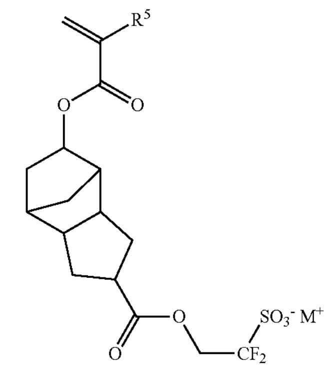
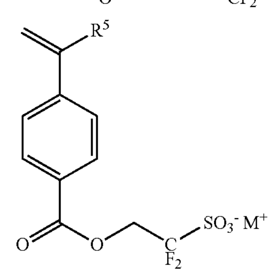
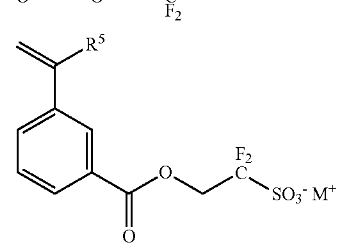
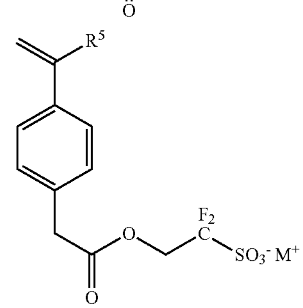
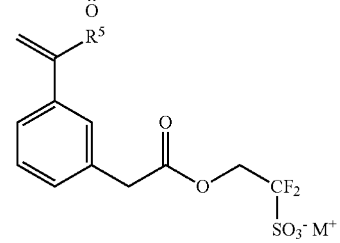

-continued
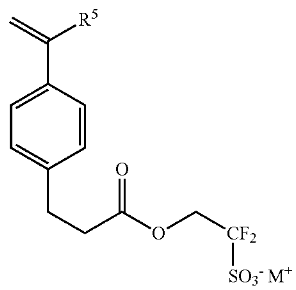
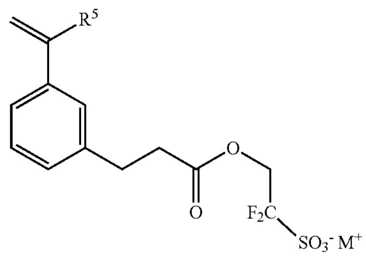
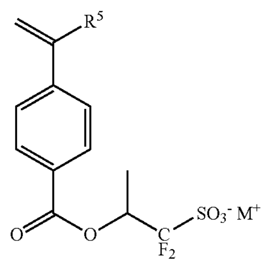
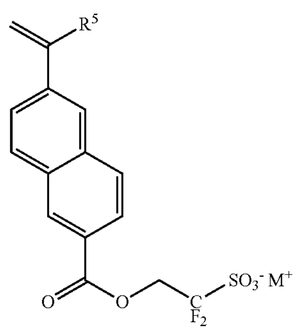
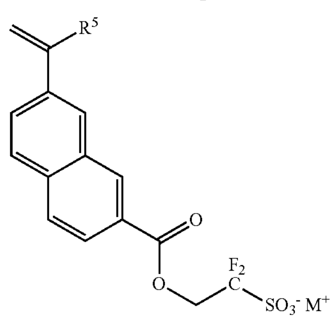
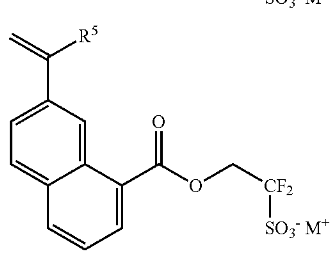
-continued
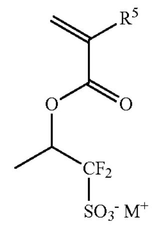
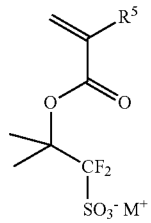
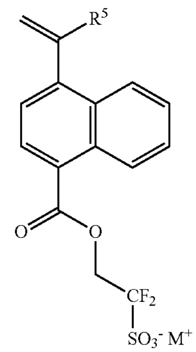
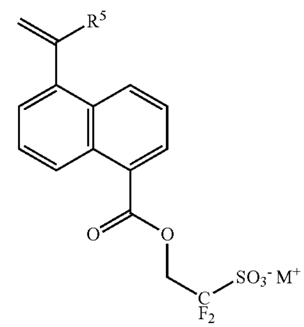
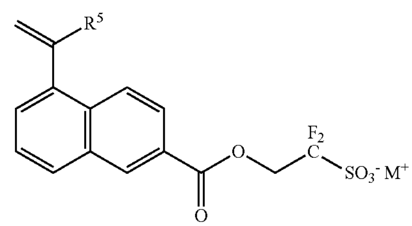
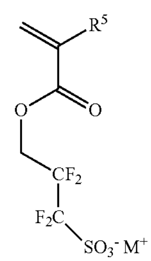
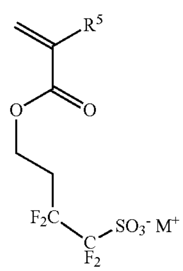
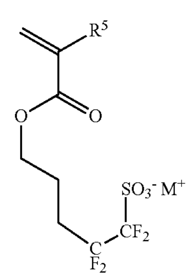
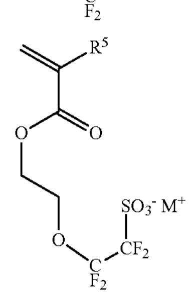
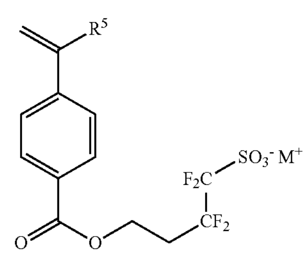

-continued
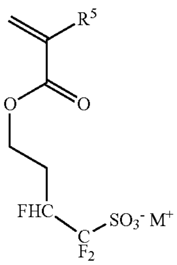
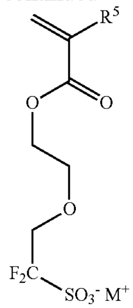
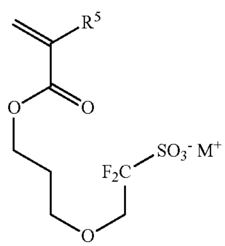
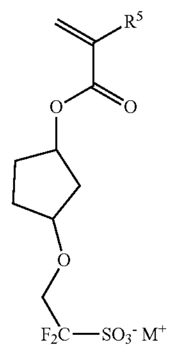
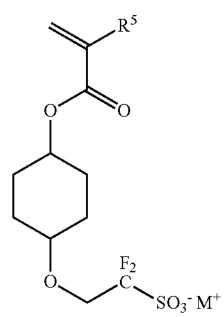
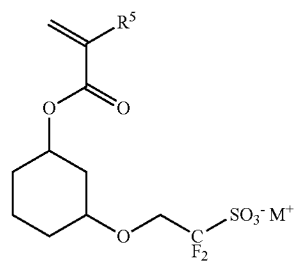
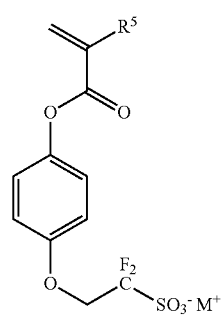
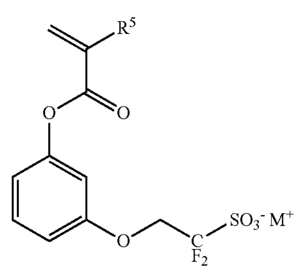
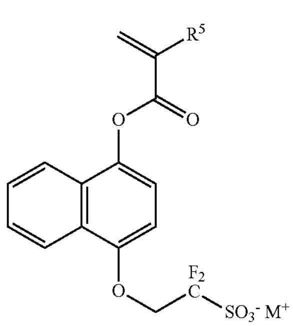
-continued
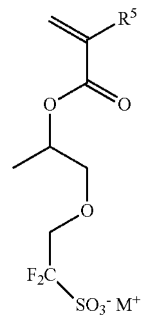
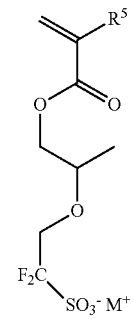
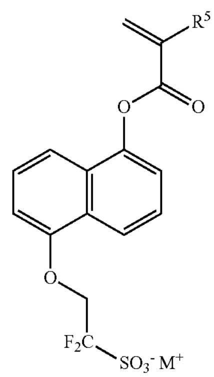
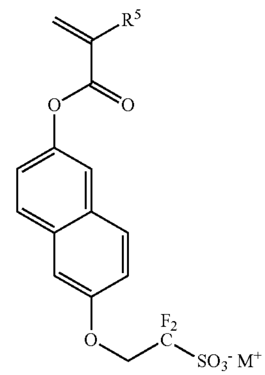
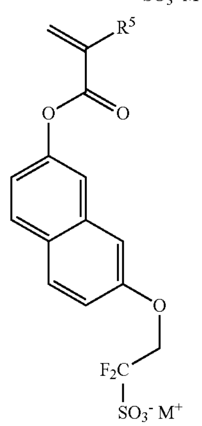
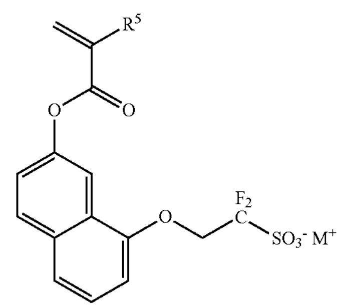
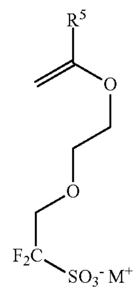
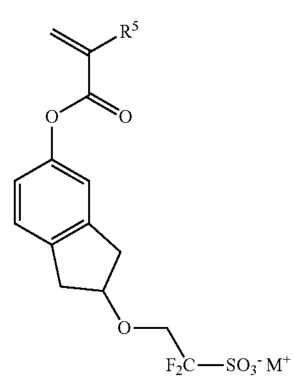

-continued
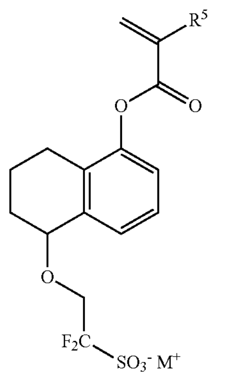
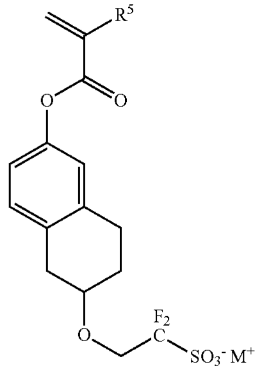
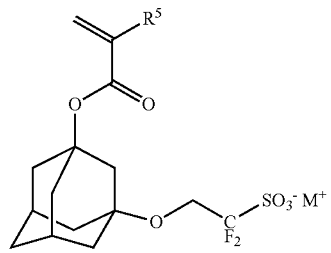
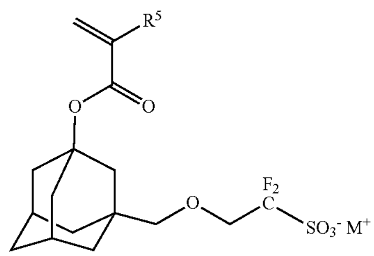
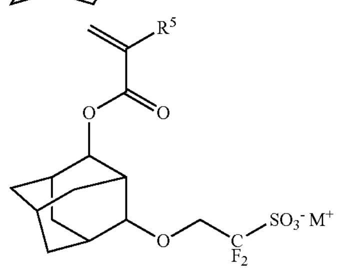
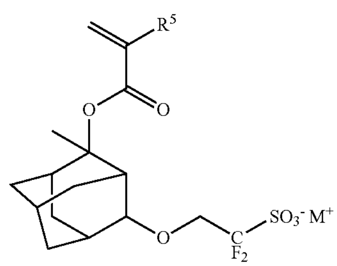
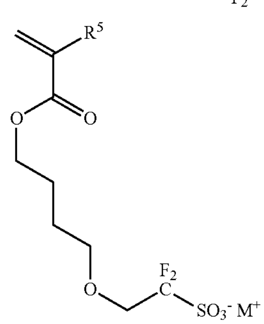
-continued
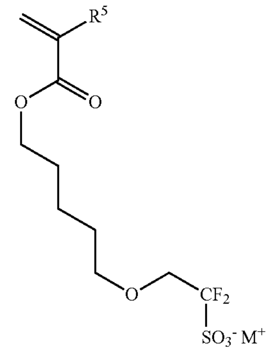
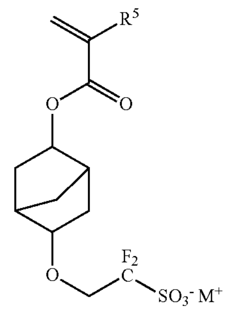
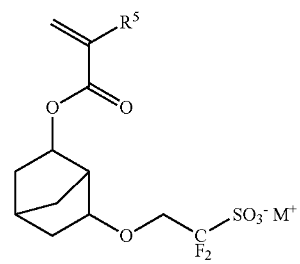
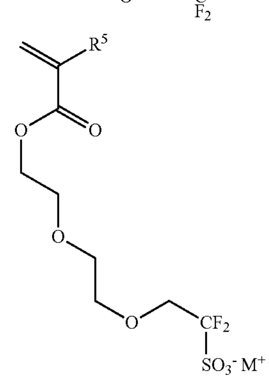
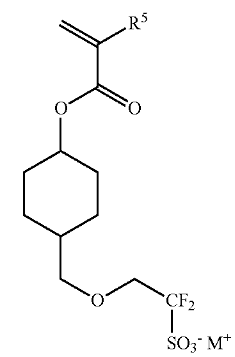
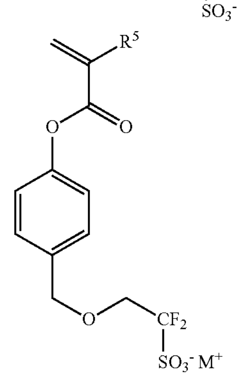

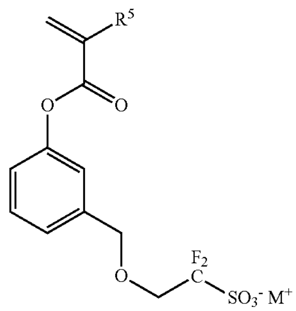
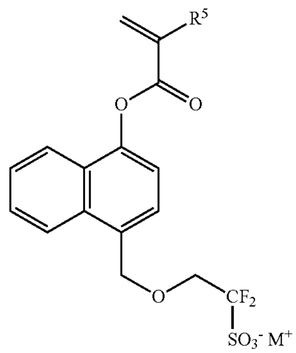
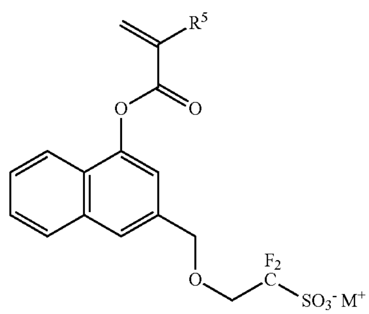
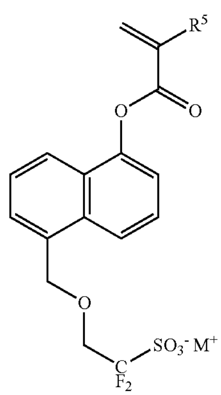
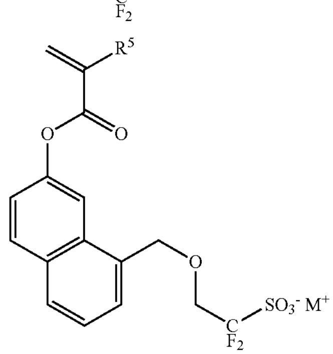
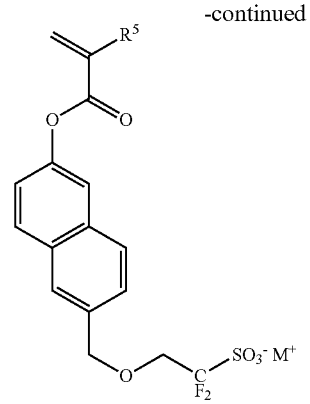
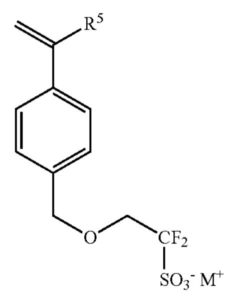
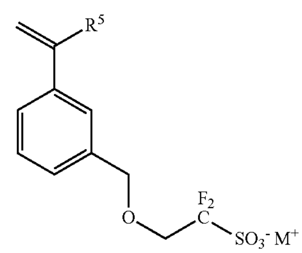
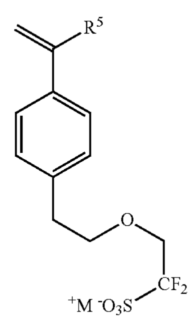
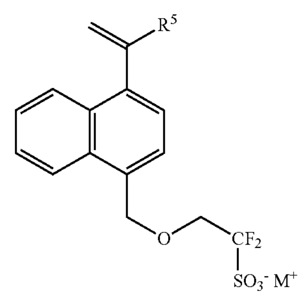
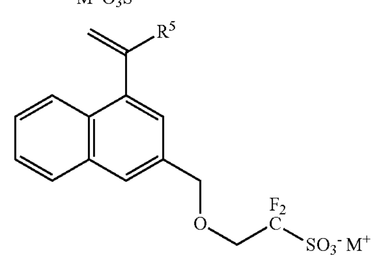
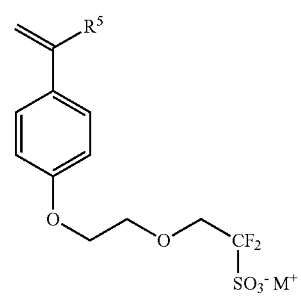

-continued
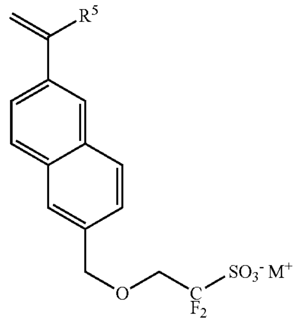
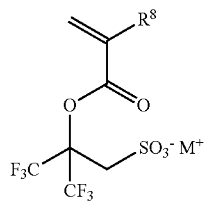
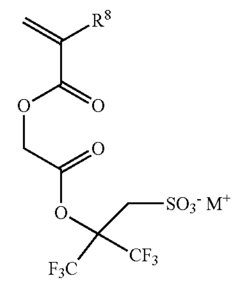
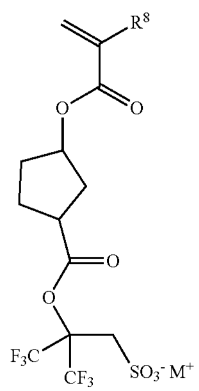
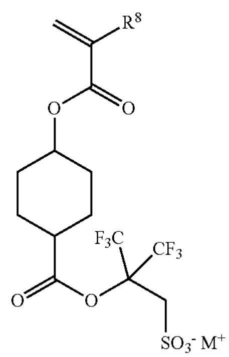
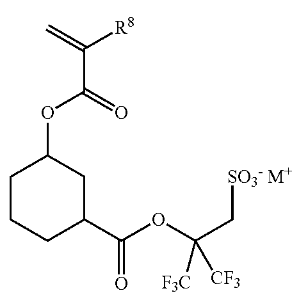
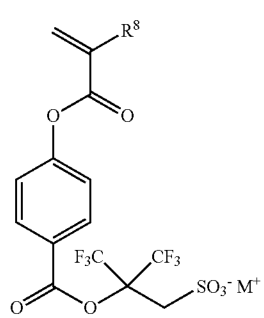
-continued
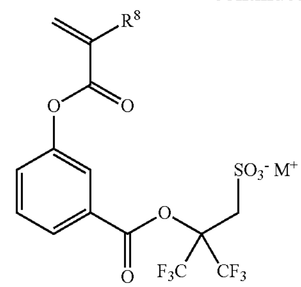
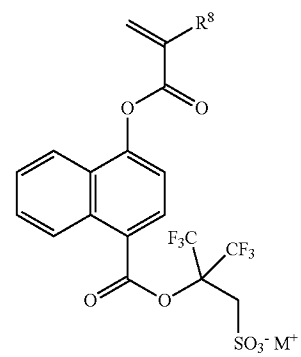
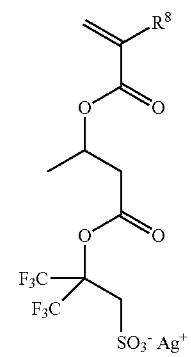
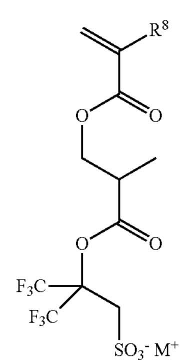
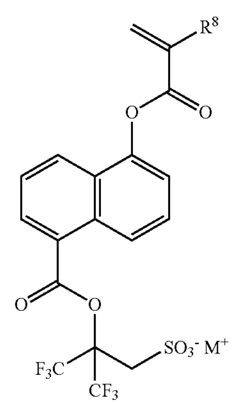
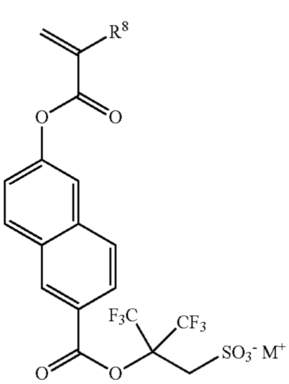

-continued
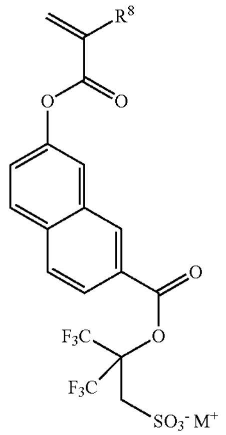
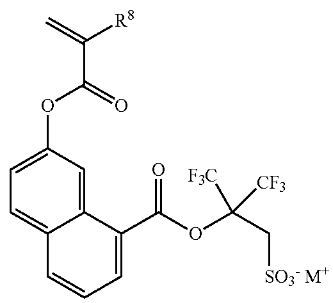
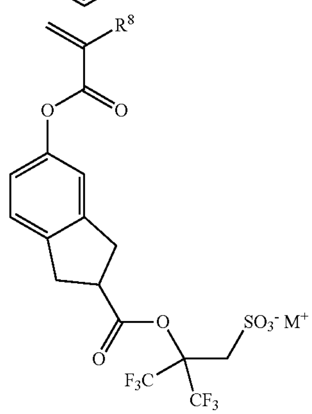
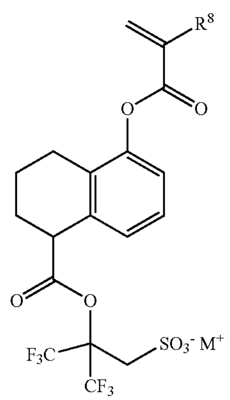
-continued
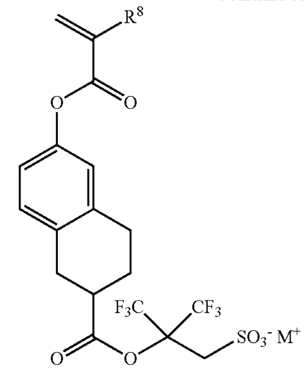
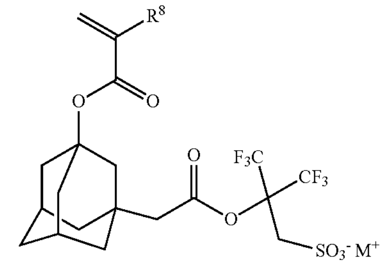
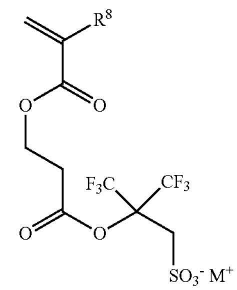
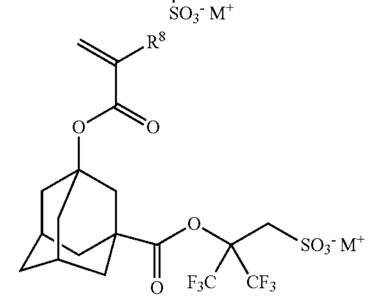
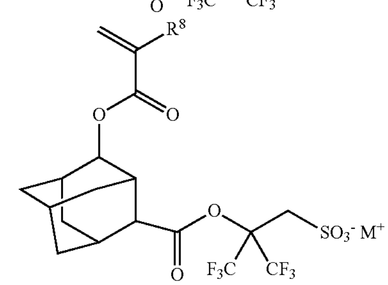
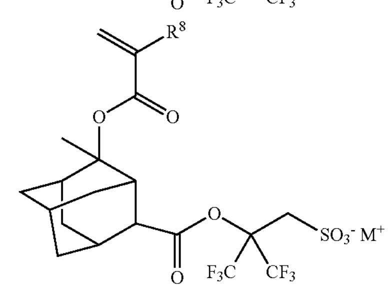

-continued
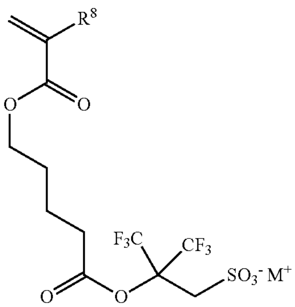
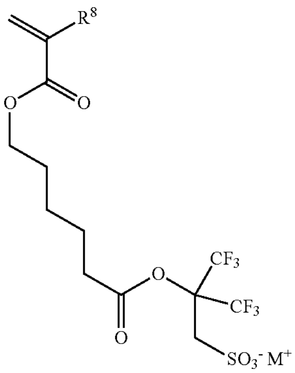
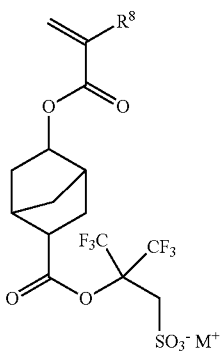
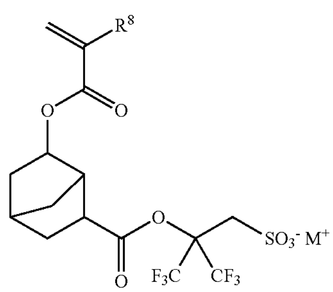
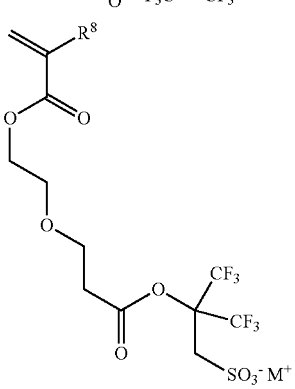
-continued
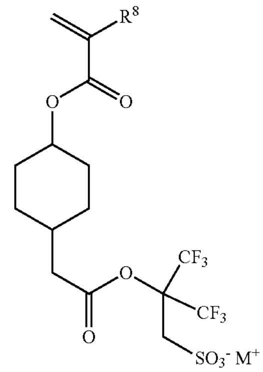
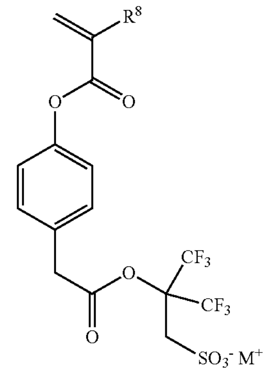
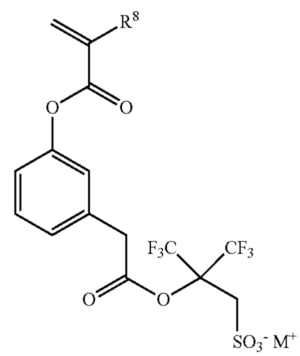
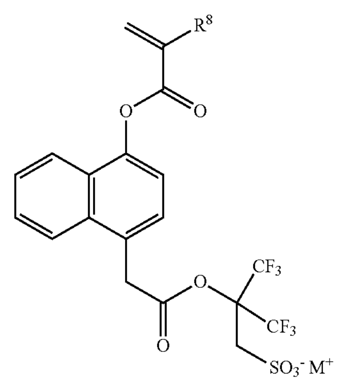
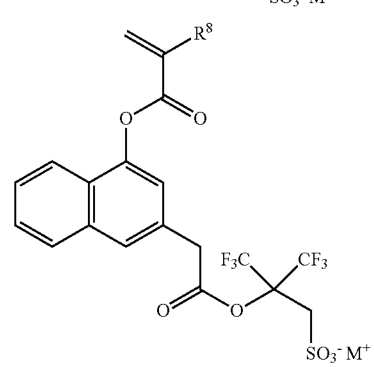

-continued
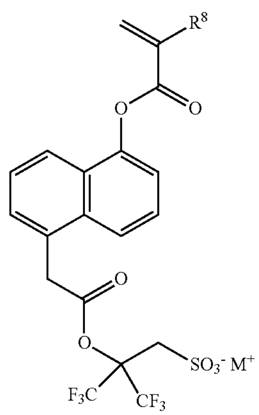
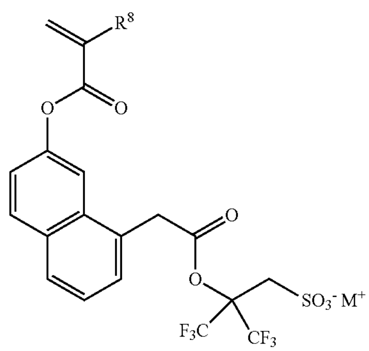
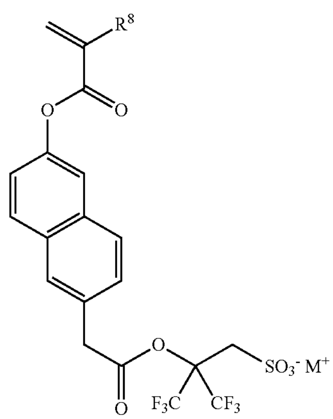
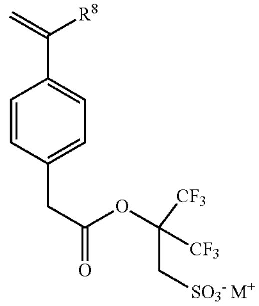
-continued
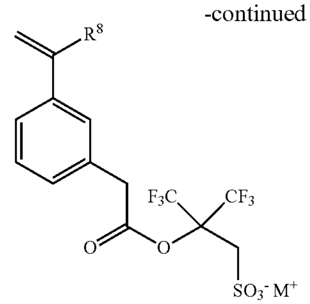
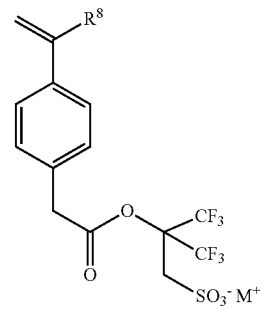
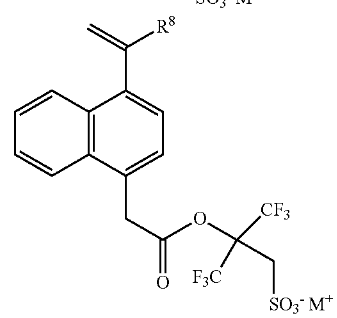
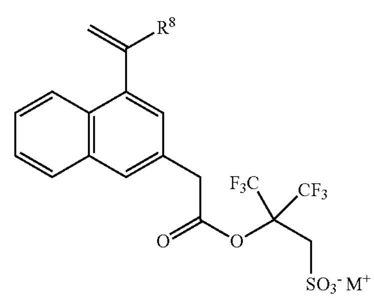
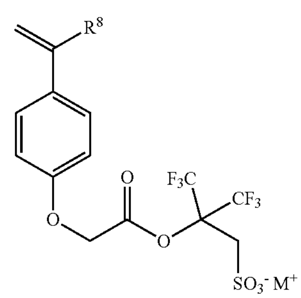

-continued
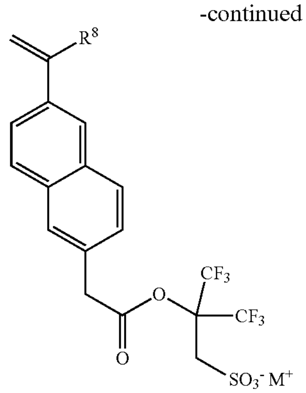
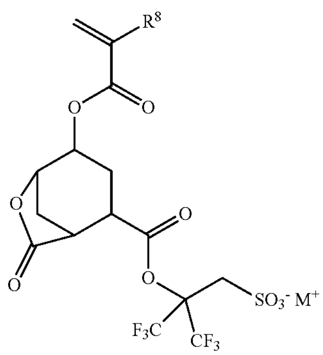
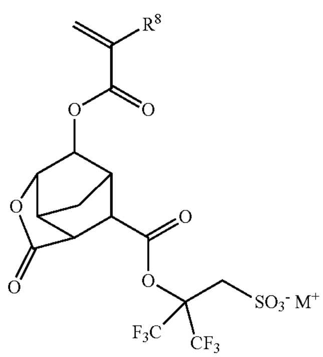
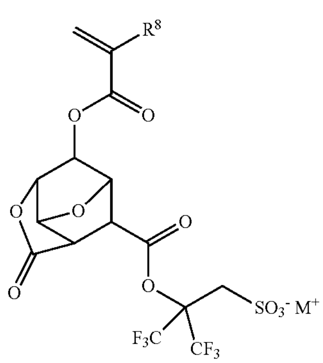
-continued
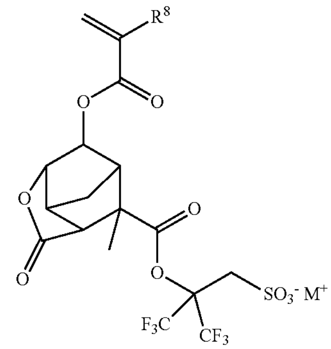
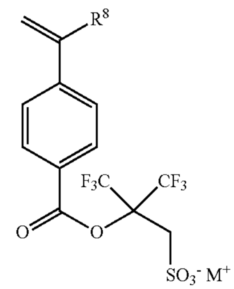
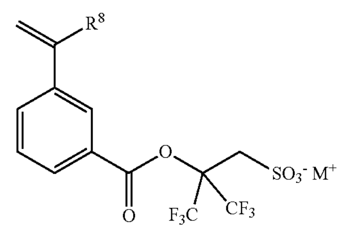
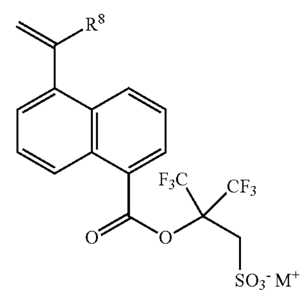
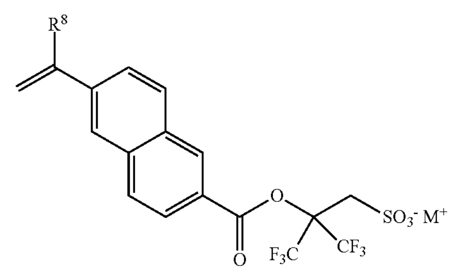
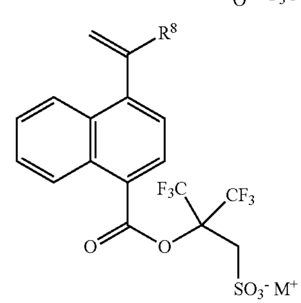

-continued
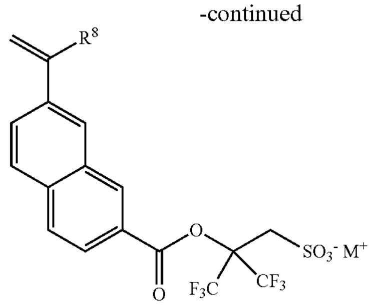
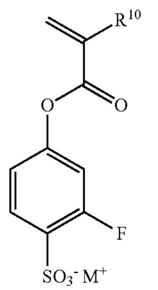
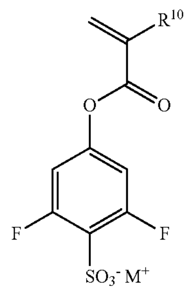
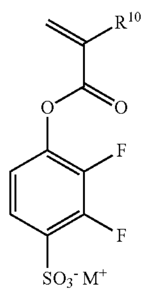
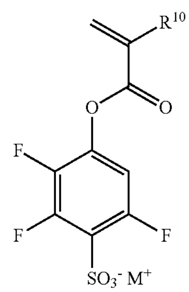
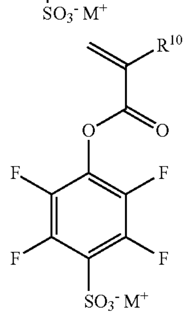
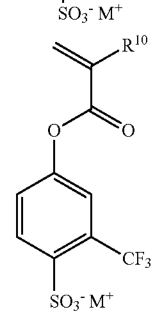
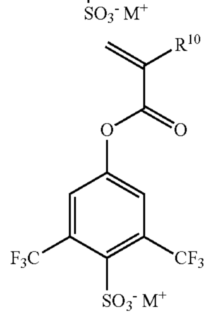
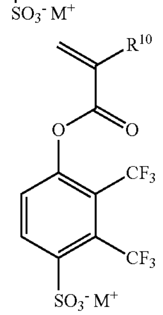
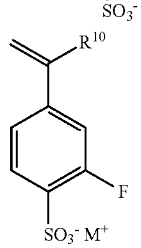
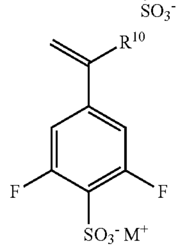
-continued
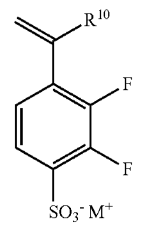
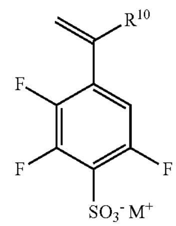
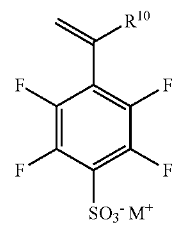
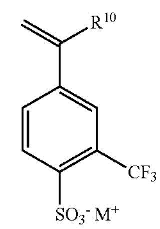
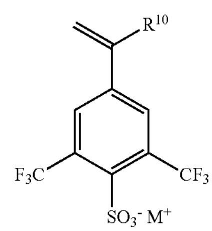
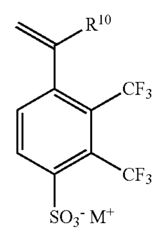
The sulfonimide salt monomer for obtaining the repeating unit "a6" represented by the general formula may be specifically exemplified by the following.
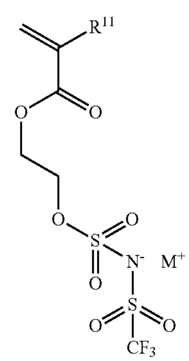
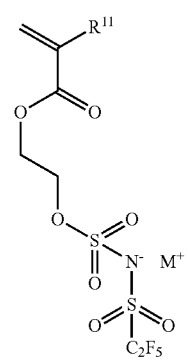
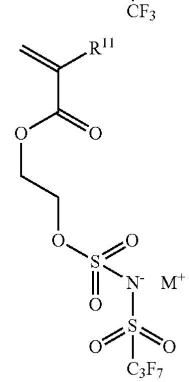
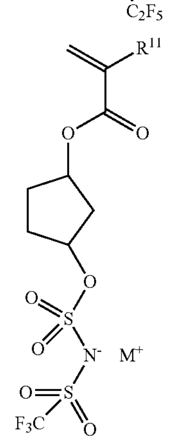

-continued
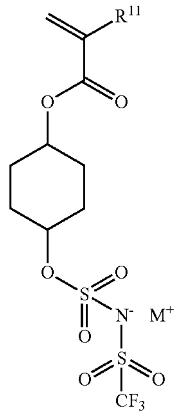
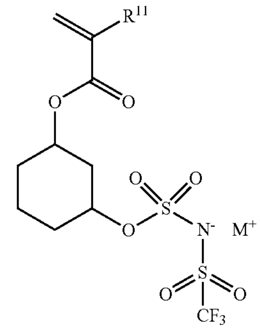
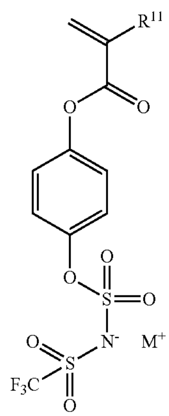
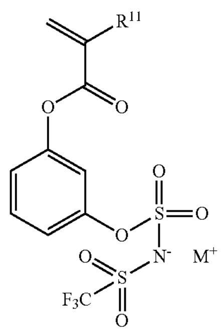
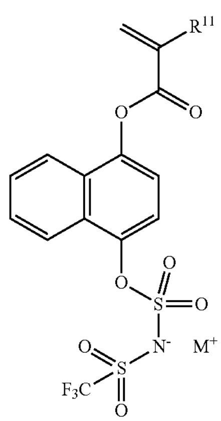
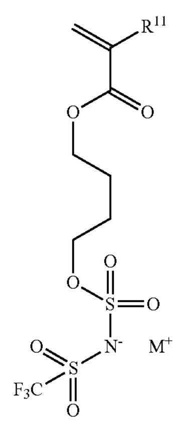
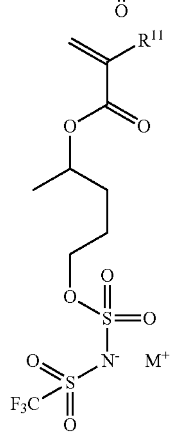
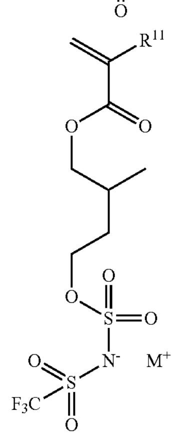
-continued
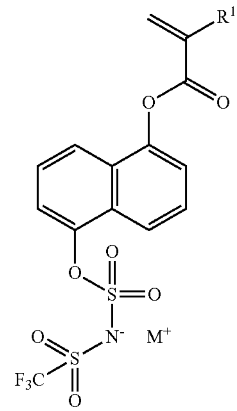
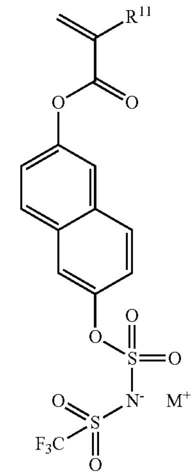
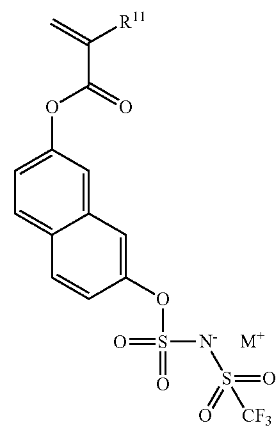
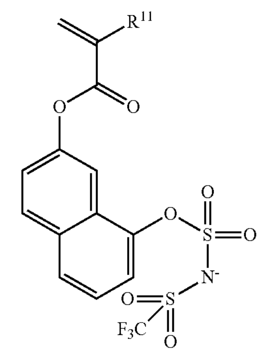
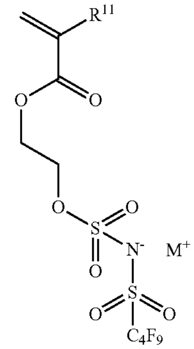
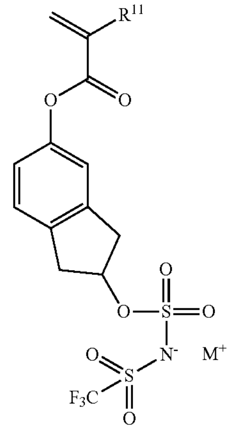

-continued
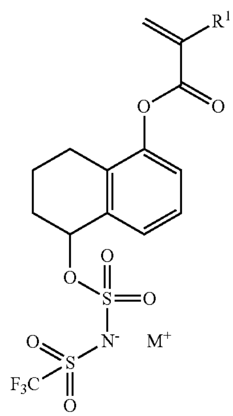
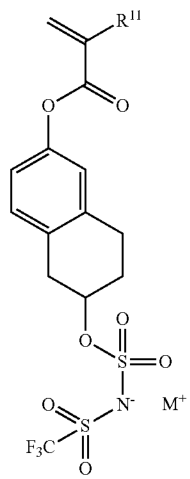
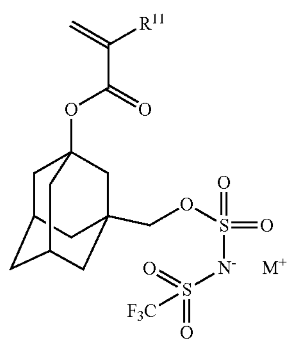
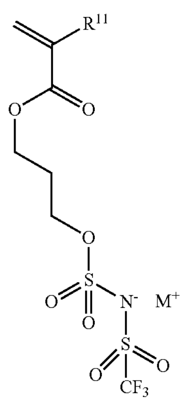
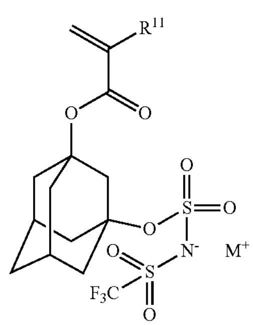
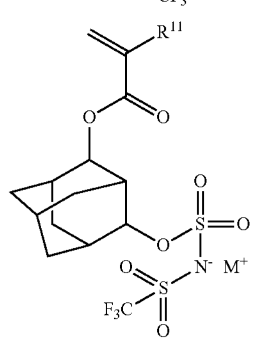
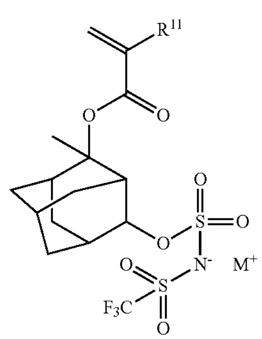
-continued
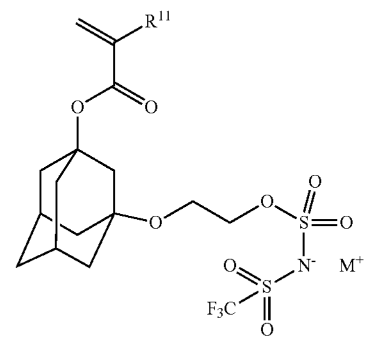
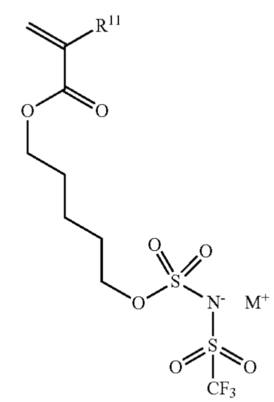
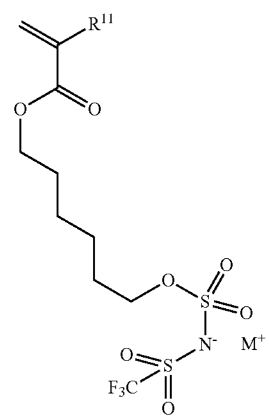
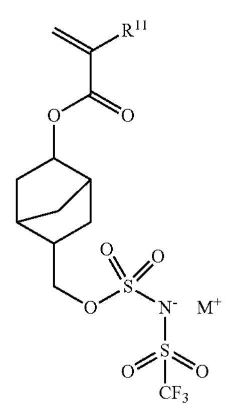
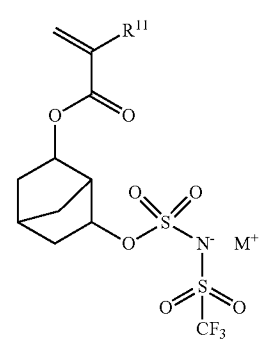
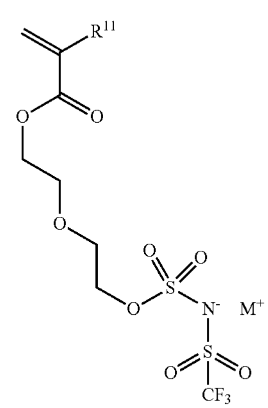
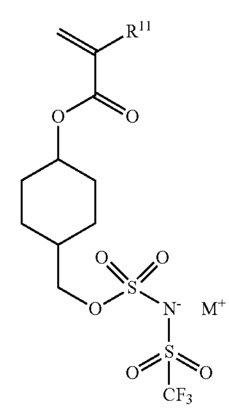

-continued
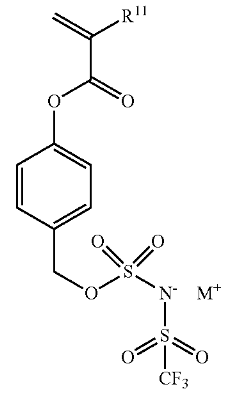
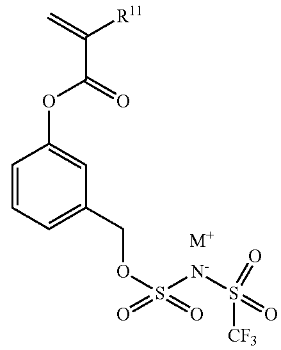
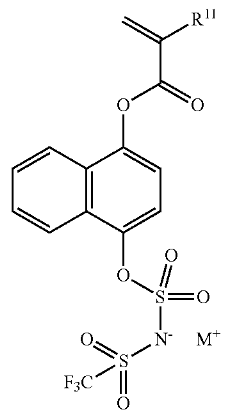
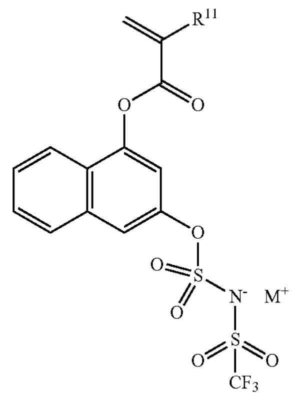
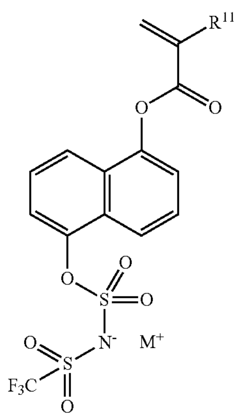
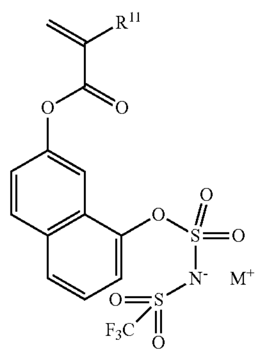
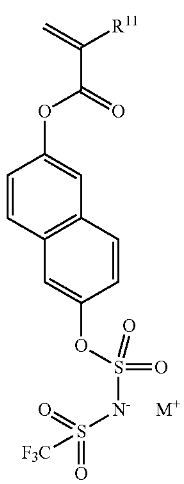
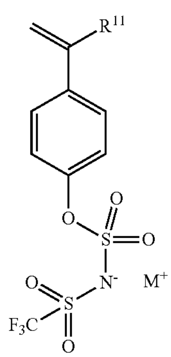
-continued
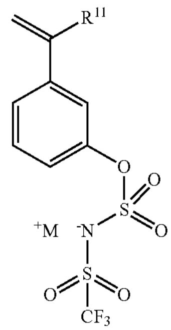
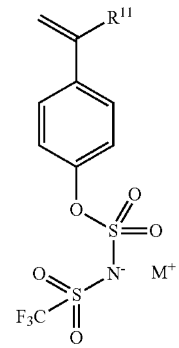
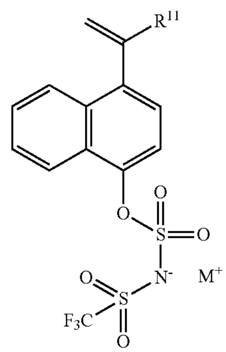
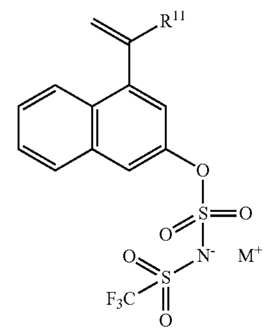
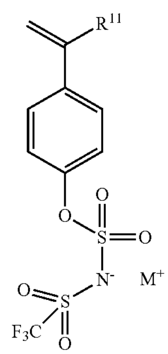
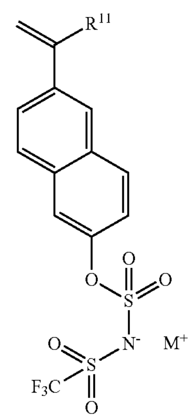
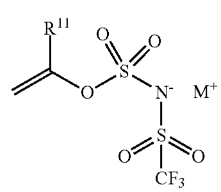
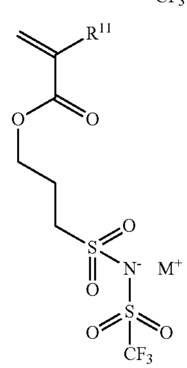
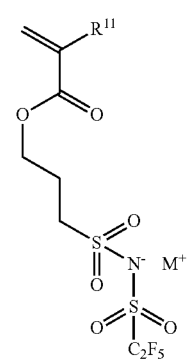

-continued
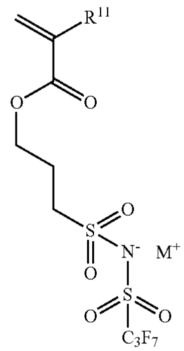
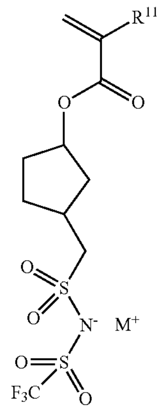
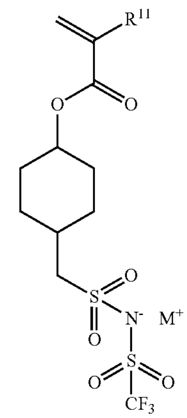
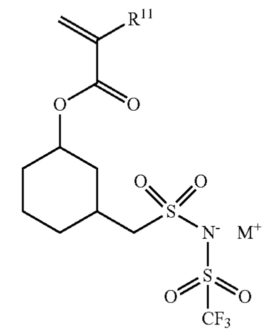
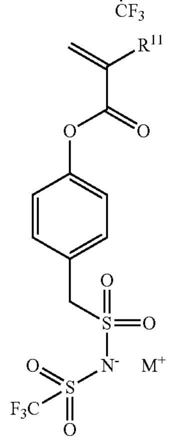
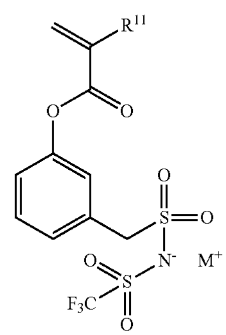
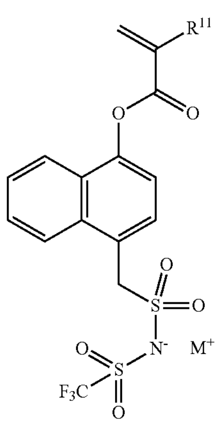
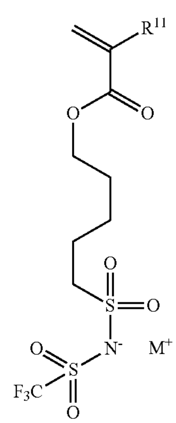
-continued
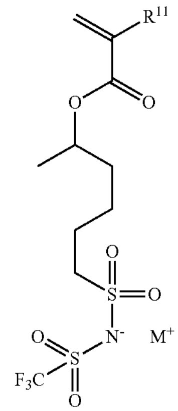
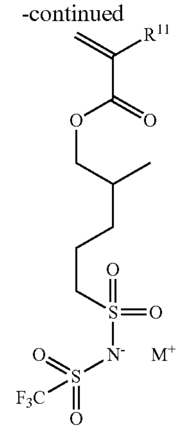
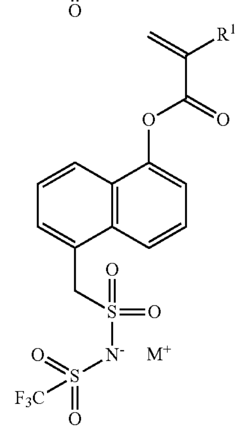
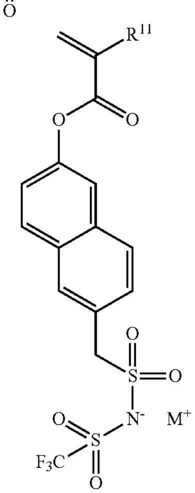
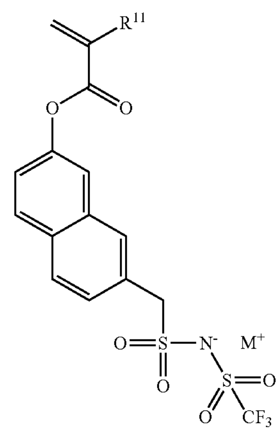
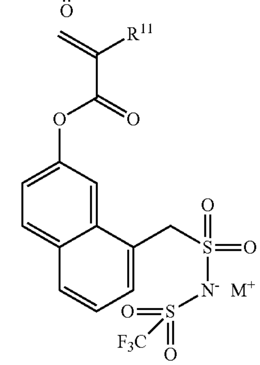
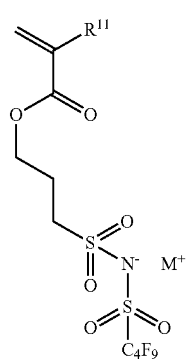
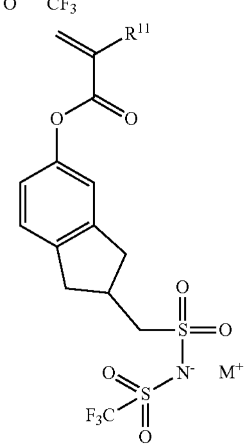

-continued
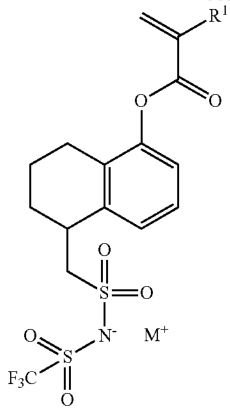
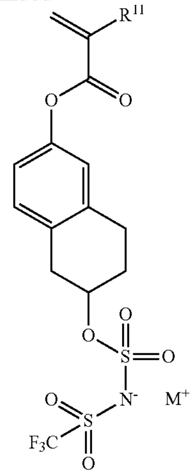
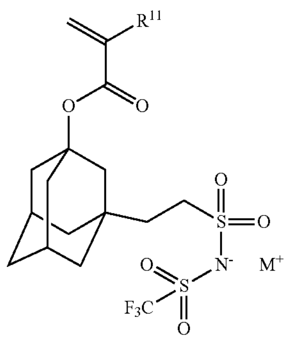
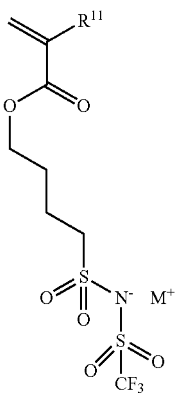
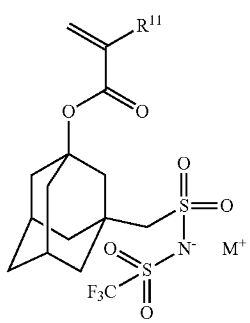
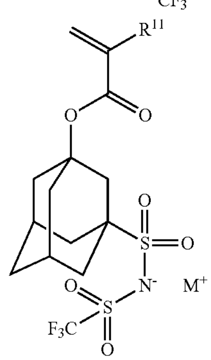
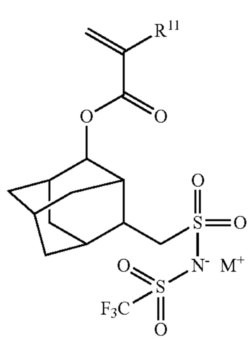
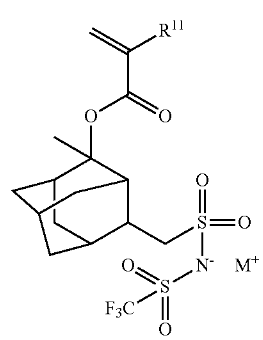
-continued
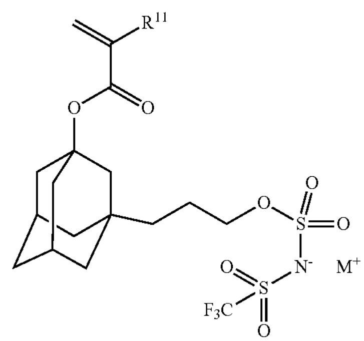
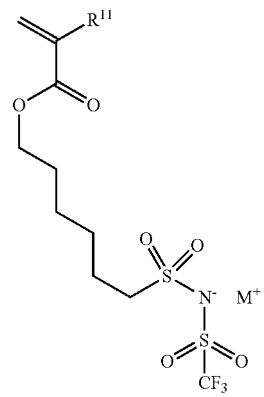
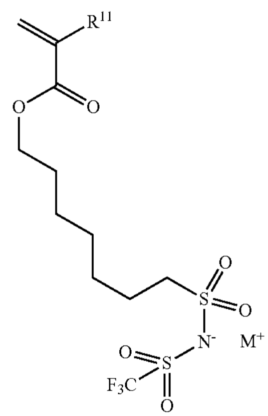
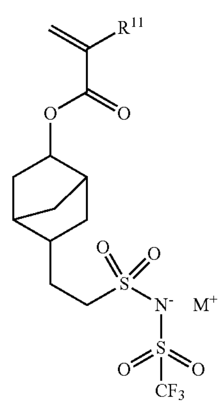
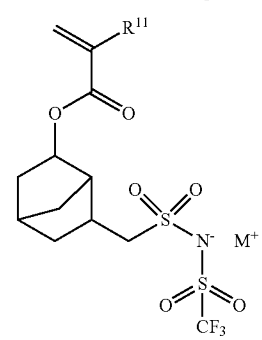
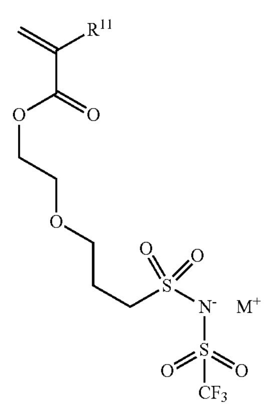
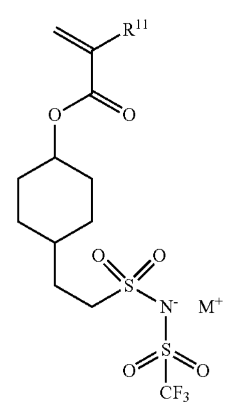

-continued
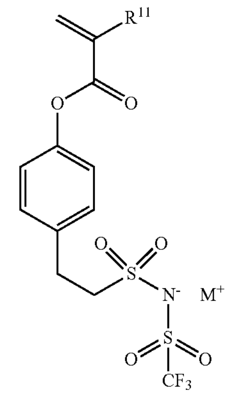
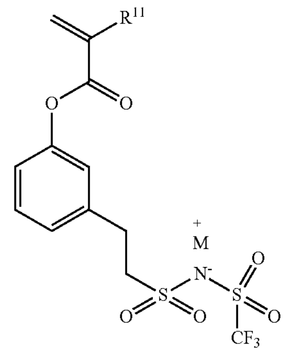
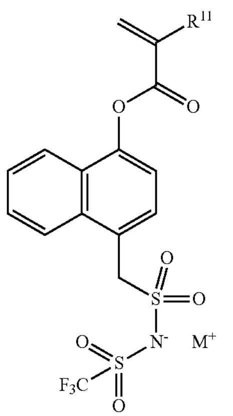
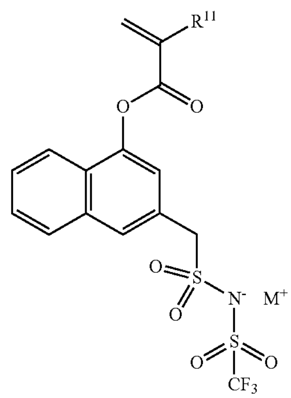
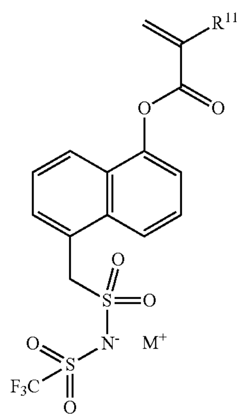
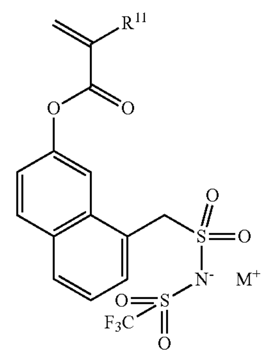
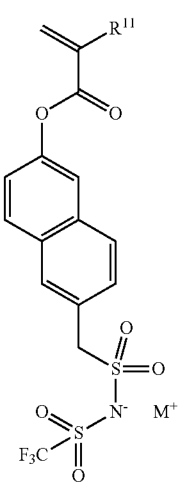
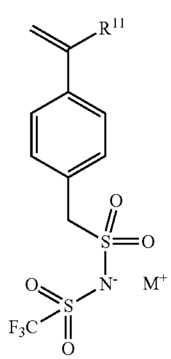
-continued
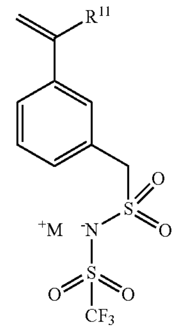
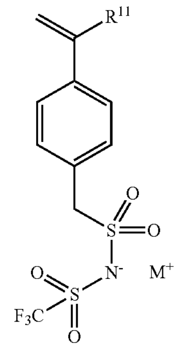
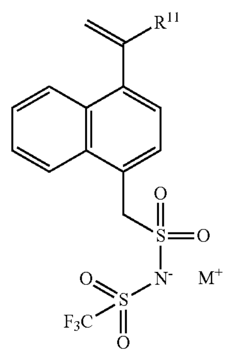
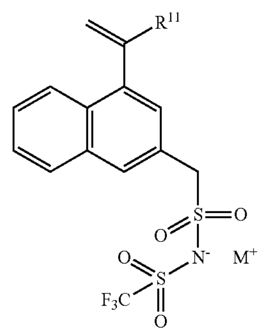
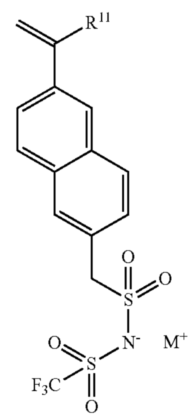
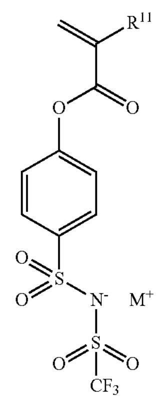
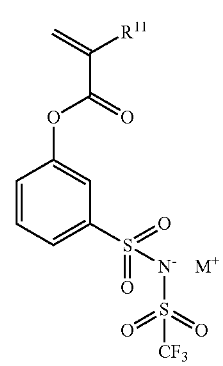
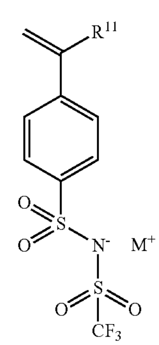

-continued
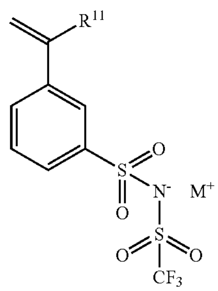
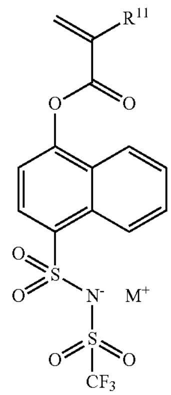
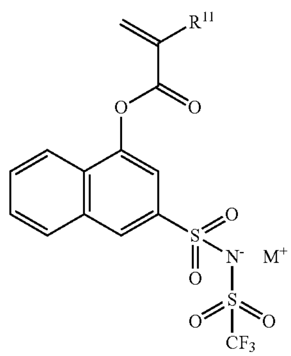
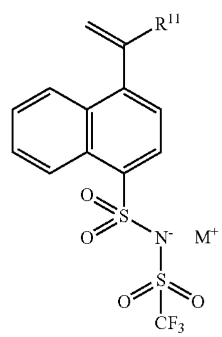
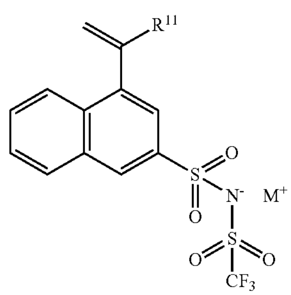
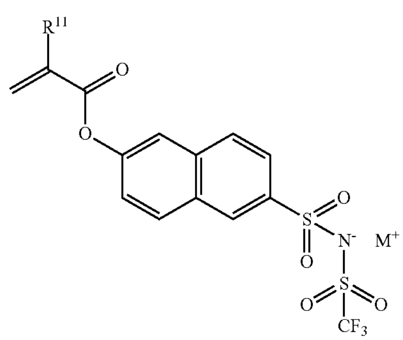
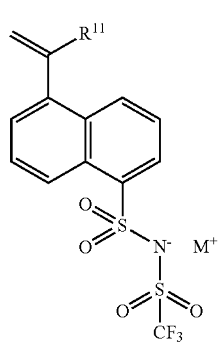
-continued
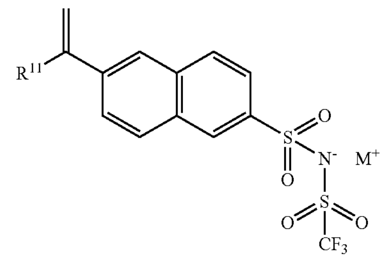
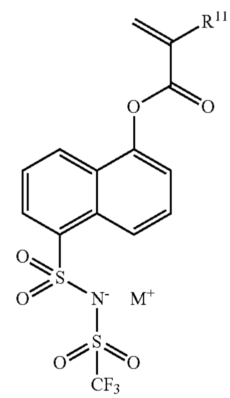
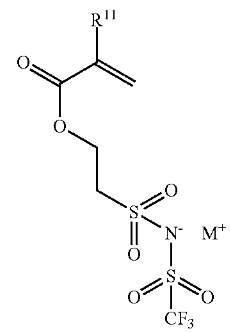
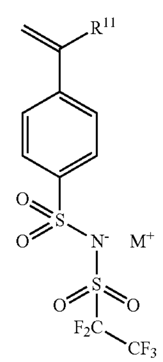
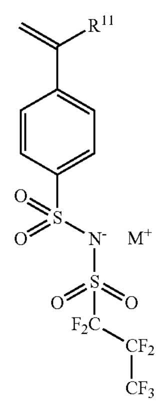
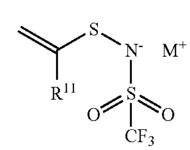
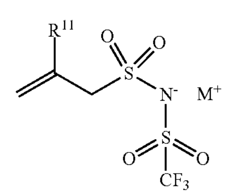
The sulfonamide salt monomer for obtaining the repeating unit "a7" represented by the general formula may be specifically exemplified by the following.
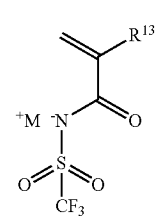
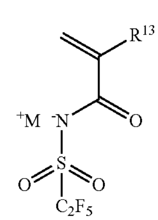
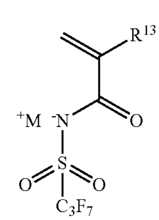

-continued
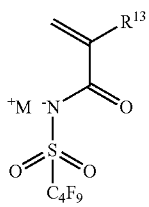
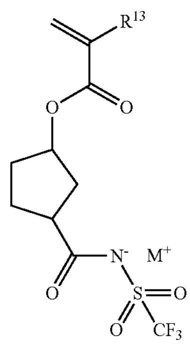
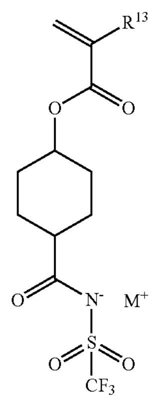
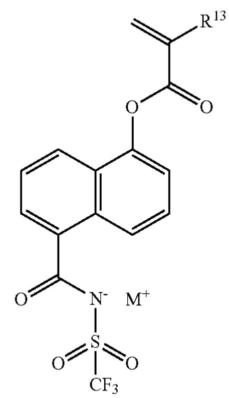
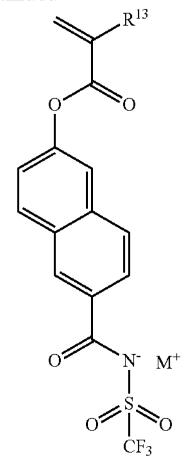
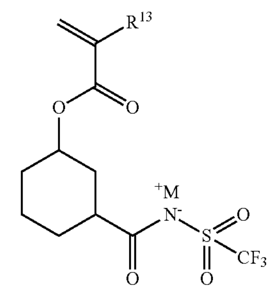
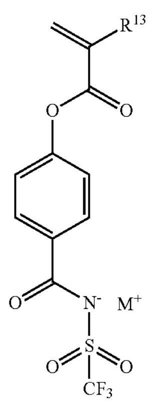
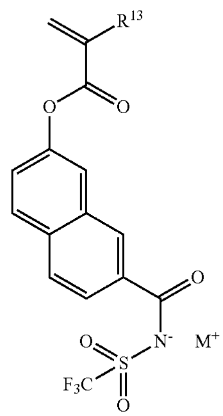
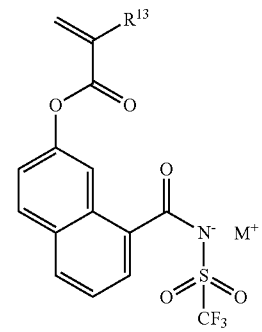
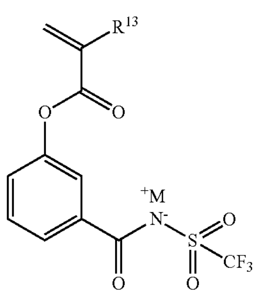
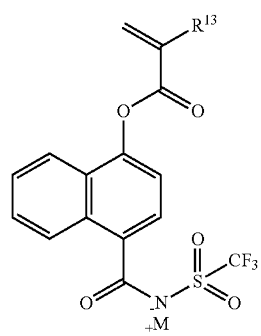
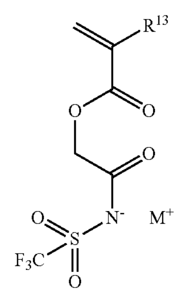
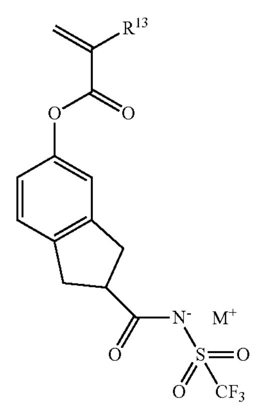
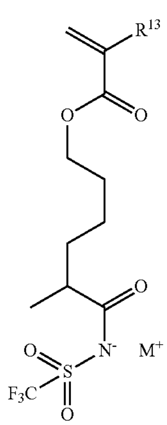
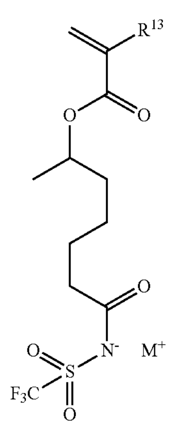
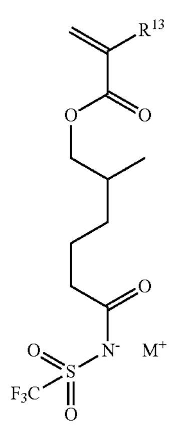
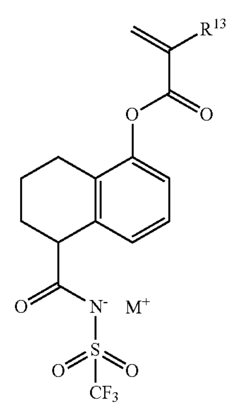
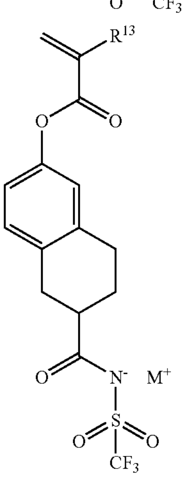

-continued
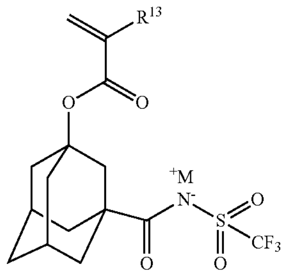
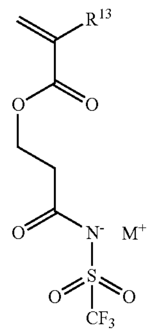
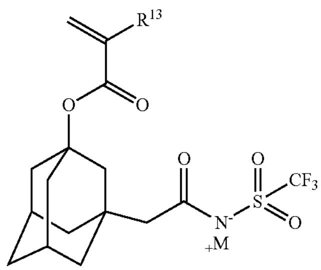
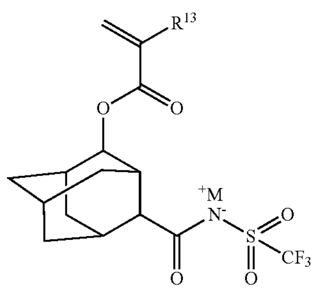
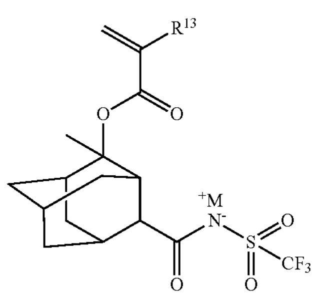
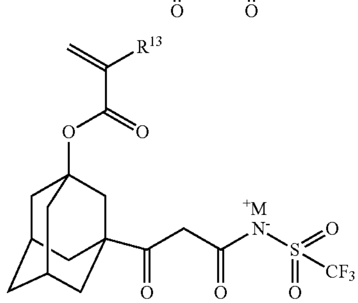
-continued
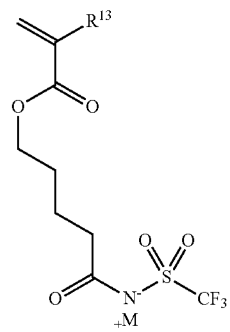
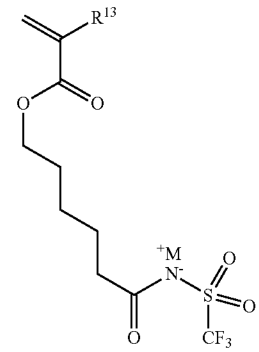
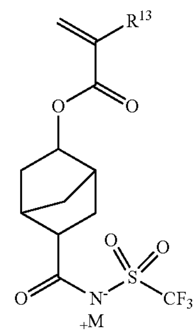
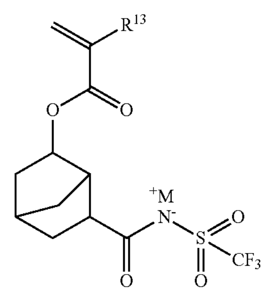
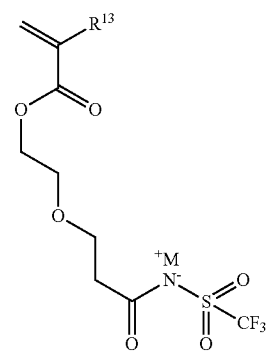
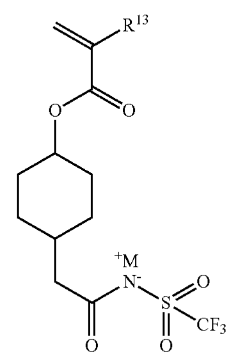
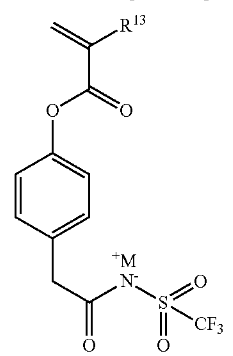
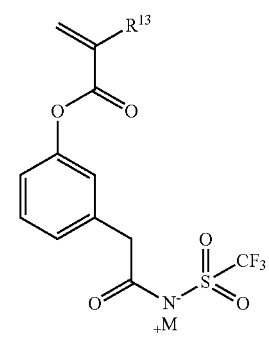
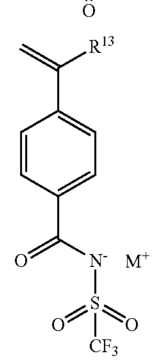
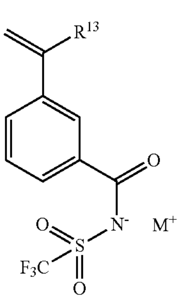

-continued

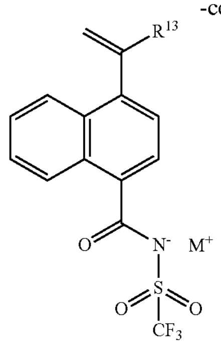

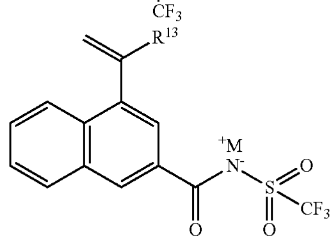

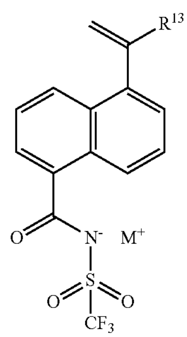

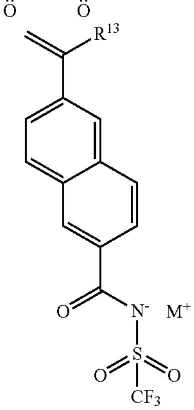

wherein, $R^1$, $R^3$, $R^5$, $R^8$, $R^{10}$, $R^{11}$ and $R^{13}$ are as defined above.

In addition, the component (A) is preferably a component containing an ammonium ion (ammonium cation) represented by the following general formula (3) as $M^+$ in the repeating unit "a" (repeating unit "a1").

(3)

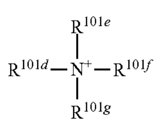

wherein, $R^{101d}$, $R^{101e}$, $R^{101f}$ and $R^{101g}$ each represent a hydrogen atom, a linear, branched or cyclic alkyl group having 1 to 12 carbon atoms, a linear, branched or cyclic alkenyl group or alkynyl group having 2 to 12 carbon atoms or an aromatic group having 6 to 20 carbon atoms, and may have one or more kinds selected from an ether group, a carbonyl group, an ester group, a hydroxy group, an amino group, a nitro group, a sulfonyl group, a sulfinyl group, a halogen group and a sulfur atom. $R^{101d}$ and $R^{101e}$, and $R^{101d}$, $R^{101e}$ and $R^{101f}$ may form a ring with the nitrogen atom bonded therewith, and when a ring is formed, $R^{101d}$ and $R^{101e}$, and $R^{101d}$, $R^{101e}$ and $R^{101f}$ are an alkylene group having 3 to 10 carbon atoms or form a heteroaromatic ring having the nitrogen atom in the formula in the ring.

As the ammonium ion represented by the general formula (3), there may be specifically exemplified by the following ions.

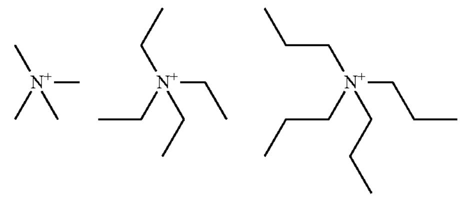

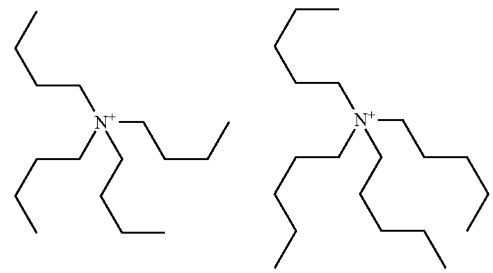

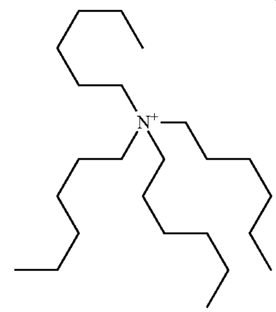

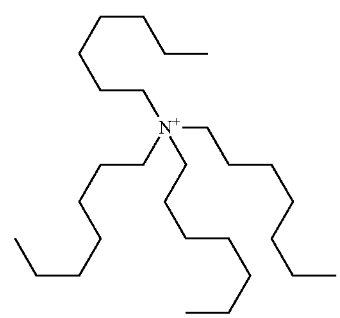

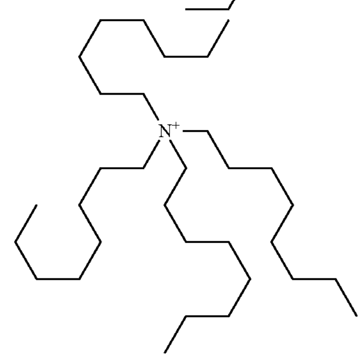

-continued
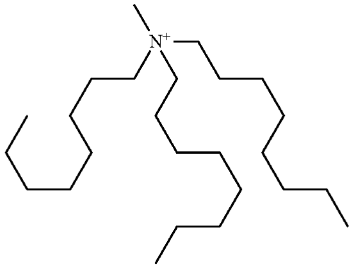
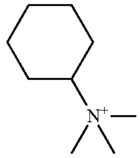
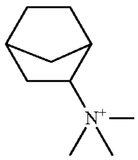
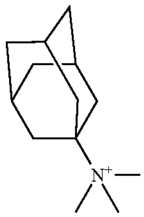
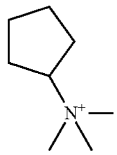
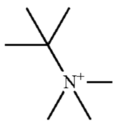
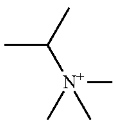
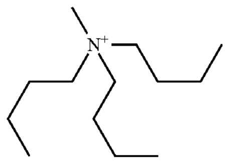
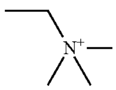
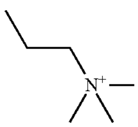
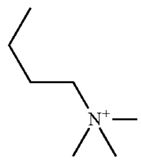
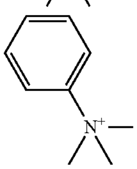
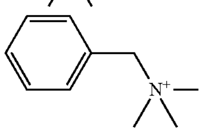
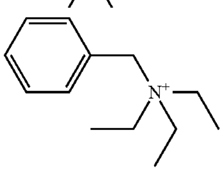
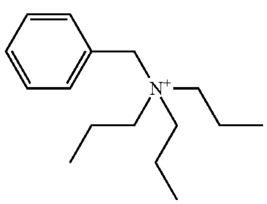
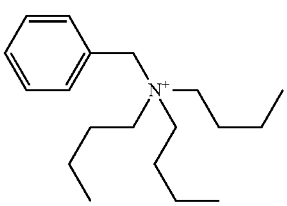
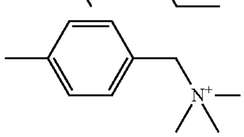
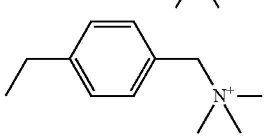
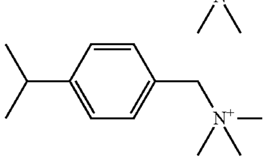
-continued
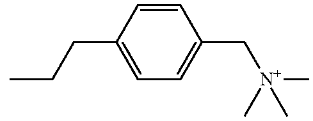
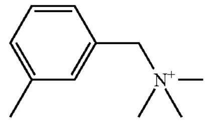
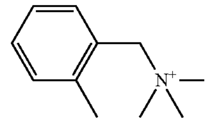
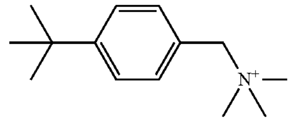
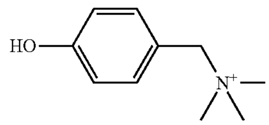
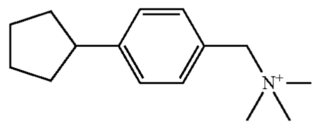
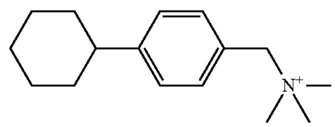
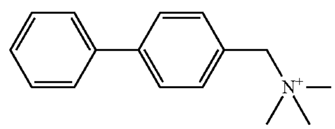
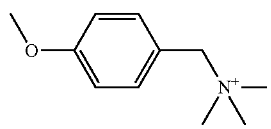
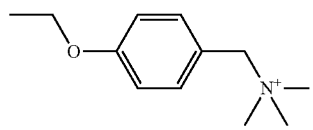
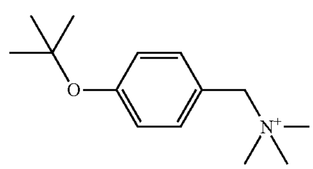
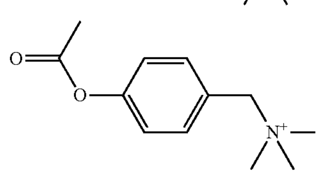
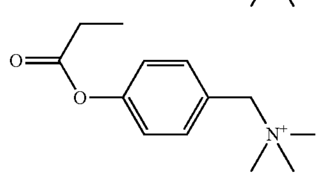

-continued
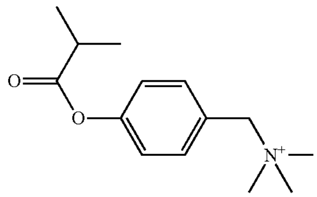
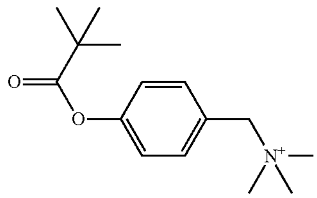
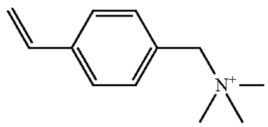
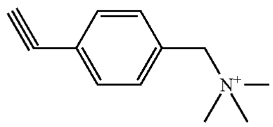
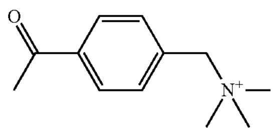
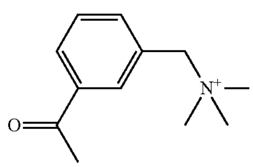
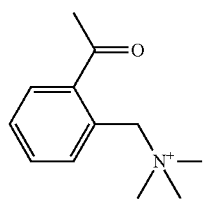
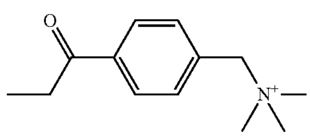
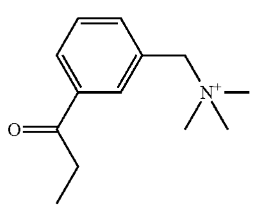
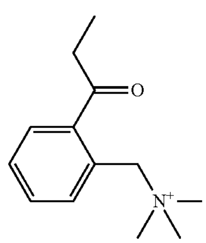
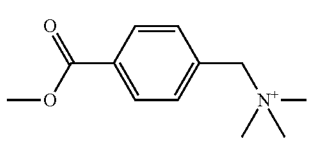
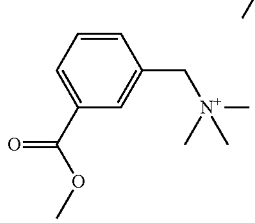
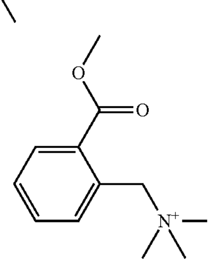
-continued
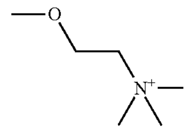
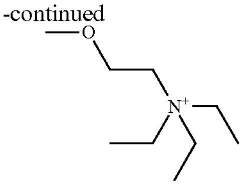
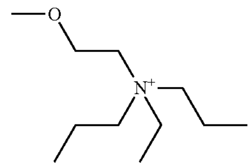
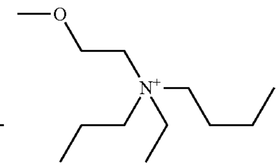
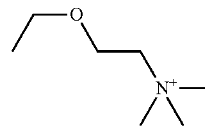
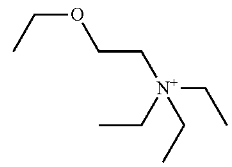
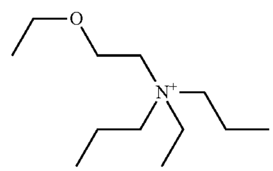
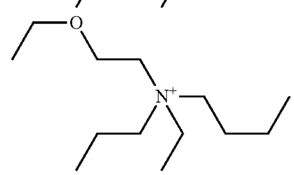
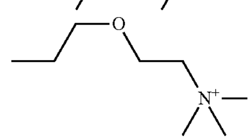
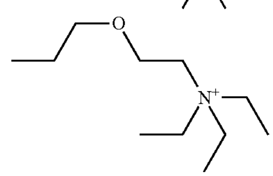
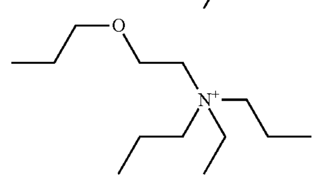
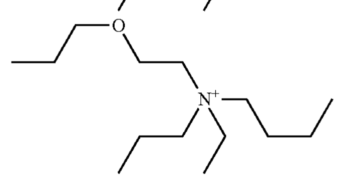
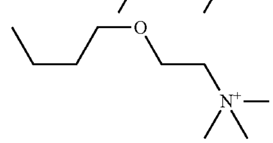
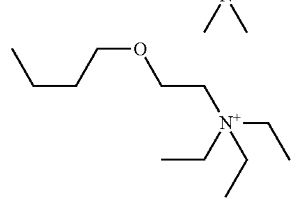

-continued
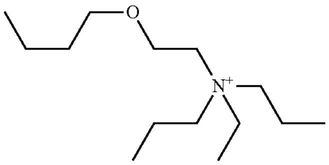
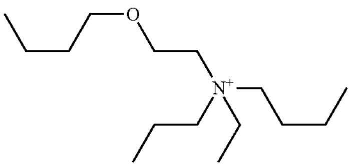
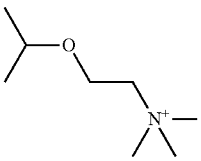
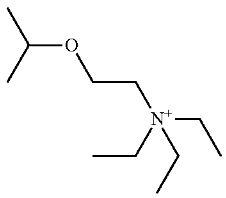
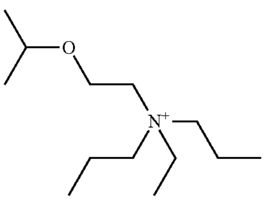
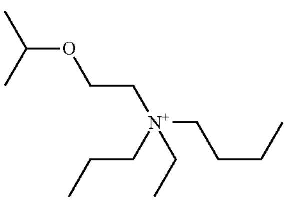
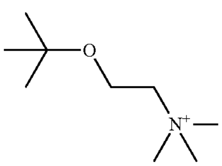
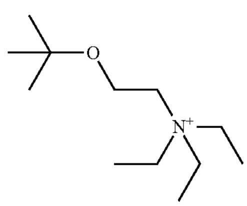
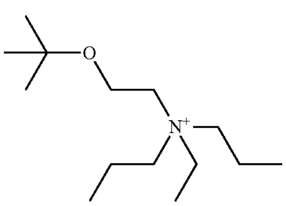
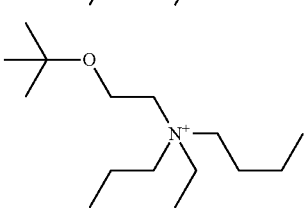
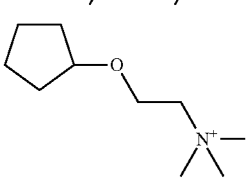
-continued
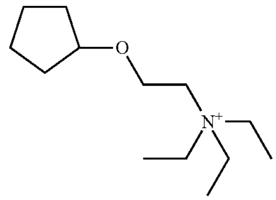
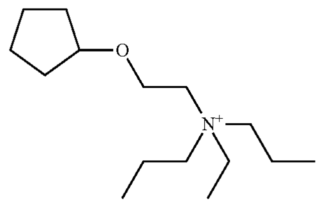
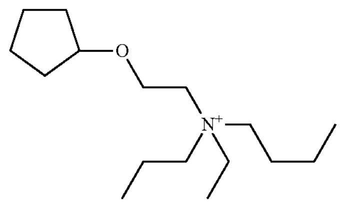
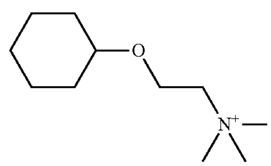
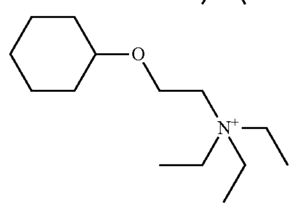
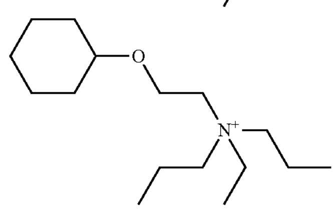
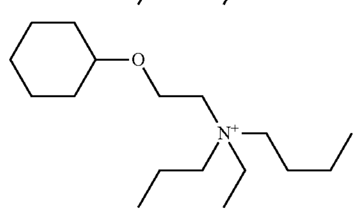
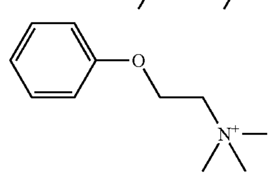
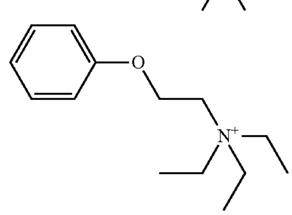

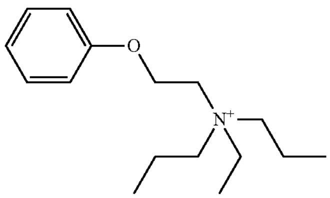
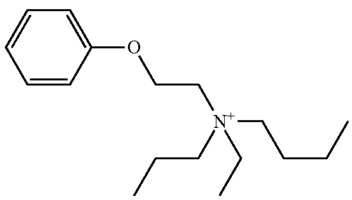
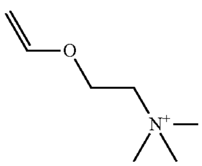
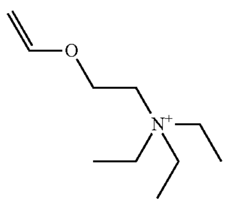
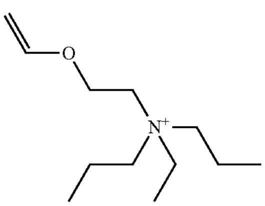
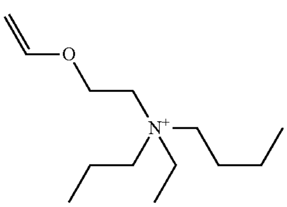
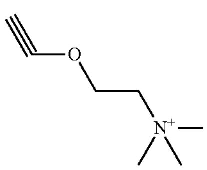
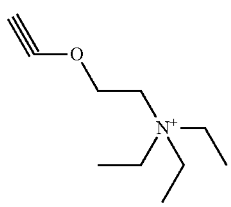
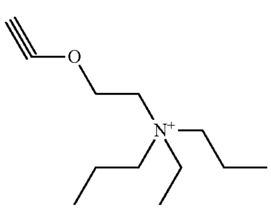
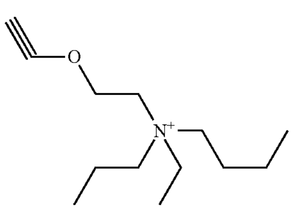
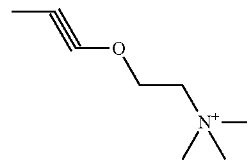
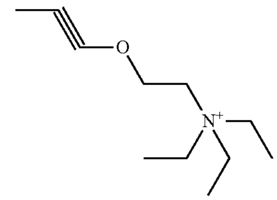
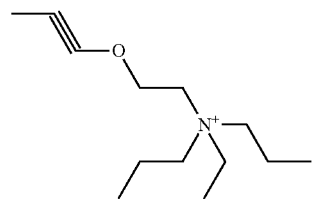
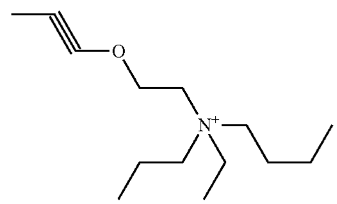
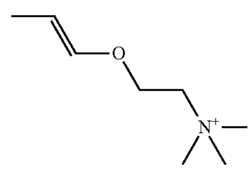
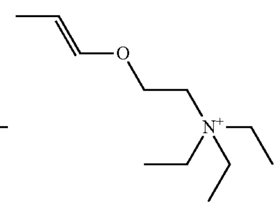
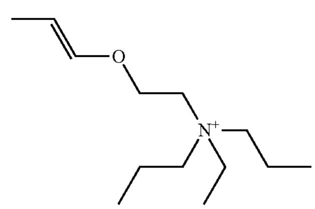
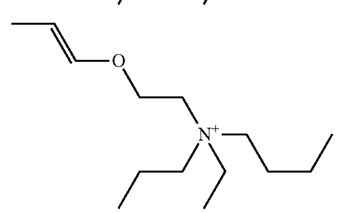
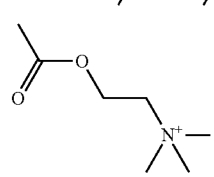
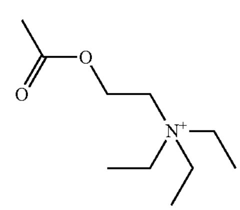
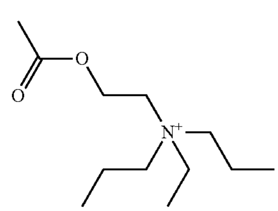

-continued
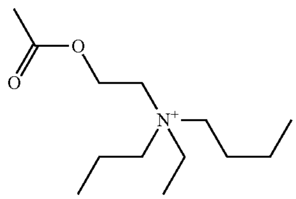
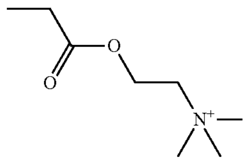
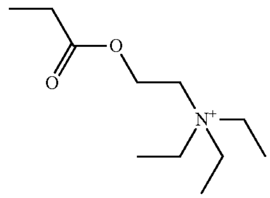
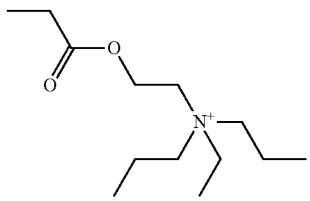
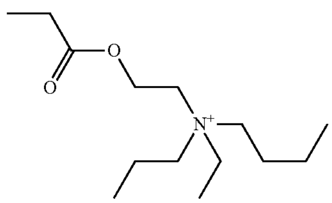
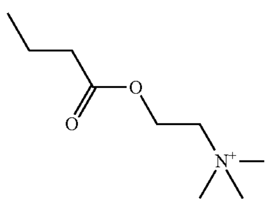
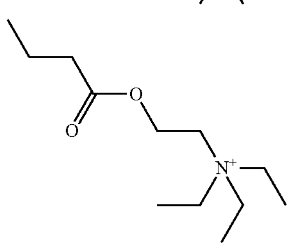
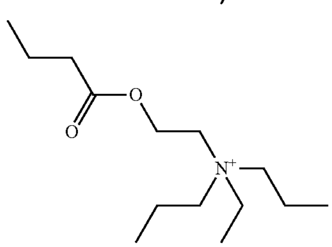
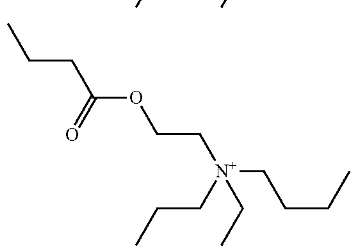
-continued
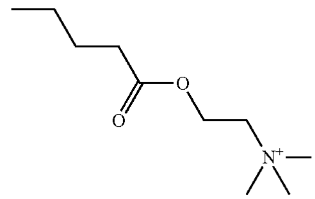
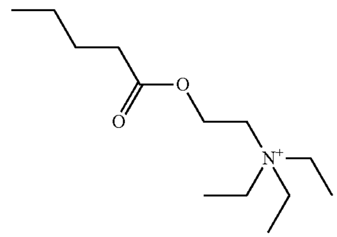
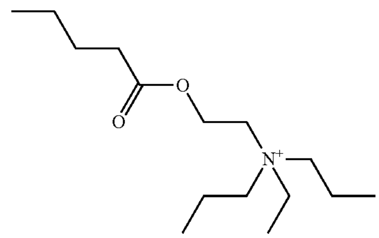
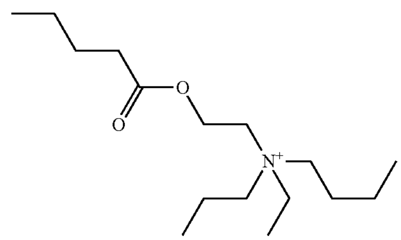
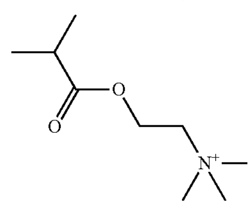
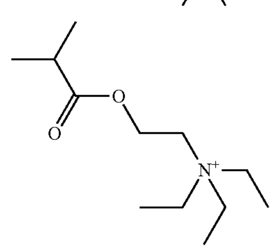
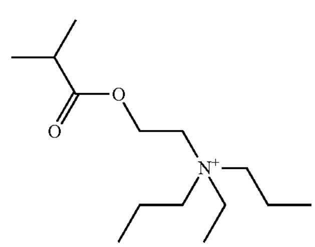

-continued
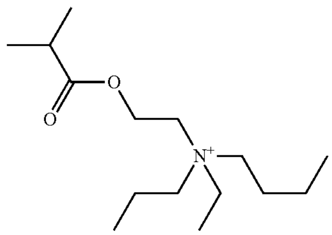
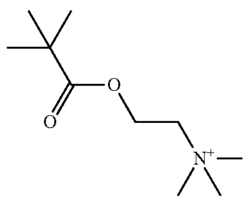
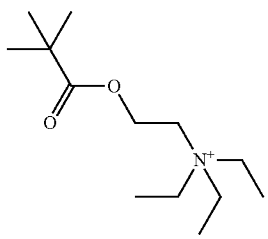
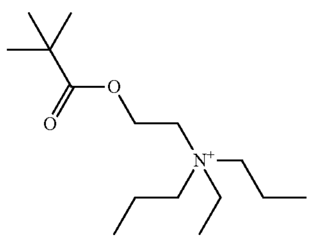
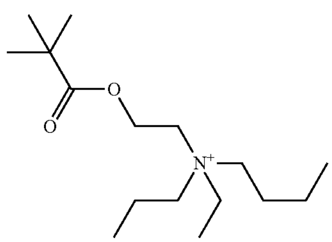
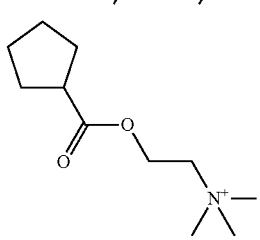
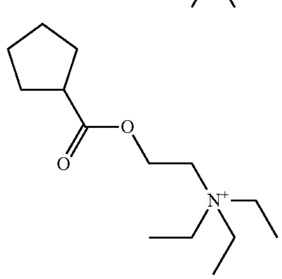
-continued
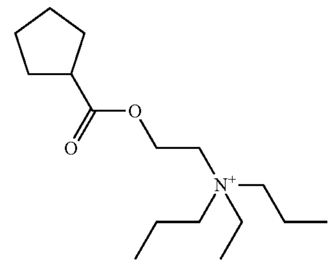
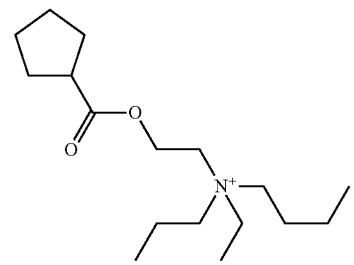
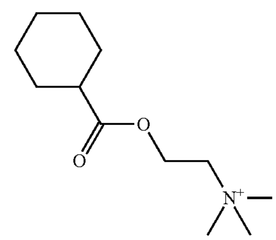
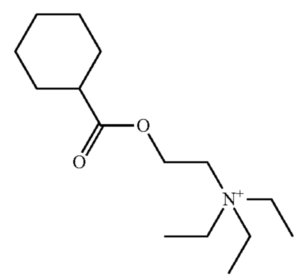
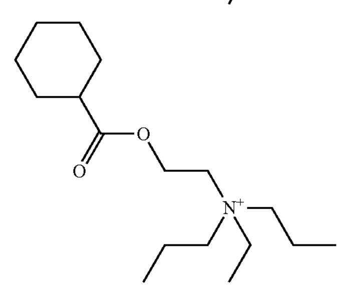
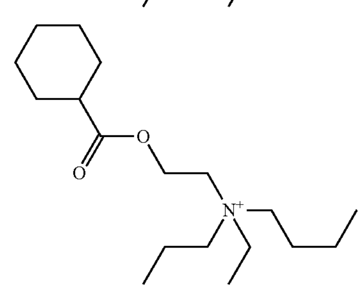

-continued
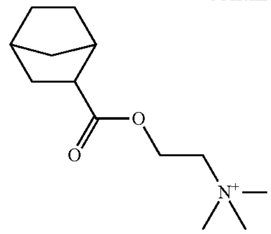
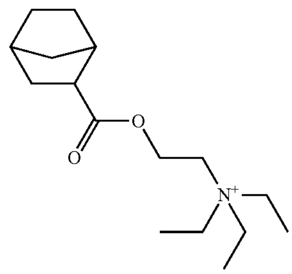
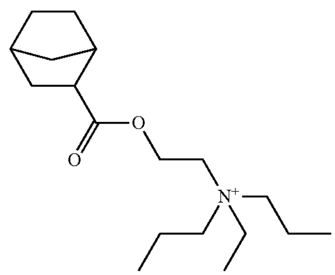
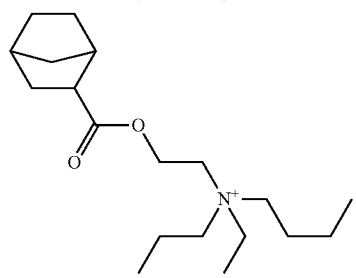
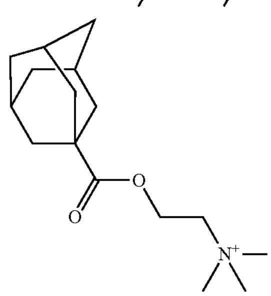
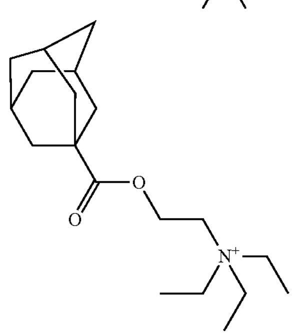
-continued
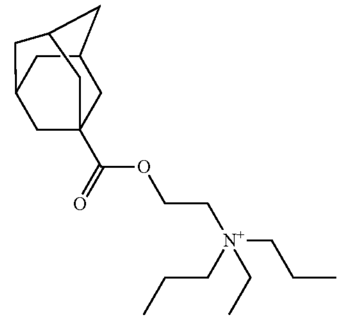
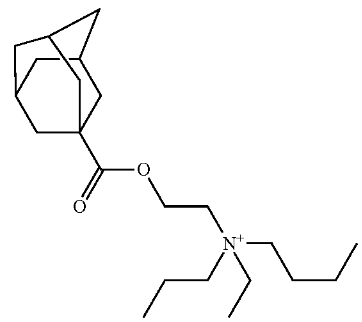
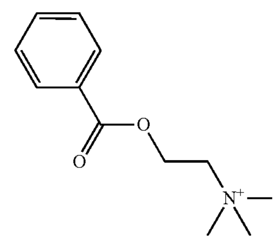
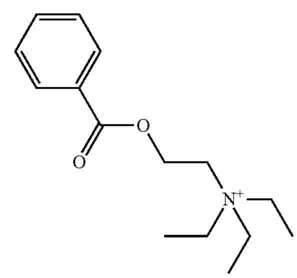
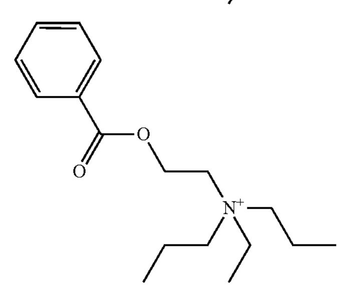
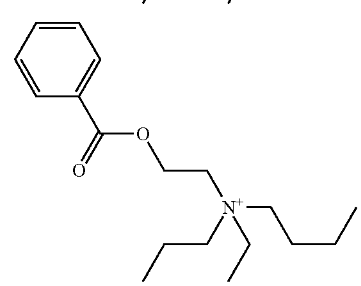

-continued
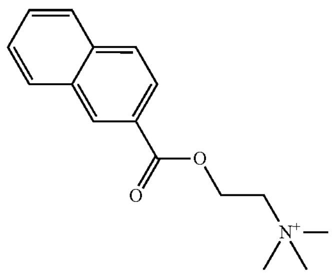
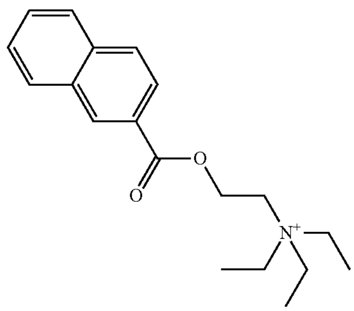
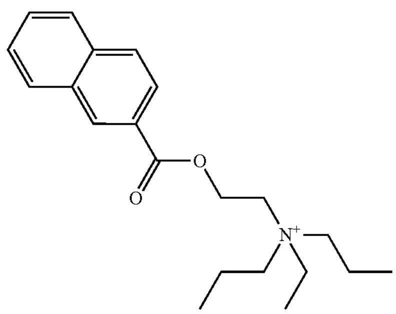
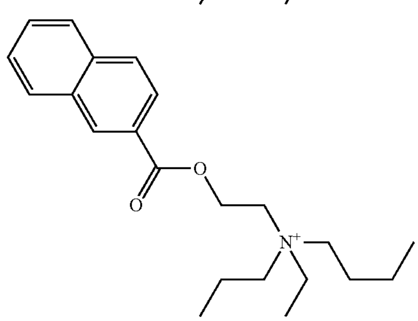
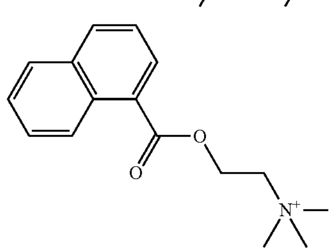
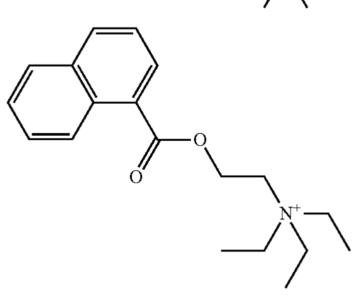
-continued
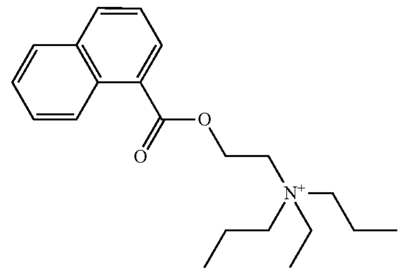
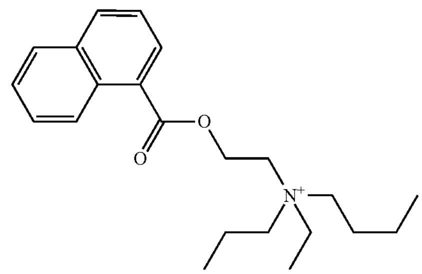
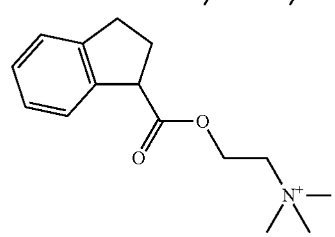
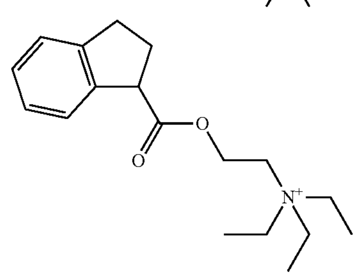
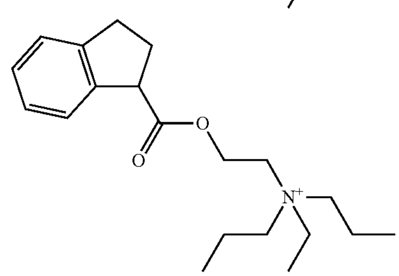
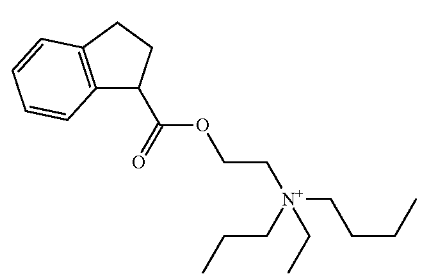

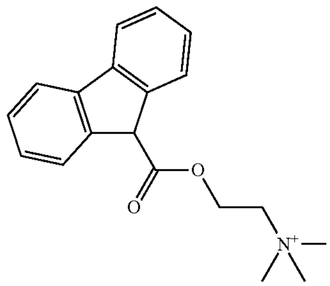
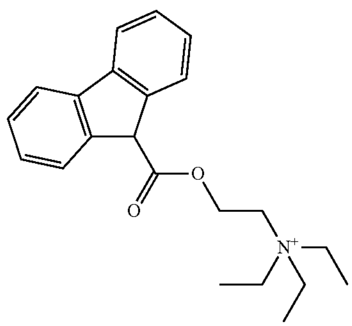
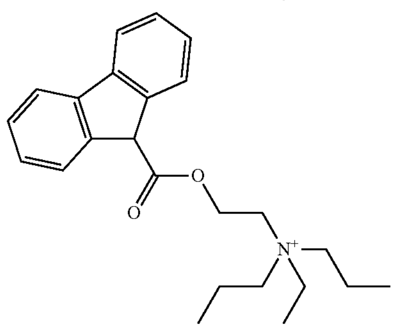
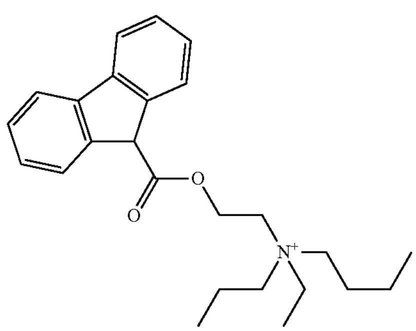
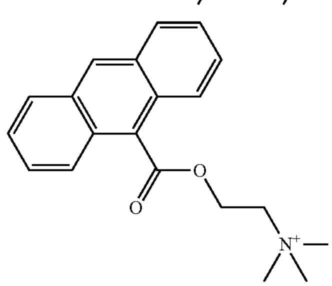
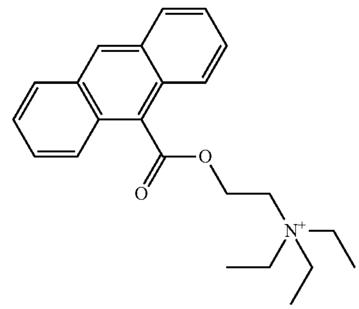
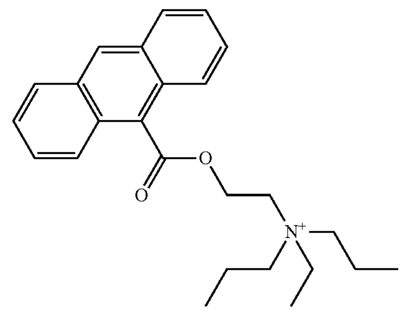
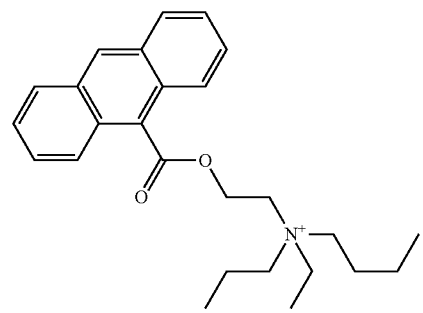
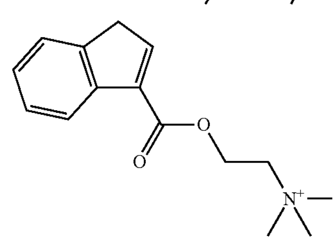
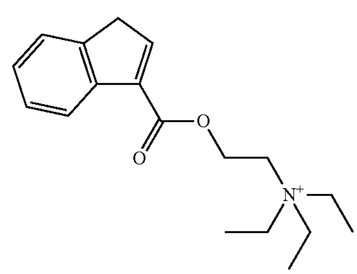
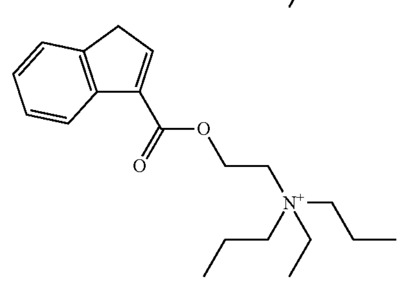

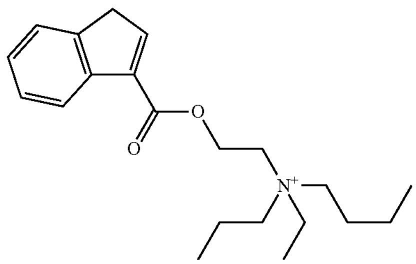
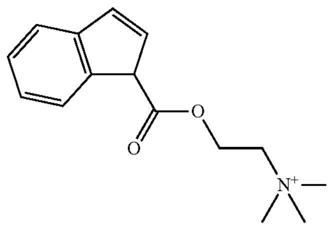
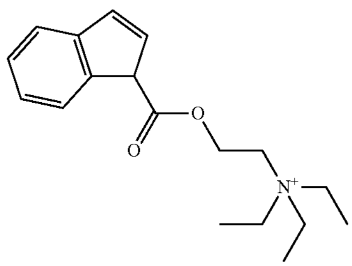
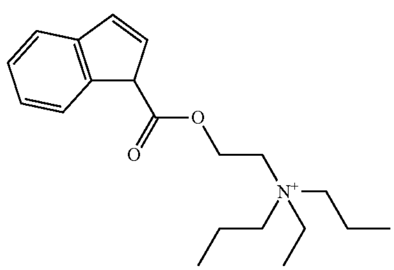
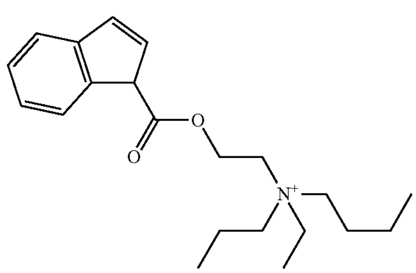
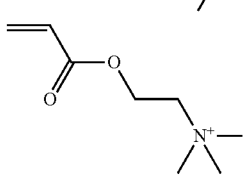
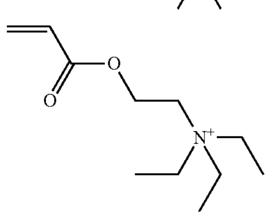
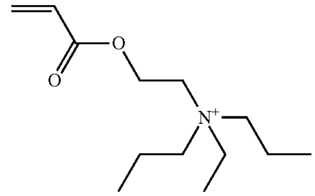
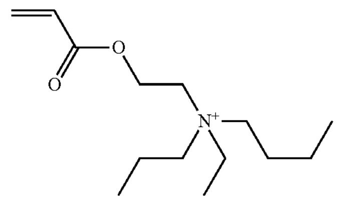
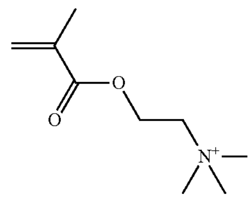
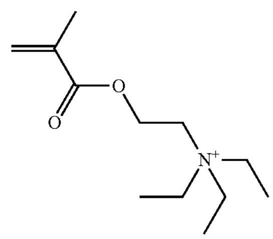
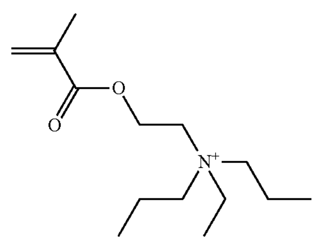
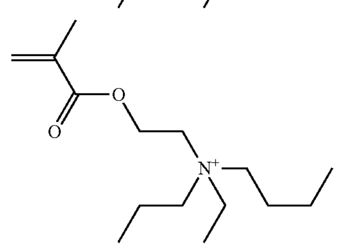
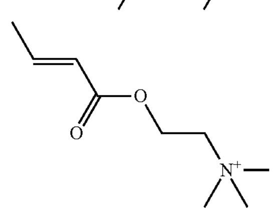
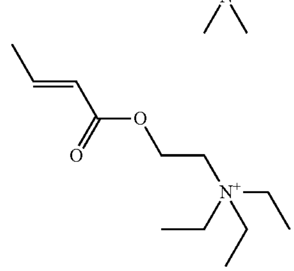

-continued
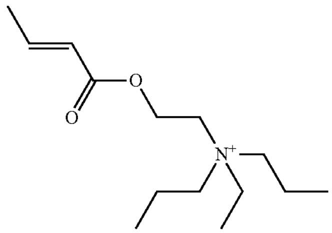
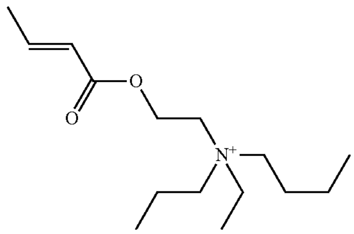
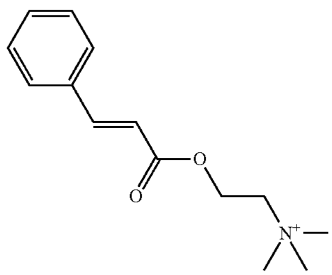
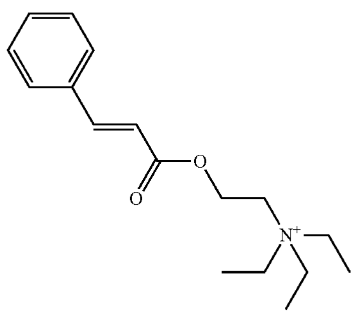
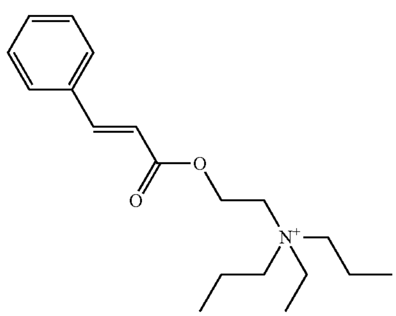
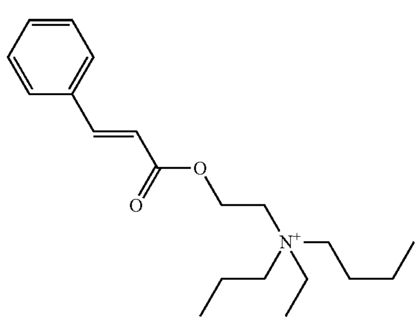
-continued
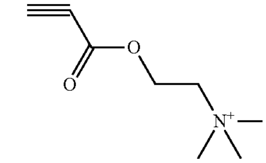
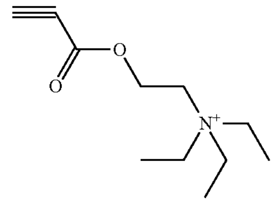
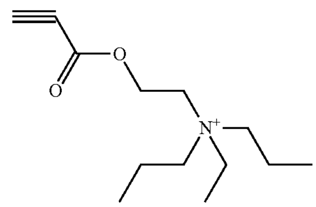
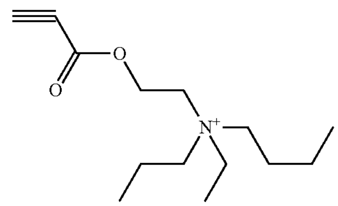
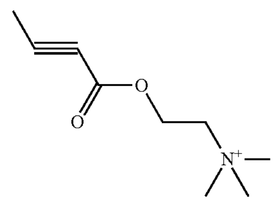
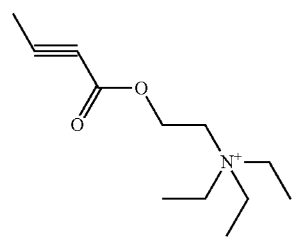
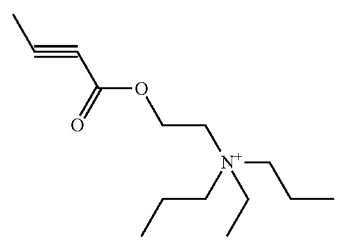
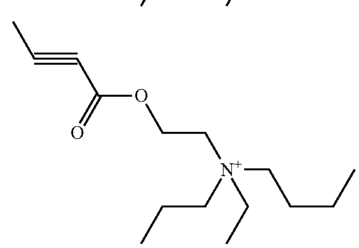

-continued
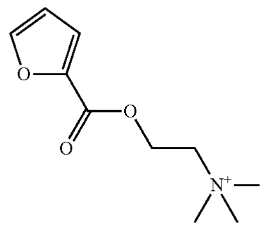
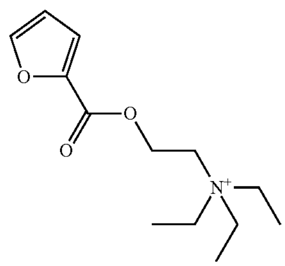
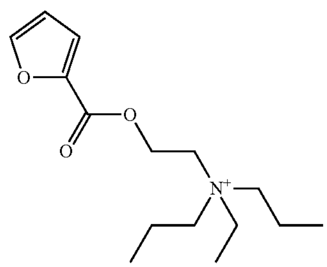
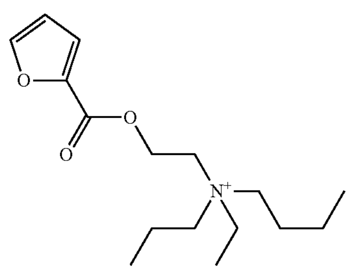
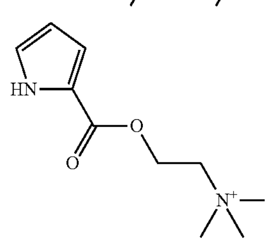
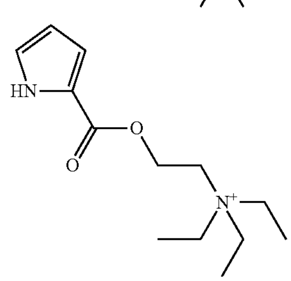
-continued
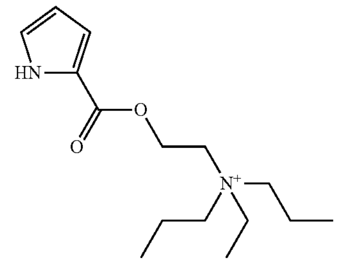
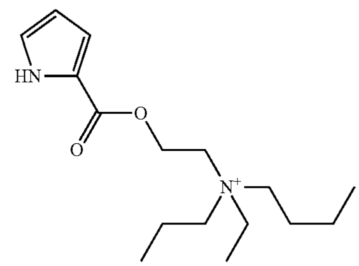
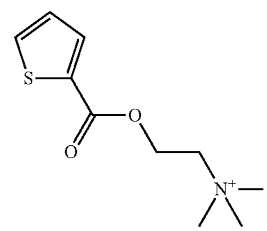
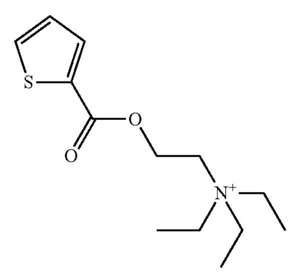
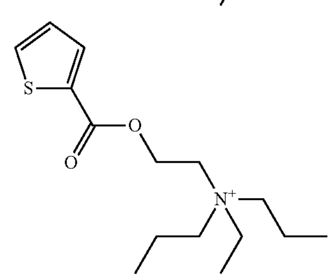
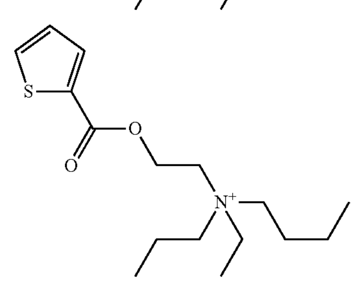

-continued
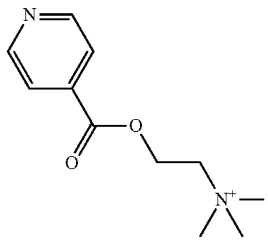
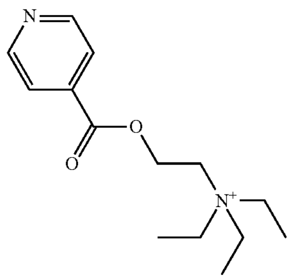
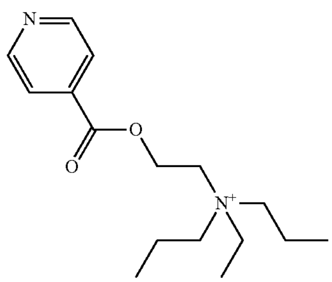
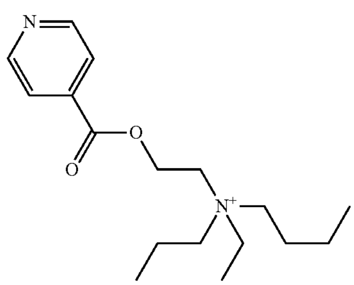
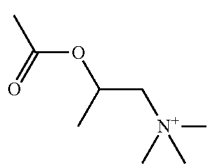
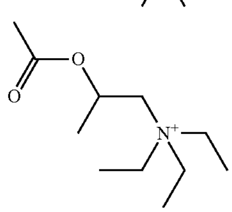
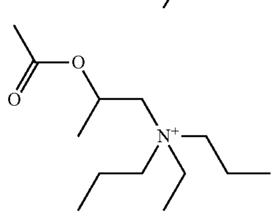
-continued
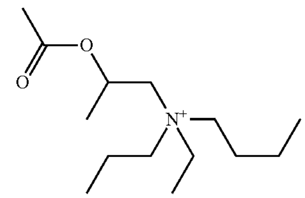
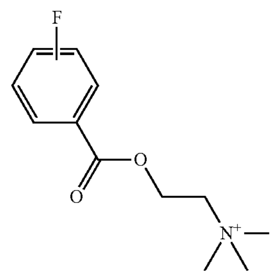
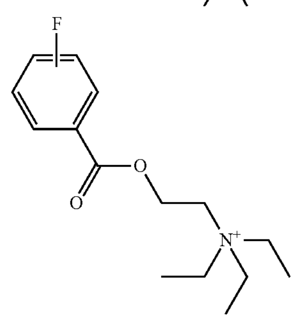
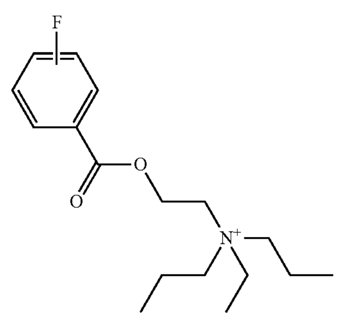
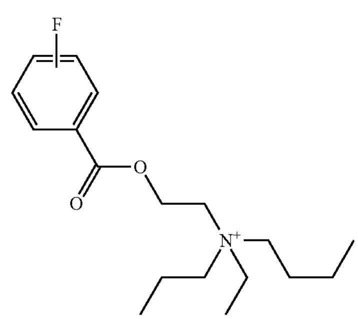

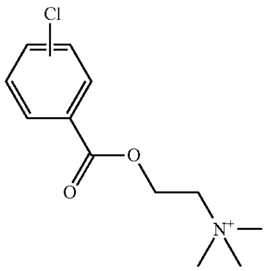
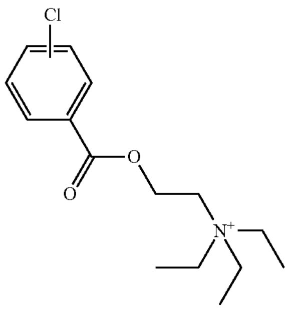
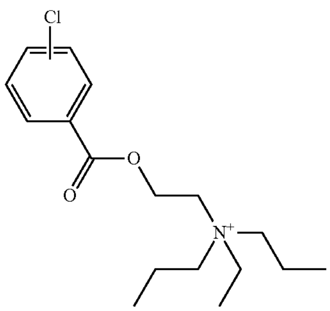
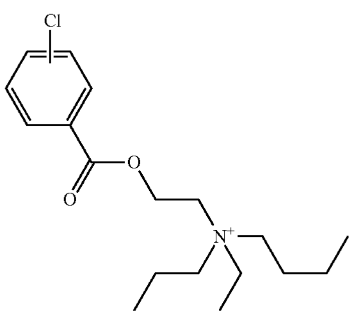
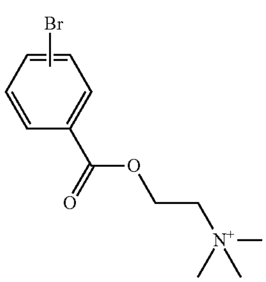
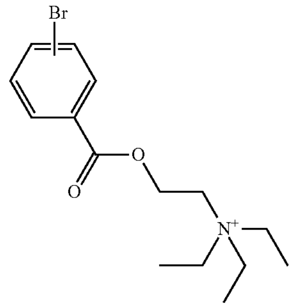
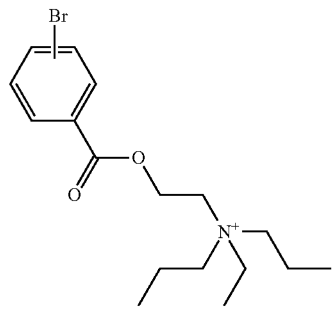
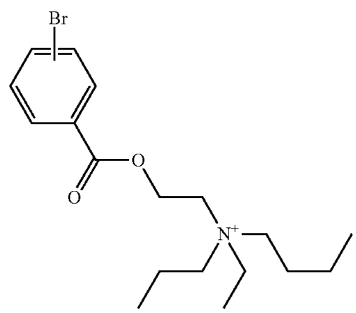
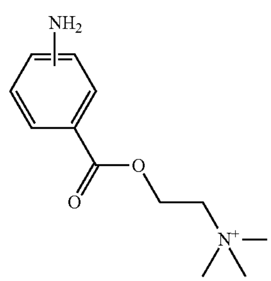
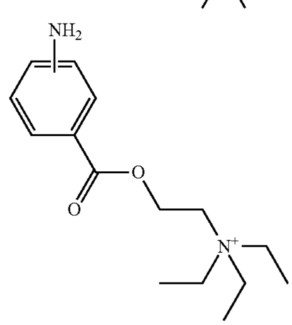

-continued
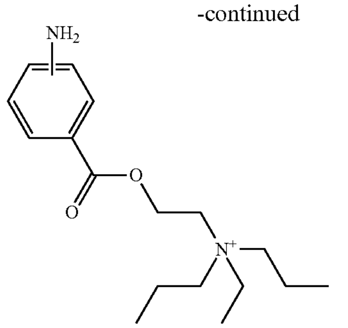
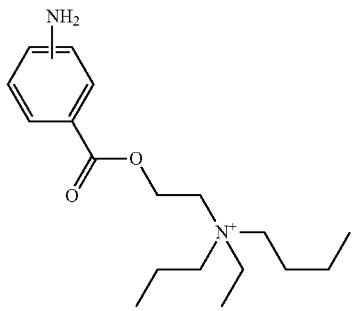
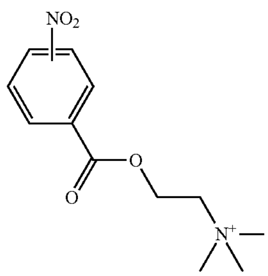
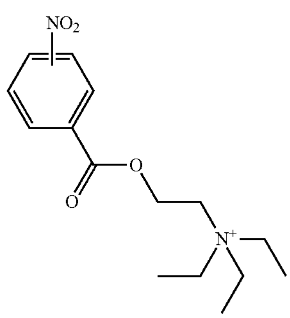
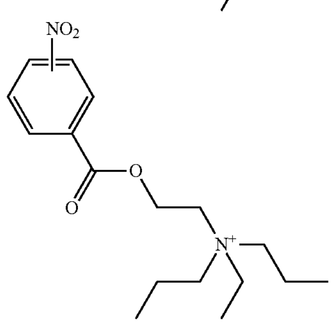
-continued
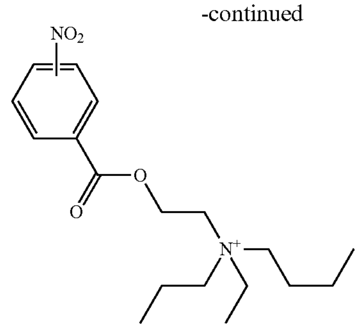
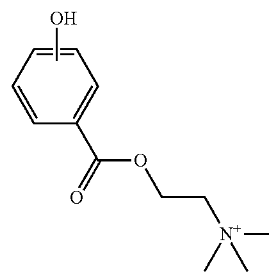
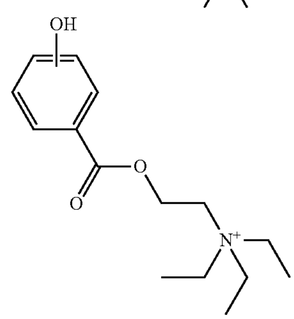
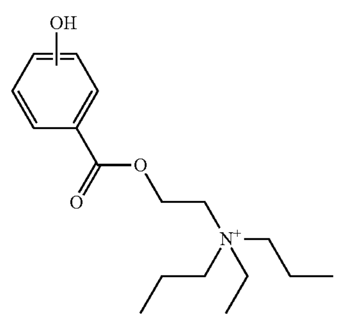
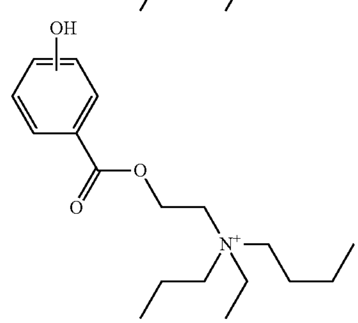

-continued
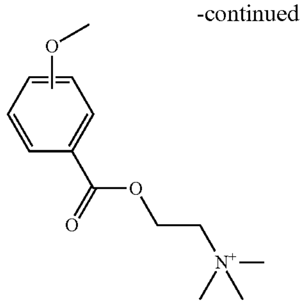
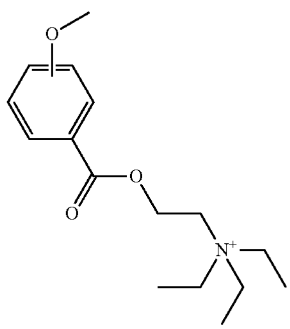
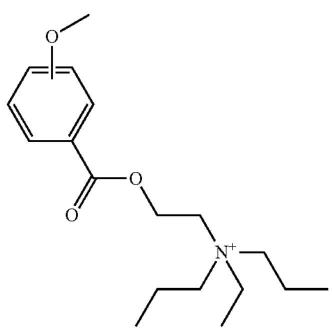
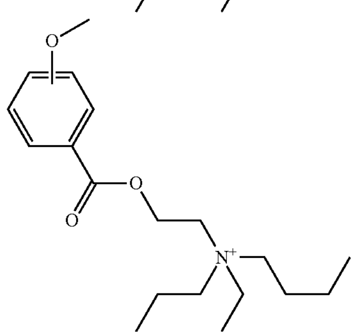
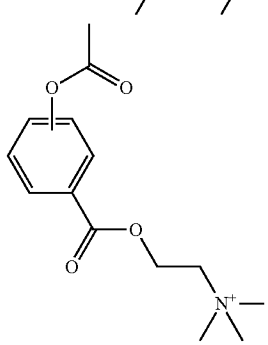
-continued
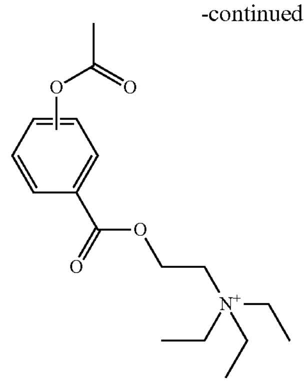
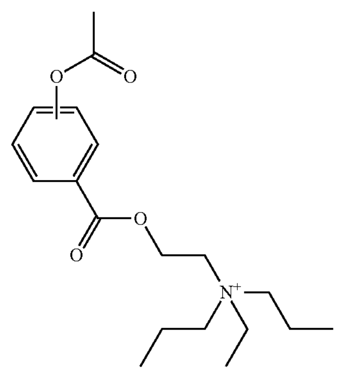
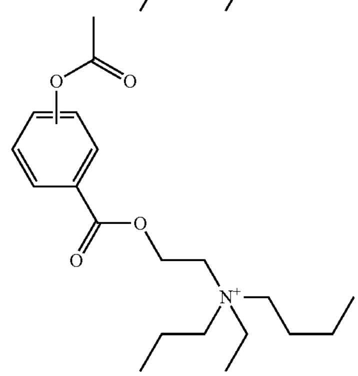
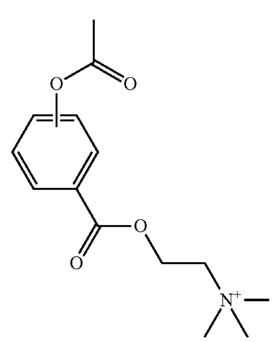

-continued
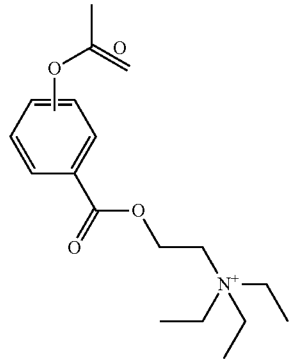
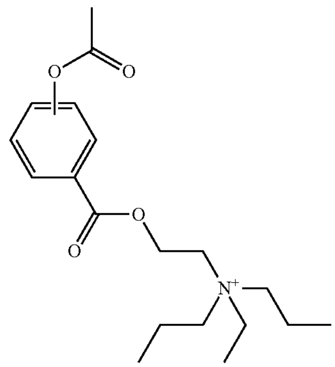
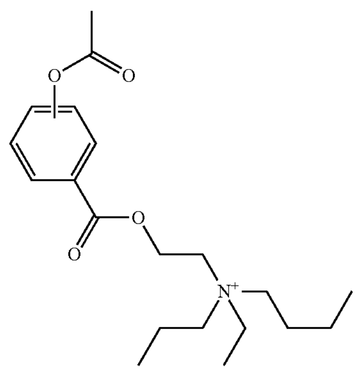
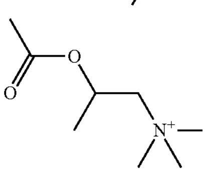
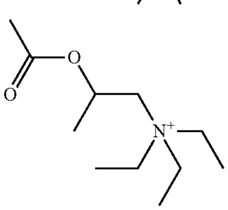
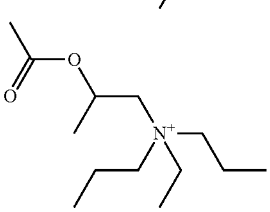
-continued
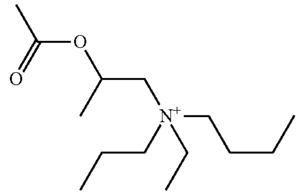 [SMILES: CCCC[N+](CC)(CCC)CC(C)OC(C)=O]
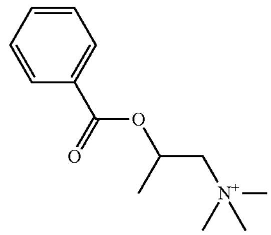
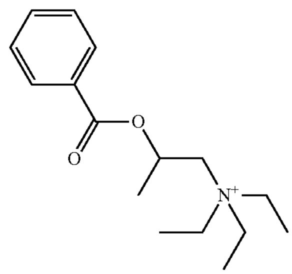
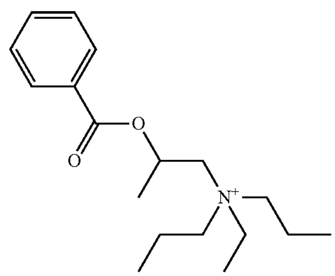
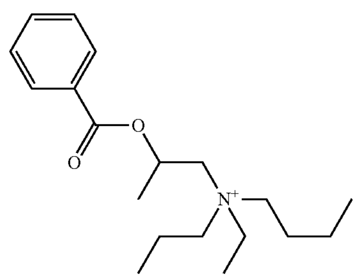
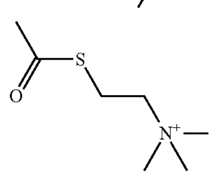
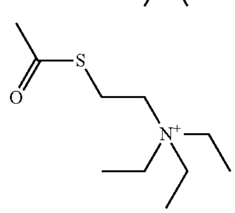

-continued
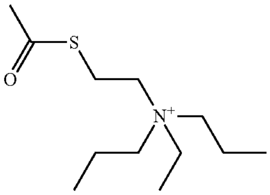
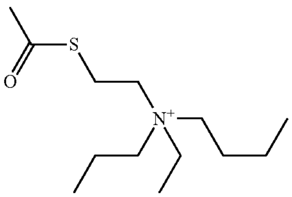
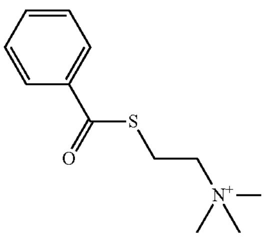
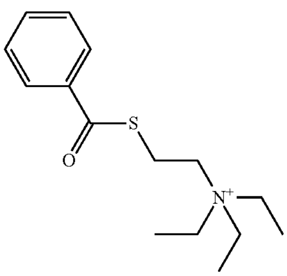
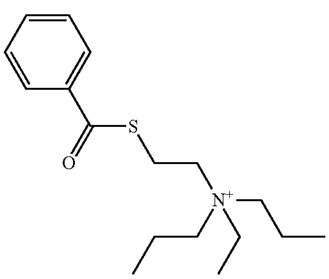
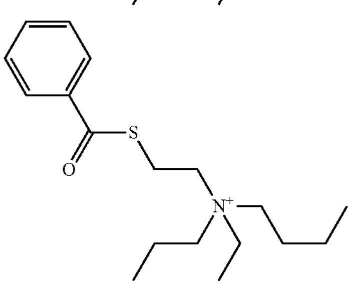
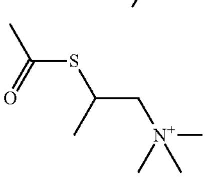
-continued
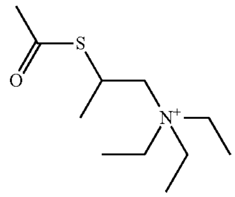
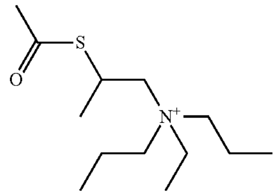
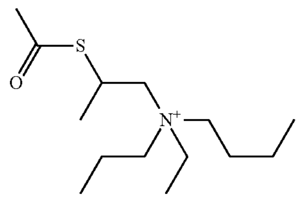
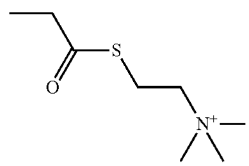
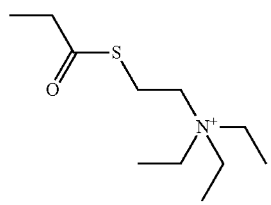
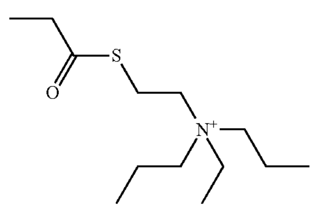
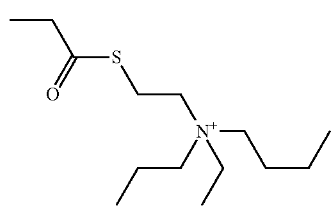
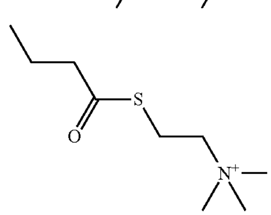

-continued
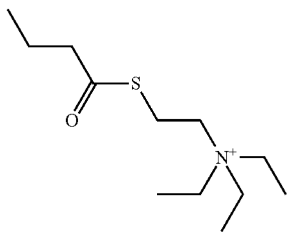
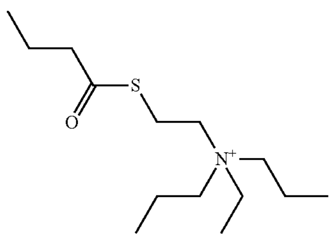
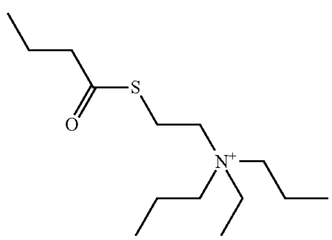
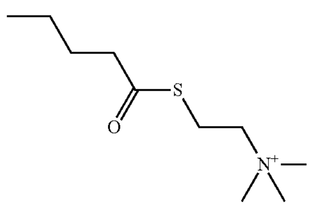
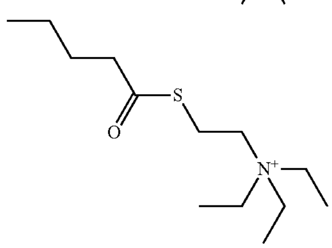
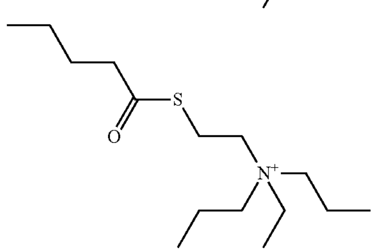
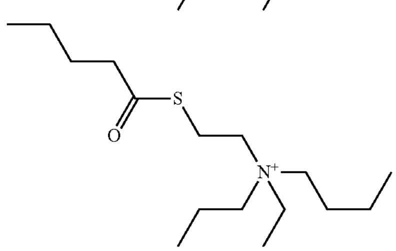
-continued
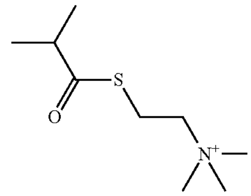
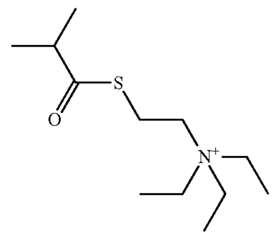
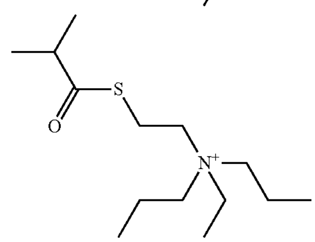
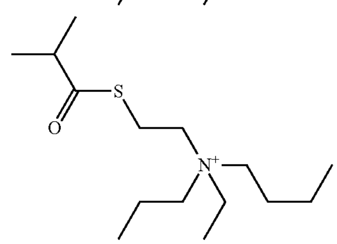
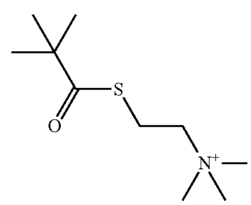
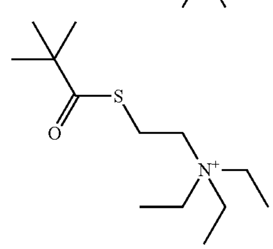
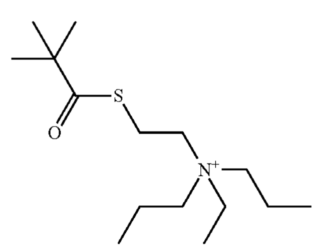

-continued
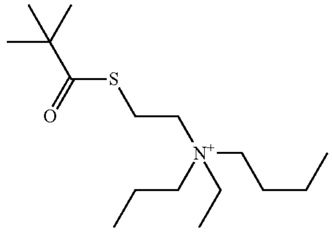
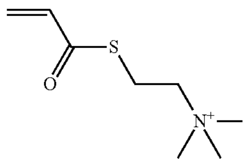
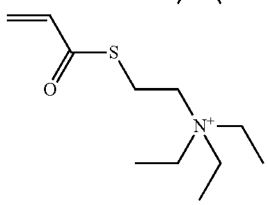
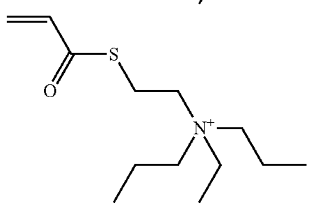
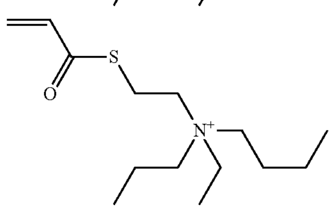
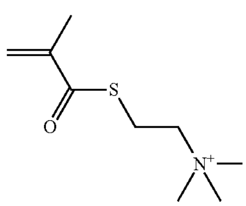
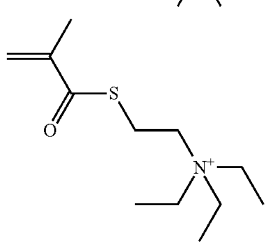
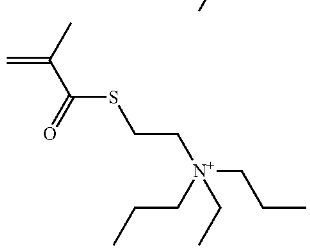
-continued
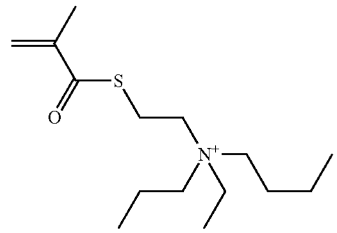
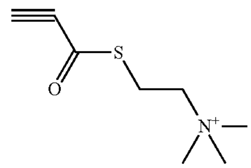
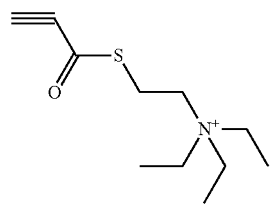
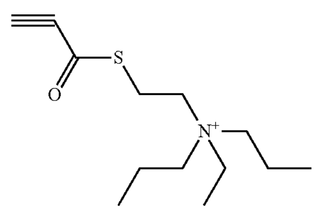
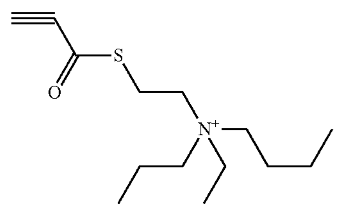
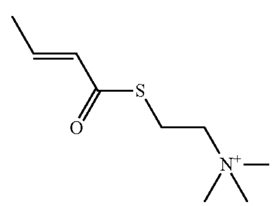
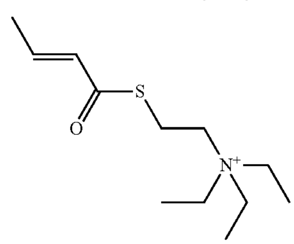
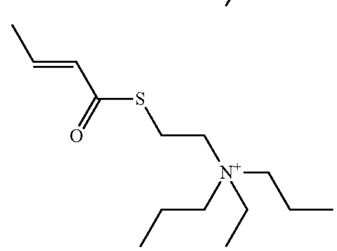

-continued
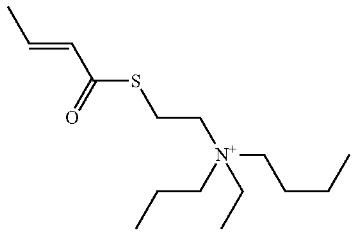
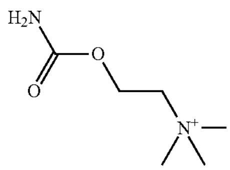
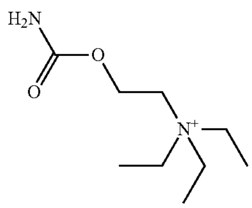
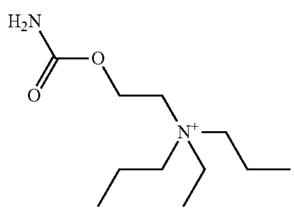
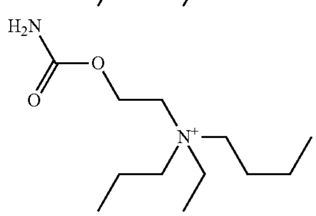
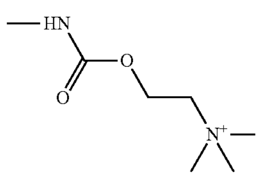
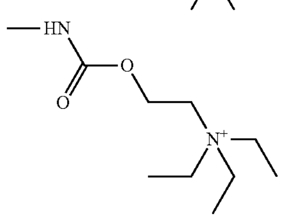
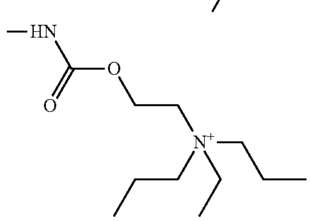
-continued
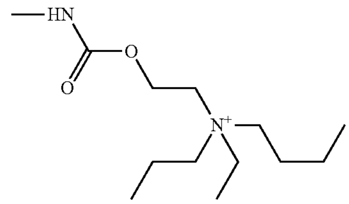
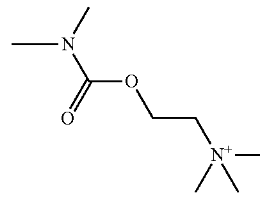
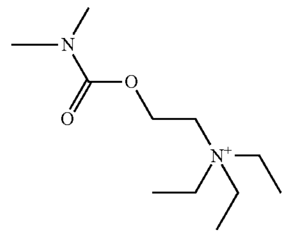
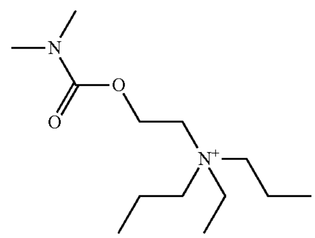
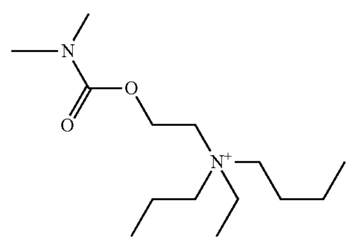
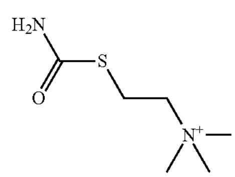
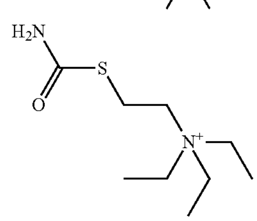
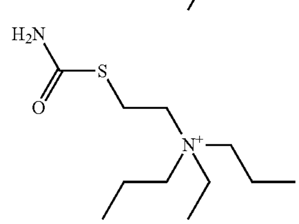

-continued
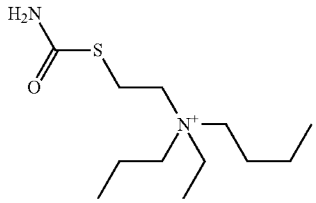
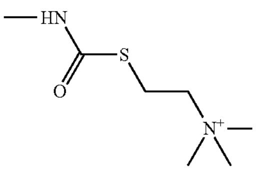
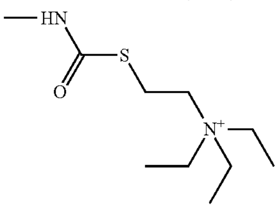
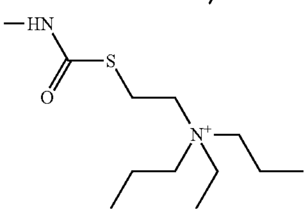
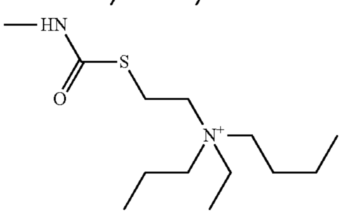
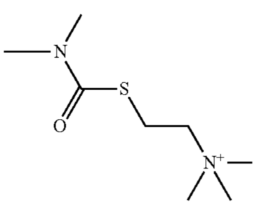
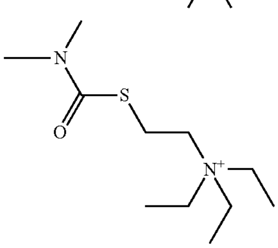
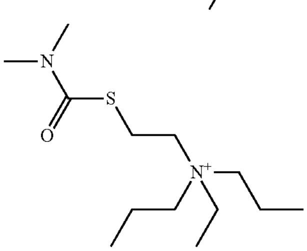
-continued
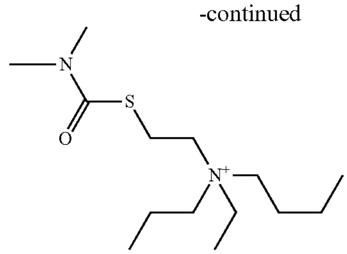
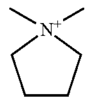
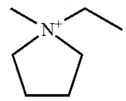
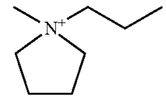
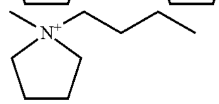
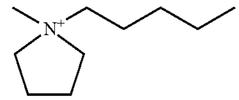
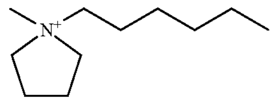
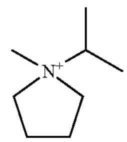
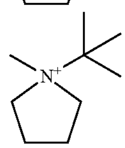
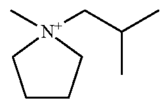
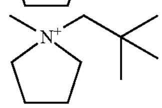
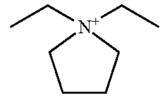
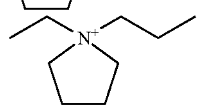
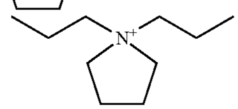
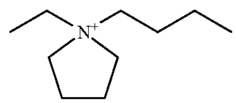
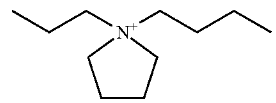
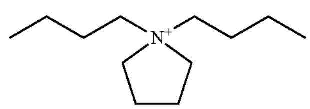
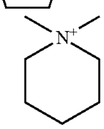
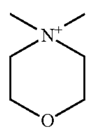
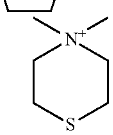
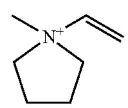
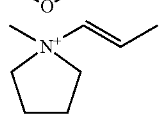
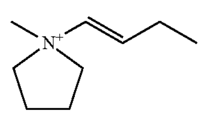
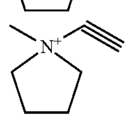
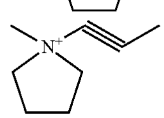
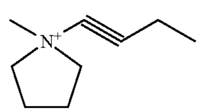
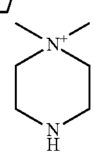
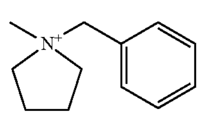
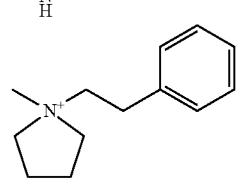

-continued
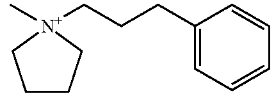
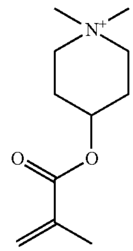
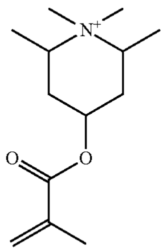
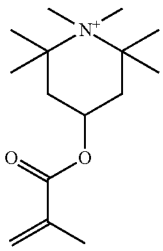
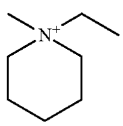
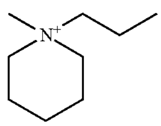
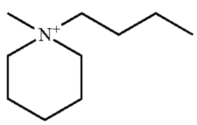
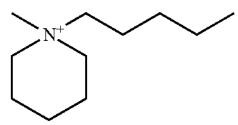
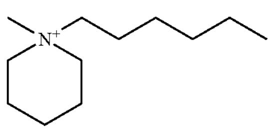
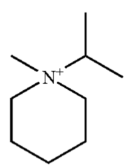
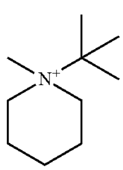
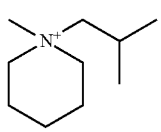
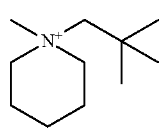
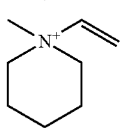
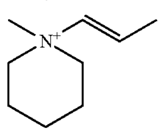
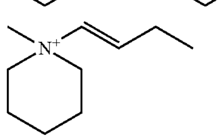
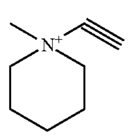
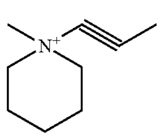
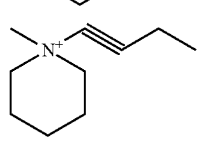
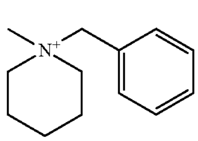
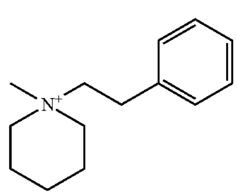
-continued
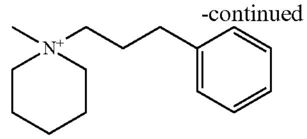
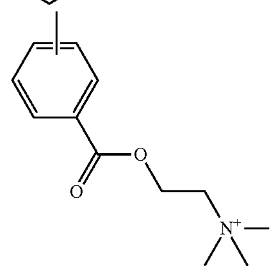
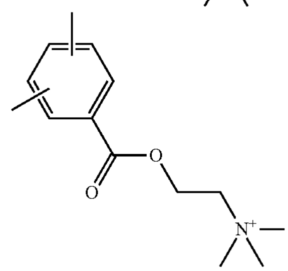
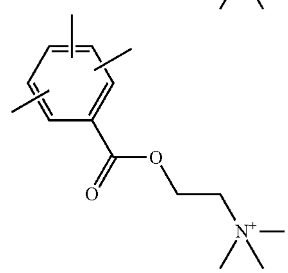
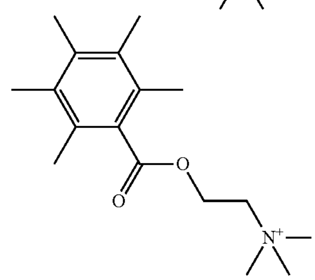
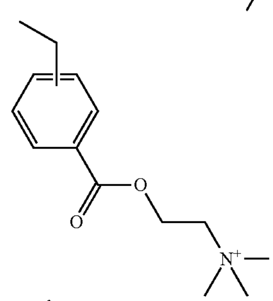
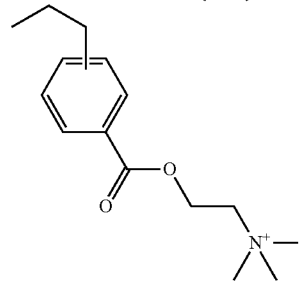

-continued
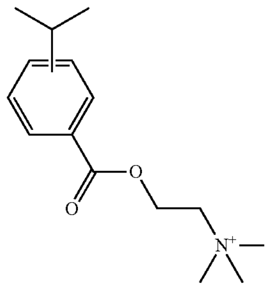
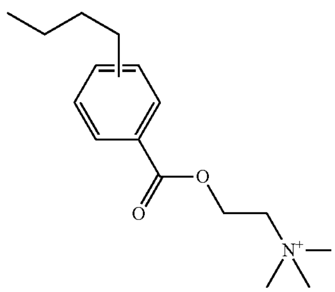
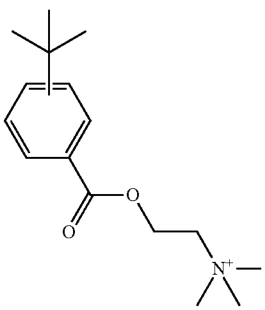
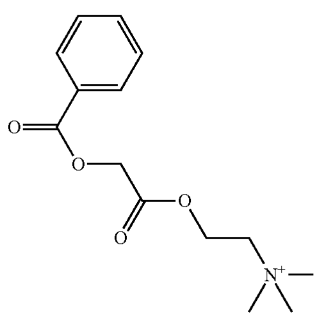
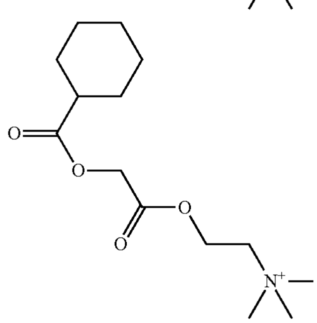
-continued
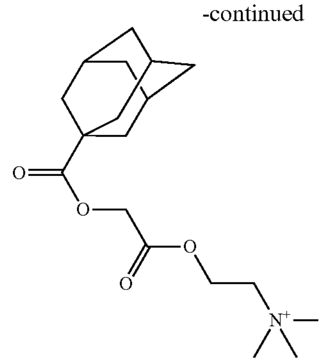
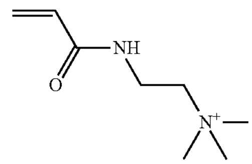
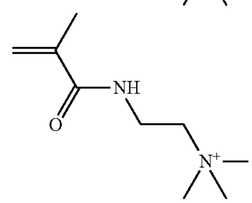
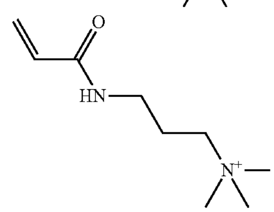
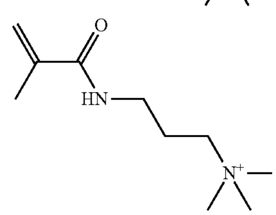
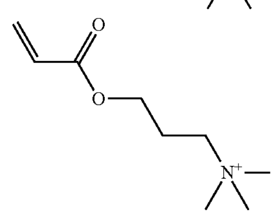
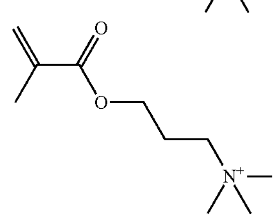
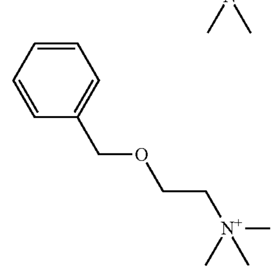

-continued
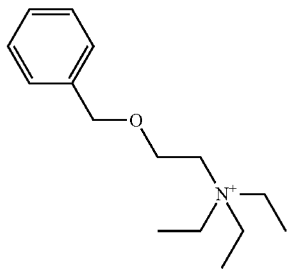
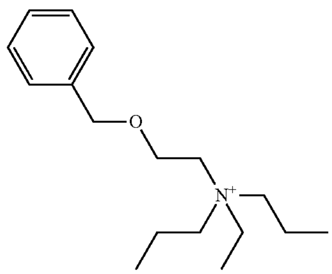
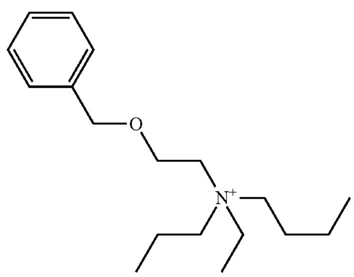
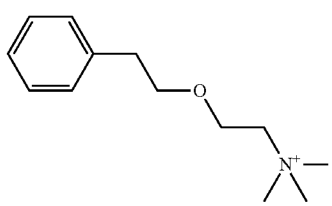
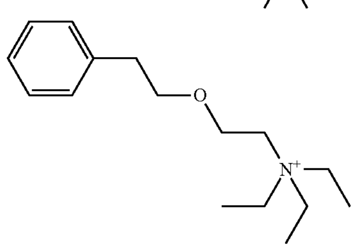
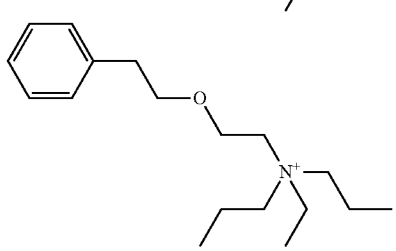
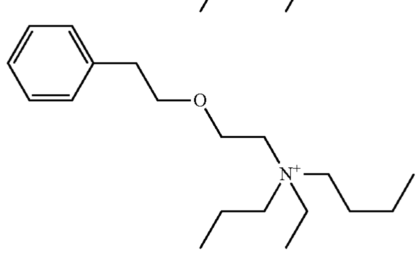
-continued
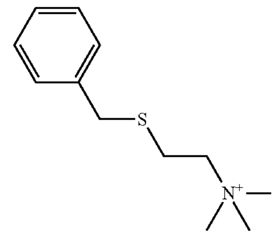
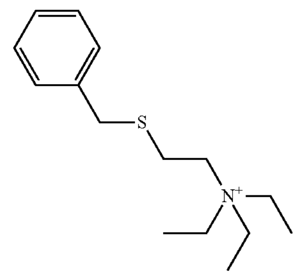
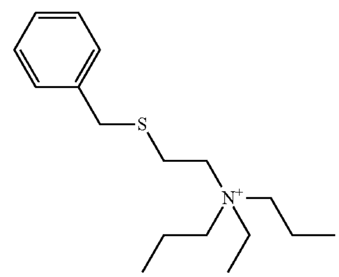
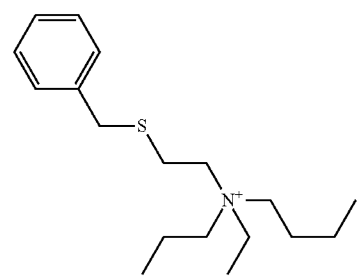
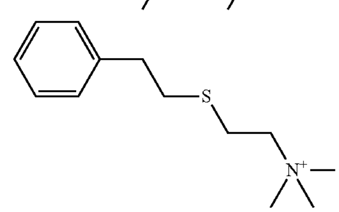
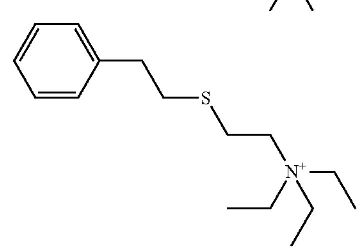
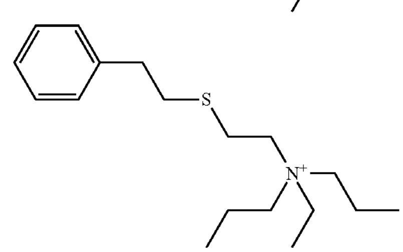

-continued
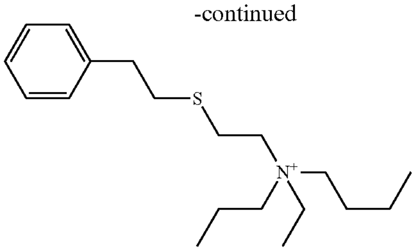
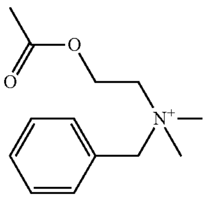
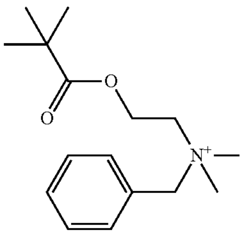
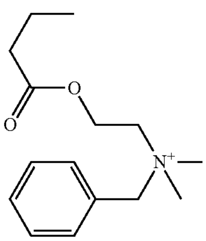
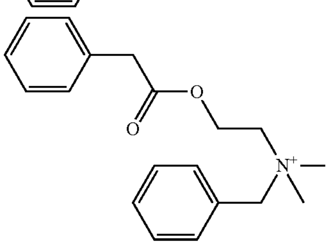
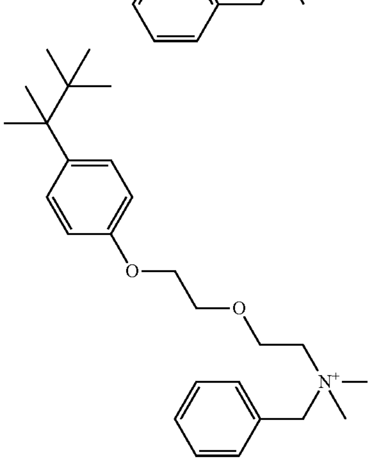
-continued
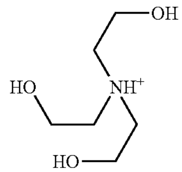
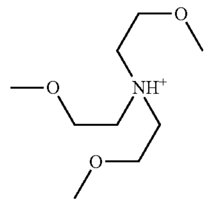
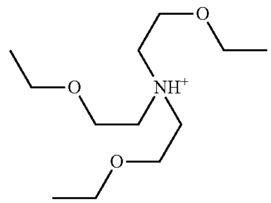
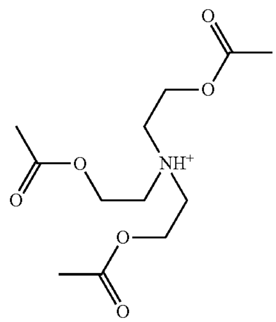
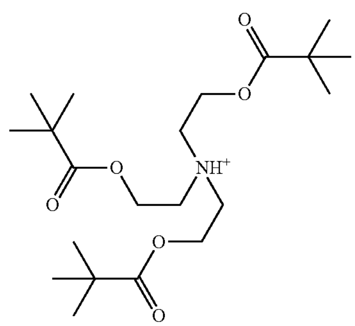
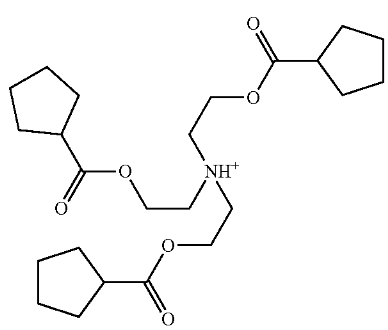
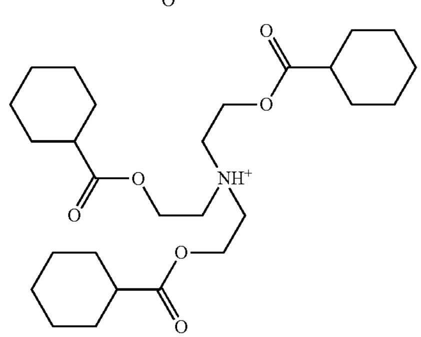

-continued
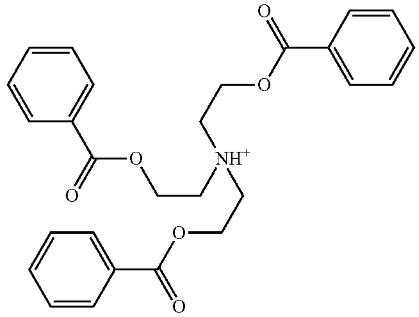
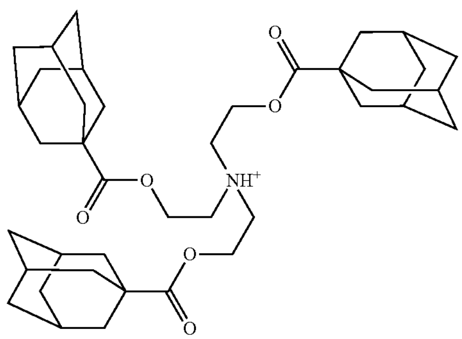
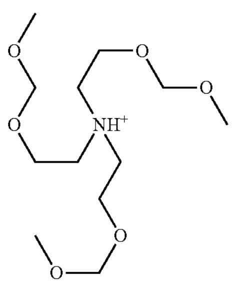
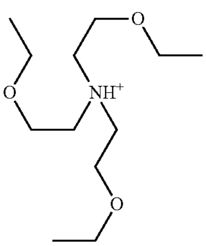
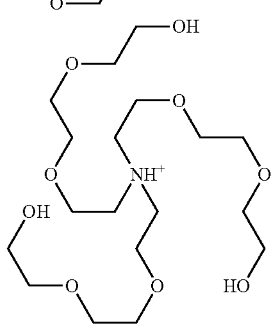
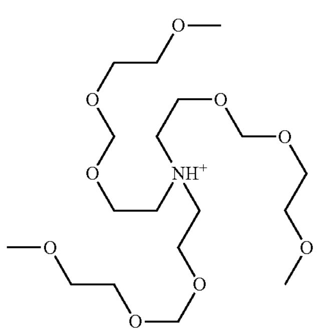
-continued
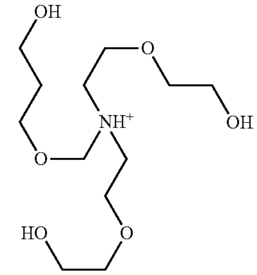
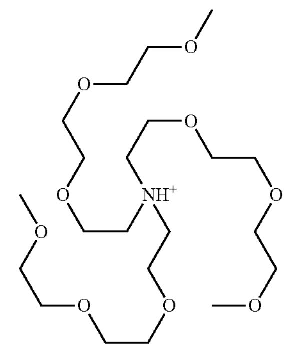
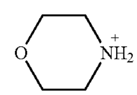
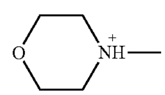
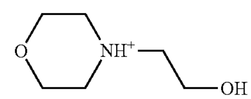
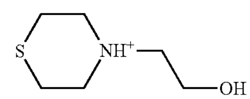
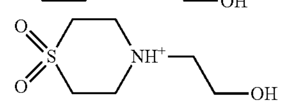
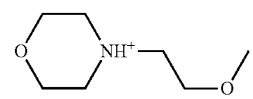
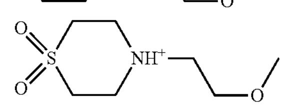
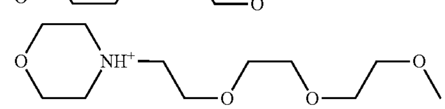
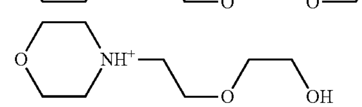
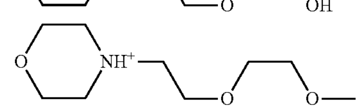
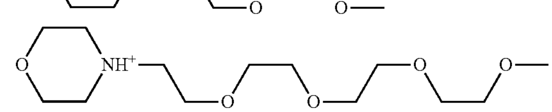
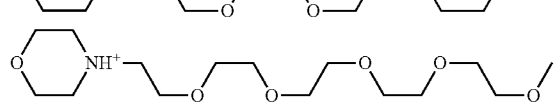
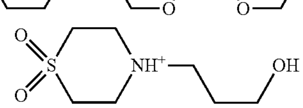
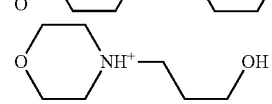

-continued

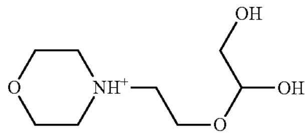

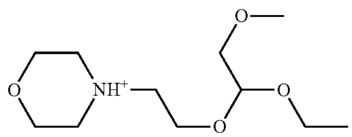

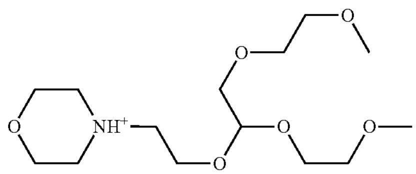

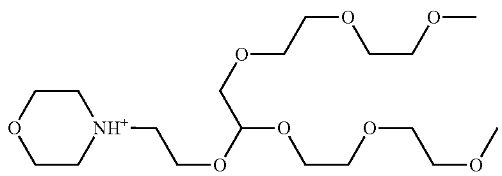

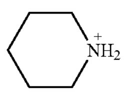

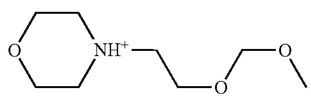

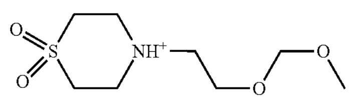

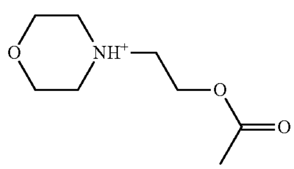

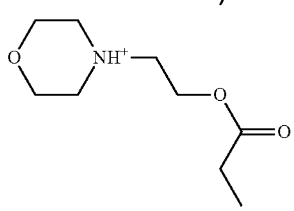

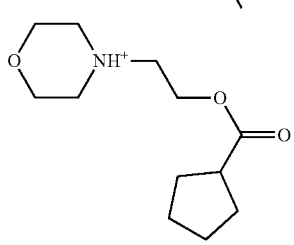

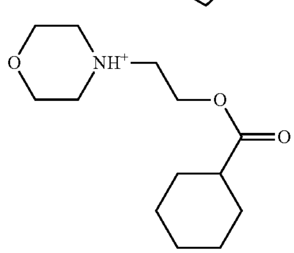

-continued

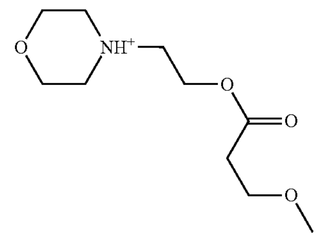

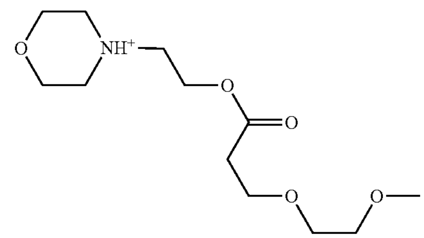

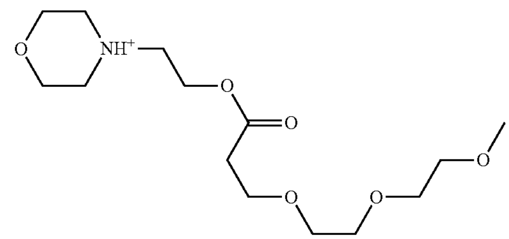

As the ammonium ion represented by the above-mentioned general formula (3), a tertiary or quaternary ammonium ion is particularly preferable.

(Repeating Unit "b")

The component (A) in the conductive wiring material composition of the present invention may have a repeating unit "b" for retaining the metal powder, in addition to the repeating units selected from the above-mentioned "a1" to "a7". For retaining the metal powder, it is preferable to have a polar group selected from a hydroxy group, a carboxyl group, an amino group, an amide group, a sulfonamide group, a urethane group, a urea group, a carbamate group, a β-keto ester group, a carbonate group, an ester group, an ether group and a lactone ring. The following units may be specifically exemplified. In the following, R represents a methyl group or a hydrogen atom.

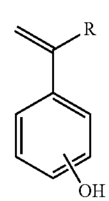

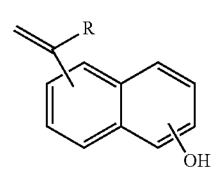

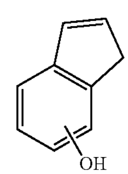

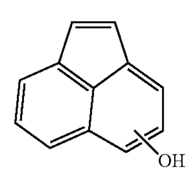

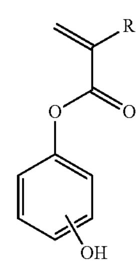

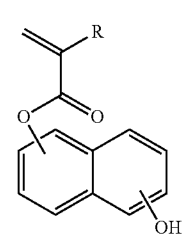

-continued
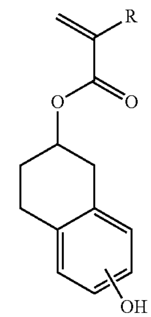
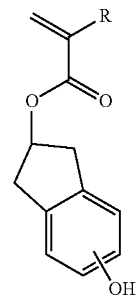
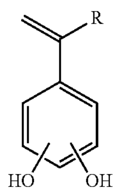
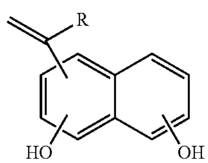
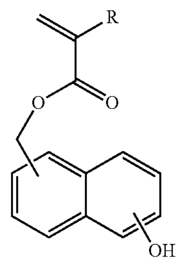
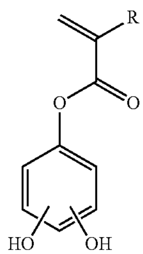
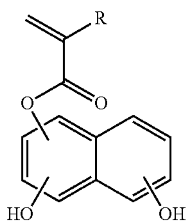
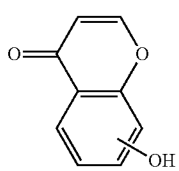
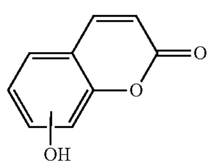
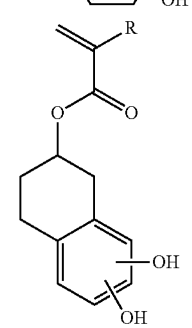
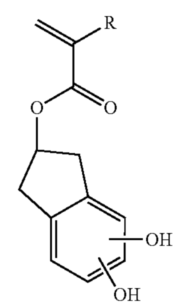
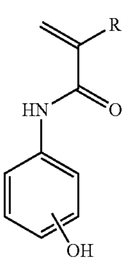
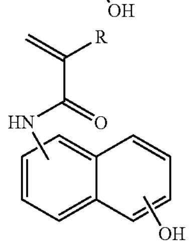
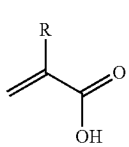
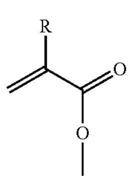
-continued
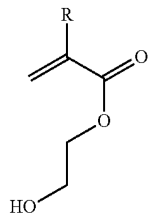
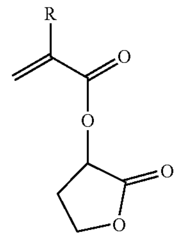
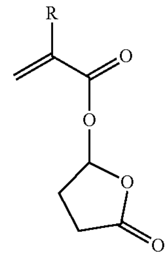
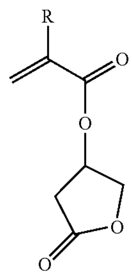
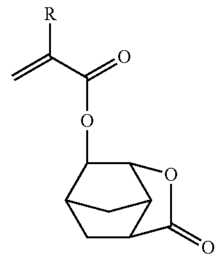
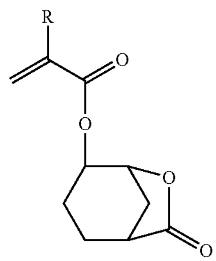
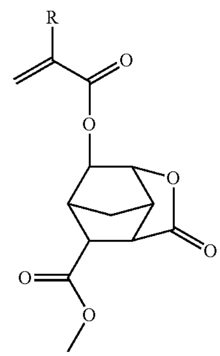
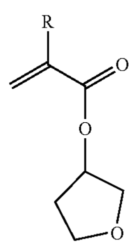
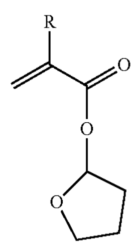
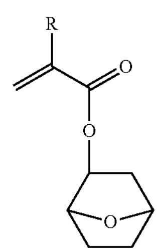
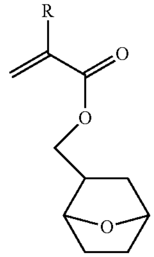
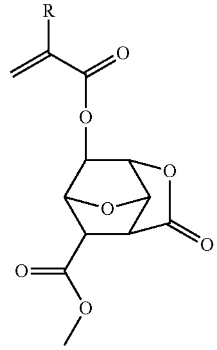

-continued
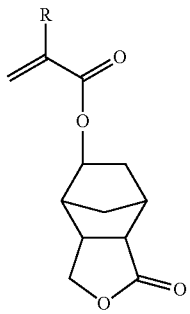
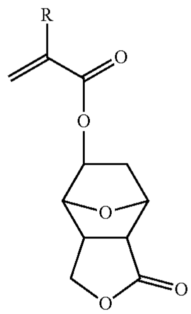
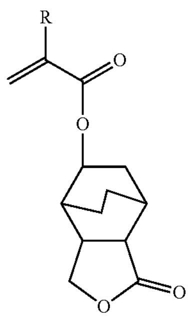
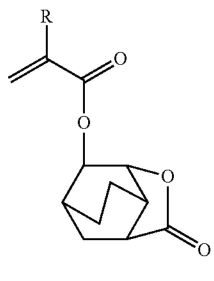
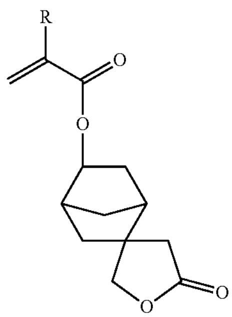
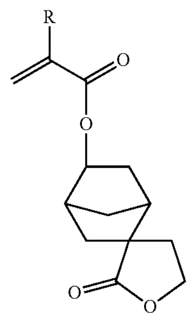
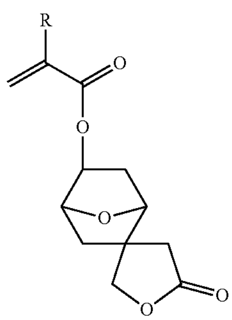
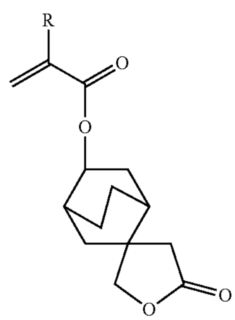
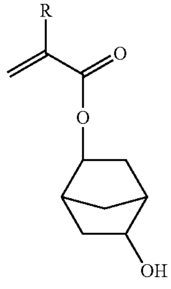
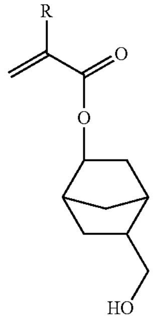
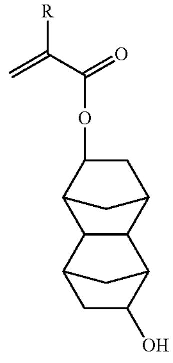
-continued
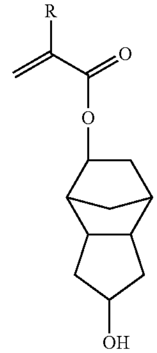
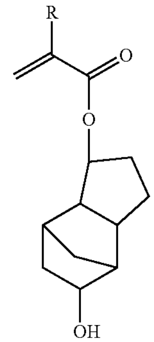
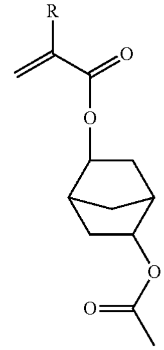
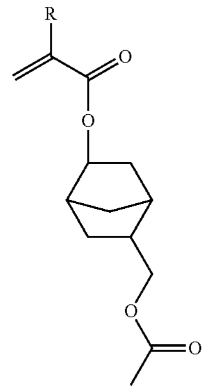
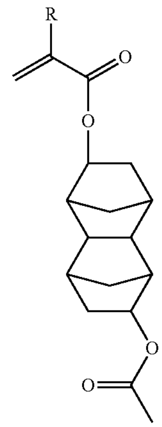
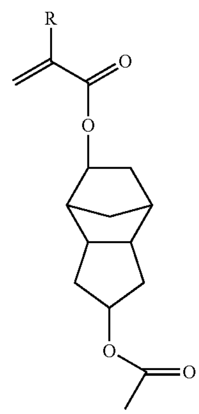
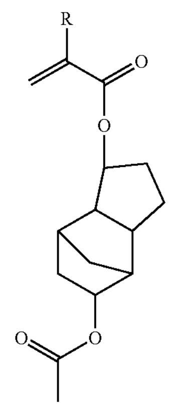
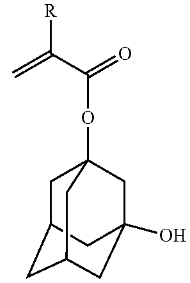
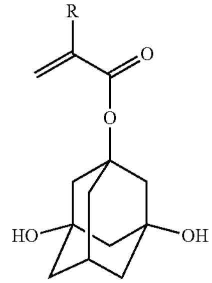

-continued
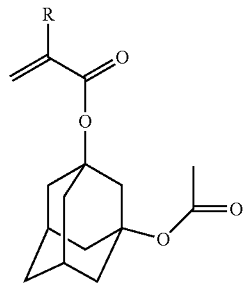
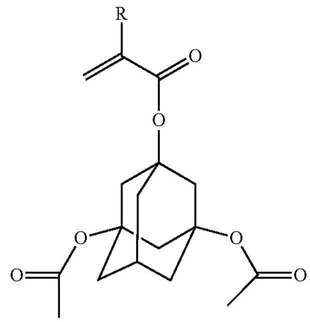
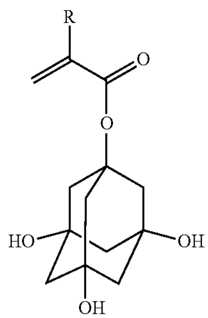
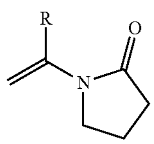
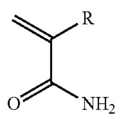
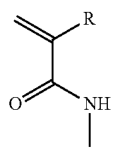
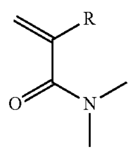
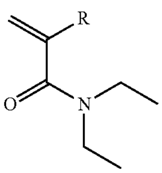
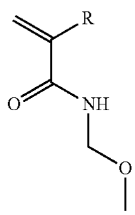
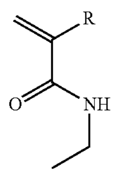
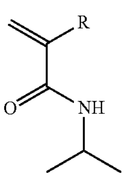
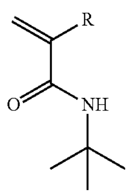
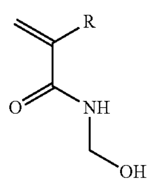
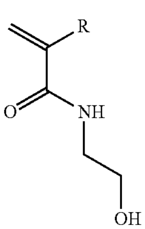
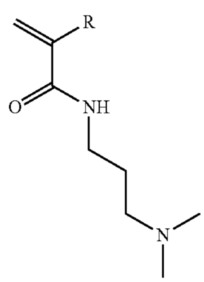
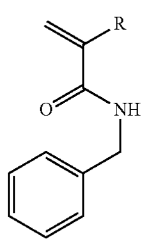
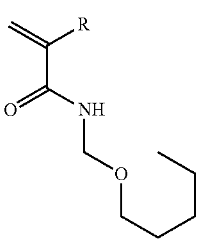
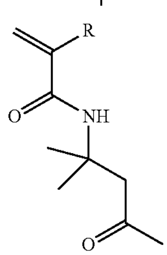
-continued
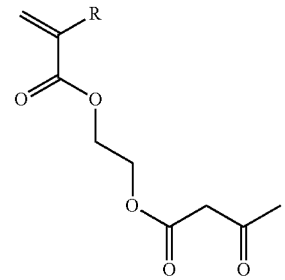
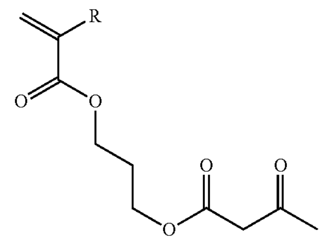
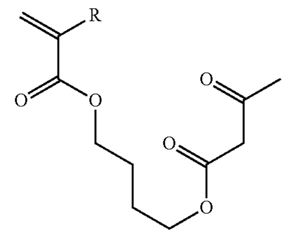
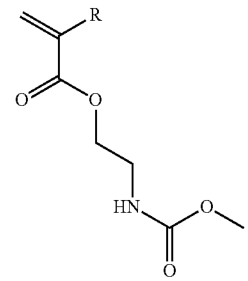
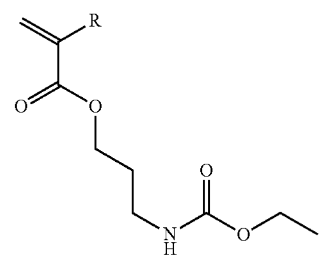
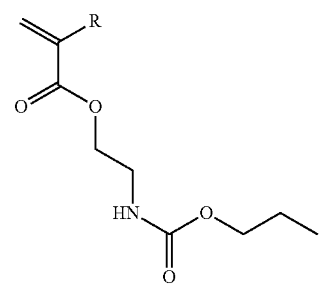
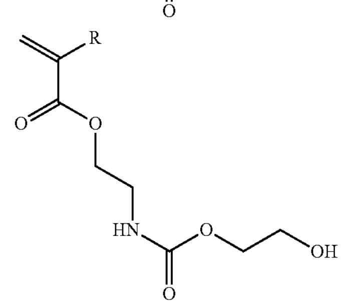

-continued
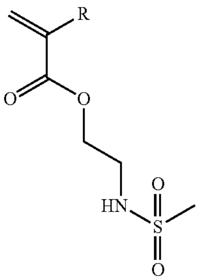
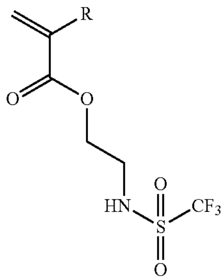
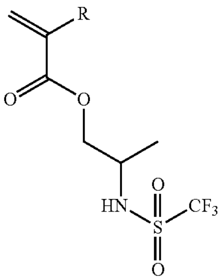
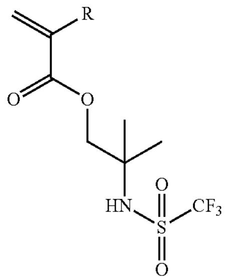
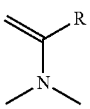
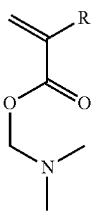
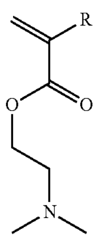
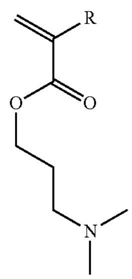
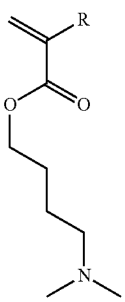
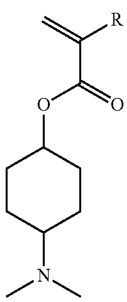
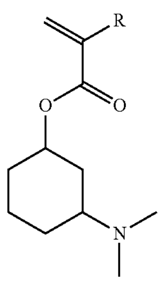
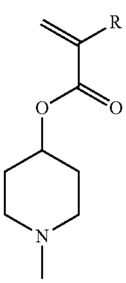
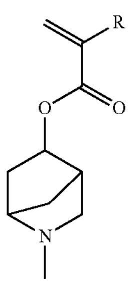
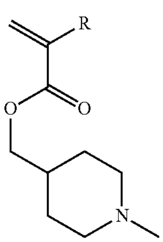
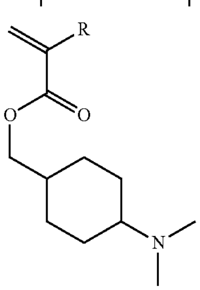
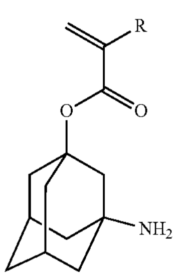
-continued
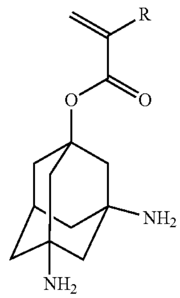
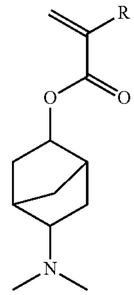
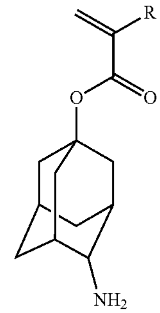
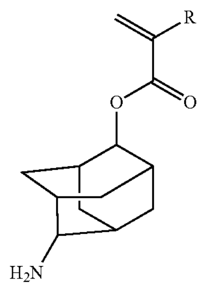
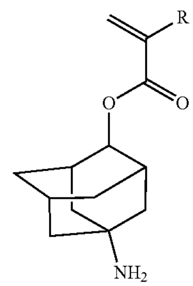
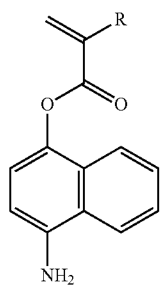
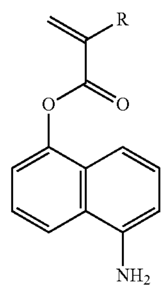
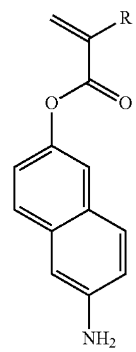
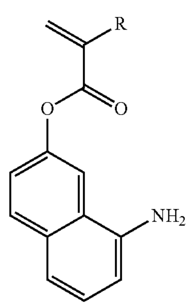
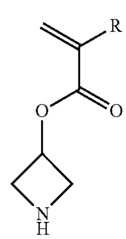
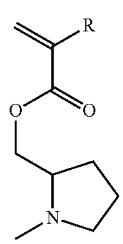
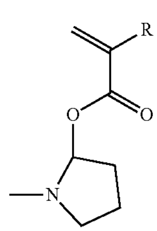
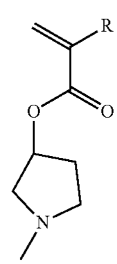
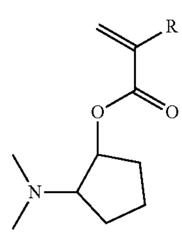

-continued

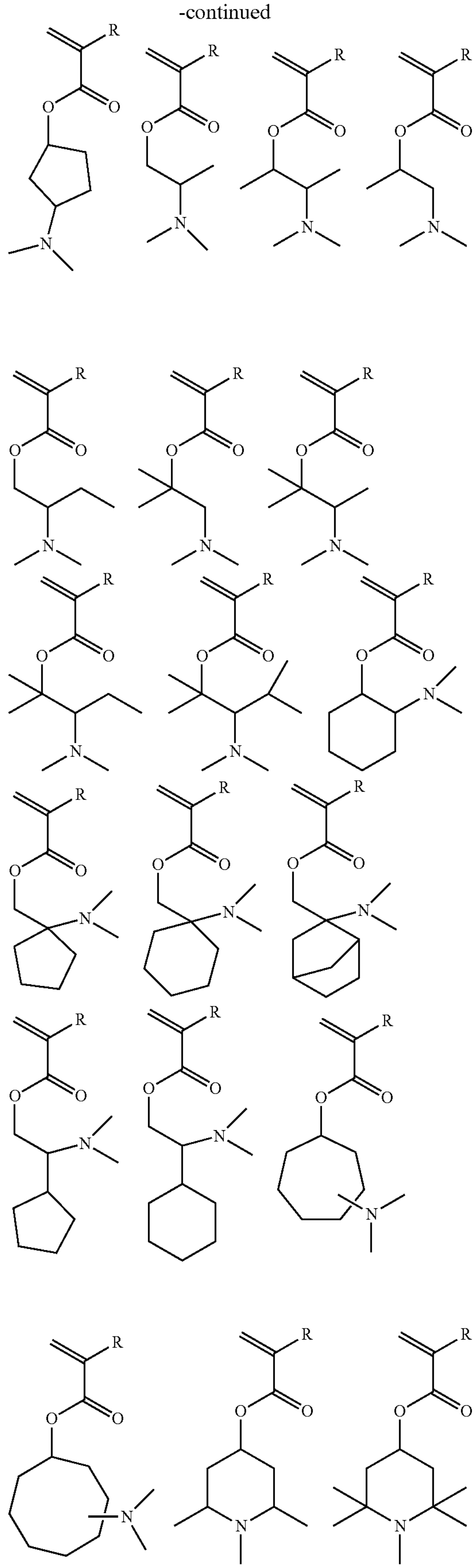

-continued

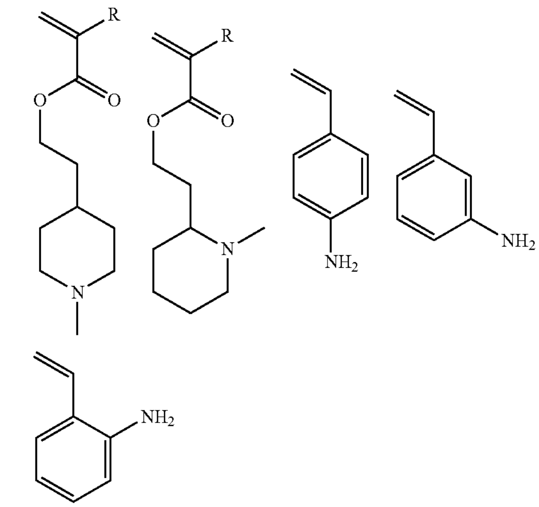

(Repeating Unit "c)

The component (A) in the conductive wiring material composition of the present invention may have a repeating unit "c" which has silicon, in addition to the repeating unit "a" selected from the above-mentioned "a1" to "a7", and the above-mentioned "b". The following units may be specifically exemplified. In the following, "n" is 0 to 100.

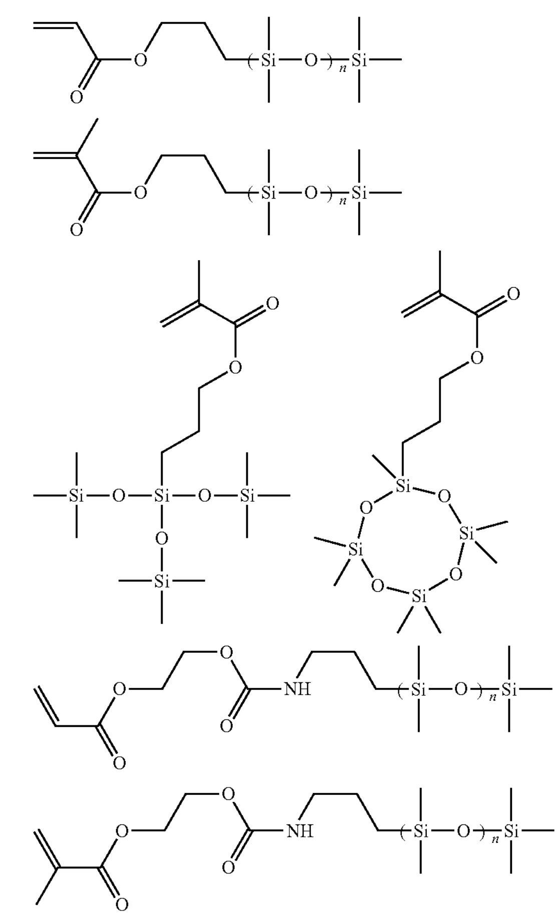

-continued
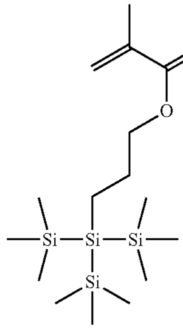
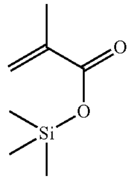
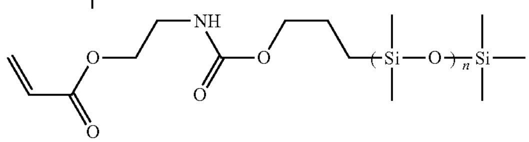
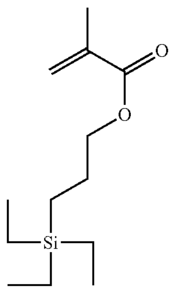
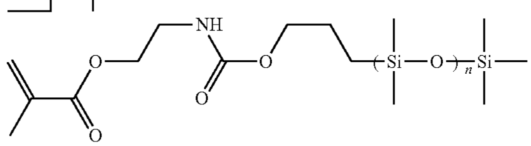
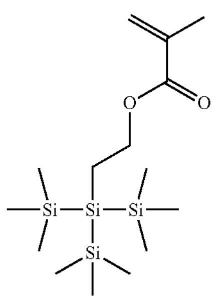
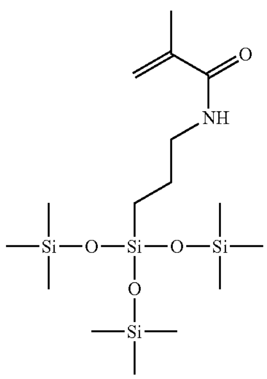
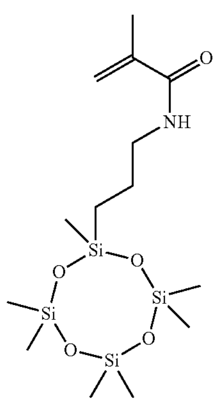
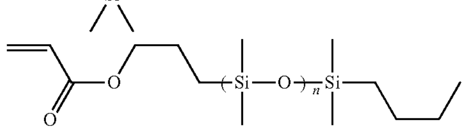
-continued
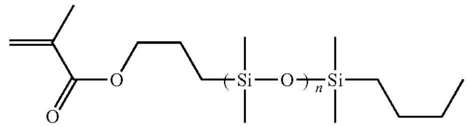
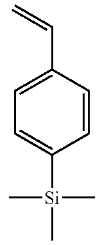
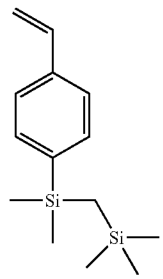
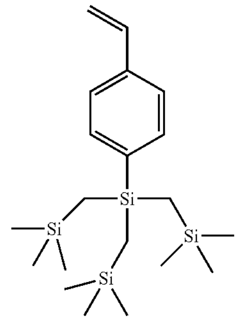
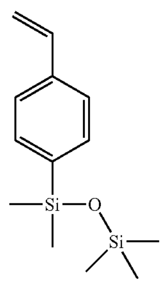
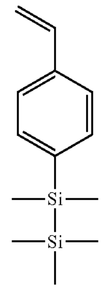
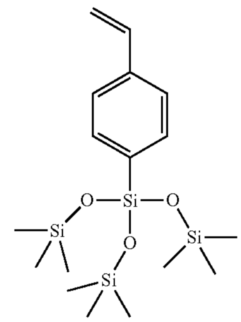
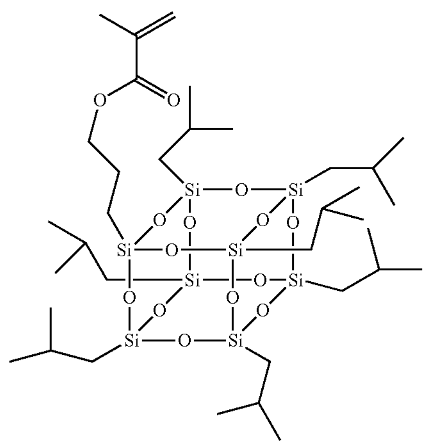
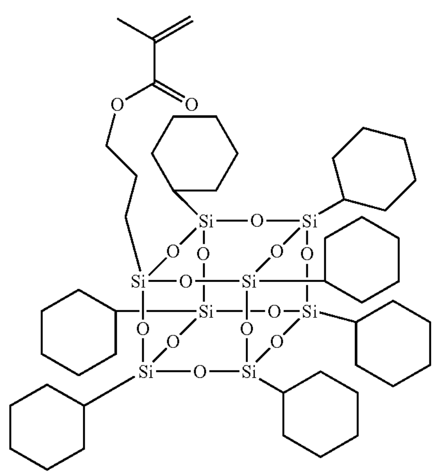

-continued

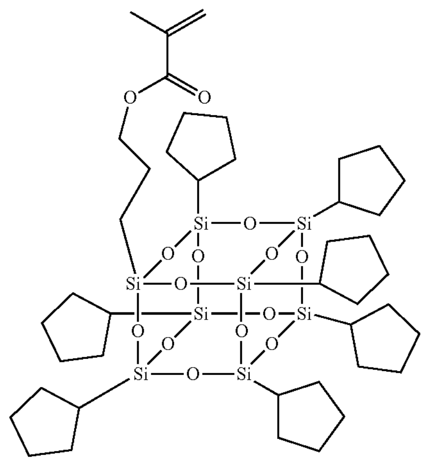

(Repeating Unit "d")

The component (A) in the conductive wiring material composition of the present invention may have a repeating unit "d" which has a fluorine(s), in addition to the repeating unit "a" selected from the above-mentioned "a1" to "a7", and the above-mentioned "b" and "c". The following units may be specifically exemplified. In the following, R represents a methyl group or a hydrogen atom. Among the repeating units having a fluorine(s), the fluoroalcohol group or the sulfonamide group has an acidity, and silver nanoparticles are generated by the redox reaction of the silver flakes during annealing after coating the conductive paste, whereby conductivity is improved.

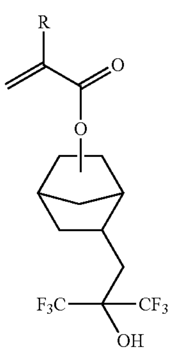

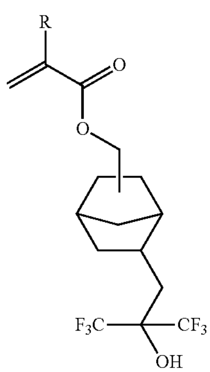

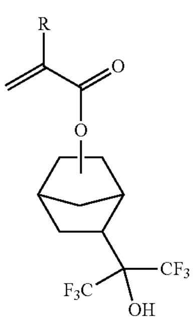

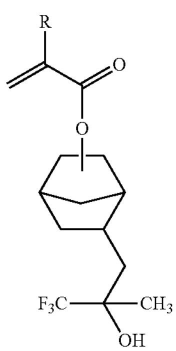

-continued

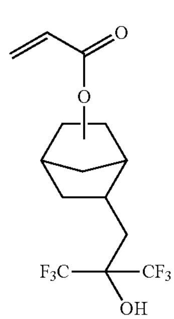

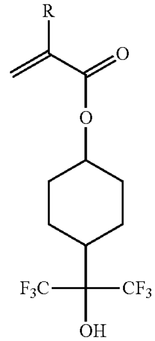

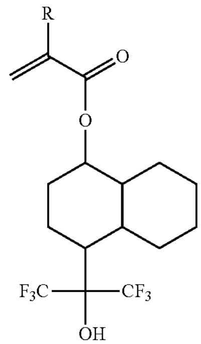

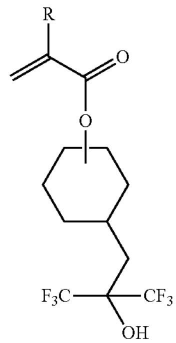

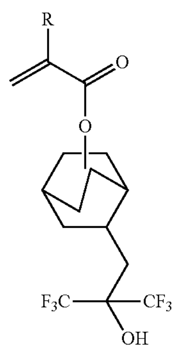

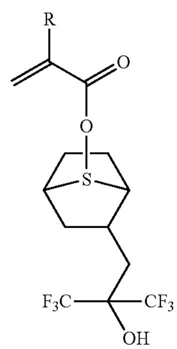

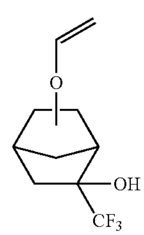

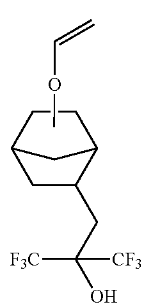

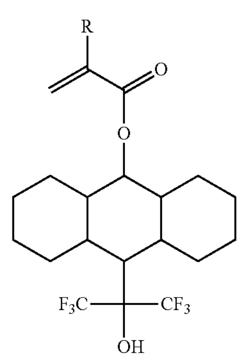

-continued
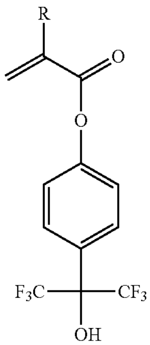
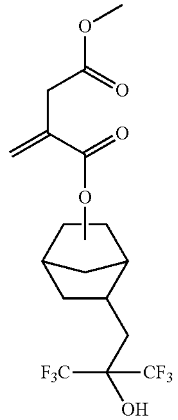
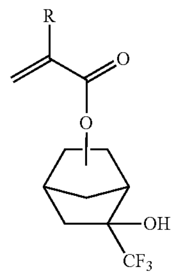
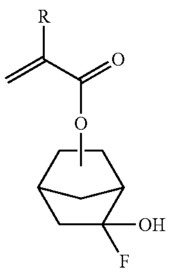
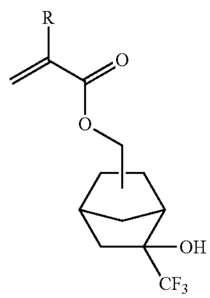
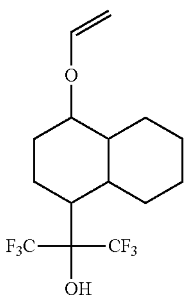
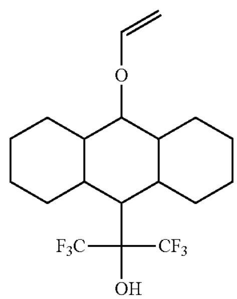
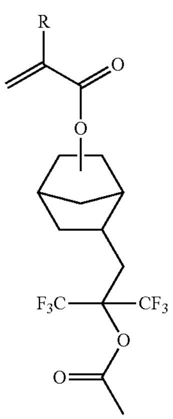
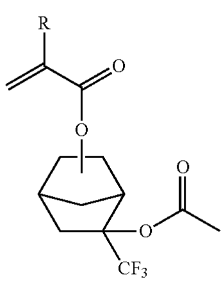
-continued
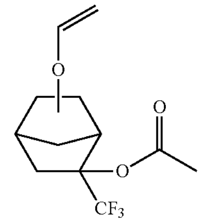
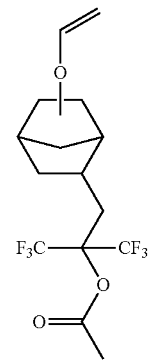
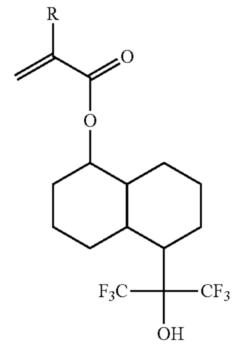
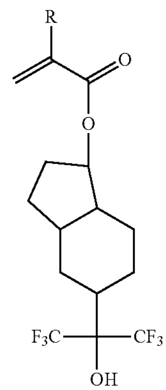
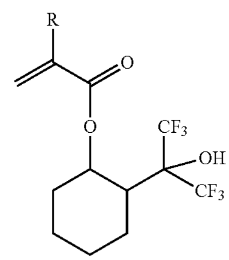
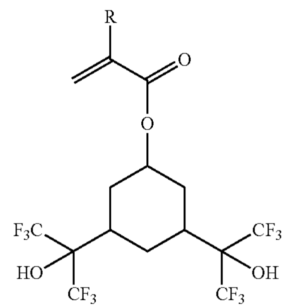
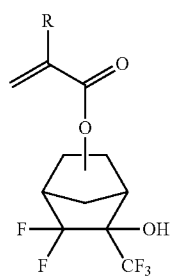
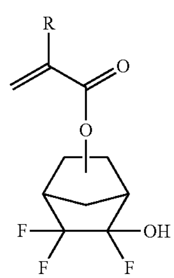
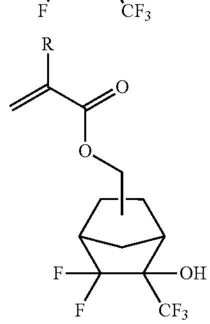
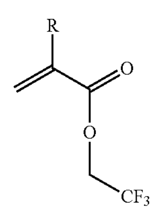
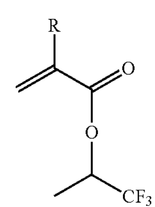

-continued
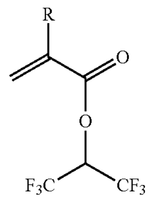
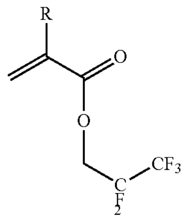
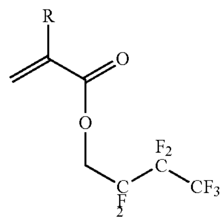
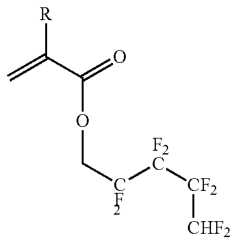
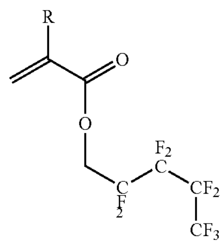
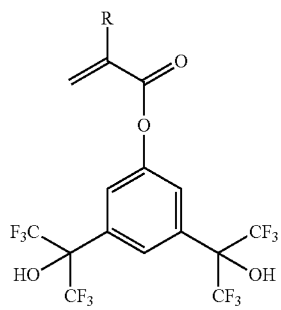
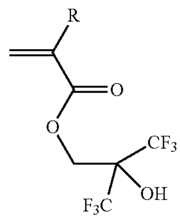
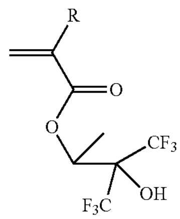
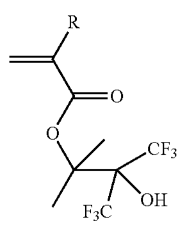
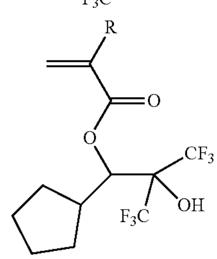
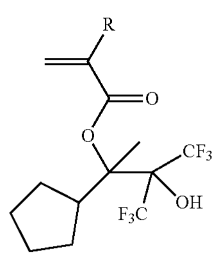
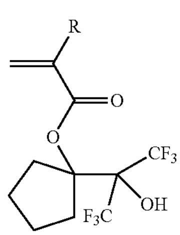
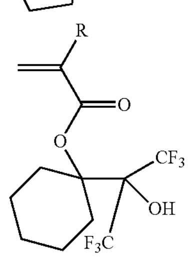
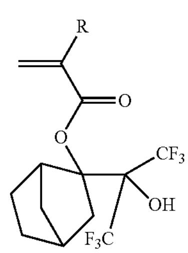
-continued
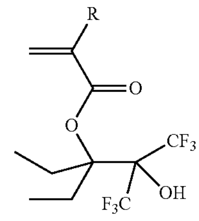
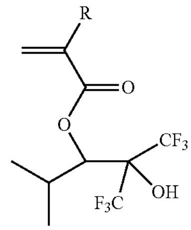
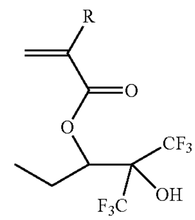
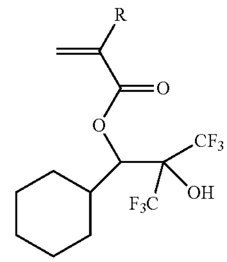
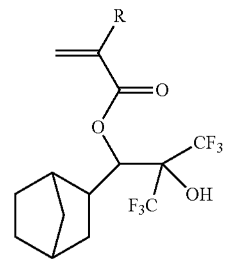
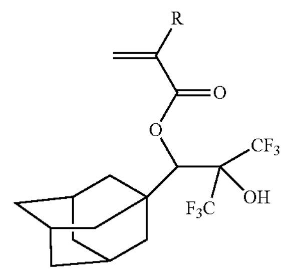
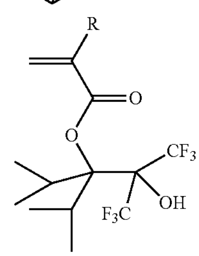
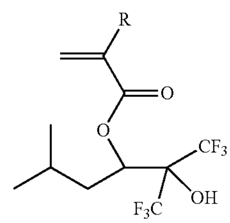
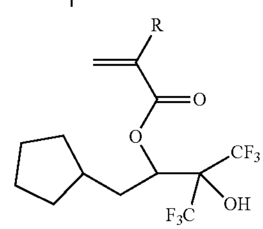
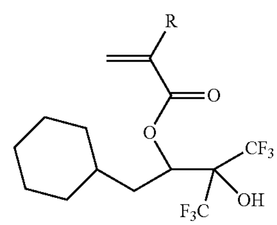
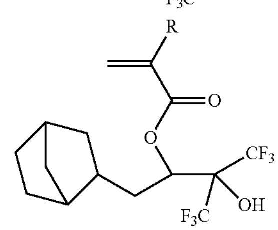
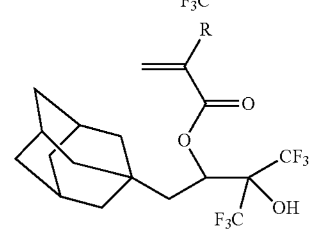

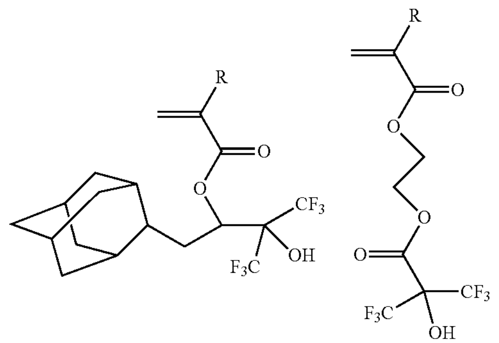
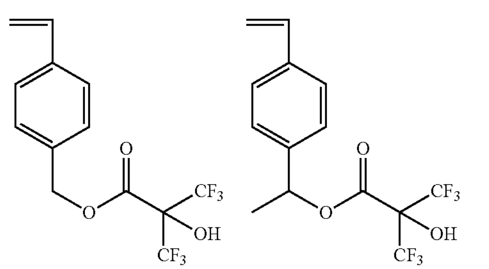
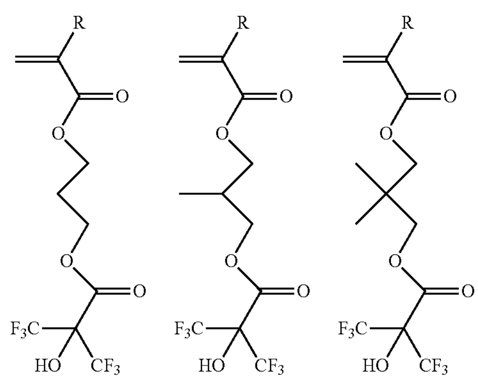
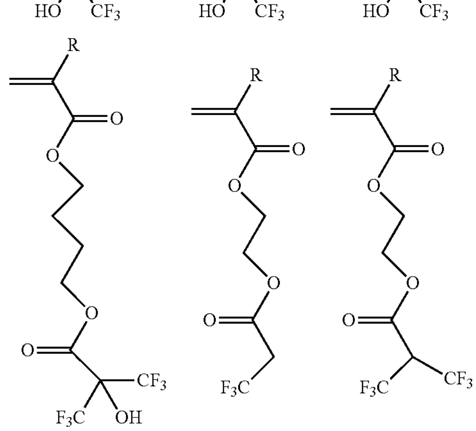
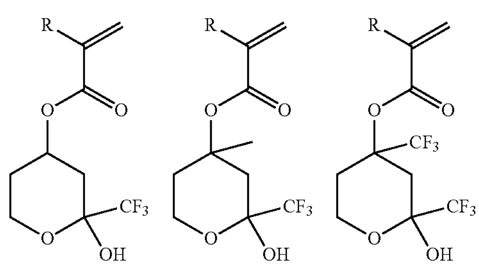
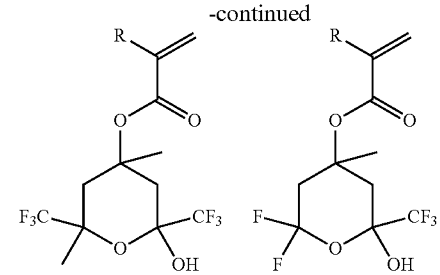
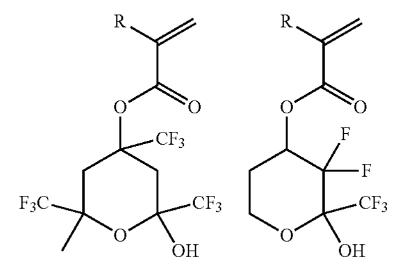
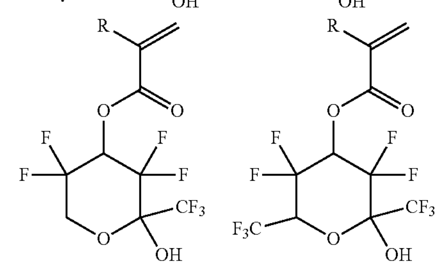
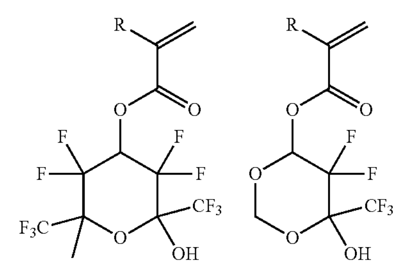
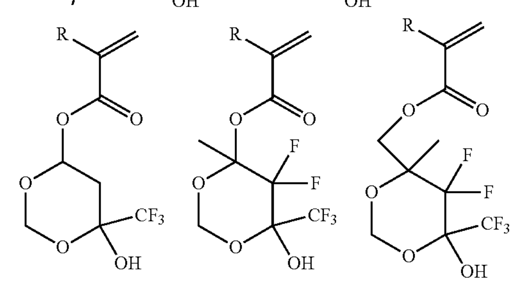
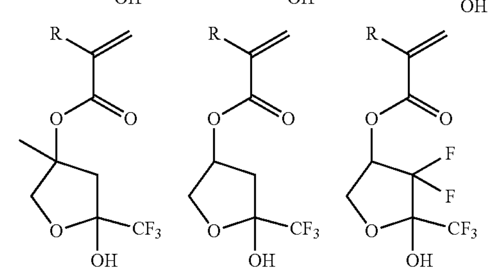

-continued
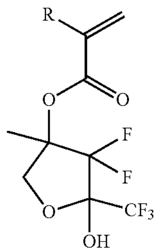
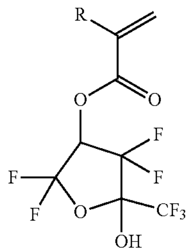
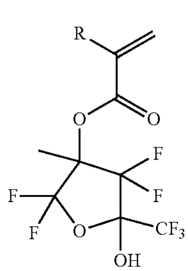
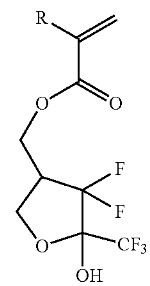
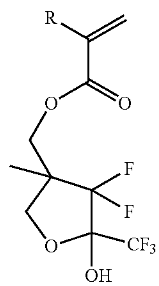
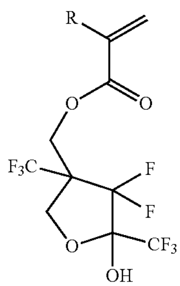
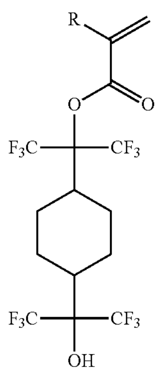
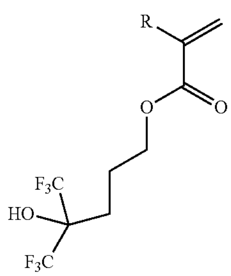
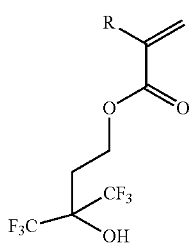
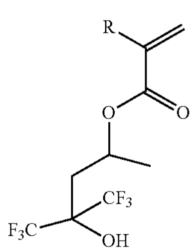
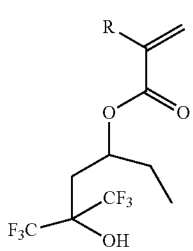
-continued
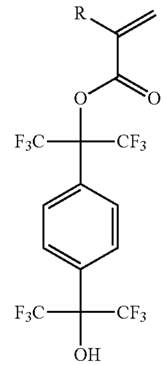
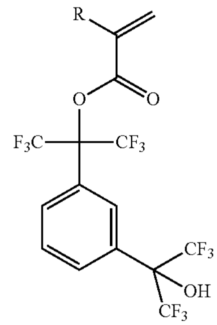
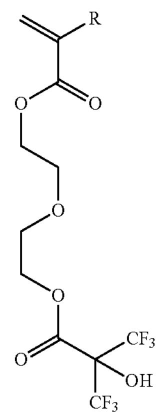
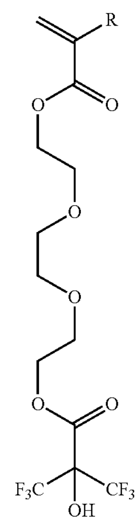
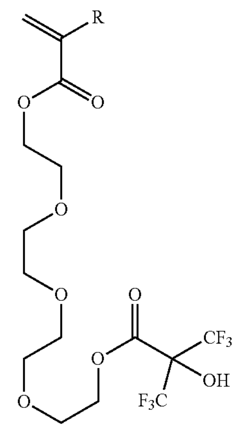
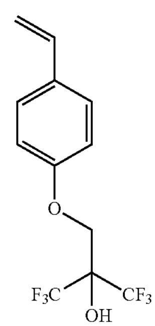
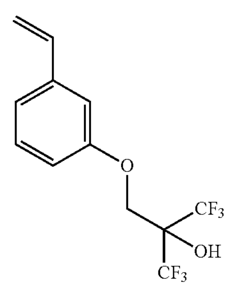
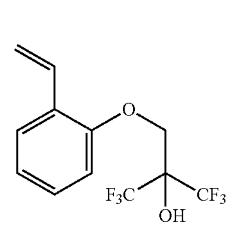
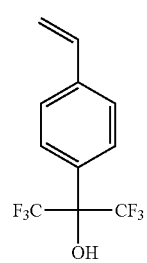

-continued
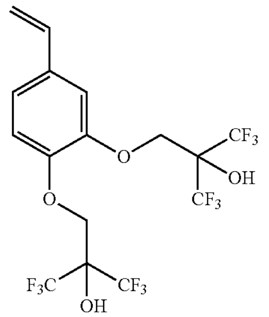
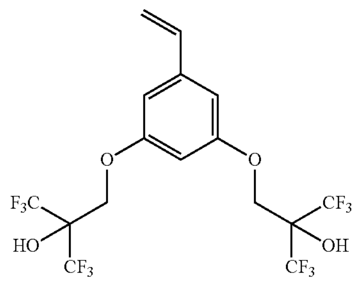
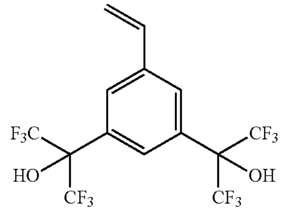
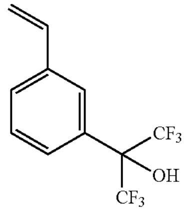
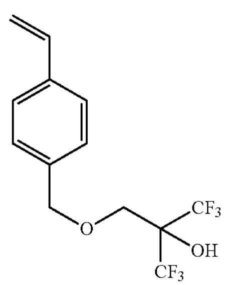
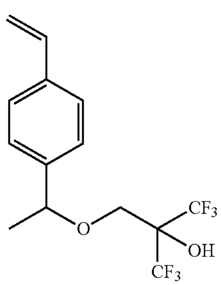
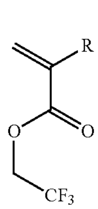
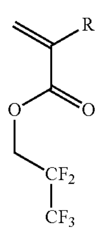
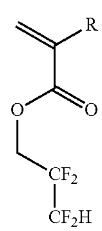
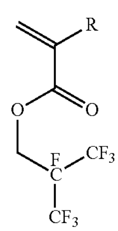
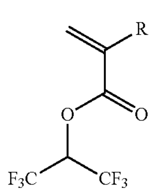
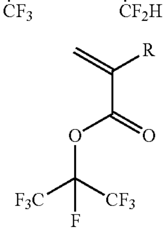
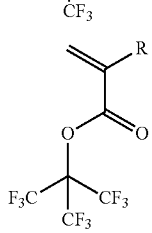
-continued
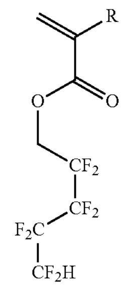
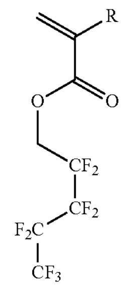
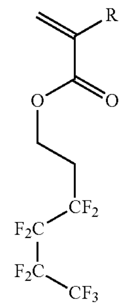
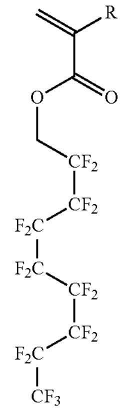
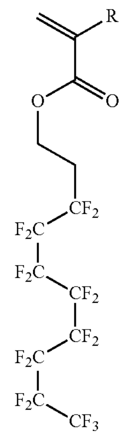
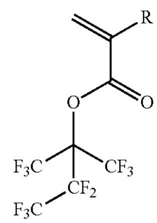
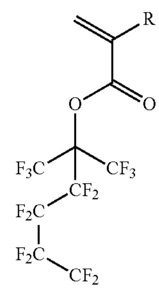
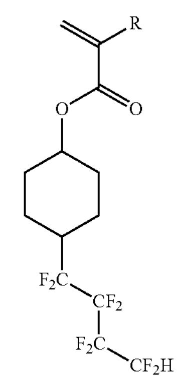
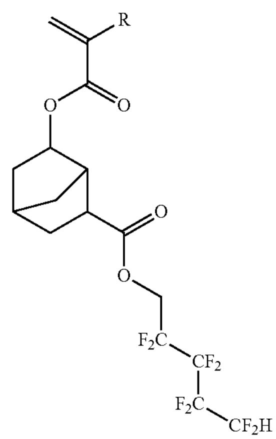
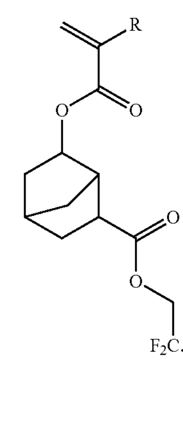
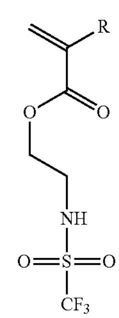

-continued

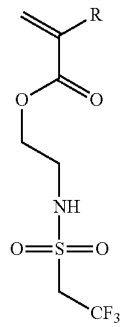

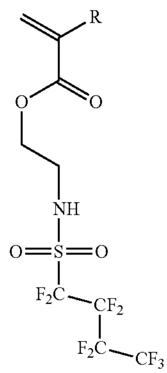

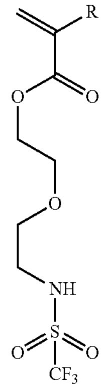

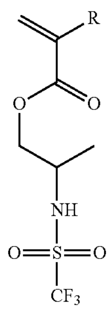

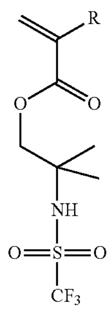

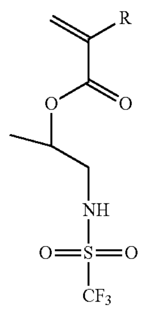

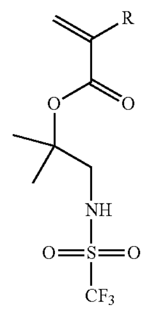

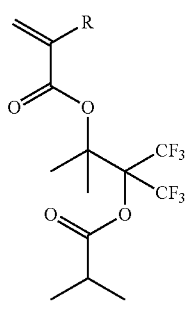

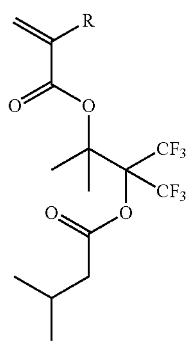

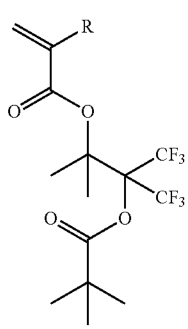

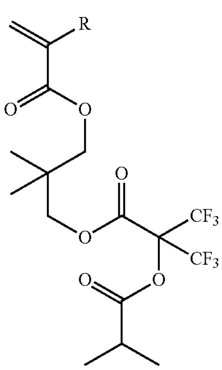

-continued

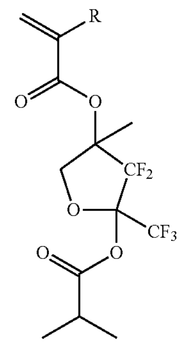

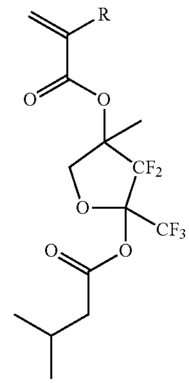

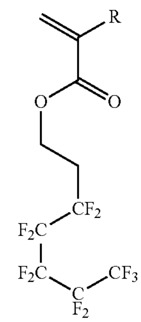

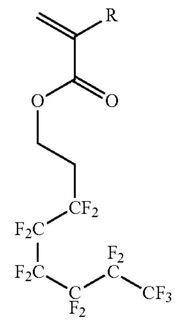

(Repeating Unit "e")

The component (A) in the conductive wiring material composition of the present invention may have a repeating unit "e" having a glyme chain may be copolymerized to improve ion conductivity, in addition to the above-mentioned repeating units "a1" to "a7", "b", "c" and "d". The monomer for obtaining the repeating unit "e" having a glyme chain may be specifically exemplified by the following. In the following, R is a methyl group or a hydrogen atom. By copolymerizing the repeating unit having a glyme chain, ion conductivity can be improved by hopping of ions.

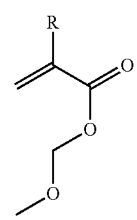

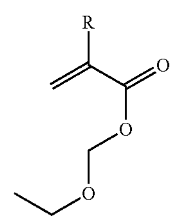

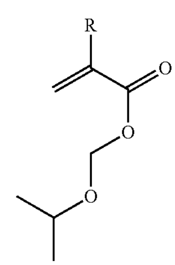

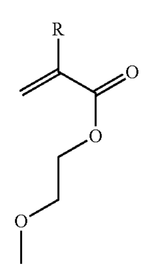

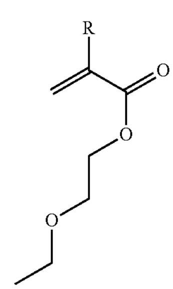

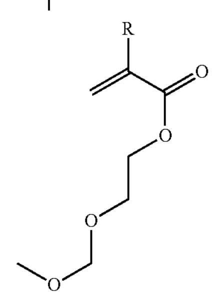

-continued
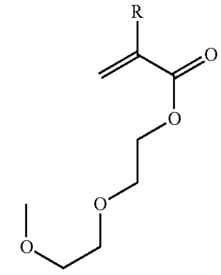
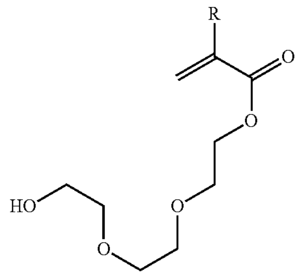
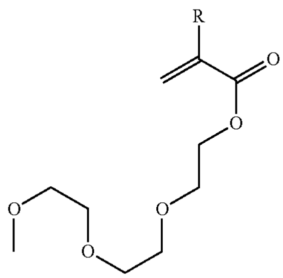
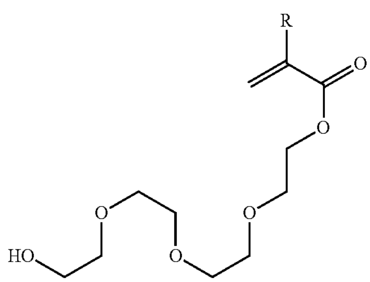
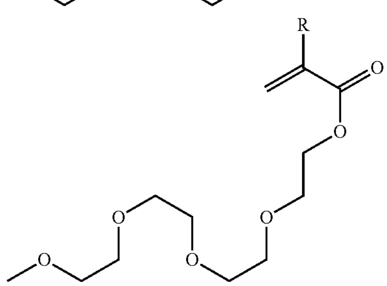
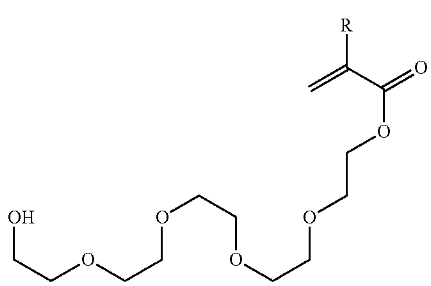
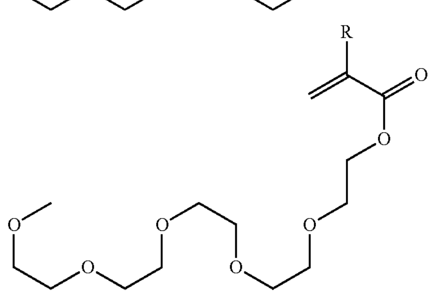
-continued
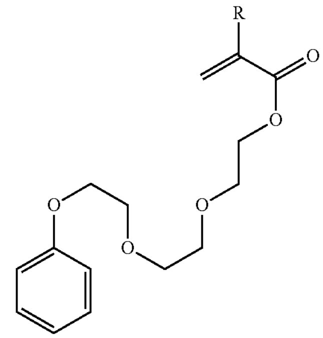
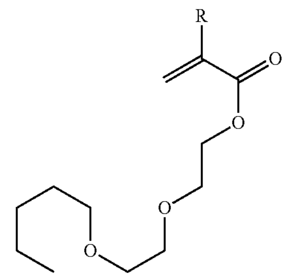
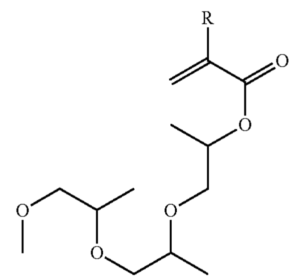
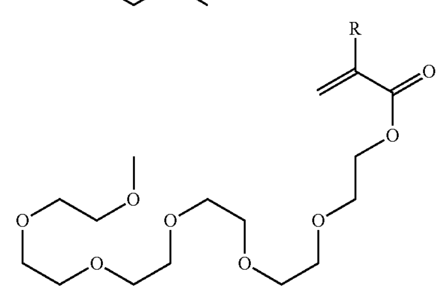
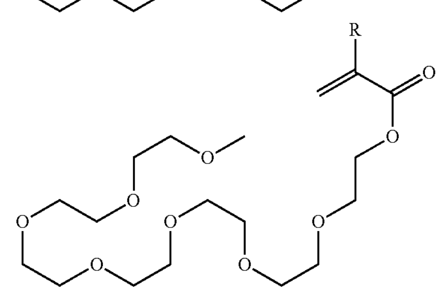
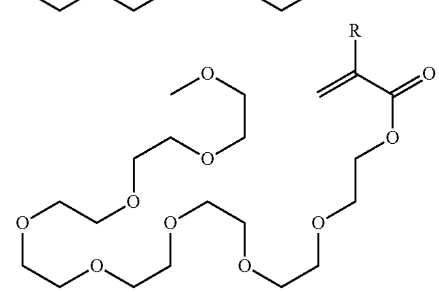

-continued
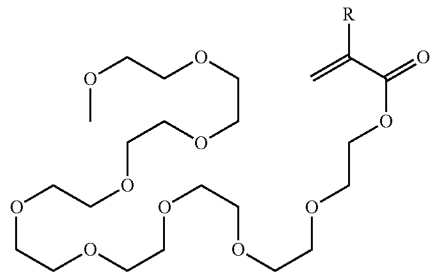
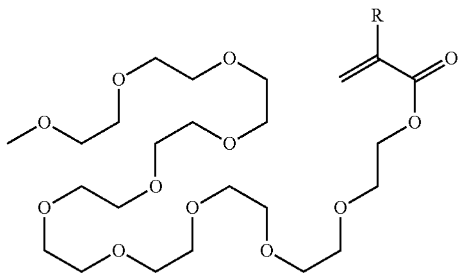
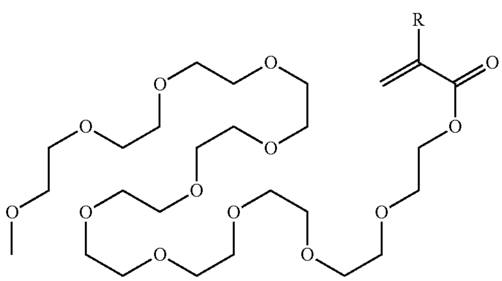
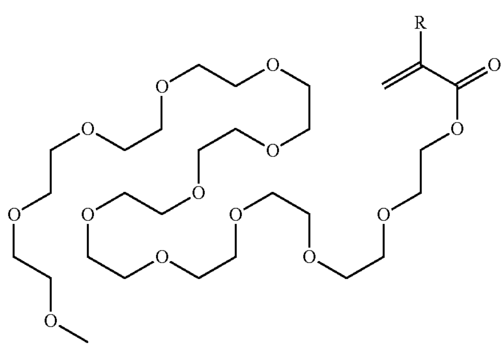
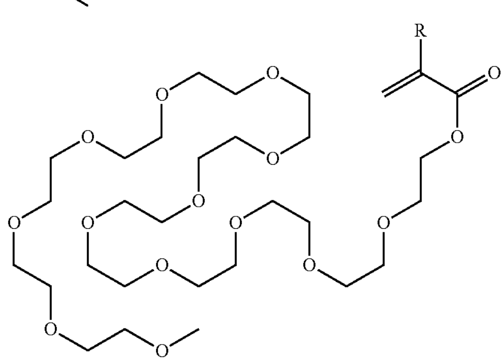
-continued
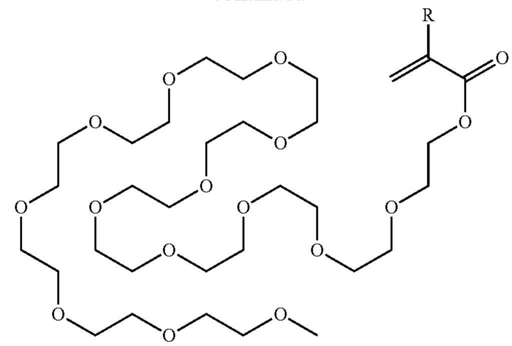
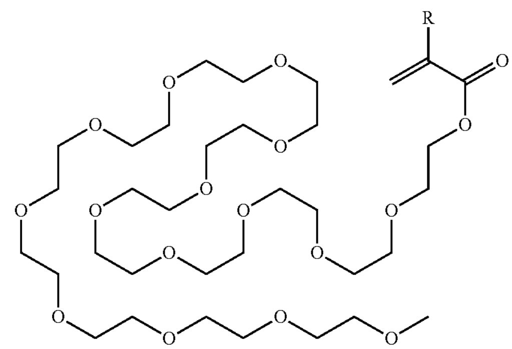
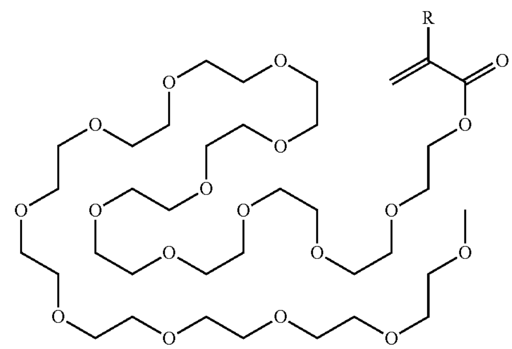
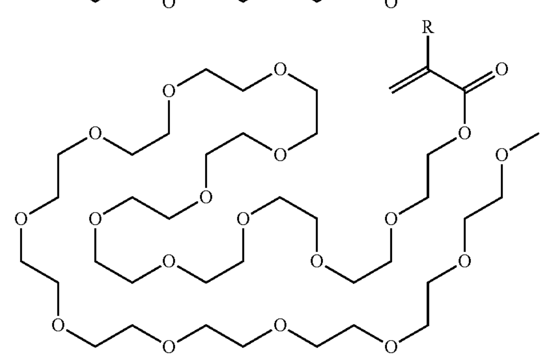
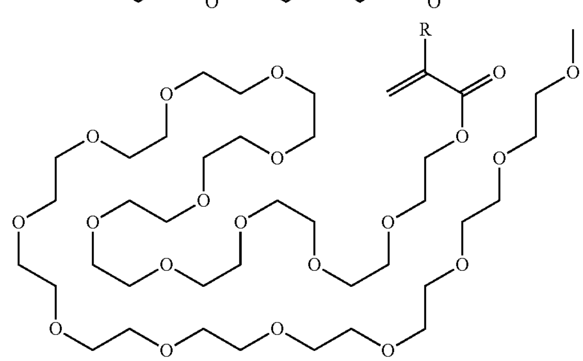

-continued
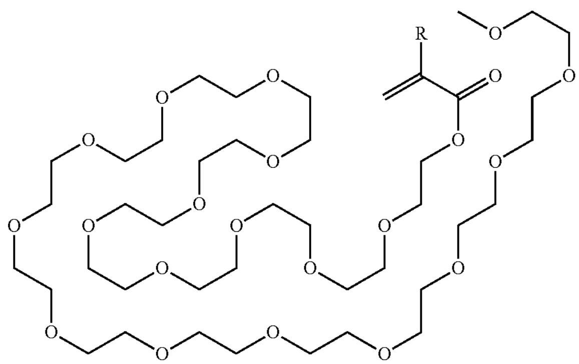
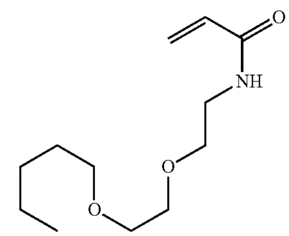
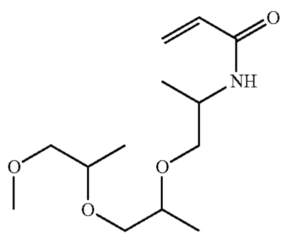
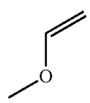
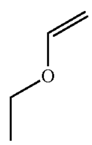
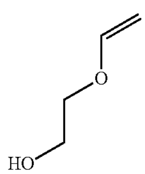
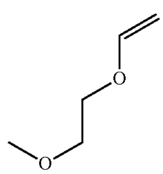
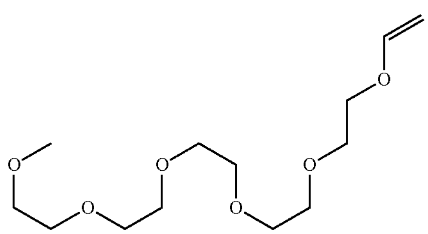
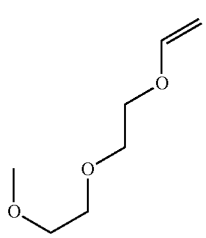
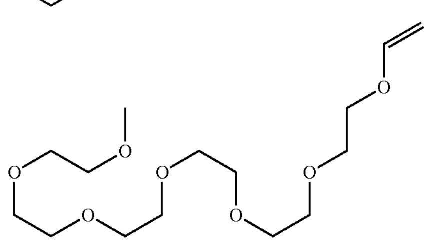
-continued
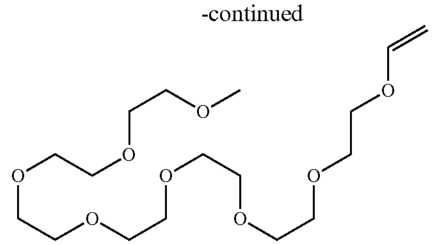
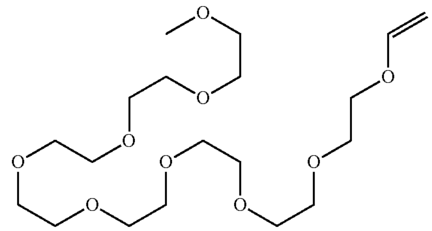
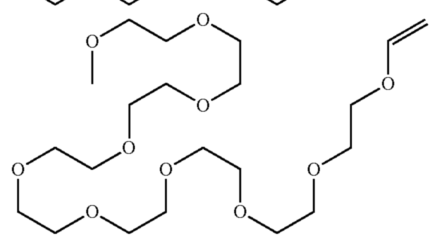
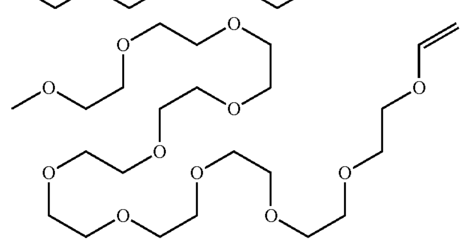
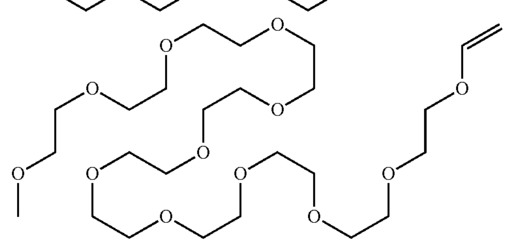
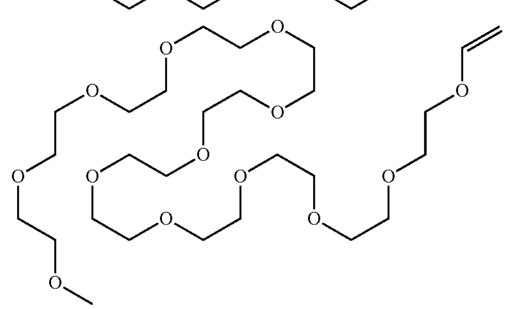
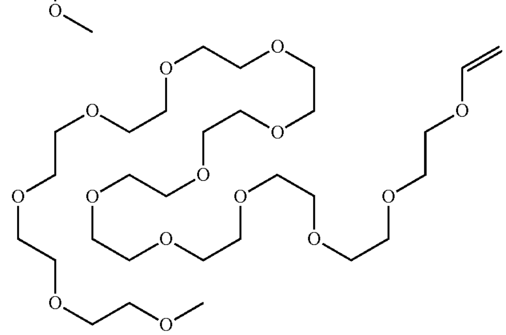

-continued
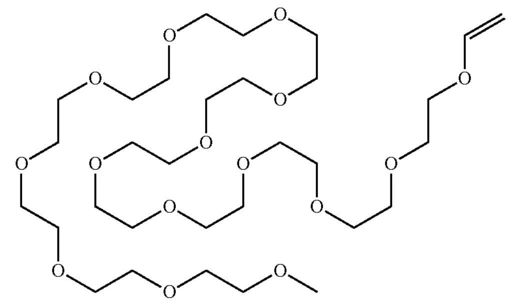
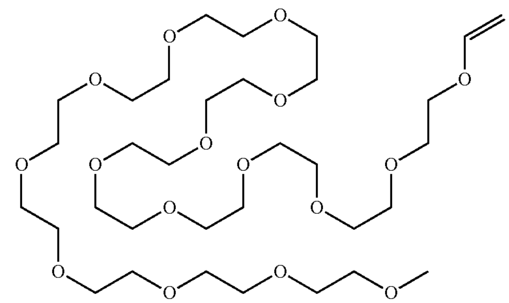
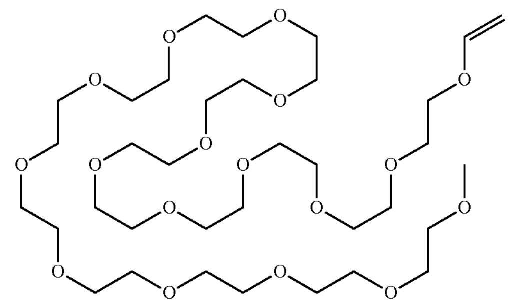
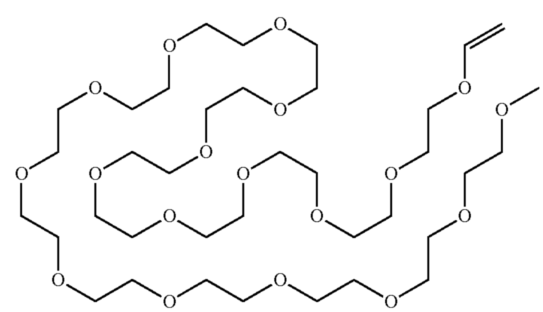
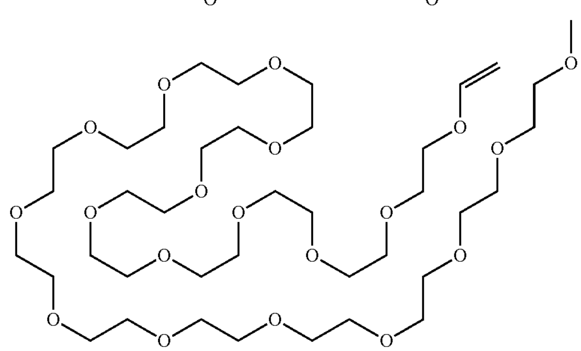
-continued
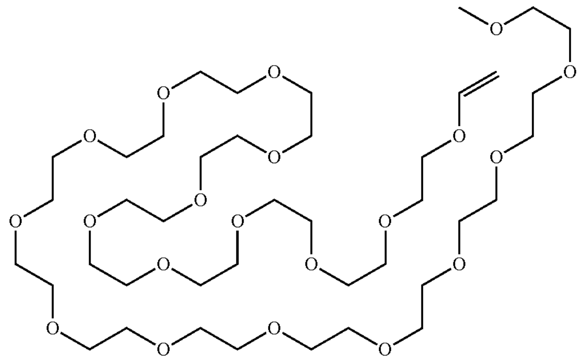
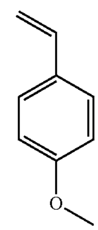
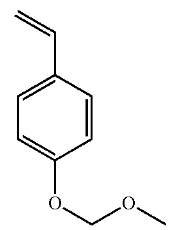
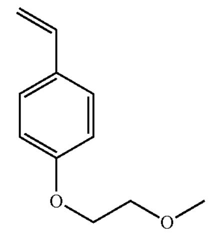
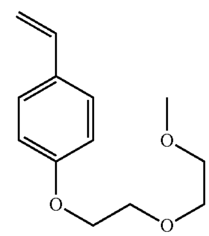
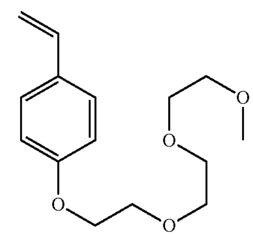
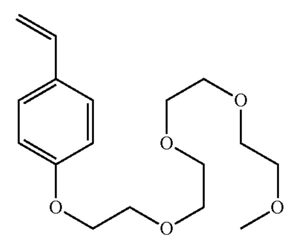
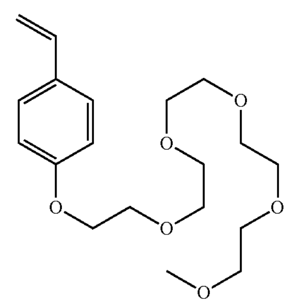
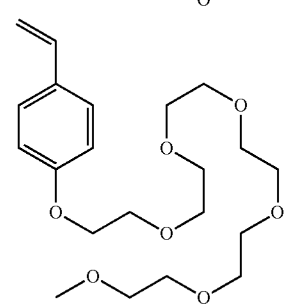

-continued

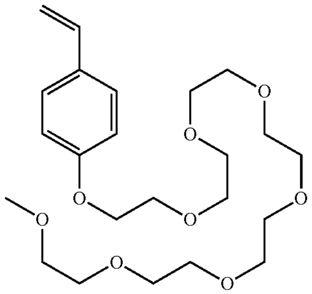

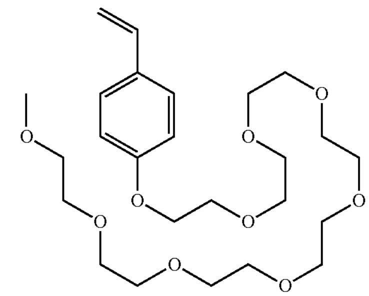

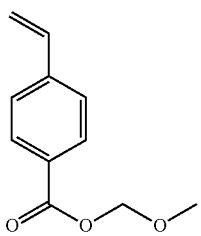

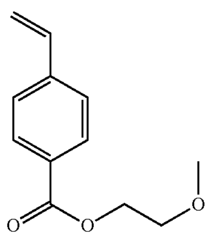

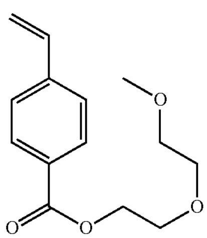

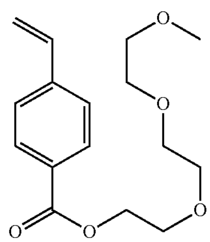

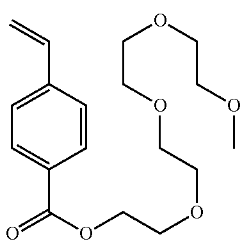

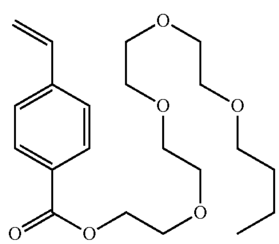

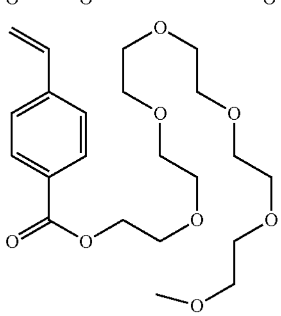

-continued

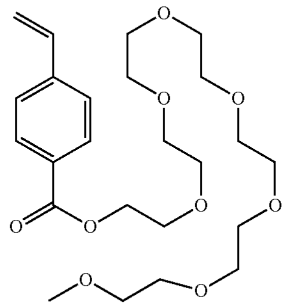

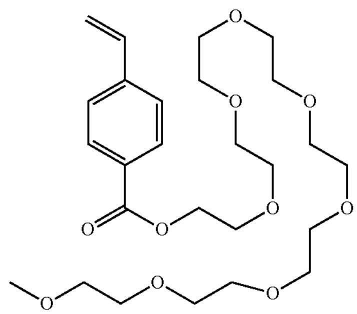

(Repeating Unit “f”)

The component (A) of the conductive wiring material composition in the present invention may have a repeating unit “f” for providing stretchability, in addition to the above-mentioned repeating units “a1” to “a7”, “b”, “c”, “d” and “e”. As a monomer for obtaining the repeating unit “f”, the following monomers may be specifically exemplified.

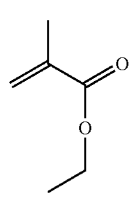

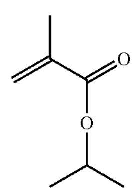

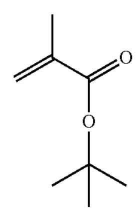

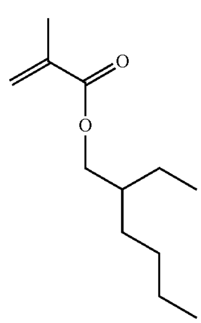

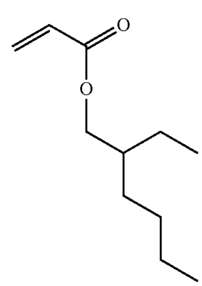

-continued
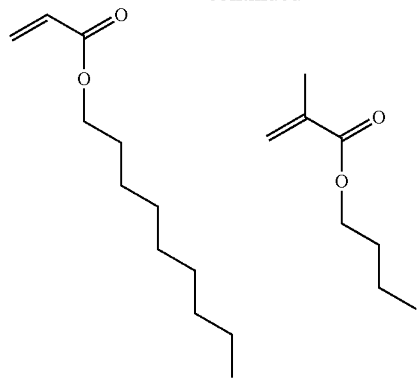
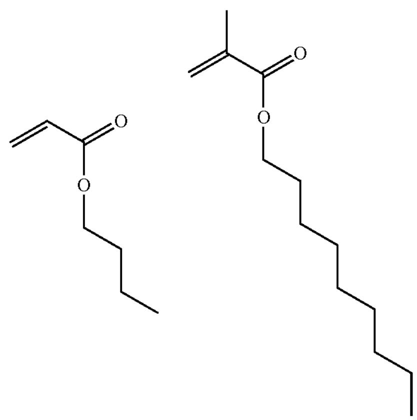
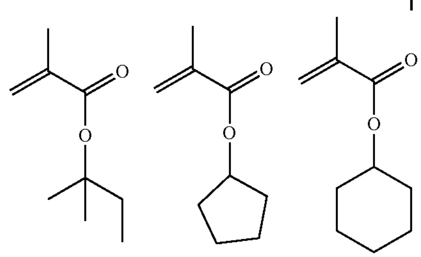
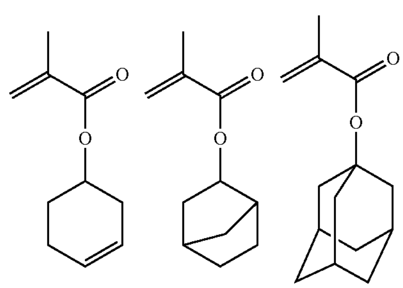
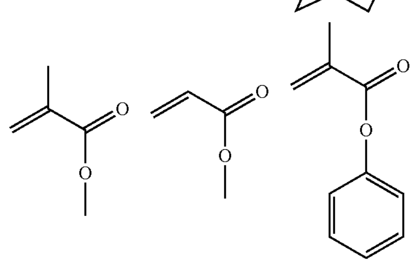
-continued
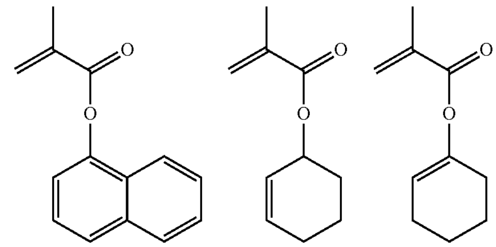
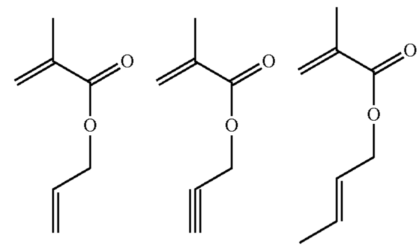
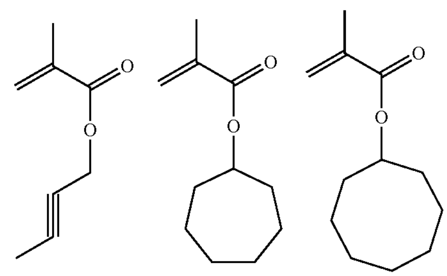
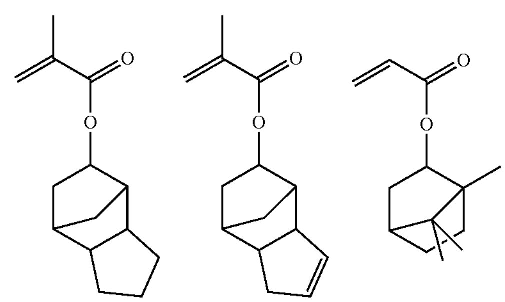
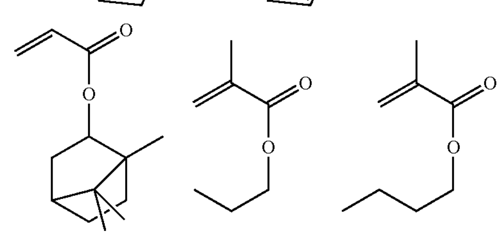
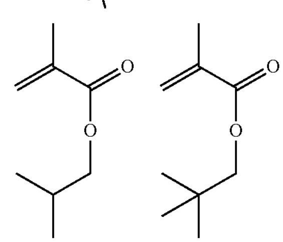

-continued
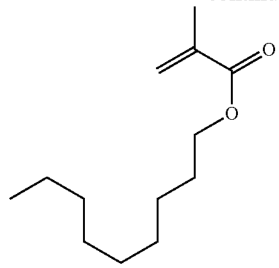
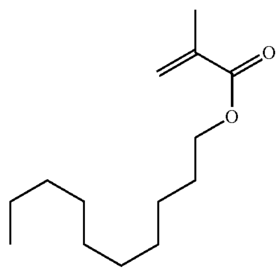
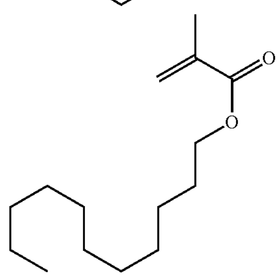
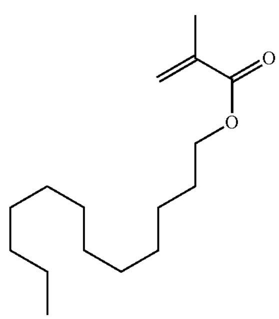
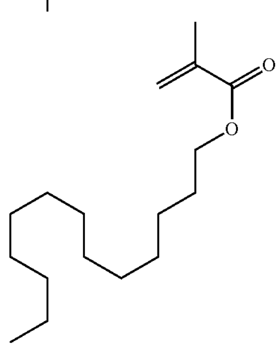
-continued
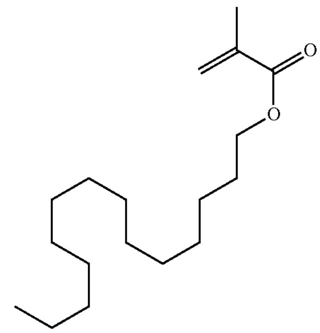
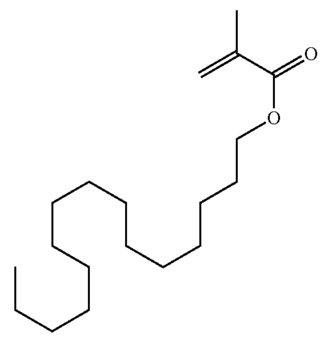
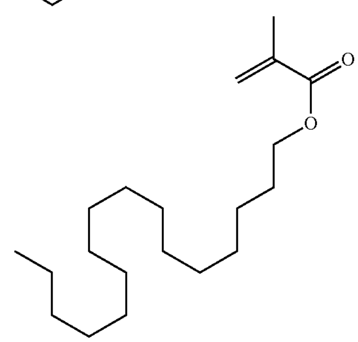
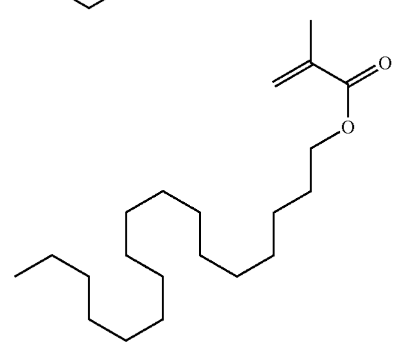
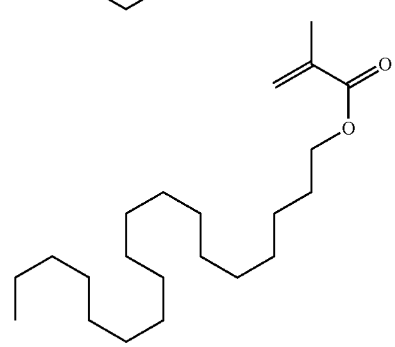

-continued
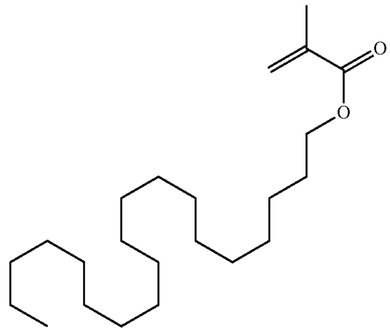
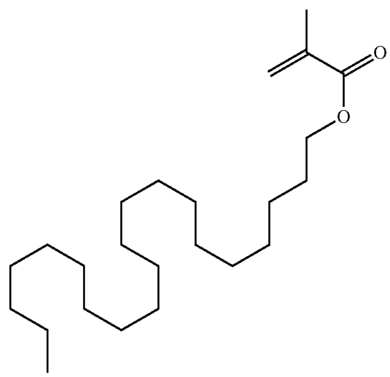
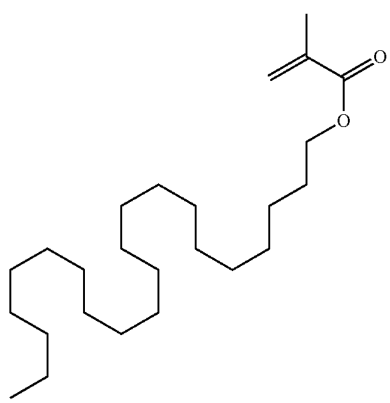
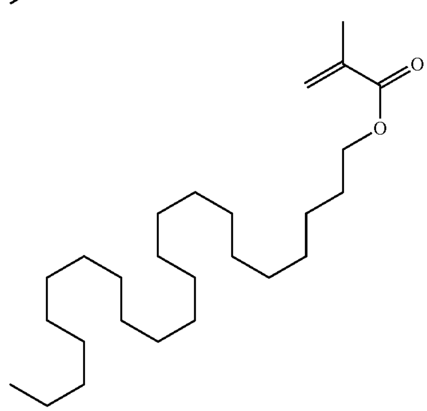
-continued
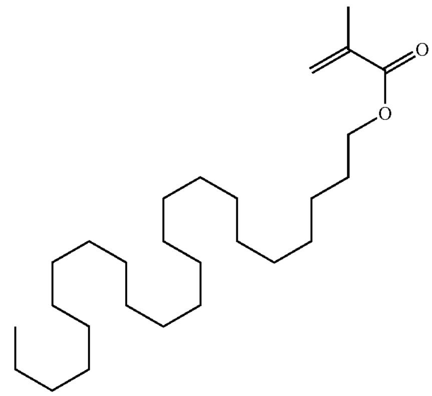
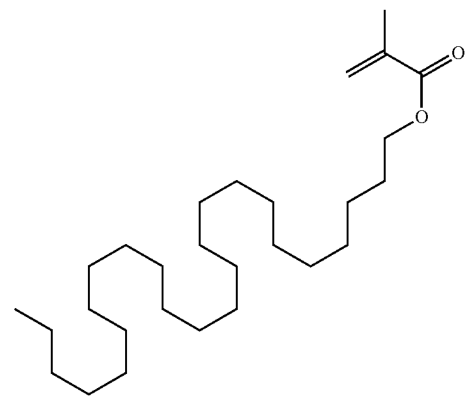
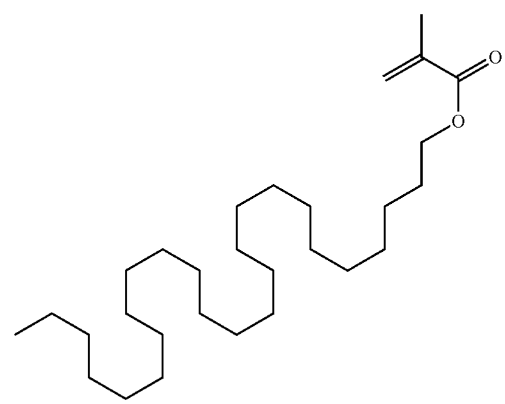
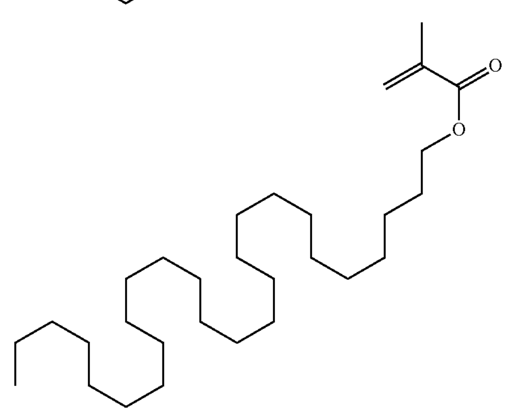

-continued
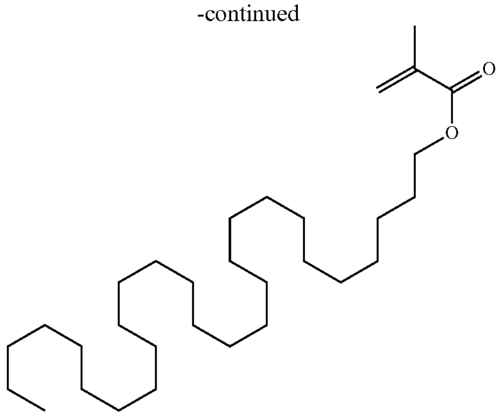
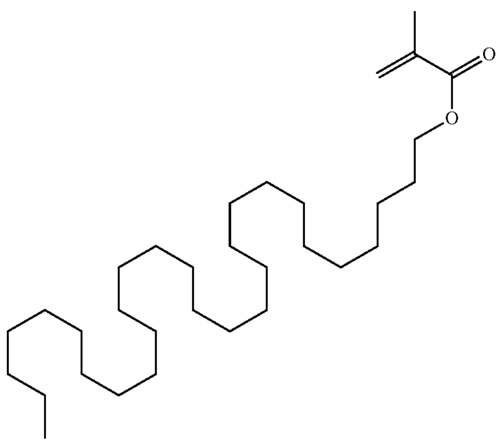
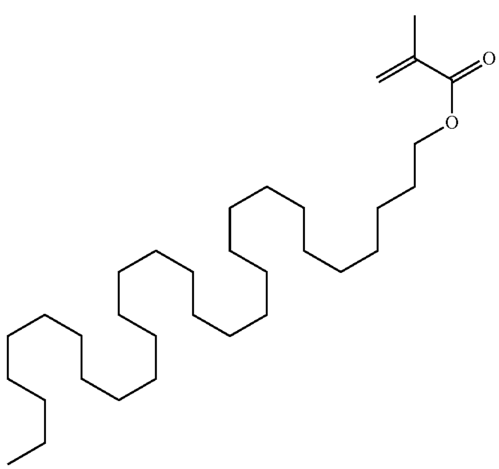
-continued
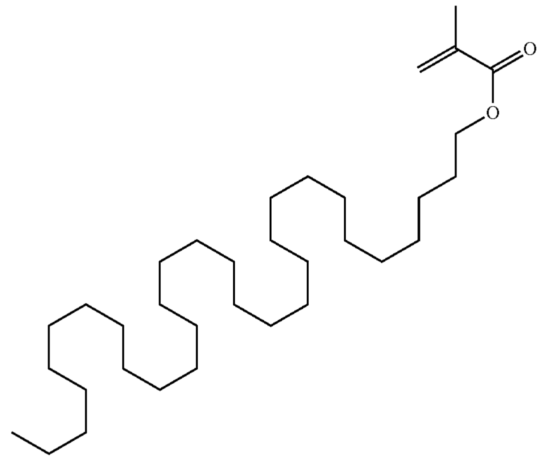
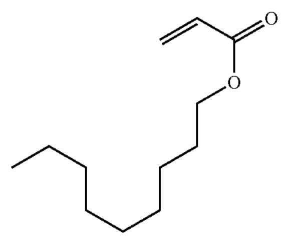
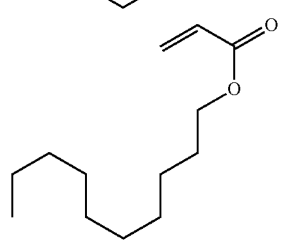
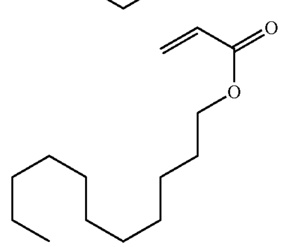
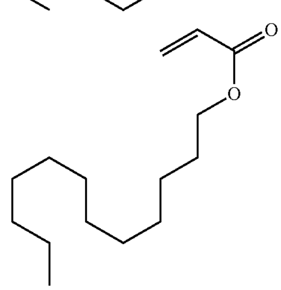
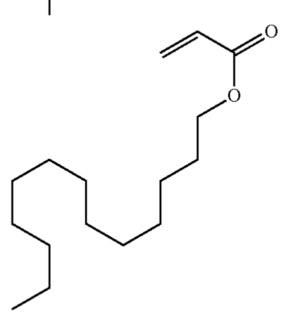

-continued
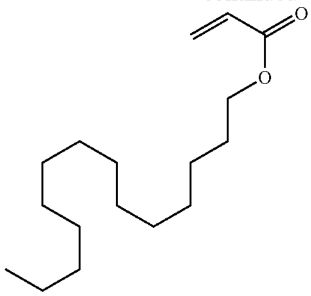
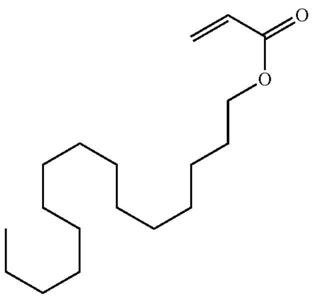
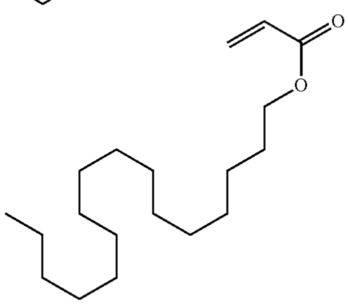
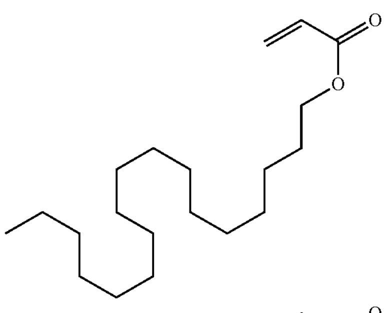
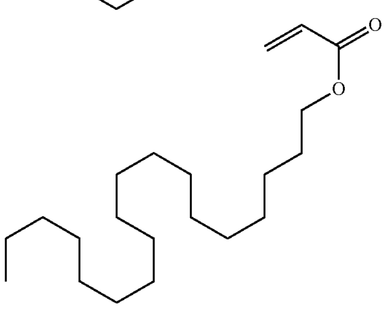
-continued
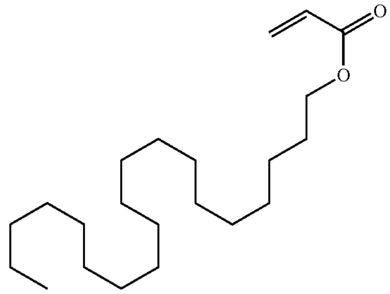
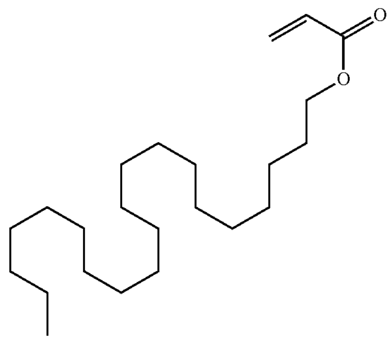
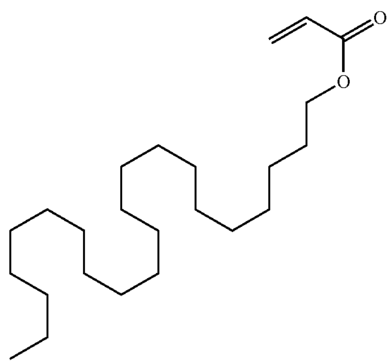
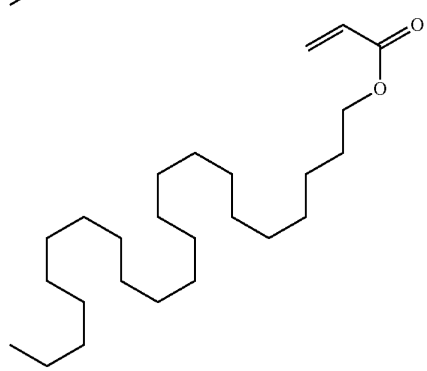
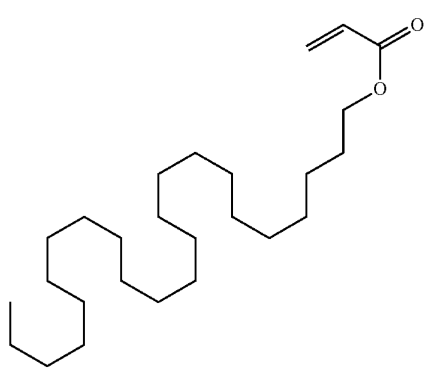

-continued
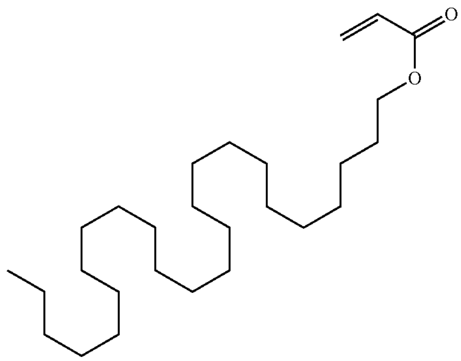
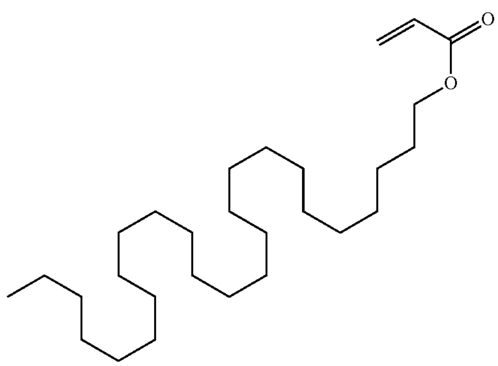
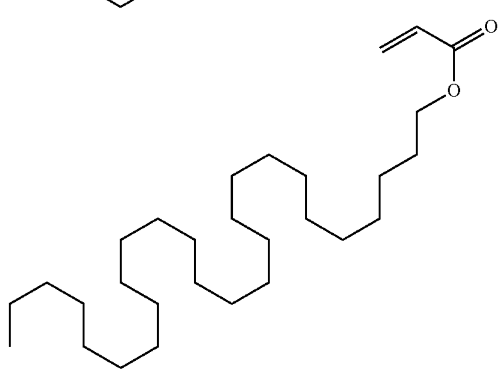
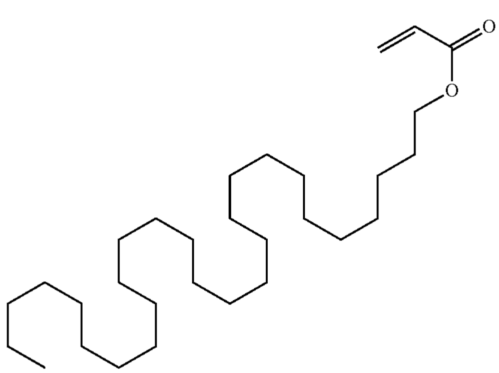
-continued
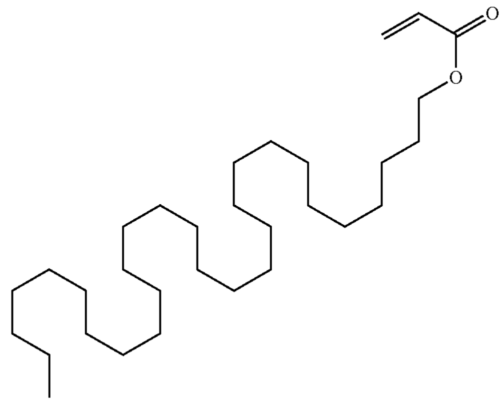
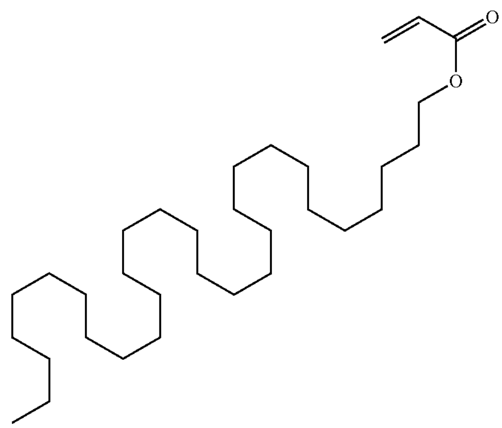
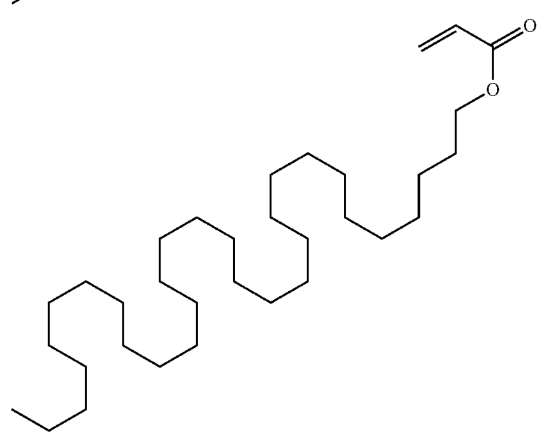
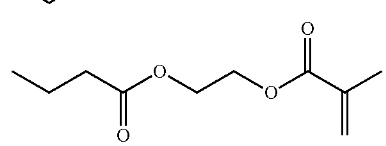
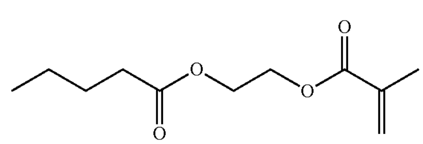
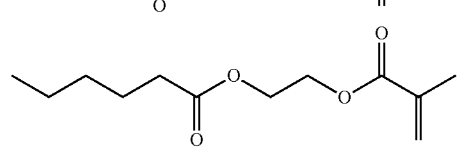

-continued
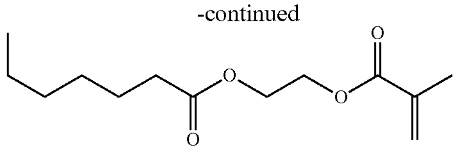
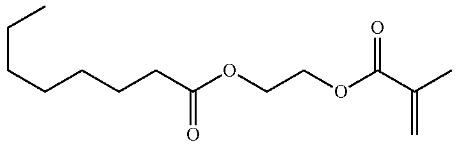
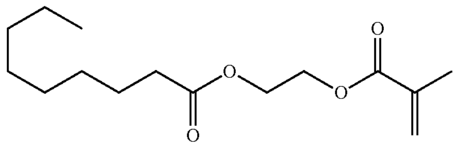
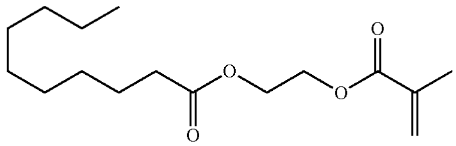
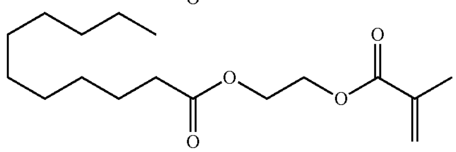
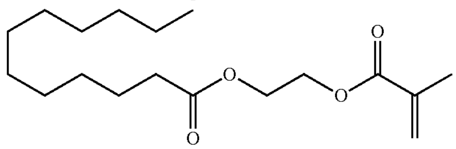
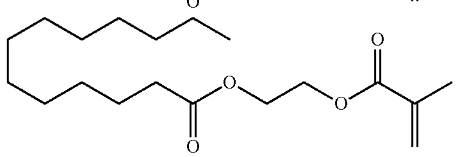
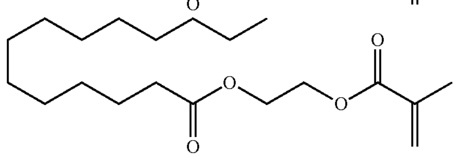
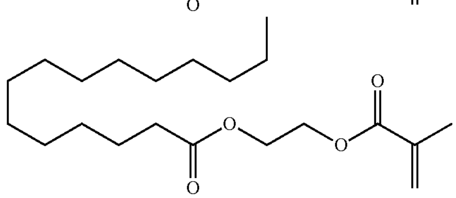
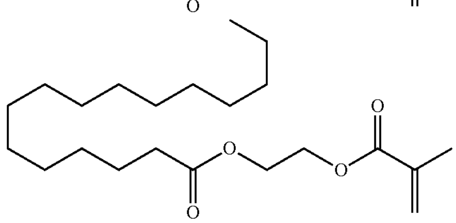
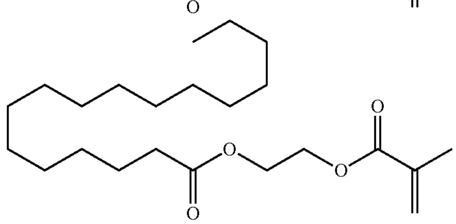
-continued
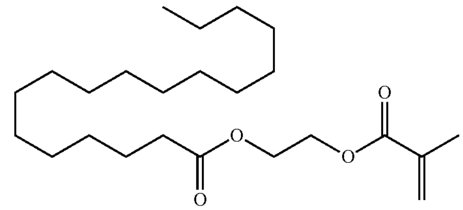
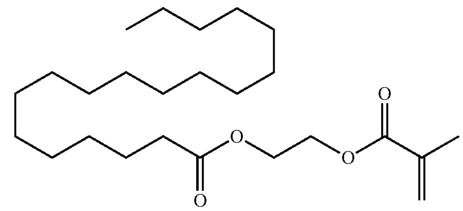
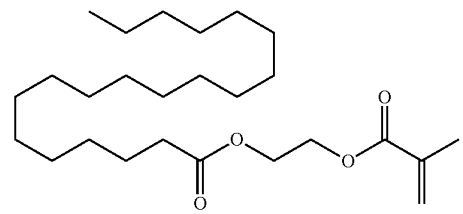
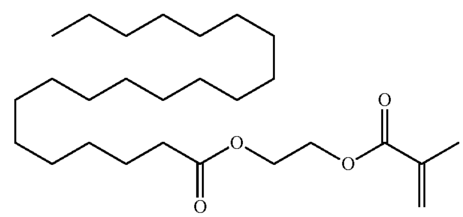
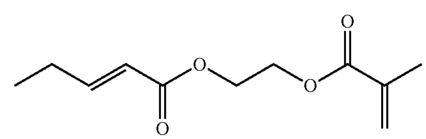
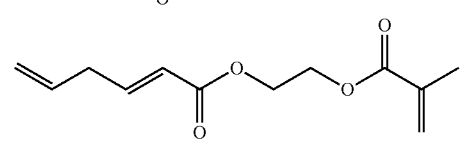
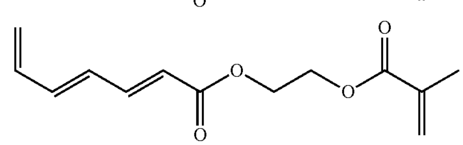
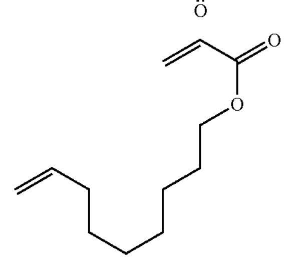
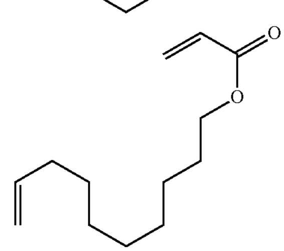

-continued
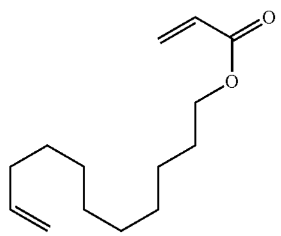
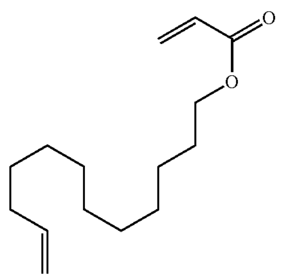
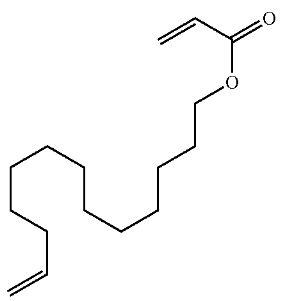
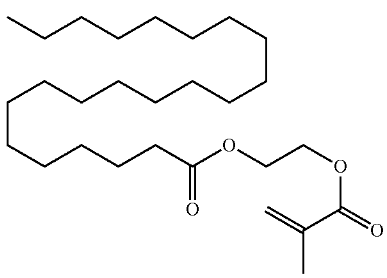
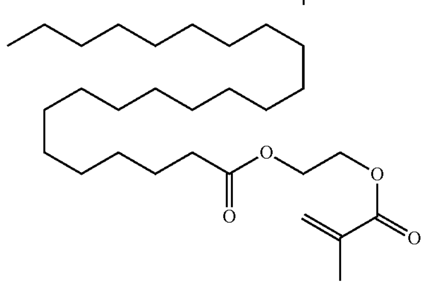
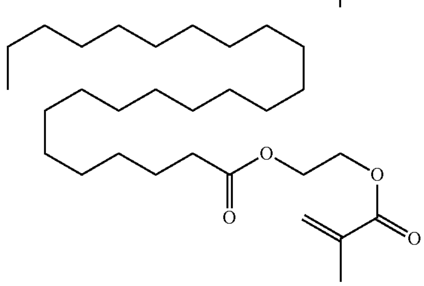
-continued
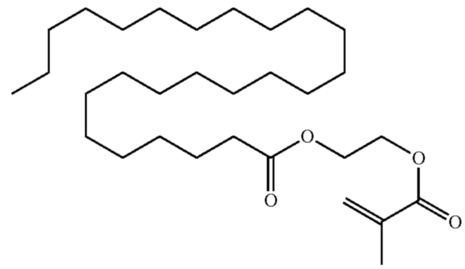
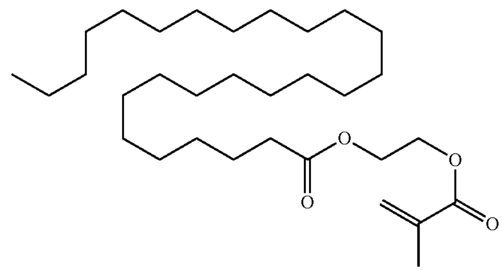
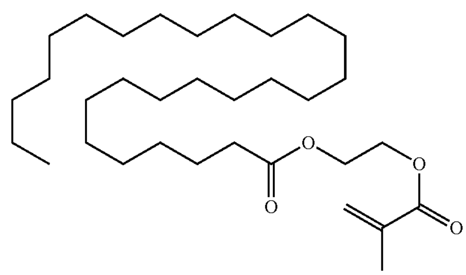
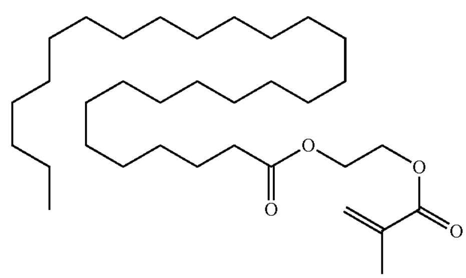
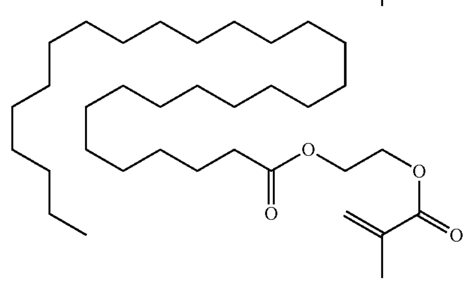
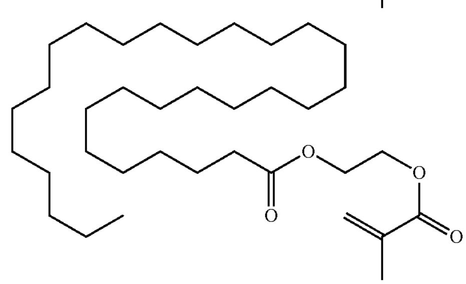

-continued

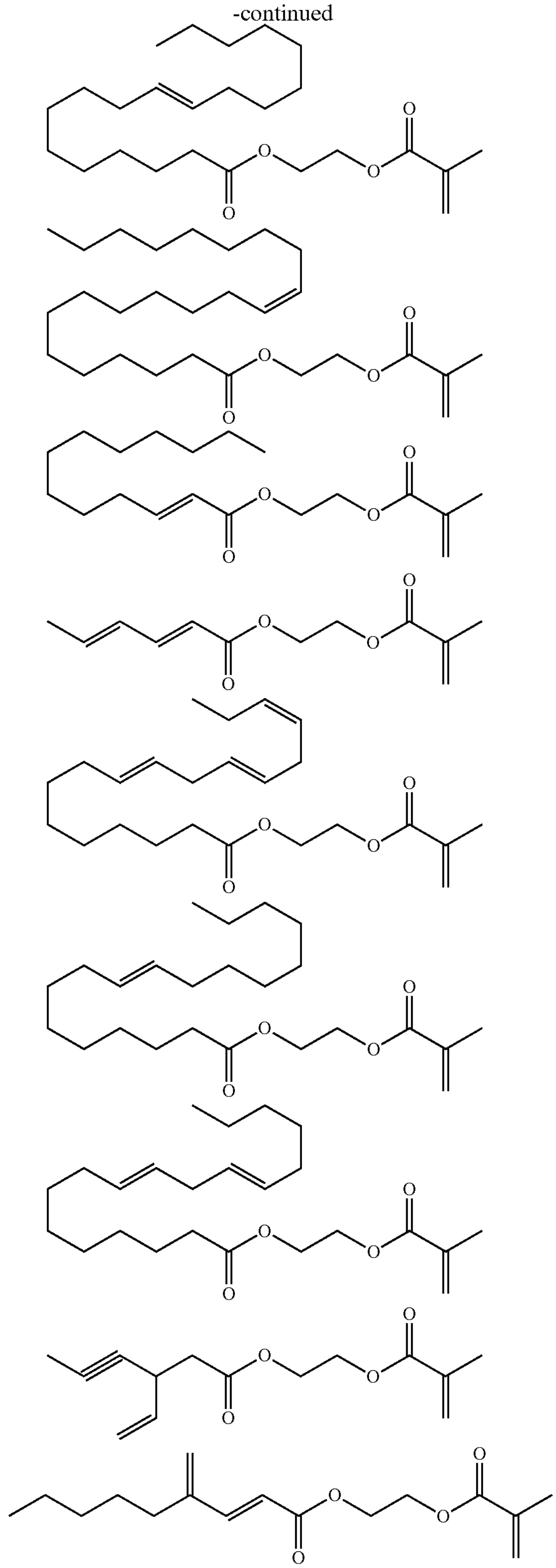

(Repeating Unit "g")

The component (A) in the conductive wiring material composition of the present invention may be copolymerized with a repeating unit "g", in addition to the above-mentioned repeating units "a1" to "a7", "b", "c", "d", "e" and "f". As a cross-linking repeating unit, there may be mentioned a repeating unit having an oxirane ring or an oxetane ring.

As a monomer for obtaining a repeating unit "g" having an oxirane ring or an oxetane ring, there may be specifically mentioned the following monomers.

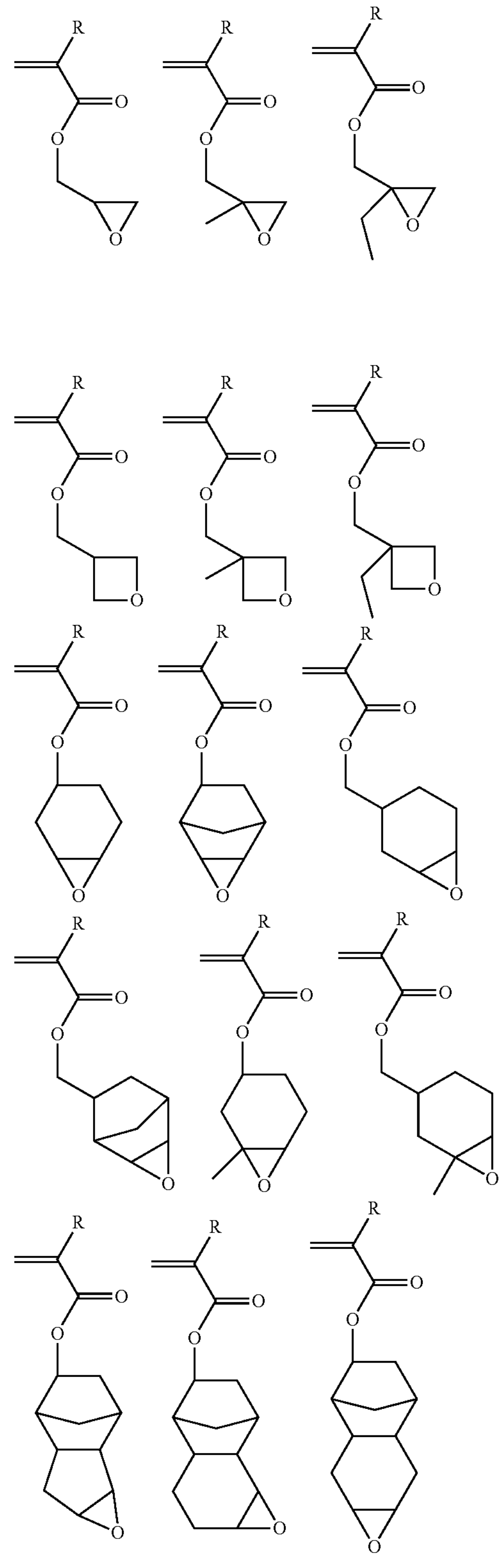

-continued
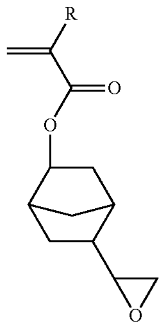
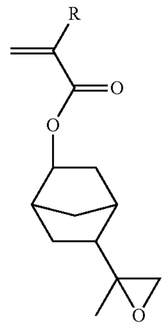
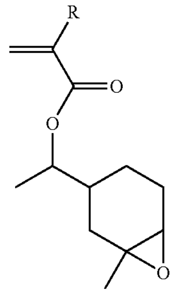
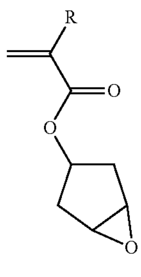
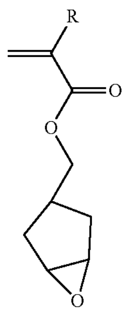
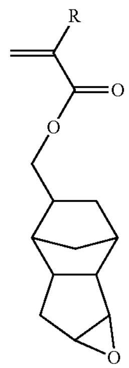
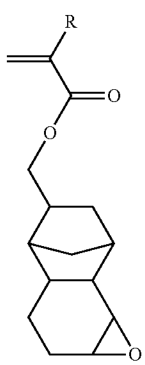
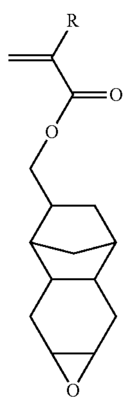
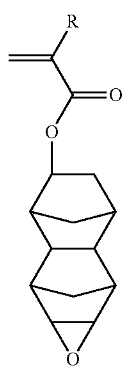
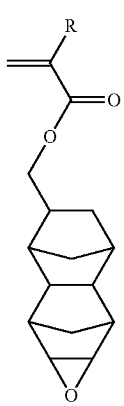
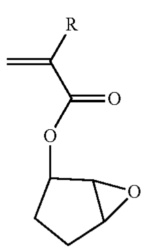
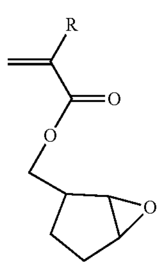
-continued
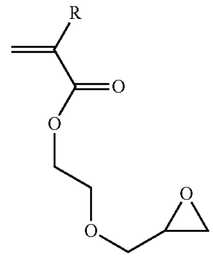
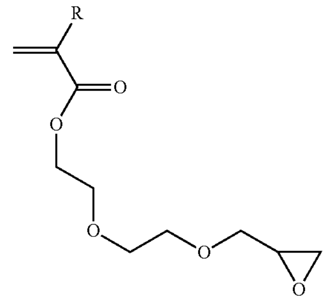
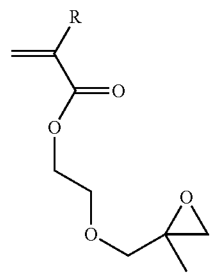
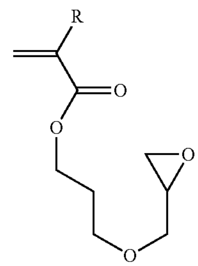
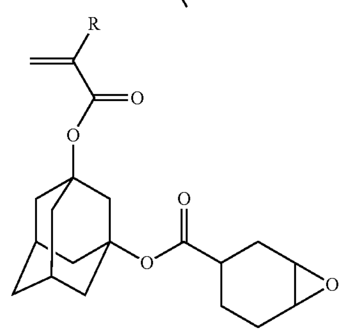
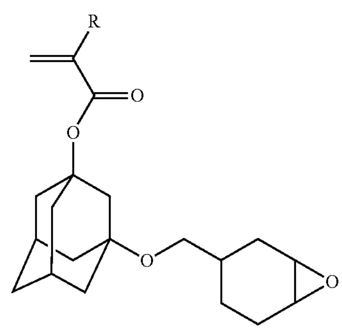
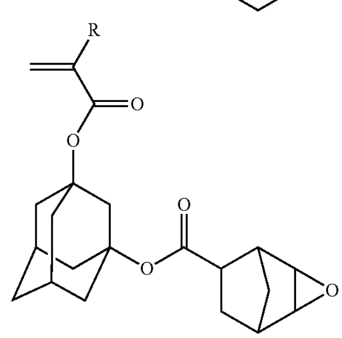

-continued
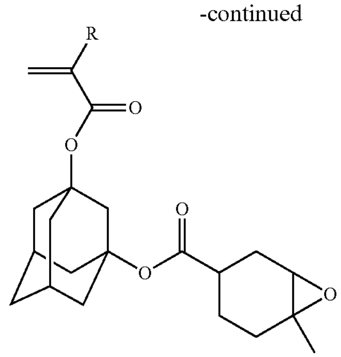
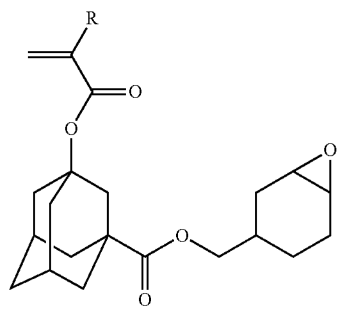
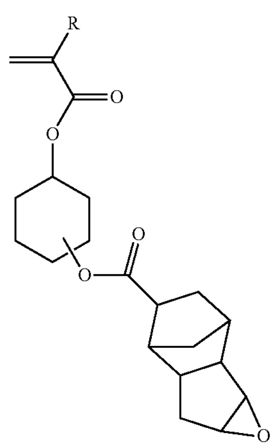
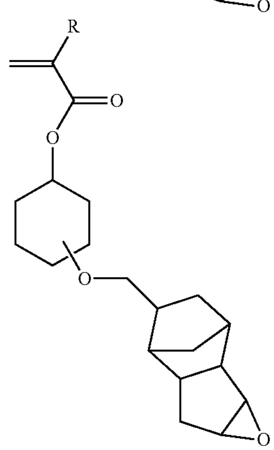
-continued
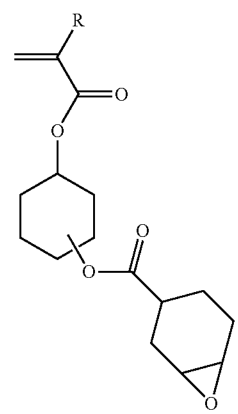
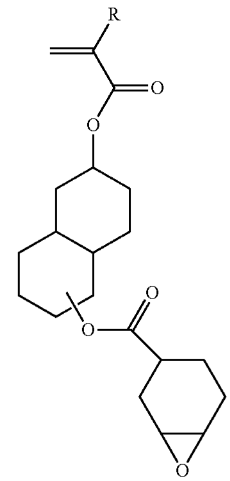
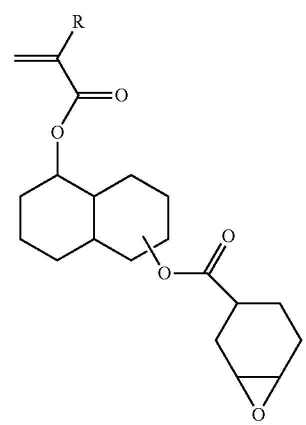
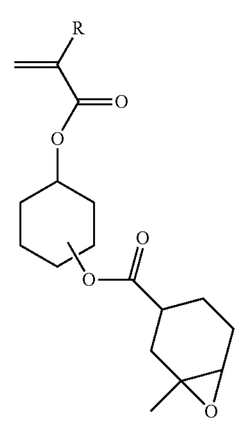
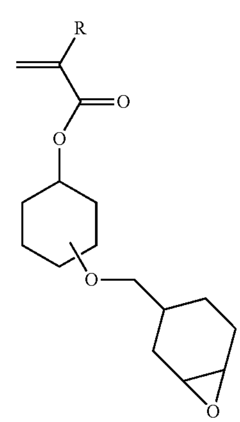

-continued

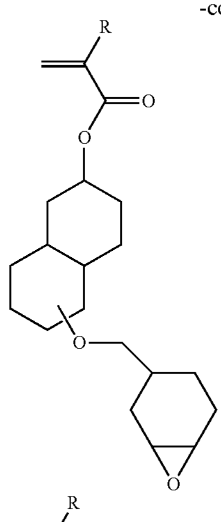

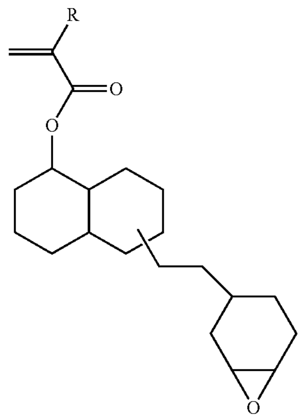

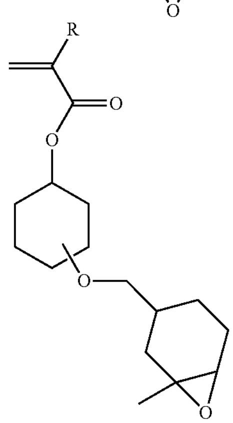

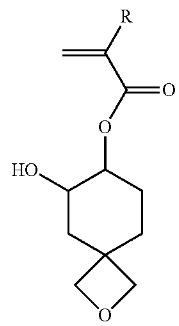

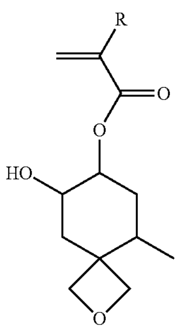

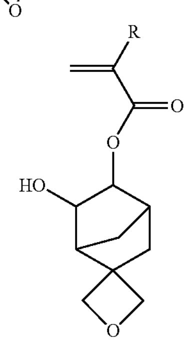

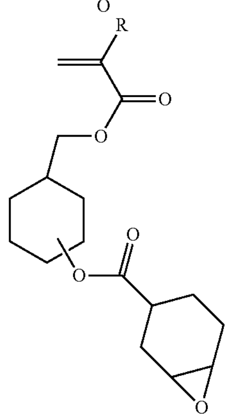

wherein, R is a methyl group or a hydrogen atom.

As one of the methods for synthesizing the polymer compound (ionic material) as the component (A), there may be mentioned a method in which, among the monomers, desired monomers of giving the repeating unit "a" (a1 to a7), and if necessary, units "b" to "g", are polymerized under heating in an organic solvent by adding a radical polymerization initiator to obtain a polymer compound which is the copolymer.

As the organic solvent to be used at the time of polymerization, there may be exemplified by toluene, benzene, tetrahydrofuran, diethyl ether, dioxane, and the like. As the polymerization initiator, there may be exemplified by 2,2'-azobisisobutyronitrile (AIBN), 2,2'-azobis(2,4-dimethylvaleronitrile), dimethyl2,2-azobis(2-methylpropionate), benzoyl peroxide, lauroyl peroxide, and the like. A heating temperature is preferably 50 to 80° C., and a reaction time is preferably 2 to 100 hours and more preferably 5 to 20 hours.

Here, ratios of the repeating units "a1" to "a7", "b", "c", "d", "e", "f" and "g" are 0≤a1≤1.0, 0≤a2≤1.0, 0≤a3≤1.0, 0≤a4≤1.0, 0≤a5≤1.0, 0≤a6≤1.0, 0≤a7≤1.0, 0<a1+a2+a3+a4+a5+a6+a7≤1.0, 0≤b<1.0, 0≤c<1.0, 0≤d<1.0, 0≤e<1.0, 0≤f<1.0 and 0≤g<1.0, preferably 0≤a1≤0.9, 0≤a2≤0.9, 0≤a3≤0.9, 0≤a4≤0.9, 0≤a5≤0.9, 0≤a6≤0.9, 0≤a7≤0.9, 0.01≤a1+a2+a3+a4+a5+a6+a7≤1.0, 0≤b≤0.9, 0≤c≤0.8, 0≤d≤0.6, 0≤e<0.4, 0≤f<0.4 and 0≤g<0.4, and more preferably 0≤a1≤0.8, 0≤a2≤0.8, 0≤a3≤0.8, 0≤a4≤0.8, 0≤a5≤0.8, 0≤a6≤0.8, 0≤a7≤0.8, 0.02≤a1+a2+a3+a4+a5+a6+a7≤0.8, 0.1≤b≤0.8, 0≤c≤0.7, 0≤d≤0.5, 0≤e<0.3, 0≤f<0.3 and 0≤g<0.3.

Incidentally, for example, a1+a2+a3+a4+a5+a6+a7+b+c+d+e+f+g=1 means that, in the polymer compound containing the repeating units "a1", "a2", "a3", "a4", "a5", "a6", "a7", "b", "c", "d", "e", "f" and "g", the total amount of the repeating units "a1", "a2", "a3", "a4", "a5", "a6", "a7", "b", "c", "d", "e", "f" and "g" is 100 mol % based on the total amount of the whole repeating units, and a1+a2+a3+a4+a5+a6+a7+b+c+d+e+f+g<1 means that, the total amount of the repeating units "a1", "a2", "a3", "a4", "a5", "a6", "a7", "b", "c", "d", "e", "f" and "g" is less than 100 mol % based on the total amount of the whole repeating units and the polymer has other repeating unit(s) than the repeating units "a1", "a2", "a3", "a4", "a5", "a6", "a7", "b", "c", "d", "e", "f" and "g"

A molecular weight as the component (A) is preferably 500 or more as a weight average molecular weight, more preferably 1,000 or more and 1,000,000 or less, and further preferably 2,000 or more and 500,000 or less. In the present invention, the weight average molecular weight as the component (A) is measured by gel permeation chromatography (GPC) using tetrahydrofuran (THF) as a solvent. In addition, if an amount of the ionic monomer (remaining monomer) not incorporated into the component (A) after the polymerization is a little, lowering in conductivity of the wiring at the time of stretching of the wiring can be suppressed to be a little, so that the amount of the remaining monomer is preferably decreased as little as possible. The amount of the remaining monomer is preferably 10 parts by mass or less based on 100 parts by mass of the whole the component (A).

[(B) Metal Powder]

To the conductive wiring material composition of the present invention, in order to increase conductivity, powder or nanoparticles of metal, such as gold, silver, platinum, copper, tin, titanium, nickel, aluminum, tungsten, molybdenum, ruthenium, chromium and indium is added as the component (B). An amount as the component (B) is in the range exceeding 50 parts by mass based on 100 parts by mass of the solid content of the conductive wiring material composition of the present invention excluding the component (B). If the formulation amount of the component (B) is 50 parts by mass or less based on 100 parts by mass of the above-mentioned solid content, conductivity of the wiring formed by the conductive wiring material composition is low, and lowering in conductivity of the wiring at the time of stretching becomes large.

The formulation amount of the component (B) is preferably in the range exceeding 100 parts by mass based on 100 parts by mass of the above-mentioned solid content, more preferably 200 parts by mass or more, and further preferably 300 parts by mass or more.

As the metal powder as the component (B), gold, silver and platinum are preferably from the viewpoint of conductivity, while silver, copper, tin, titanium, nickel, aluminum, tungsten, molybdenum, ruthenium and chromium are preferably from the viewpoint of a cost. From these viewpoints, silver, copper, tin and titanium are totally most preferable.

As a shape of the metal powder as the component (B), there may be mentioned spherical, disc-shaped, flake, and needle, and when the flaky powder is added, conductivity is highest so that it is preferable. The component (B) is preferably flaky having a relatively low density and large specific surface area such as a size of the metal powder of 100 μm or less, a tap density of 5 g/cm$^3$ or less, and a specific surface area of 0.5 m$^2$/g or more.

[(C) Stretchable Resin]

The conductive wiring material composition of the present invention is preferably a composition containing (C) a stretchable resin. In the conductive wiring material composition of the present invention, an amount of the component (C) is preferably 0 to 300 parts by mass based on 100 parts by mass of the component (A), and more preferably 0 to 200 parts by mass. When the conductive wiring material composition of the present invention is a material containing the component (C), the component (B) is preferably contained in an amount exceeding 50 parts by mass based on 100 parts by mass of the total of the component (A) and the component (C). Also, one kind of the component (C) may be used alone or mixture of the two or more kinds thereof may be used.

The component (C) formulated in the conductive material composition of the present invention is a the component for retaining the conductivity improving agent such as metal powder or the like by being compatible with the (A) ionic material (salt), and to exhibit stretchability. Incidentally, the component (C) may be any resin other than the component (A), and preferably a resin containing the component(s) selected from polyurethane, polyester, polyamide, silicone, polybutadiene and polyacrylonitrile.

[Carbon Material]

As a conductivity improving agent, a carbon material may be added, in addition to the metal powder. As the carbon material, there may be mentioned carbon black, carbon nanotube, carbon fiber and the like. The carbon nanotube may be either a single-walled or a multi-walled carbon nanotube, and the surface of which may be modified by an organic group(s). An amount of the carbon material is preferably in the range of 0 to 50 parts by mass based on 100 parts by mass of the solid content in the conductive wiring material composition of the present invention excluding the component (B).

[Organic Solvent]

Also, to the conductive wiring material composition of the present invention, an organic solvent may be added. As the organic solvent, there may be specifically mentioned an aromatic hydrocarbon-based solvent such as toluene, xylene, cumene, 1,2,3-trimethylbenzene, 1,2,4-trimethylbenzene, 1,3,5-trimethylbenzene, styrene, α-methylstyrene, butylbenzene, sec-butylbenzene, isobutylbenzene, cymene, diethylbenzene, 2-ethyl-p-xylene, 2-propyltoluene, 3-propyltoluene, 4-propyltoluene, 1,2,3,5-tetramethyltoluene, 1,2,4,5-tetramethyltoluene, tetrahydronaphthalene, 4-phenyl-1-butene, tert-amylbenzene, amylbenzene, 2-tert-butyltoluene, 3-tert-butyltoluene, 4-tert-butyltoluene, 5-isopropyl-m-xylene, 3-methylethylbenzene, tert-butyl-3-ethylbenzene, 4-tert-butyl-o-xylene, 5-tert-butyl-m-xylene, tert-butyl-p-xylene, 1,2-diisopropylbenzene, 1,3-diiso-propylbenzene, 1,4-diisopropylbenzene, dipropylbenzene, pentamethylbenzene, hexamethylbenzene, hexylbenzene, 1,3,5-triethylbenzene, etc., an aliphatic hydrocarbon-based solvent such as n-heptane, isoheptane, 3-methylhexane, 2,3-dimethylpentane, 3-ethylpentane, 1,6-heptadiene, 5-methyl-1-hexyne, norbornane, norbornene, dicyclopentadiene, 1-methyl-1,4-cyclohexadiene, 1-heptyne, 2-heptyne, cycloheptane, cycloheptene, 1,3-dimethylcyclopentane, ethylcyclopentane, methylcyclohexane, 1-methyl-1-cyclohexene, 3-methyl-1-cyclohexene, methylenecyclohexane, 4-methyl-1-cyclohexene, 2-methyl-1-hexene, 2-methyl-2-hexene, 1-heptene, 2-heptene, 3-heptene, n-octane, 2,2-dimethylhexane, 2,3-dimethylhexane, 2,4-dimethylhexane, 2,5-dimethylhexane, 3,3-dimethylhexane, 3,4-dimethylhexane, 3-ethyl-2-methylpentane, 3-ethyl-3-methylpentane, 2-methylheptane, 3-methylheptane, 4-methylheptane, 2,2,3-trimethylpentane, 2,2,4-trimethylpentane, cyclooctane, cyclooctene, 1,2-dimethylcyclohexane, 1,3-dimethylcyclohexane, 1,4-dimethylcyclohexane, ethylcyclohexane, vinylcyclohexane, isopropylcyclopentane, 2,2-dimethyl-3-hexene, 2,4-dimethyl-1-hexene, 2,5-dimethyl-1-hexene, 2,5-dimethyl-2-hexene, 3,3-dimethyl-1-hexene, 3,4-dimethyl-1-hexene, 4,4-dimethyl-1-hexene, 2-ethyl-1-hexene, 2-methyl-1-heptene, 1-octene, 2-octene, 3-octene, 4-octene, 1,7-octadiene, 1-octyne, 2-octyne, 3-octyne, 4-octyne, n-nonane, 2,3-dimethylheptane, 2,4-dimethylheptane, 2,5-dimethylheptane, 3,3-dimethylheptane, 3,4-dimethylheptane, 3,5-dimethylheptane, 4-ethylheptane, 2-methyloctane, 3-methyloctane, 4-methyloctane, 2,2,4,4-tetramethylpentane, 2,2,4-trimethylhexane, 2,2,5-trimethylhexane, 2,2-dimethyl-3-heptene, 2,3-dimethyl-3-heptene, 2,4-dimethyl-1-heptene, 2,6-dimethyl-1-heptene, 2,6-dimethyl-3-heptene, 3,5-dimethyl-3-heptene, 2,4,4-trimethyl-1-hexene, 3,5,5-trimethyl-1-hexene, 1-ethyl-2-methylcyclohexane, 1-ethyl-3-methylcyclohexane, 1-ethyl-4-methylcyclohexane, propyl-cyclohexane, isopropylcyclohexane, 1,1,3-trimethylcyclohexane, 1,1,4-trimethylcyclohexane, 1,2,3-trimethylcyclohexane, 1,2,4-trimethylcyclohexane, 1,3,5-trimethylcyclohexane, allylcyclohexane, hydrindane, 1,8-nonadiene, 1-nonyne, 2-nonyne, 3-nonyne, 4-nonyne, 1-nonene, 2-nonene, 3-nonene, 4-nonene, n-decane, 3,3-dimethyloctane, 3,5-dimethyloctane, 4,4-dimethyloctane, 3-ethyl-3-methylheptane, 2-methylnonane, 3-methylnonane, 4-methylnonane, tert-butylcyclohexane, butylcyclohexane, isobutylcyclohexane, 4-isopropyl-1-methylcyclohexane, pentylcyclopentane, 1,1,3,5-tetramethylcyclohexane, cyclododecane, 1-decene, 2-decene, 3-decene, 4-decene, 5-decene, 1,9-decadiene, decahydronaphthalene, 1-decyne, 2-decyne, 3-decyne, 4-decyne, 5-decyne, 1,5,9-decatriene, 2,6-dimethyl-2,4,6-octatriene, limonene, myrcene, 1,2,3,4,5-pentamethylcyclopentadiene, α-phellandrene, pinene, terpinene, tetrahydrodicyclopentadiene, 5,6-dihydrodicyclopentadiene, dicyclopentadiene, 1,4-decadiyne, 1,5-decadiyne, 1,9-decadiyne, 2,8-decadiyne, 4,6-decadiyne, n-undecane, amylcyclohexane, 1-undecene, 1,10-undecadiene, 1-undecyne, 3-undecyne, 5-undecyne, tricyclo[6.2.1.02,7]undeca-4-ene, n-dodecane, 2-methylundecane, 3-methylundecane, 4-methyl-undecane, 5-methylundecane, 2,2,4,6,6-pentamethylheptane, 1,3-dimethyladamantane, 1-ethyladamantane, 1,5,9-cyclododecatriene, 1,2,4-trivinylcyclohexane, isoparaffin, etc., a ketone-based solvent such as cyclohexanone, cyclopentanone, 2-octanone, 2-nonanone, 2-heptanone, 3-heptanone, 4-heptanone, 2-hexanone, 3-hexanone, diisobutyl ketone, methylcyclohexanone, methyl n-pentyl ketone, etc., an alcohol-based solvent such as 3-methoxybutanol, 3-methyl-3-methoxybutanol, 1-methoxy-2-propanol, 1-ethoxy-2-propanol, etc., an ether-based solvent such as propylene glycol monomethyl ether, ethylene glycol monomethyl ether, propylene glycol monoethyl ether, ethylene glycol monoethyl ether, propylene glycol dimethyl ether, diethylene glycol dimethyl ether, diethylene glycol diethyl ether, diethylene glycol monomethyl ether, diethylene glycol monoethyl ether, diethylene glycol monopropyl ether, diethylene glycol monobutyl ether, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-tert-amyl ether, di-n-hexyl ether, anisole, etc., an ester-based solvent such as propylene glycol monomethyl ether acetate, propylene glycol monoethyl ether acetate, propylene glycol monopropyl ether acetate, propylene glycol monobutyl ether acetate, propylene glycol diacetate, diethylene glycol monomethyl ether acetate, diethylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, etc., and a lactone-based solvent such as γ-butyrolactone, etc.

An amount of the organic solvent is preferably in the range of 10 to 50,000 parts by mass based on 100 parts by mass of the resin.

As described above, when the conductive wiring material composition of the present invention is employed, electric signals can be transmitted to the device with good efficiency and with high conductivity even at the time of stretching, and a wiring pattern can be formed on a substrate by printing at a low cost.

<Conductive Wiring Substrate>

In the present invention, a wiring substrate (wiring board) formed on a stretchable substrate, which exhibits stretchability, is provided.

Hereinafter, the wiring substrate of the present invention will be described in detail with reference to the drawing, but the present invention is not limited thereto.

FIG. 1 is a schematic sectional view showing an example of a conductive wiring substrate 100 of the present invention. The device shown in FIG. 1 is an electrocardiogram meter (ECG). On a stretchable substrate 1 of FIG. 1, bioelectrodes 2 and a center device 3 are connected to each other by a wiring 4 exhibiting stretchability. This is the structure disclosed in, for example, JP 2004-033468A.

As the stretchable substrate 1, a stretchable film or sheet such as polyurethane, polyester, silicone, nitrile rubber, butadiene rubber, polyethylene, polypropylene, polyolefin, PTFE, PFA or the like is used. The surface of the stretchable substrate 1 may be flat or may be uneven. When the surface is uneven, it is possible to form a stretchable wiring having a bellows structure in the perpendicular direction to the stretchable substrate 1, and it is possible to suppress change in conductivity at the time of stretching and shrinkage. In addition, it is possible to use a cloth including a non-woven fabric or stretchable fiber.

The stretchable substrate 1 preferably has stretchability of the maximum of 1,000%. A degree of stretch of the skin with respect to movement of human is said to be 10% on the bones such as chest or the like, 20% on the abdomen or the like, and 50% on the joint portion, and the stretching degree required for the wiring 4 is different depending on the part to be attached to the skin. In addition, stretchable fabrics are stretched by several hundred percent so that higher stretchability is required.

A wiring 4 is formed on a stretchable substrate 1 by using the conductive wiring material composition of the present invention. A method of coating the conductive wiring material composition of the present invention on the stretchable substrate 1 is not particularly limited and, for example, a method of dip coating, spray coating, spin coating, roll coating, flow coating, doctor coating, screen printing, flexographic printing, gravure printing, inkjet printing or the like is suitable. In particular, forming a wiring pattern by printing can improve productivity and make a free design including a wiring width possible.

A film thickness of the wiring 4 is preferably in the range of 10 nm to 1,000 μm. The thinner the wiring 4 is, the smaller an amount of the conductive wiring material composition to be used is, however, in this case, electric resistance of the wiring 4 increases. These values are determined in light of the balance among the electric resistance, the width of the wiring and the thickness of the wiring.

The conductive wiring material composition of the present invention is coated on the stretchable substrate 1 by printing and then baked. The baking is carried out not only to evaporate a solvent, but also to generate metal nanoparticles from metal flakes due to a redox reaction during annealing. According to this procedure, conductivity at the time of stretching is improved. The phenomenon of generating nanoparticles by annealing is described in the above-mentioned Patent Document 5. A baking temperature is in the range of 50 to 200° C., preferably 100° C. to 150° C., and a duration is 1 second to 10 hours, preferably 2 seconds to 5 hours. The baking can be carried out by a hot plate or in an oven, and it may be carried out by flash annealing at a higher temperature than the above-mentioned temperature for a short time, and it is also possible to carry out the baking by irradiation of infrared light.

In the case of an ECG device, it is necessary to provide a bioelectrode 2 at the portion contacting with the skin. As the bioelectrode 2, there may be mentioned those based on a gel electrolyte as described in JP H11-349786A, those using a fiber coated with a conductive polymer such as PEDOT-PSS as described in JP 2015-37696A, and those containing an ionic polymer as described in JP 2018-110845A and JP 2018-126496A, but it is not particularly limited as long as it can detect a biological signal. However, it is necessary to have water resistance when wearing in taking a shower, taking a bath, or during sports to sweat, and dry electrodes containing an ion polymer based on a silicone as described in JP 2018-110845A and JP 2018-126496A are preferable since they are possible to wear for a long time.

A layer of silver chloride may be provided between the bioelectrode 2 and the wiring 4. In the case of a gel electrode, a potential is generated by the reduction reaction of silver chloride to silver, so that the presence of the silver chloride layer is essential. In the case of the above-mentioned ion polymer dry electrode, the reduction reaction is not used for transmitting the potential so that the silver chloride layer is not necessarily required.

The bioelectrode 2 preferably has adhesiveness since it is need to be attached to the skin. When the bioelectrode 2 has no adhesiveness, it is necessary to use an adhesive for pasting to the skin separately. When an adhesive membrane is separately provided, an adhesive membrane may be formed using an adhesive membrane material such as acrylic type, urethane type, silicone type or the like, and in particular, the silicone type has high oxygen permeability, is possible to breathe of the skin while adhering the electrode to the skin and has high water repellency so that lowering in adhesiveness due to sweat is a little and irritation to the skin is low so that it is suitable.

A thickness of a biological contact layer of the bioelectrode 2 is preferably 1 μm or more and 5 mm or less, and more preferably 2 μm or more and 3 mm or less. When the biological contact layer becomes thin, the adhesive force becomes low, but flexibility is increased, it becomes light and conformability to the skin becomes better. A thickness of the biological contact layer can be selected in consideration of the adhesiveness and texture to the skin.

It is possible to evaluate the conductivity by printing the wiring 4 on the stretchable substrate 1, and measuring the electric resistance between both ends of the wiring 4. It can be said to be excellent material when the absolute value of the electric resistance is smaller, change in the conductivity is smaller between the state where the stretchable substrate 1 is not stretched and the state where the stretchable substrate 1 is stretched, or deterioration of the conductivity is smaller when the stretchable substrate 1 is shrunk and returned to the original state. It is preferable that change in the conductivity is small without causing breakage of the wiring 4 even if stretching and shrinkage are carried out repeatedly.

Further, it is possible to provide a cover membrane for covering the wiring 4. By providing the cover membrane, water resistance or mechanical strength can be improved. Since both the stretchable substrate 1 and the wiring 4 have stretchability, the cover membrane is also required to have stretchability. A material of the cover membrane is selected from polyurethane, polyester, silicone, nitrile rubber, butadiene rubber, polyethylene, polypropylene, polyolefin, PTFE and PFA similar to the stretchable substrate 1. A thickness of the cover membrane preferably used is in the range of 10 nm to 1 mm.

EXAMPLE

Hereinafter the present invention will be specifically explained by referring to Examples and Comparative Examples, but the present invention is not limited to these.

Ionic polymers 1 to 19 and Comparative Ionic polymer 1 formulated in the conductive wiring material composition as the ionic material (conductive material) were synthesized as follows. A solution at 30% by mass of each monomer in a propylene glycol-1-monomethyl ether-2-acetate (PGMEA) was charged in a reaction vessel and the solution(s) was/were mixed, and the reaction vessel was cooled to −70° C. under nitrogen atmosphere, degassing under reduced pressure and nitrogen blowing were repeated three times. After the temperature of the mixture was raised to room temperature, 0.01 mol of azobisisobutyronitrile (AIBN) was added as a polymerization initiator to the mixture based on 1 mol of the whole monomer, and the temperature of the mixture was raised to 60° C. and then the mixture was reacted for 15 hours. A composition of the obtained polymer was confirmed by $^{1}$H-NMR after drying the solvent. Also, a weight average molecular weight (Mw) and a degree of dispersion (Mw/Mn, which is also called to as molecular weight distribution) of the obtained polymer were confirmed by gel permeation chromatography (GPC) using tetrahydrofuran (THF) as a solvent. Ionic polymers 1 to 19, and Comparative Ionic polymer 1 thus synthesized are shown below.

Ionic Polymer 1

Mw=14,300, Mw/Mn=1.68

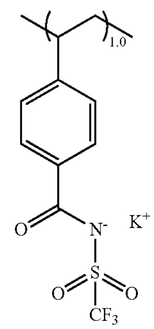

Ionic Polymer 2

Mw=14, 100, Mw/Mn=1.99

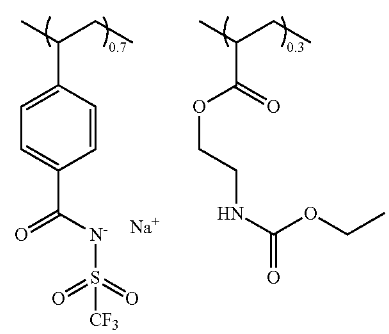

Ionic Polymer 3

Mw=18,100, Mw/Mn=1.87

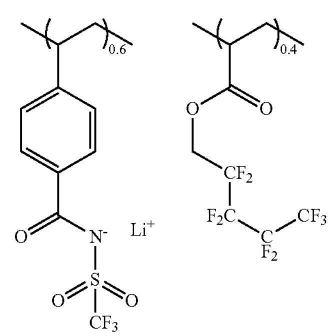

Ionic Polymer 4
Mw=21,900, Mw/Mn=1.77
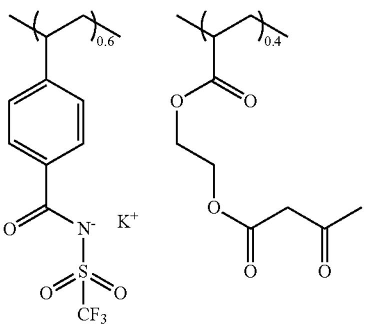
Ionic Polymer 5
Mw=23,500, Mw/Mn=1.85
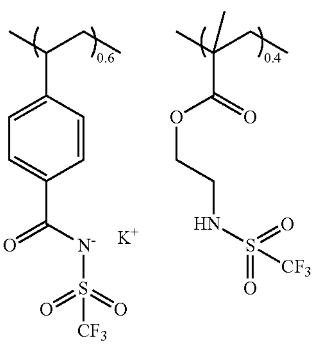
Ionic Polymer 6
Mw=19,900, Mw/Mn=1.81
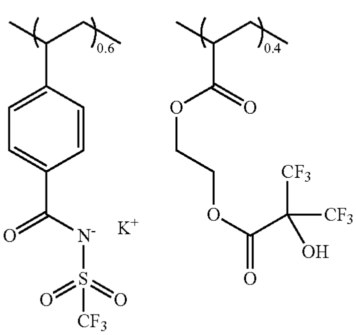
Ionic Polymer 7
Mw=19,600, Mw/Mn=2.10
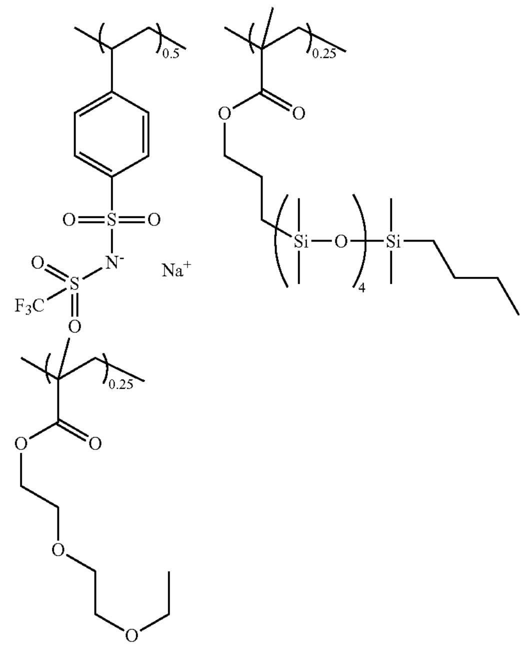
Ionic Polymer 8
Mw=31,100, Mw/Mn=2.02
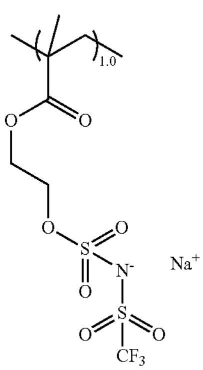
Ionic Polymer 9
Mw=16,300, Mw/Mn=2.11
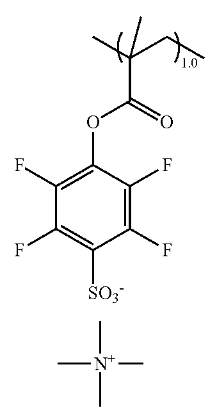

Ionic Polymer 10
Mw=14,600, Mw/Mn=1.94
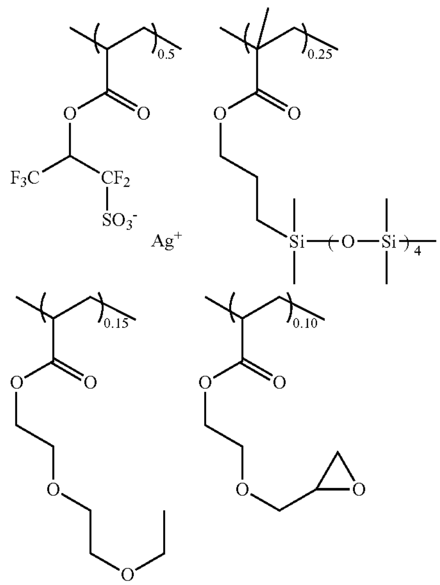
Ionic Polymer 11
Mw=26,500, Mw/Mn=1.91
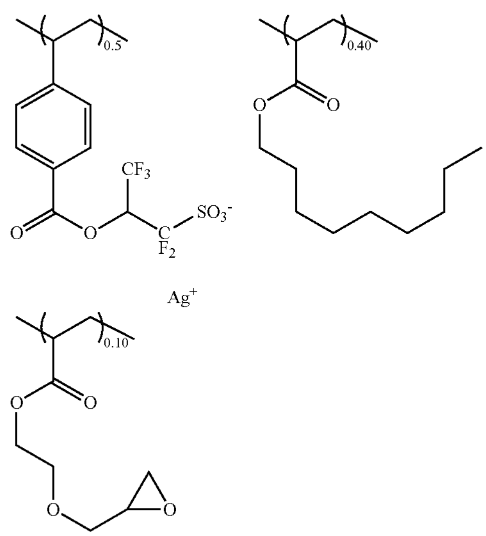
Ionic Polymer 12
Mw=15,200, Mw/Mn=1.82
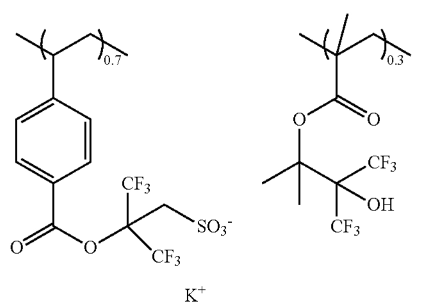
Ionic Polymer 13
Mw=21,300, Mw/Mn=1.68
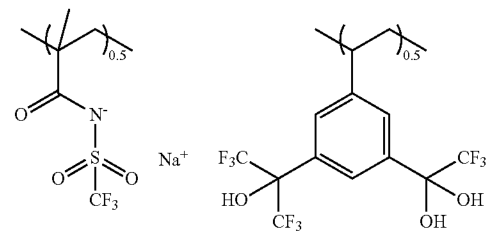
Ionic Polymer 14
Mw=14,300, Mw/Mn=1.61
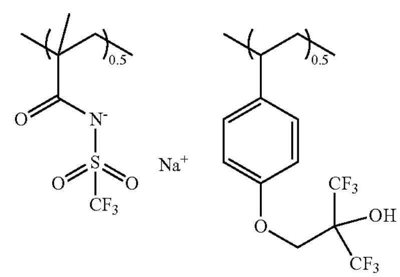
Ionic Polymer 15
Mw=64,100
Mw/Mn=2.29
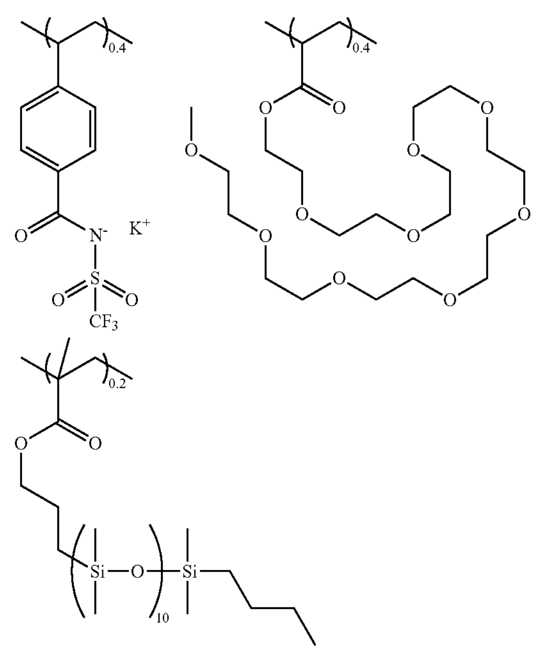

Ionic Polymer 16
Mw=52,300
Mw/Mn=2.02
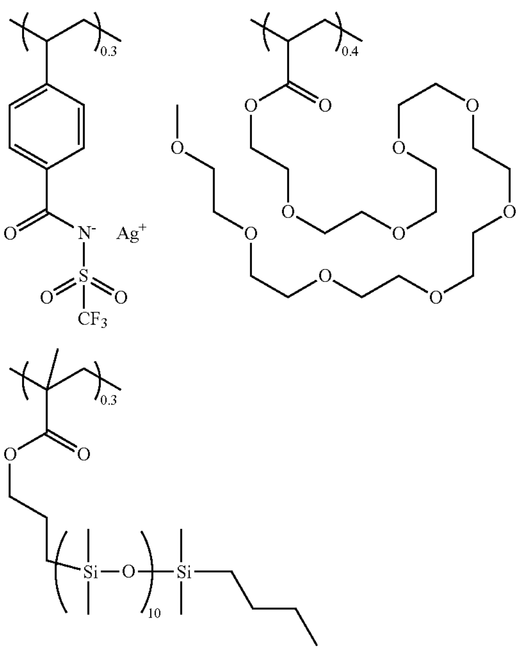
Ionic Polymer 17
Mw=56,500
Mw/Mn=1.93
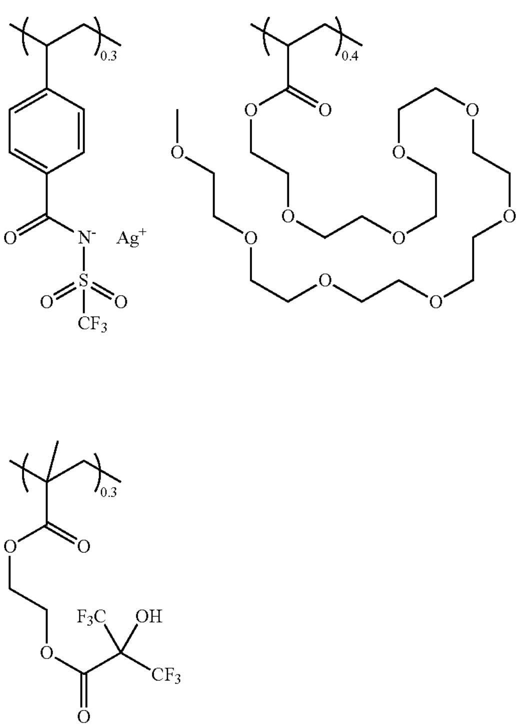
Ionic Polymer 18
Mw=63,500
Mw/Mn=1.94
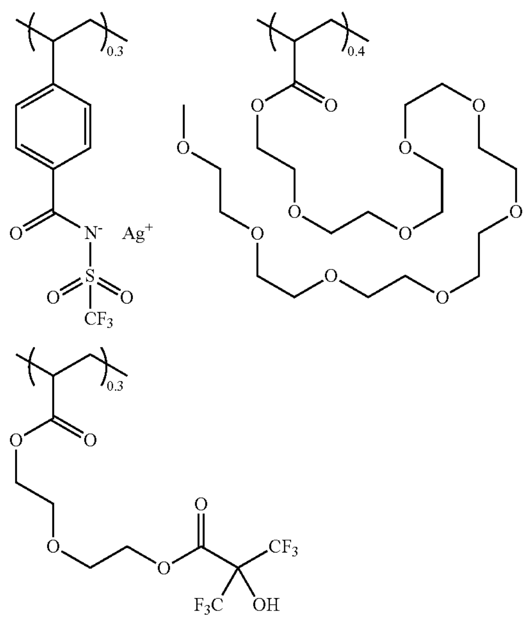
Ionic Polymer 19
Mw=51,700
Mw/Mn=1.98
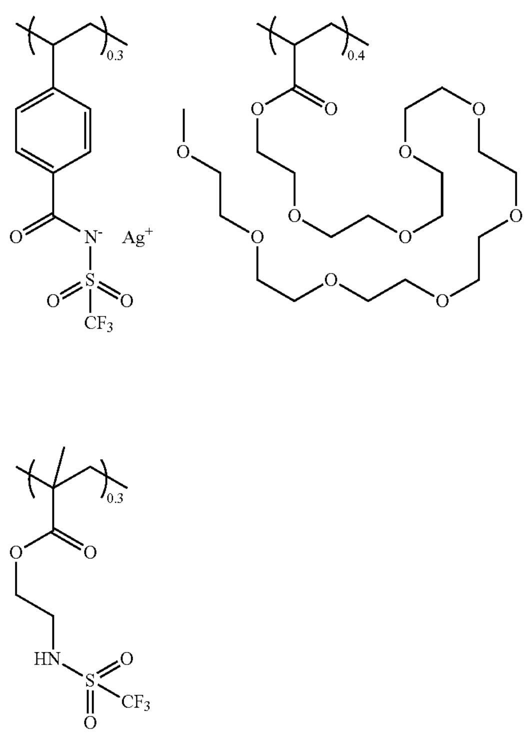

Comparative salts 1 to 3 formulated in the conductive wiring material compositions of Comparative Examples as the ionic material are shown below.

Comparative Salt 1

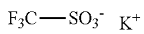

Comparative Salt 2

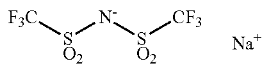

Comparative Salt 3

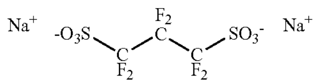

Comparative Ionic Polymer 1

Mw=24,900, Mw/Mn=2.09

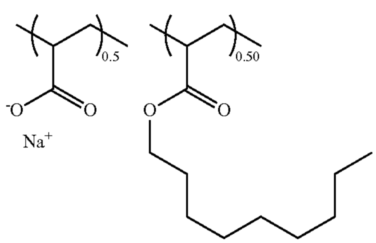

Organic solvents formulated in the conductive wiring material compositions are shown below.

PGMEA: Propylene glycol-1-monomethyl ether-2-acetate

DGEEA: Diethylene glycol ethyl ether acetate

DEG: Diethylene glycol

PG: Propylene glycol (B) metal powders, (C) stretchable resins and carbon materials (carbon black, carbon nanotube) formulated in the conductive wiring material compositions as additives are shown below.

Metal Powder

Silver powder: silver flake (diameter: 10 μm) available from Sigma-Aldrich

Gold powder: gold powder (diameter: 10 μm or less) available from Sigma-Aldrich

Tin powder: tin powder (diameter: 45 μm or less) available from Sigma-Aldrich

Titanium powder: titanium powder (diameter: 45 μm or less) available from Sigma-Aldrich Copper powder: copper powder (diameter: 45 μm or less) available from Sigma-Aldrich Stretchable Resin Polyurethane: Poly[4,4'-methylenebis(phenyl isocyanate)-alt-1,4-butanediol/di(propylene glycol)/polycaprolactone] available from Sigma-Aldrich Styrene butadiene rubber: available from Sigma-Aldrich Nitrile rubber: poly(acrylonitrile-co-butadiene) available from Sigma-Aldrich Carbon black: Denka Black HS-100 available from Denka Company Limited Multi-walled carbon nanotubes: available from Sigma-Aldrich (diameter: 110 to 170 nm, length: 5 to 9 μm)

Examples 1 to 28, Comparative Examples 1 to 6

Ionic materials (salt), metal powders, stretchable resins, organic solvents and carbon materials were blended with the compositions shown in Table 1 to Table 3 to prepare conductive wiring material compositions (conductive wiring material compositions 1 to 28 and Comparative conductive wiring material compositions 1 to 6).

TABLE 1

| Conductive wiring material composition | Ionic material (parts by mass) | Metal powder (parts by mass) | Stretchable resin (parts by mass) | Organic solvent (parts by mass) | Carbon material (parts by mass) |
|---|---|---|---|---|---|
| 1 | Ionic polymer 1 (50) | Silver powder (800) | Polyurethane (50) | PGMEA (800) PG (1000) | — |
| 2 | Ionic polymer 2 (50) | Silver powder (800) | Polyurethane (50) | PGMEA (800) PG (1000) | — |
| 3 | Ionic polymer 3 (50) | Silver powder (750) | Polyurethane (50) | PGMEA (800) PG (1000) | — |
| 4 | Ionic polymer 4 (50) | Silver powder (800) | Polyurethane (50) | PGMEA (800) PG (1000) | — |
| 5 | Ionic polymer 5 (50) | Silver powder (800) | Polyurethane (50) | DGEEA (800) PG (1000) | — |
| 6 | Ionic polymer 6 (50) | Silver powder (800) | Polyurethane (50) | PGMEA (800) DEG (1000) | — |
| 7 | Ionic polymer 7 (50) | Silver powder (800) | Polyurethane (50) | PGMEA (800) PG (1000) | — |
| 8 | Ionic polymer 8 (100) | Silver powder (700) | — | PGMEA (800) PG (1000) | — |
| 9 | Ionic polymer 9 (50) | Silver powder (800) | Polyurethane (50) | PGMEA (800) PG (1000) | — |
| 10 | Ionic polymer 10 (50) | Silver powder (800) | Polyurethane (50) | PGMEA (800) PG (1000) | — |
| 11 | Ionic polymer 11 (50) | Silver powder (800) | Polyurethane (50) | PGMEA (800) PG (1000) | — |
| 12 | Ionic polymer 12 (50) | Silver powder (800) | Polyurethane (50) | PGMEA (800) PG (1000) | — |
| 13 | Ionic polymer 13 (50) | Silver powder (800) | Polyurethane (50) | PGMEA (800) PG (1000) | |
| 14 | Ionic polymer 14 (50) | Silver powder (800) | Polyurethane (50) | PGMEA (800) PG (1000) | — |
| 15 | Ionic polymer 1 (50) | Silver powder (800) | Styrene butadiene rubber (50) | PGMEA (800) PG (1000) | — |
| 16 | Ionic polymer 1 (50) | Silver powder (800) | Nitrile rubber (50) | PGMEA (800) PG (1000) | — |
| 17 | Ionic polymer 1 (50) | Silver powder (700) | Polyurethane (50) | PGMEA (800) PG (1000) | Carbon black (15) |
| 18 | Ionic polymer 1 (50) | Silver powder (700) | Polyurethane (50) | PGMEA (800) PG (1000) | Carbon nanotubes (10) |
| 19 | Ionic polymer 1 (50) | Silver powder (800) | Polyurethane (50) | PGMEA (800) PG (1000) | — |
| 20 | Ionic polymer 1 (50) | Gold powder (200) Silver powder (600) | Polyurethane (50) | PGMEA (800) PG (1000) | — |

TABLE 1-continued

| Conductive wiring material composition | Ionic material (parts by mass) | Metal powder (parts by mass) | Stretchable resin (parts by mass) | Organic solvent (parts by mass) | Carbon material (parts by mass) |
|---|---|---|---|---|---|
| 21 | Ionic polymer 1 (50) | Tin powder (200) Silver powder (600) | Polyurethane (50) | PGMEA (800) PG (1000) | — |
| 22 | Ionic polymer 1 (50) | Titanium powder (200) Silver powder (600) | Polyurethane (50) | PGMEA (800) PG (1000) | — |
| 23 | Ionic polymer 1 (50) | Copper powder (400) Silver powder (400) | Polyurethane (50) | PGMEA (800) PG (1000) | — |

TABLE 2

| Comparative conductive wiring material composition | Ionic material (parts by mass) | Metal powder (parts by mass) | Stretchable resin (parts by mass) | Organic solvent (parts by mass) | Carbon material (parts by mass) |
|---|---|---|---|---|---|
| 1 | — | Silver powder (800) | Polyurethane (100) | PGMEA (800) PG (1000) | — |
| 2 | Ionic polymer 1 (50) | Silver powder (40) | Polyurethane (50) | PGMEA (800) PG (1000) | — |
| 3 | Comparative Ionic polymer 1 (50) | Silver powder (800) | Polyurethane (50) | PGMEA (800) PG (1000) | — |
| 4 | Comparative salt 1 (50) | Silver powder (800) | Polyurethane (50) | PGMEA (800) PG (1000) | — |
| 5 | Comparative salt 2 (50) | Silver powder (800) | Polyurethane (50) | PGMEA (800) PG (1000) | — |
| 6 | Comparative salt 3 (50) | Silver powder (800) | Polyurethane (50) | PGMEA (800) PG (1000) | — |

TABLE 3

| Conductive wiring material solution | Ionic material (parts by mass) | Metal powder (parts by mass) | Stretchable resin (parts by mass) | Organic solvent (parts by mass) | Carbon material (parts by mass) |
|---|---|---|---|---|---|
| Conductive wiring material solution 24 | Ionic polymer 15 (50) | Silver powder (800) | Polyurethane (50) | PGMEA (800) PG (1000) | — |
| Conductive wiring material solution 25 | Ionic polymer 16 (50) | Silver powder (800) | Polyurethane (50) | PGMEA (800) PG (1000) | — |
| Conductive wiring material solution 26 | Ionic polymer 17 (50) | Silver powder (800) | Polyurethane (50) | PGMEA (800) PG (1000) | — |
| Conductive wiring material solution 27 | Ionic polymer 18 (50) | Silver powder (800) | Polyurethane (50) | PGMEA (800) PG (1000) | — |
| Conductive wiring material solution 28 | Ionic polymer 19 (50) | Silver powder (800) | Polyurethane (50) | PGMEA (800) PG (1000) | — |

(Evaluation of Conductivity)

Using a stainless plate having a thickness of 30 μm with an opened pattern having a width of 1 mm and a length of 70 mm, a conductive wiring material composition was coated on a stretchable polyurethane film having a thickness of 100 μm by a roll coater and baked in an oven to produce a wiring having a width of 1 mm and a length of 70 mm.

The thickness of the wiring layer was measured using a 3D microscope, and conductive terminals were attached to both ends of the wiring. Electric resistances between the conductive terminals before stretching the stretchable polyurethane film (initial resistance), at 20% elongation and at 50% elongation were measured. The results are shown in Table 4.

TABLE 4

| | (Comparative) Conductive wiring material composition | Baking temperature/ duration | Film thickness (μm) | Initial resistance (Ω) | Resistance at 20% elongation (Ω) | Resistance at 50% elongation (Ω) |
|---|---|---|---|---|---|---|
| Example 1 | 1 | 130° C./2 hrs | 15 | 25 | 86 | 210 |
| Example 2 | 2 | 130° C./2 hrs | 12 | 20 | 72 | 180 |
| Example 3 | 3 | 130° C./2 hrs | 14 | 18 | 42 | 120 |
| Example 4 | 4 | 130° C./2 hrs | 11 | 29 | 90 | 320 |
| Example 5 | 5 | 130° C./2 hrs | 16 | 32 | 90 | 310 |
| Example 6 | 6 | 130° C./2 hrs | 20 | 25 | 81 | 220 |
| Example 7 | 7 | 130° C./2 hrs | 21 | 24 | 93 | 260 |
| Example 8 | 8 | 130° C./2 hrs | 18 | 16 | 45 | 122 |
| Example 9 | 9 | 130° C./2 hrs | 12 | 33 | 87 | 225 |
| Example 10 | 10 | 130° C./2 hrs | 16 | 32 | 93 | 270 |
| Example 11 | 11 | 130° C./2 hrs | 11 | 31 | 91 | 273 |
| Example 12 | 12 | 130° C./2 hrs | 12 | 29 | 96 | 240 |
| Example 13 | 13 | 130° C./2 hrs | 14 | 21 | 67 | 210 |
| Example 14 | 14 | 130° C./2 hrs | 18 | 20 | 84 | 280 |
| Example 15 | 15 | 140° C./1 hr | 9 | 32 | 98 | 310 |
| Example 16 | 16 | 140° C./1 hr | 18 | 20 | 67 | 280 |
| Example 17 | 17 | 130° C./2 hrs | 14 | 27 | 89 | 320 |
| Example 18 | 18 | 130° C./2 hrs | 12 | 26 | 76 | 330 |
| Example 19 | 19 | 130° C./2 hrs | 18 | 32 | 67 | 366 |
| Example 20 | 20 | 130° C./2 hrs | 16 | 13 | 46 | 126 |
| Example 21 | 21 | 130° C./2 hrs | 12 | 37 | 91 | 364 |
| Example 22 | 22 | 130° C./2 hrs | 18 | 38 | 98 | 370 |
| Example 23 | 23 | 130° C./2 hrs | 15 | 38 | 96 | 390 |
| Comparative Example 1 | Comparative 1 | 130° C./2 hrs | 16 | 50 | 205 | 810 |
| Comparative Example 2 | Comparative 2 | 130° C./2 hrs | 13 | 30 | 230 | 620 |
| Comparative Example 3 | Comparative 3 | 130° C./2 hrs | 12 | 60 | 320 | 910 |
| Comparative Example 4 | Comparative 4 | 130° C./2 hrs | 8 | 24 | 350 | 630 |
| Comparative Example 5 | Comparative 5 | 130° C./2 hrs | 9 | 28 | 320 | 860 |
| Comparative Example 6 | Comparative 6 | 130° C./2 hrs | 10 | 32 | 290 | 720 |

TABLE 5

| Example | Conductive wiring material solution | Baking temperature (° C.)/duration (hrs.) | Film thickness (μm) | Initial resistance (Ω) | Resistance at 20% elongation (Ω) | Resistance at 50% elongation (Ω) |
|---|---|---|---|---|---|---|
| Example 24 | Conductive wiring material solution 24 | 130° C./2 hrs | 12 | 25 | 66 | 190 |
| Example 25 | Conductive wiring material solution 25 | 130° C./2 hrs | 16 | 20 | 56 | 130 |
| Example 26 | Conductive wiring material solution 26 | 130° C./2 hrs | 13 | 18 | 46 | 128 |
| Example 27 | Conductive wiring material solution 27 | 130° C./2 hrs | 11 | 16 | 36 | 110 |
| Example 28 | Conductive wiring material solution 28 | 130° C./2 hrs | 13 | 18 | 39 | 180 |

As shown in Tables 4 and 5, in Examples 1 to 28 in which conductive wirings were formed by using the conductive wiring material compositions of the present invention where salts (ionic material) having specific structures and metal powder were formulated, the initial resistance was low and no significant increase in the resistance value occurred even after elongation. That is, in Exampled 1 to 28, wirings having high initial conductivity and exhibiting stretchability which did not cause significant lowering in conductivity at the time of stretching could be obtained. Further, such wirings of Examples 1 to 28 gave high conductivity particularly at the time of stretching than those of the wirings of Comparative Examples 1 and 3 to 6 which did not contain the ionic material of the present invention and that of the wiring of Comparative Example 2 in which the formulation amount of the metal powder was too little.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A conductive wiring material composition comprising (A) an ionic material, and (B) metal powder, wherein the component (A) is a polymer compound having a repeating unit "a" which has a structure selected from an ammonium salt, a lithium salt, a sodium salt, a potassium salt and a silver salt of fluorosulfonic acid, and the component (B) is contained in an amount exceeding 50 parts by mass based on 100 parts by mass of a solid content in the conductive wiring material composition excluding the component (B), and wherein the repeating unit "a" is a repeating unit having one or more structures represented by the following general formula (1)-1 or (1)-2:

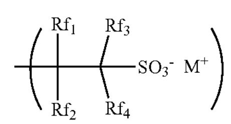

(1)-1

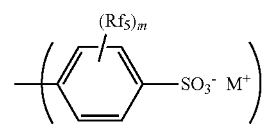

(1)-2 wherein, $Rf_1$ and $Rf_2$ each represent a hydrogen atom, a fluorine atom, an oxygen atom, a methyl group or a trifluoromethyl group, when $Rf_1$ is an oxygen atom, $Rf_2$ is also an oxygen atom to form a carbonyl group together with the carbon atom to which it is bonded;

$Rf_3$ and $Rf_4$ each represent a hydrogen atom, a fluorine atom or a trifluoro-methyl group and one or more of $Rf_1$ to $Rf_4$ is/are a fluorine atom(s) or a trifluoromethyl group(s); $Rf_5$ represents a fluorine atom or a linear or branched alkyl group having 1 to 4 carbon atoms and have one or more fluorine atoms; "m" is an integer of 1 to 4; $M^+$ represents an ion selected from an ammonium ion, a lithium ion, a sodium ion, a potassium ion and a silver ion.

2. The conductive wiring material composition according to claim 1, further comprising (C) a stretchable resin, and wherein the metal powder as the component (B) is contained in an amount exceeding 50 parts by mass based on 100 parts by mass of the total of the component (A) and the component (C).

3. The conductive wiring material composition according to claim 2, wherein the component (C) is a resin selected from polyurethane, polyester, polyamide, silicone, polybutadiene and polyacrylonitrile.

4. The conductive wiring material composition according to claim 3, wherein the repeating unit "a" is one or more kinds selected from repeating units represented by the following general formula (2):

(2)

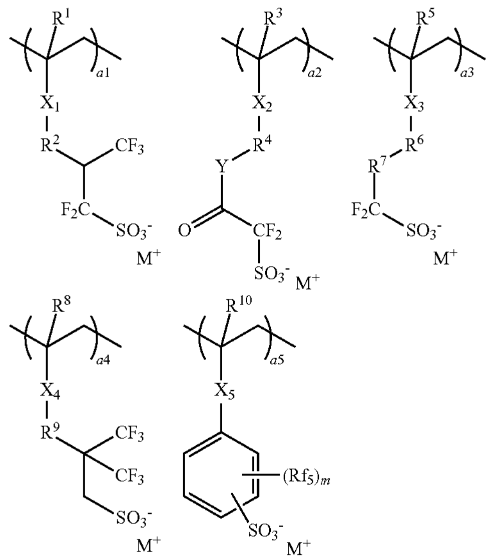

wherein, $R^1$, $R^3$, $R^5$, $R^8$, $R^{10}$, $R^{11}$, and $R^{13}$ each independently represent a hydrogen atom or a methyl group; $R^2$, $R^4$, $R^6$, and $R^9$ independently represent a single bond, an ester group, or a linear, branched or cyclic hydrocarbon group having 1 to 13 carbon atoms which may have either of or both of an ether group and an ester group; $R^7$ represents a linear or branched alkylene group having 1 to 4 carbon atoms, and among hydrogen atoms in $R^7$, one or two of them may be substituted by a fluorine atom(s); $X_1$, $X_2$, $X_3$ and $X_4$ each independently represent any of a single bond, a phenylene group, a naphthylene group, an ether group, an ester group and an amide group; $X_5$ represents any of a single bond, an ether group and an ester group; Y represents an oxygen atom or a —$NR^{19}$— group, $R^{19}$ represents a hydrogen atom or a linear or branched alkyl group having 1 to 4 carbon atoms, and Y and $R^4$ may be bonded to each other to form a ring; "m" is an integer of 1 to 4; "a1", "a2", "a3", "a4" and "a5" each represent $0 \leq a1 < 1.0$, $0 \leq a2 < 1.0$, $0 \leq a3 < 1.0$, $0 \leq a4 < 1.0$ and $0 \leq a5 < 1.0$ and numbers satisfying $0 < a1+a2+a3+a4+a5 < 1.0$; and $M^+$ represents an ion selected from an ammonium ion, a lithium ion, a sodium ion, a potassium ion and a silver ion.

5. The conductive wiring material composition according to claim 2, wherein the repeating unit "a" is one or more kinds selected from repeating units represented by the following general formula (2):

(2)

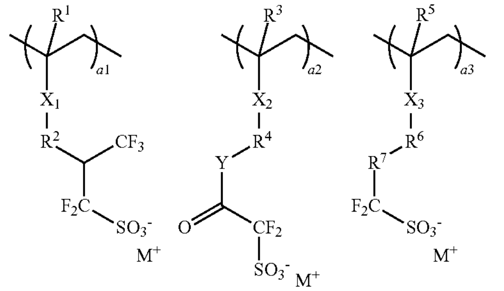

-continued

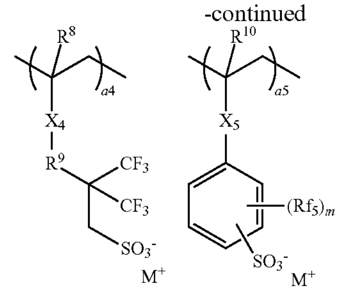

wherein, $R^1$, $R^3$, $R^5$, $R^8$, $R^{10}$, $R^{11}$, and $R^{13}$ each independently represent a hydrogen atom or a methyl group; $R^2$, $R^4$, $R^6$ each independently represent a single bond, an ester group, or a linear, branched or cyclic hydrocarbon group having 1 to 13 carbon atoms which may have either of or both of an ether group and an ester group; $R^7$ represents a linear or branched alkylene group having 1 to 4 carbon atoms, and among hydrogen atoms in $R^7$, one or two of them may be substituted by a fluorine atom(s); $X_1$, $X_2$, $X_3$ and $X_4$ each independently represent any of a single bond, a phenylene group, a naphthylene group, an ether group, an ester group and an amide group; $X_5$ represents any of a single bond, an ether group and an ester group; Y represents an oxygen atom or a —$NR^{19}$— group, $R^{19}$ represents a hydrogen atom or a linear or branched alkyl group having 1 to 4 carbon atoms, and Y and $R^4$ may be bonded to each other to form a ring; "m" is an integer of 1 to 4; "a1", "a2", "a3", "a4" and "a5" each represent $0 \leq a1 \leq 1.0$, $0 < a2 < 1.0$, $0 \leq a3 < 1.0$, $0 \leq a4 < 1.0$ and $0 \leq a5 < 1.0$, and numbers satisfying $0 < a1+a2+a3+a4+a5 < 1.0$; and $M^+$ represents an ion selected from an ammonium ion, a lithium ion, a sodium ion, a potassium ion and a silver ion.

6. The conductive wiring material composition according to claim 1, wherein the repeating unit "a" is one or more kinds selected from repeating units represented by the following general formula (2):

(2)

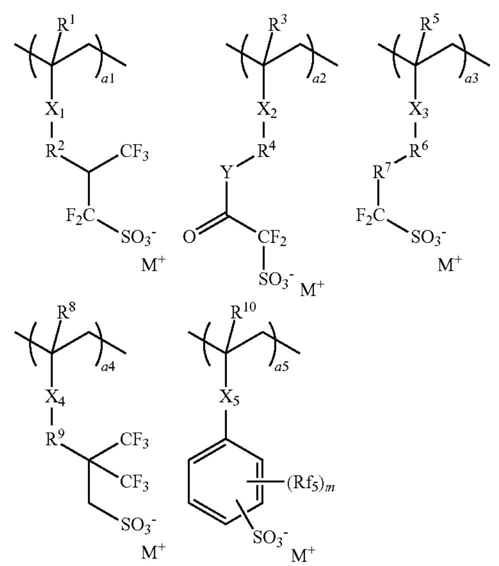

wherein, $R^1$, $R^3$, $R^5$, $R^8$, $R^{11}$, and $R^{13}$ each independently represent a hydrogen atom or a methyl group; $R^2$, $R^4$, $R^6$ and $R^9$ independently represent a single bond, an ester group, or a linear, branched or cyclic hydrocarbon group having 1 to 13 carbon atoms which may have either of or both of an ether group and an ester group; $R^7$ represents a linear or branched alkylene group having 1 to 4 carbon atoms, and among hydrogen atoms in $R^7$, one or two of them may be substituted by a fluorine atom(s); $X_1$, $X_2$, $X_3$ and $X_4$ and $X_6$ each independently represent any of a single bond, a phenylene group, a naphthylene group, an ether group, an ester group and an amide group; $X_5$ represents any of a single bond, an ether group and an ester group; Y represents an oxygen atom or a —$NR^{19}$— group, $R^{19}$ represents a hydrogen atom or a linear or branched alkyl group having 1 to 4 carbon atoms, and Y and $R^4$ may be bonded to each other to form a ring; "m" is an integer of 1 to 4; "a1", "a2", "a3", "a4" and "a5" each represent $0<a1<1.0$, $0<a2<1.0$, $0<a3<1.0$, $0<a4<1.07$ and $0<a5<1.0$, and numbers satisfying $0<a1+a2+a3+a4+a5<1.0$; and $M^+$ represents an ion selected from an ammonium ion, a lithium ion, a sodium ion, a potassium ion and a silver ion.

7. The conductive wiring material composition according to claim 1, wherein the component (A) has the repeating unit "a" having the ammonium salt structure, the ammonium salt comprises an ammonium ion represented by the following general formula (3):

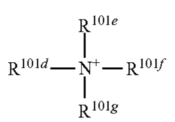

(3)

wherein, $R^{101d}$, $R^{101e}$, $R^{101f}$ and $R^{101g}$ each represent a hydrogen atom, a linear, branched or cyclic alkyl group having 1 to 12 carbon atoms, a linear, branched or cyclic alkenyl group or alkynyl group having 2 to 12 carbon atoms, or an aromatic group having 6 to 20 carbon atoms, and may have one or more kinds selected from an ether group, a carbonyl group, an ester group, a hydroxy group, an amino group, a nitro group, a sulfonyl group, a sulfinyl group, a halogen group and a sulfur atom; $R^{101d}$ and $R^{101e}$, and $R^{101d}$, $R^{101e}$ and $R^{101f}$ may form a ring with the nitrogen atom bonded therewith, and when a ring is formed, $R^{101d}$ and $R^{101e}$, and $R^{101d}$, $R^{101e}$ and $R^{101f}$ are an alkylene group having 3 to 10 carbon atoms or form a heteroaromatic ring having the nitrogen atom in the formula in the ring.

8. The conductive wiring material composition according to claim 1, wherein the conductive wiring material composition further comprises an organic solvent.

9. The conductive wiring material composition according to claim 1, wherein the component (B) is powder of a metal selected from gold, silver, platinum, copper, tin, titanium, nickel, aluminum, tungsten, molybdenum, ruthenium, chromium and indium.

10. The conductive wiring material composition according to claim 1, wherein the component (B) is silver powder, copper powder, tin powder or titanium powder.

11. A conductive wiring substrate comprising a wiring formed by the conductive wiring material composition according to claim 1 on a substrate.

12. The conductive wiring substrate according to claim 11, wherein the substrate is a substrate capable of stretching at the maximum of 1,000%.

13. A method for producing a conductive wiring substrate comprising printing the conductive wiring material composition according to claim 1 on a substrate to form a wiring.

* * * * *